US012532660B2

(12) United States Patent
Sakamoto

(10) Patent No.: US 12,532,660 B2
(45) Date of Patent: Jan. 20, 2026

(54) LIGHT EMITTING DEVICE AND AMINE COMPOUND FOR THE SAME

(71) Applicant: Samsung Display Co., Ltd., Yongin-si (KR)

(72) Inventor: Naoya Sakamoto, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 1184 days.

(21) Appl. No.: 17/337,911

(22) Filed: Jun. 3, 2021

(65) Prior Publication Data

US 2022/0123221 A1 Apr. 21, 2022

(30) Foreign Application Priority Data

Oct. 20, 2020 (KR) ........................ 10-2020-0136196

(51) Int. Cl.
*H10K 85/60* (2023.01)
*H10K 85/40* (2023.01)

(52) U.S. Cl.
CPC ........... *H10K 85/636* (2023.02); *H10K 85/40* (2023.02); *H10K 85/622* (2023.02); (Continued)

(58) Field of Classification Search
CPC ............. H01L 51/0061; H01L 51/0072; H01L 51/0073; H01L 51/0067; H01L 51/0054; (Continued)

(56) References Cited

U.S. PATENT DOCUMENTS 8,039,121 B2 10/2011 Iwakuma et al.
9,278,926 B2 3/2016 Kato
(Continued)

FOREIGN PATENT DOCUMENTS

CN 102596907 A 7/2012
CN 110669040 A 1/2020
(Continued)

OTHER PUBLICATIONS

Search Report for Chinese Application No. 202110931238.6 dated Jun. 4, 2025. 13 pages . (see p. 11-12, categorizing the cited references).

*Primary Examiner* — Vu A Nguyen
(74) *Attorney, Agent, or Firm* — Lerner David LLP

(57) ABSTRACT

Provided is a light emitting device including a first electrode, a second electrode disposed on the first electrode, and at least one functional layer disposed between the first electrode and the second electrode. The at least one functional layer may include an amine compound represented by Formula 1 below, thereby exhibiting excellent luminous efficiency and improved service life characteristics.

[Formula 1]

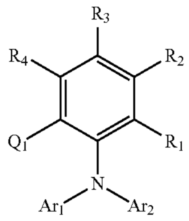

18 Claims, 8 Drawing Sheets

(52) U.S. Cl.
CPC ....... *H10K 85/654* (2023.02); *H10K 85/6572* (2023.02); *H10K 85/6574* (2023.02); *H10K 85/6576* (2023.02)

(58) Field of Classification Search
CPC ............ H01L 51/0094; H01L 51/0074; H01L 51/5016; C07D 307/91; C07D 333/76; C09K 11/06
See application file for complete search history.

(56) References Cited

U.S. PATENT DOCUMENTS

| | | | |
|---|---|---|---|
| 9,650,565 | B2 | 5/2017 | Matsumoto et al. |
| 11,437,585 | B2 | 9/2022 | Jeong et al. |
| 12,289,989 | B2 | 4/2025 | Zhang et al. |
| 2017/0117488 | A1 | 4/2017 | Ahn et al. |
| 2020/0144508 | A1 | 5/2020 | Jang et al. |

FOREIGN PATENT DOCUMENTS

| | | | | | |
|---|---|---|---|---|---|
| CN | 111253302 | | | 6/2020 | |
| CN | 111253302 | A | * | 6/2020 | ........... C07D 209/88 |
| CN | 111564562 | A | | 8/2020 | |
| JP | 2011088835 | A | | 5/2011 | |
| KR | 2012-0066076 | A | * | 6/2012 | |
| KR | 10-1356953 | | | 1/2014 | |
| KR | 10-2018-0027468 | | | 3/2018 | |
| KR | 10-1872580 | | | 6/2018 | |
| KR | 10-1935710 | | | 4/2019 | |
| KR | 10-2020-0050748 | | | 5/2020 | |
| KR | 20200076003 | A | * | 6/2020 | ............ H10K 50/00 |
| WO | 2011/049123 | | | 4/2011 | |
| WO | WO/2011/049123 | A2 | * | 4/2011 | |

* cited by examiner

LIGHT EMITTING DEVICE AND AMINE COMPOUND FOR THE SAME

CROSS-REFERENCE TO RELATED APPLICATION(S)

This application claims priority to and benefits of Korean Patent Application No. 10-2020-0136196 under 35 U.S.C. § 119, filed on Oct. 20, 2020 in the Korean Intellectual Property Office, the entire contents of which are incorporated herein by reference.

BACKGROUND

1. Technical Field

The disclosure relates to an amine compound used as a hole transport material and a light emitting device including the same.

2. Description of the Related Art

Active development continues for an organic electroluminescence display as an image display apparatus. The organic electroluminescence display includes a so-called self-luminescent light emitting device in which holes and electrons respectively injected from a first electrode and a second electrode recombine in an emission layer, so that a luminescent material of the emission layer emits light to implement display.

In the application of a light emitting device to a display apparatus, there is a demand for a light emitting device to achieve low driving voltage, high luminous efficiency, and a long service life, and continuous development is required for materials for a light emitting device which stably achieves such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device exhibiting excellent luminous efficiency and long service life characteristics.

The disclosure also provides an amine compound which is a material for a light emitting device having high efficiency and long service life characteristics.

An embodiment provides a light emitting device that includes a first electrode, a second electrode disposed on the first electrode, and at least one functional layer disposed between the first electrode and the second electrode and including an amine compound represented by Formula 1 below:

[Formula 1]

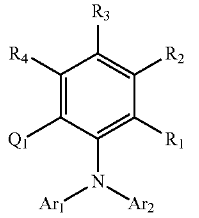

In Formula 1 above, $Q_1$ may be a substituted or unsubstituted heteroaryl group having 2 to 30 ring-forming carbon atoms, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, one pair selected from among $R_1$ and $R_2$, $R_2$ and $R_3$, and $R_3$ and $R_4$ may be bonded to each other to form a ring represented by Formula 2 below, and the remainder of $R_1$, $R_2$, $R_3$, and $R_4$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms:

[Formula 2]

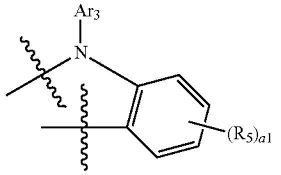

In Formula 2 above, $Ar_3$ may be a substituted or unsubstituted aryl group having 6 to 30 ring-forming carbon atoms, or a substituted or unsubstituted heteroaryl group having 2 to 30 ring-forming carbon atoms, a1 may be an integer from 0 to 4, and $R_5$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula 2,

indicates a binding site to a neighboring atom.

In an embodiment, $Q_1$ may be a substituted or unsubstituted dibenzofuran group, a substituted or unsubstituted dibenzothiophene group, a substituted or unsubstituted carbazole group, a substituted or unsubstituted dibenzosilole group, a substituted or unsubstituted dibenzothiophene sulfone group, a substituted or unsubstituted pyridine group, a substituted or unsubstituted pyrimidine group, or a substituted or unsubstituted triazine group.

In an embodiment, Formula 1 above may be represented by any one among Formula 1-1 to Formula 1-6 below:

[Formula 1-1]

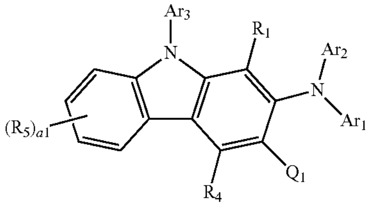

[Formula 1-2]

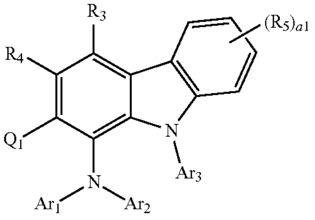

[Formula 1-3]

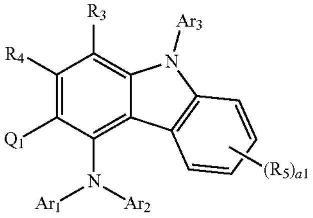

[Formula 1-4]

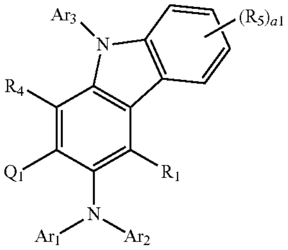

[Formula 1-5]

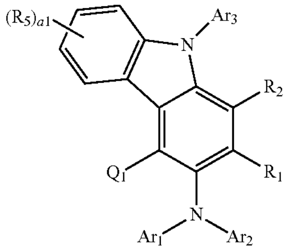

[Formula 1-6]

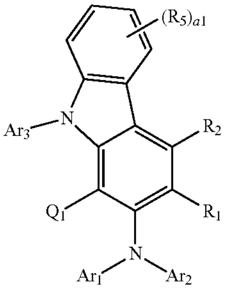

In Formula 1-1 to Formula 1-6 above, $Q_1$, $Ar_1$ to $Ar_3$, a1, $R_1$ to $R_5$ may be the same as defined in connection with Formula 1 above.

In an embodiment, in Formula 1-2 to Formula 1-6 above, $Q_1$ may be a substituted or unsubstituted dibenzofuran group, or a substituted or unsubstituted dibenzothiophene group.

In an embodiment, Formula 1 above may be represented by Formula 3 below:

[Formula 3]

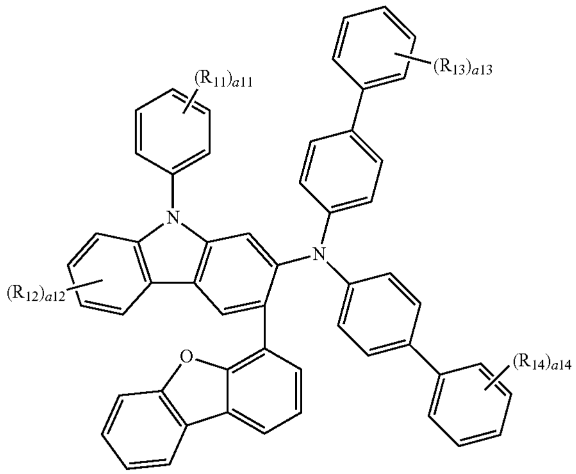

In Formula 3 above, a11, a13, and a14 may each independently be an integer from 0 to 5, a12 may be an integer from 0 to 4, at least one of $R_{12}$ to $R_{14}$ may be a deuterium atom, and the remainder of $R_{11}$ to $R_{14}$ may be hydrogen atoms.

In an embodiment, $Ar_1$ and $Ar_2$ may each independently be represented by any one among A-1 to A-3 below:

A-1

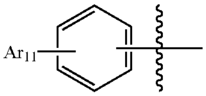

A-2

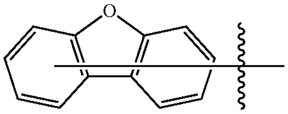

A-3

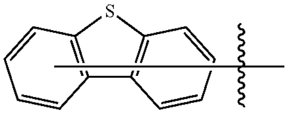

In A-1 above, $Ar_{11}$ may be a hydrogen atom, a methyl group, or a substituted or unsubstituted aryl group having 6 to 30 ring-forming carbon atoms. In A-1 to A-3,

indicates a binding site to a neighboring atom.

In an embodiment, $Ar_1$ and $Ar_2$ may be the same as each other.

In an embodiment, $Ar_3$ may be a substituted or unsubstituted phenyl group, an unsubstituted naphthyl group, an unsubstituted phenanthryl group, an unsubstituted triphenyl group, an unsubstituted naphthobenzofuran group, or an unsubstituted benzonaphthothiophene group.

In an embodiment, a difference value between a lowest singlet exciton energy level and a lowest triplet exciton energy level of the amine compound may be equal to or less than about 0.2 eV.

In an embodiment, the at least one functional layer may include an emission layer, a hole transport region disposed between the first electrode and the emission layer, and an electron transport region disposed between the emission layer and the second electrode, and at least one of the hole transport region and the emission layer may include the amine compound.

In an embodiment, the at least one functional layer may include an emission layer, a hole transport region disposed between the first electrode and the emission layer, and an electron transport region disposed between the emission layer and the second electrode. The hole transport region may include a hole injection layer disposed on the first electrode, a hole transport layer disposed on the hole injection layer, and an electron blocking layer disposed on the hole transport layer. At least one functional layer of the hole injection layer, the hole transport layer, and the electron blocking layer may include the amine compound.

In an embodiment, an amine compound may be represented by Formula 1 above.

In an embodiment, $Q_1$ above may be represented by any one among Q-1 to Q-8 below:

Q-1

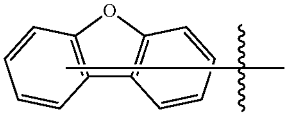

Q-2

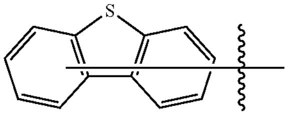

Q-3

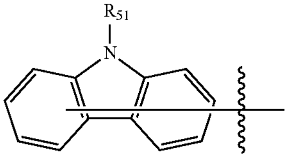

Q-4

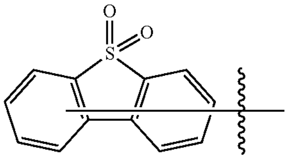

Q-5

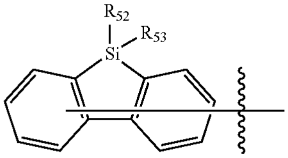

-continued

Q-6

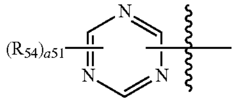

Q-7

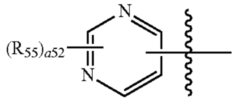

Q-8

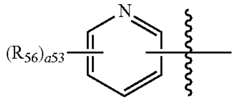

In Q-6 above, a51 may be an integer from 0 to 2. In Q-7 above, a52 may be an integer from 0 to 3. In Q-8 above, a53 may be an integer from 0 to 4. In Q-3 and Q-5 to Q-8 above, $R_{51}$ to $R_{56}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Q-1 to Q-8,

indicates a binding site to a neighboring atom.

BRIEF DESCRIPTION OF THE DRAWINGS

The accompanying drawings are included to provide a further understanding of the embodiments, and are incorporated in and constitute a part of this specification. The drawings illustrate embodiments of the disclosure. The above and other aspects and features of the disclosure will become more apparent by describing in detail embodiments thereof with reference to the attached drawings, in which.

DETAILED DESCRIPTION OF THE EMBODIMENTS

Figure 1:
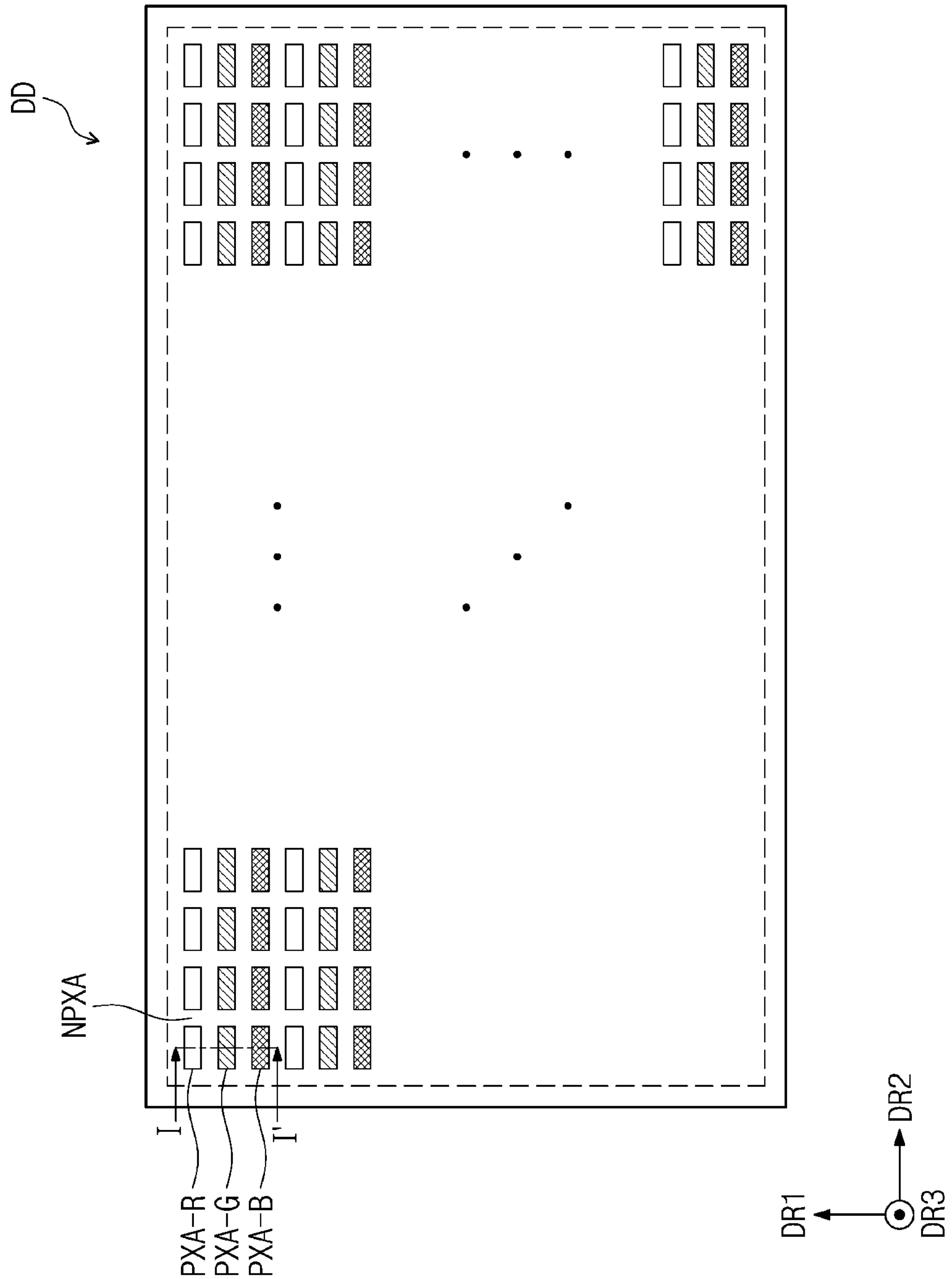
FIG. 1 is a plan view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being “on”, “connected to”, or “coupled to” another element, it can be directly on, connected to, or coupled to the other element, or one or more intervening elements may be present therebetween. In a similar sense, when an element (or region, layer, part, etc.) is described as “covering” another element, it can directly cover the other element, or one or more intervening elements may be present therebetween.

In the description, when an element is “directly on,” “directly connected to,” or “directly coupled to” another element, there are no intervening elements present. For example, “directly on” may mean that two layers or two elements are disposed without an additional element such as an adhesion element therebetween.

As used herein, the expressions used in the singular such as “a,” “an,” and “the,” are intended to include the plural forms as well, unless the context clearly indicates otherwise.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

The term “at least one of” is intended to include the meaning of “at least one selected from” for the purpose of its meaning and interpretation. For example, “at least one of A and B” may be understood to mean “A, B, or A and B.” When preceding a list of elements, the term, “at least one of,” modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, 10%, or 5% of the stated value.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

Figure 2:
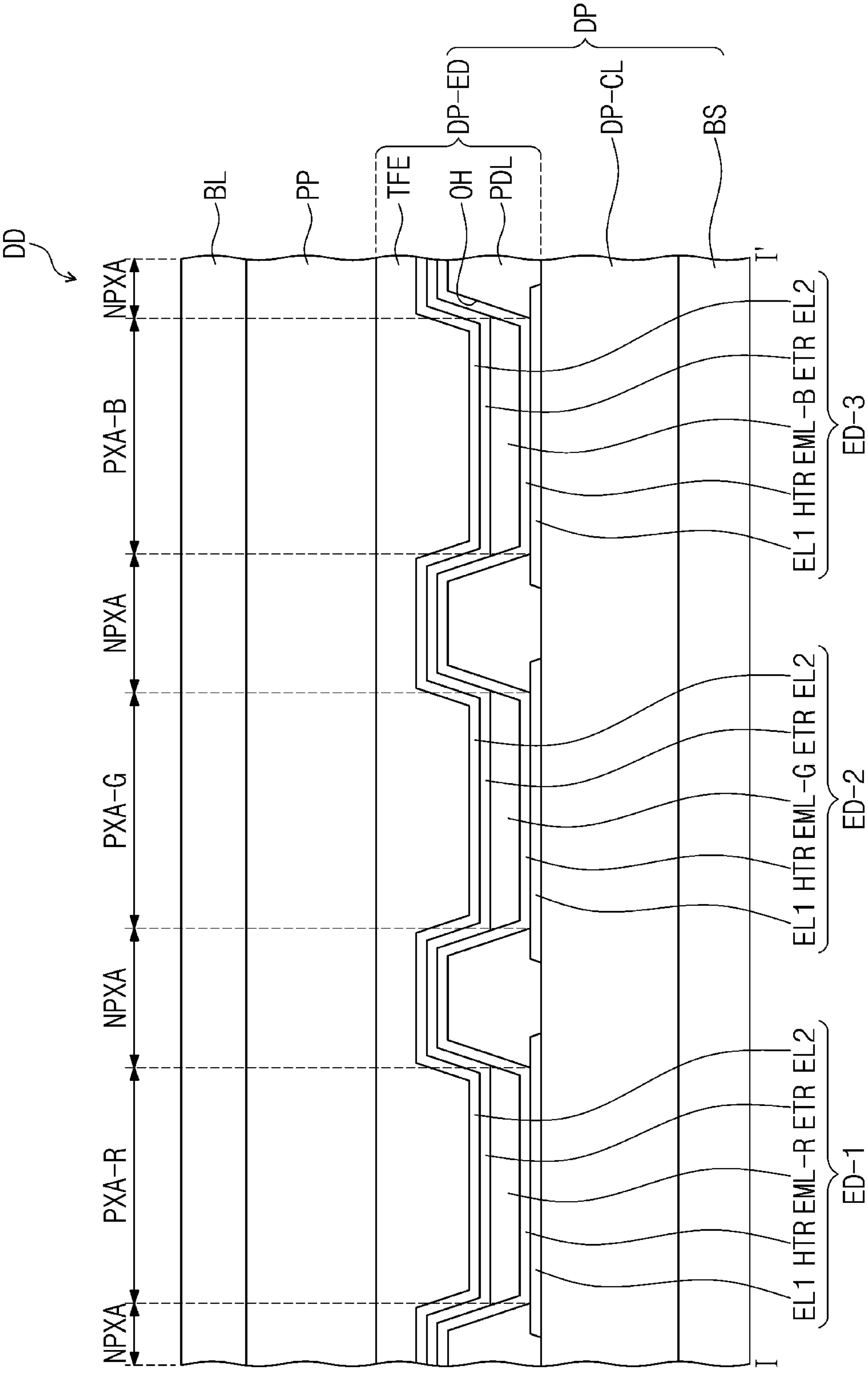
FIG. 2 is a schematic cross-sectional view illustrating a display apparatus according to an embodiment.

FIG. 1 is a plan view illustrating an embodiment of a display apparatus DD. FIG. 2 is a schematic cross-sectional view of the display apparatus DD of the embodiment. FIG. 2 is a schematic cross-sectional view illustrating a part taken along line I-I' of FIG. 1.

The display apparatus DD may include a display panel DP and an optical layer PP disposed on the display panel DP. The display panel DP includes light emitting devices ED-1, ED-2, and ED-3. The display apparatus DD may include light emitting devices ED-1, ED-2, and ED-3. The optical layer PP may be disposed on the display panel DP and control reflected light in the display panel DP due to external light. The optical layer PP may include, for example, a polarization layer or a color filter layer. While it is not illustrated in the drawing, the optical layer PP may be omitted from the display apparatus DD in another embodiment.

A base substrate BL may be disposed on the optical layer PP. The base substrate BL may be a member which provides a base surface on which the optical layer PP disposed. The base substrate BL may be a glass substrate, a metal substrate, a plastic substrate, etc. However, embodiments are not limited thereto, and the base substrate BL may be an inorganic layer, an organic layer, or a composite material layer. Different from what is shown in the drawings, in another embodiment, the base substrate BL may be omitted.

The display apparatus DD according to an embodiment may further include a filling layer (not shown). The filling layer (not shown) may be disposed between a display device layer DP-ED and the base substrate BL. The filling layer (not shown) may be an organic material layer. The filling layer (not shown) may include at least one of an acrylic-based resin, a silicone-based resin, and an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 disposed between portions of the pixel defining film PDL, and an encapsulation layer TFE disposed on the light emitting devices ED-1, ED-2, and ED-3.

The base layer BS may be a member which provides a base surface on which the display device layer DP-ED is disposed. The base layer BS may be a glass substrate, a metal substrate, a plastic substrate, etc. However, embodiments are not limited thereto, and the base layer BS may be an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the light emitting devices ED-1, ED-2, and ED-3 in the openings OH defined in the pixel defining film PDL, and the hole transport region HTR, the electron transport region ETR, and the second electrode EL2 are provided as a common layer in the entire light emitting devices ED-1, ED-2, and ED-3. However, embodiments are not limited thereto, and different from what is illustrated in FIG. 2, in another embodiment, the hole transport region HTR and the electron transport region ETR may be provided by being patterned inside the opening OH defined in the pixel defining film PDL. For example, the hole transport region HTR, the emission layers EML-R, EML-G, and EML-B, and the electron transport region ETR in an embodiment may be provided by being patterned in an inkjet printing method.

The encapsulation layer TFE may cover the luminescence devices ED-1, ED-2, and ED-3. The encapsulation layer TFE may seal the display device layer DP-ED. The encapsulation layer TFE may be a thin film encapsulation layer. The encapsulation layer TFE may be formed by laminating one layer or multiple layers. The encapsulation layer TFE may include at least one insulation layer. The encapsulation layer TFE according to an embodiment may include at least one inorganic film (hereinafter, an encapsulation-inorganic film) The encapsulation layer TFE according to an embodiment may also include at least one organic film (hereinafter, an encapsulation-organic film) and at least one encapsulation-inorganic film.

The encapsulation-inorganic film may protect the display device layer DP-ED from moisture and/or oxygen, and the encapsulation-organic film may protect the display device layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic-based compound, an epoxy-based compound, or the like. The encapsulation-organic film may include a photopolymerizable organic material, but embodiments are not limited thereto.

The encapsulation layer TFE may be disposed on the second electrode EL2. The encapsulation layer TFE may be disposed to fill the opening hole OH.

Referring to FIGS. 1 and 2, the display apparatus DD may include a non-light emitting region NPXA and light emitting regions PXA-R, PXA-G, and PXA-B. The light emitting regions PXA-R, PXA-G, and PXA-B may each be a region which emits light generated from the light emitting devices ED-1, ED-2, and ED-3, respectively. The light emitting regions PXA-R, PXA-G, and PXA-B may be spaced apart from each other in a plane.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In the specification, each of the light emitting regions PXA-R, PXA-G, and PXA-B may correspond to a pixel. The pixel defining film PDL may separate the light emitting devices ED-1, ED-2, and ED-3. The emission layers EML-R, EML-G and EML-B of the light emitting devices ED-1, ED-2, and ED-3 may be disposed in openings OH defined by the pixel defining film PDL and separated from each other.

The light emitting regions PXA-R, PXA-G, and PXA-B may be divided into groups according to the color of light generated from the light emitting devices ED-1, ED-2, and ED-3. In the display apparatus DD of an embodiment shown in FIGS. 1 and 2, three light emitting regions PXA-R, PXA-G, and PXA-B which emit red light, green light, and blue light, respectively are illustrated. For example, the display apparatus DD of an embodiment may include the red light emitting region PXA-R, the green light emitting region PXA-G, and the blue light emitting region PXA-B which are different.

In the display apparatus DD according to an embodiment, the light emitting devices ED-1, ED-2, and ED-3 may each emit light in different wavelength regions. For example, in an embodiment, the display apparatus DD may include the first light emitting device ED-1 that emits red light, the second light emitting device ED-2 that emits green light, and the third light emitting device ED-3 that emits blue light. For example, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments are not limited thereto, and the first to the third light emitting devices ED-1, ED-2, and ED-3 may emit light in the same wavelength range or at least one light emitting device may emit light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the red light emitting regions PXA-R, the green light emitting regions PXA-G, and the blue light emitting regions PXA-B may each be arranged along a second directional axis DR2. The red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but embodiments are not limited thereto, and the light emitting regions PXA-R, PXA-G, and PXA-B may have different areas from each other according to a wavelength range of the emitted light. For example, the areas of the light emitting regions PXA-R, PXA-G, and PXA-B may be areas in a plan view that are defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required in the display apparatus DD. For example, the arrangement form of the light emitting regions PXA-R, PXA-G, and PXA-B may be a PenTile® arrangement form or a diamond arrangement form.

The areas of the light emitting regions PXA-R, PXA-G, and PXA-B may be different from each other. For example, in an embodiment, the area of the green light emitting region PXA-G may be smaller than that of the blue light emitting region PXA-B, but embodiments are not limited thereto.

Hereinafter, FIGS. 3 to 6 are schematic cross-sectional views each illustrating light emitting devices according to embodiments. Each of the light emitting devices ED according to embodiments may include a first electrode EL1, a hole transport region HTR, an emission layer EML, an electron transport region ETR, and a second electrode EL2 that are sequentially stacked.

Figure 3:
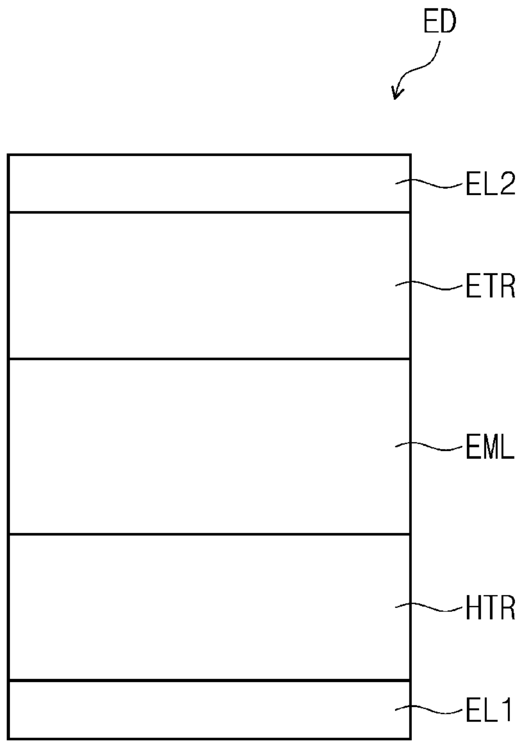
FIG. 3 is a schematic cross-sectional view illustrating a light emitting device to an embodiment.
Figure 4:
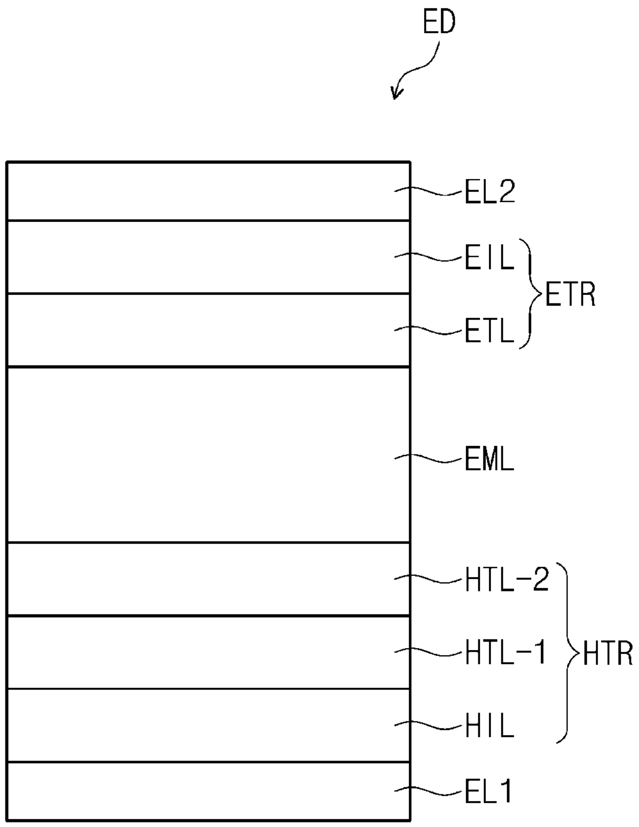
FIG. 4 is a schematic cross-sectional view illustrating a light emitting device to an embodiment.

In comparison to FIG. 3, FIG. 4 shows a schematic cross-sectional view of a light emitting device ED of an embodiment, in which the hole transport region HTR includes a hole injection layer HIL, a first hole transport layer HTL-1, and a second hole transport layer HTL-2, and the electron transport region ETR includes an electron injection layer EIL and an electron transport layer ETL. The electron blocking layer EBL (FIG. 5) may be disposed between the second hold transport layer HTL-2 and the emission layer EML.

Different from what is shown in FIG. 4, in another embodiment, any one of the first hole transport layer HTL-1 and the second hole transport layer HTL-2 may be omitted. The light emitting device ED of an embodiment may include three or more hole transport layers. In the specification, the description of the hole transport layer HTL may be equally applied to each of the first hole transport layer HTL-1 and the second hole transport layer HTL-2.

Figure 5:
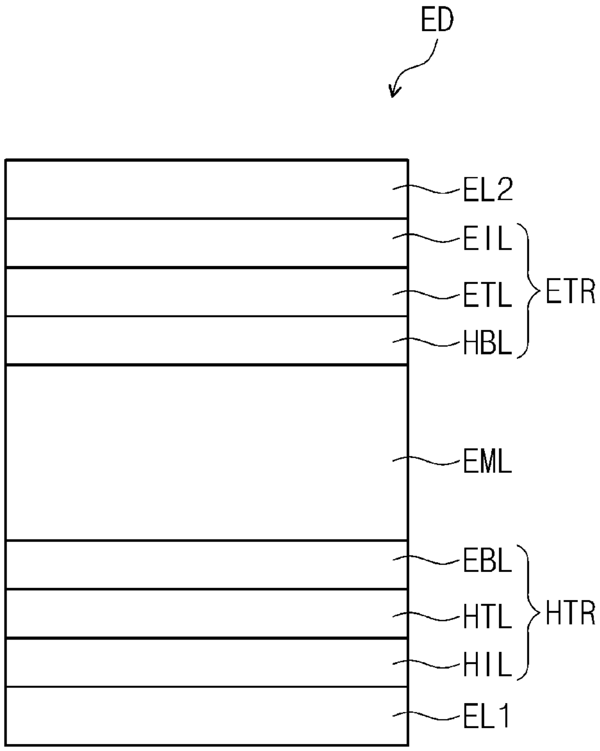
FIG. 5 is a schematic cross-sectional view illustrating a light emitting device to an embodiment.
Figure 6:
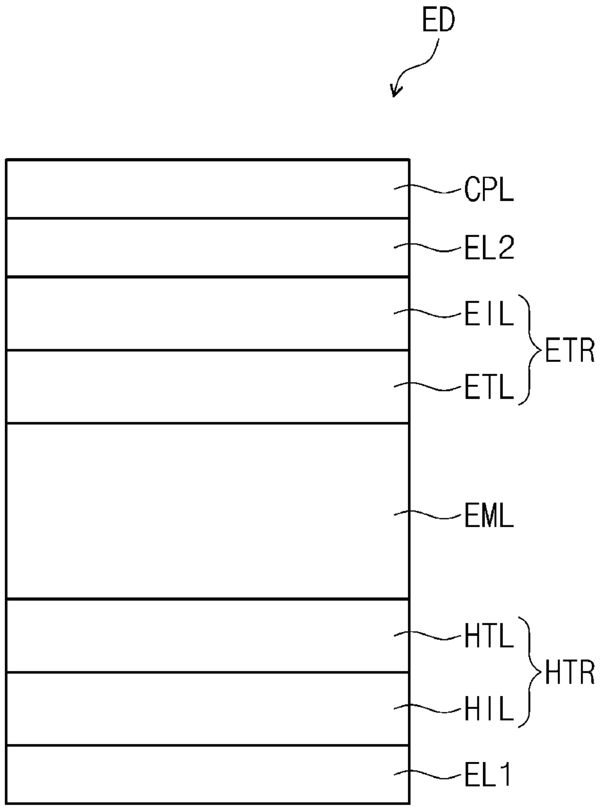
FIG. 6 is a schematic cross-sectional view illustrating a light emitting device to an embodiment.

In comparison to FIG. 3, FIG. 5 illustrates a schematic cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of a light emitting device ED of an embodiment including a capping layer CPL disposed on a second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments are not limited thereto. In another embodiment, the first electrode EL1 may include the above-described metal materials, combinations of at least two metal materials of the above-described metal materials, oxides of the above-described metal materials, or the like, but embodiments are not limited thereto. The first electrode EL1 may have a thickness in a range of about 700 Å to about 10,000 Å. For example, the first electrode EL1 may have a thickness in a range of about 1,000 Å to about 3,000 Å.

The hole transport region HTR is provided on the first electrode ELL The hole transport region HTR in the light emitting device ED of an embodiment may include an amine compound of an embodiment.

In the specification, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents described above may be substituted or unsubstituted. For example, a biphenyl group may be interpreted as an aryl group or a phenyl group substituted with a phenyl group.

In the specification, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may be monocyclic or polycyclic. The rings formed by being bonded to each other may be connected to another ring to form a spiro structure.

In the specification, the term "an adjacent group" may mean a substituent substituted at an atom which is directly connected to an atom substituted with a corresponding substituent, another substituent substituted at an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. For example, two methyl groups in 4,5-dimethylphenanthrene may be interpreted as "adjacent groups" to each other.

In the specification, examples of the halogen atom may include a fluorine atom, a chlorine atom, a bromine atom, and an iodine atom.

In the specification, the alkyl group may be a linear, branched, or cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto.

In the specification, a heteroaryl group may include at least one of B, O, N, P, Si, and S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidadole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

In the specification, a direct linkage herein may be a single bond.

In the specification,

“ 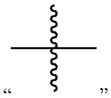 ”

and “——✱” each indicate a binding site to a neighboring atom.

The hole transport region HTR in the light emitting device ED of an embodiment may include an amine compound represented by Formula 1 below:

[Formula 1]

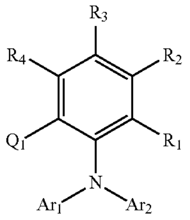

In Formula 1, $Q_1$ may be a substituted or unsubstituted heteroaryl group having 2 to 30 ring-forming carbon atoms. $Q_1$ may be a heteroaryl group containing at least one of N, O, S, and Si as a heteroatom. In an embodiment, $Q_1$ may be a substituted or unsubstituted dibenzofuran group, a substituted or unsubstituted dibenzothiophene group, a substituted or unsubstituted carbazole group, a substituted or unsubstituted dibenzosilole group, a substituted or unsubstituted dibenzothiophene sulfone group, a substituted or unsubstituted pyridine group, a substituted or unsubstituted pyrimidine group, or a substituted or unsubstituted triazine group.

In an embodiment, $Q_1$ may be represented by any one among Q-1 to Q-8 below:

Q-1

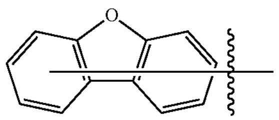

Q-2

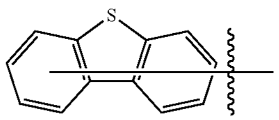

Q-3

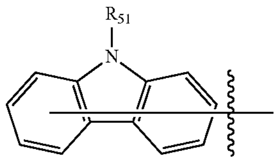

Q-4

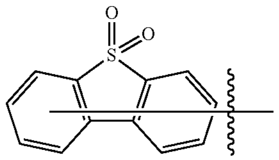

-continued

Q-5

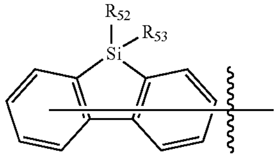

Q-6

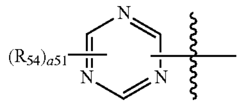

Q-7

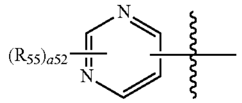

Q-8

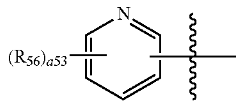

In Q-6, a51 may be an integer from 0 to 2. When a51 is 2, multiple $R_{54}$(s) may be the same as or different from each other. In Q-7, a52 may be an integer from 0 to 3. When a52 is an integer of 2 or more, multiple $R_{55}$(s) may all be the same, or at least one may be different from the others. In Q-8, a53 may be an integer from 0 to 4. When a53 is an integer of 2 or more, multiple $R_{56}$(s) may all be the same or at least one may be different from the others.

In Q-3 and Q-5 to Q-8, $R_{51}$ to $R_{56}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, in Q-3, $R_{51}$ may be a substituted or unsubstituted phenyl group. In Q-5, $R_{52}$ and $R_{53}$ may each independently be a methyl group or a substituted or unsubstituted phenyl group. In Q-5, $R_{52}$ and $R_{53}$ may be the same as each other. In Q-6, multiple $R_{54}$ (s) may be the same and may each be unsubstituted phenyl groups. In Q-7, $R_{55}$ may be a hydrogen atom or an unsubstituted phenyl group. In Q-8, $R_{56}$ may be a hydrogen atom or an unsubstituted phenyl group. In Q-1 to Q-8,

indicates a binding site to a neighboring atom.

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms.

In an embodiment, $Ar_1$ and $Ar_2$ may each independently be represented by any one among A-1 to A-3 below:

A-1

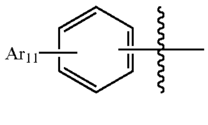

-continued

A-2

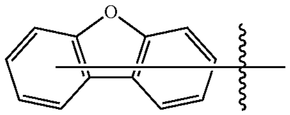

A-3

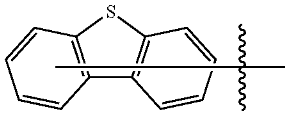

In A-1 to A-3,

indicates a binding site to a neighboring atom. In A-1, $Ar_{11}$ may be a hydrogen atom, a methyl group, a substituted or unsubstituted aryl group having 6 to 30 ring-forming carbon atoms. For example, $Ar_{11}$ may be a substituted or unsubstituted phenyl group, a substituted or unsubstituted naphthyl group, or an unsubstituted phenanthryl group. At least one of $Ar_1$ and $Ar_2$ may be represented by A-1. In an embodiment, $Ar_1$ and $Ar_2$ may be the same as each other. For example, $Ar_1$ and $Ar_2$ may each be represented by A-1. In another embodiment, $Ar_1$ and $Ar_2$ may be different from each other. For example, $Ar_1$ may be represented by A-1, and $Ar_2$ may be represented by A-2 or A-3.

In Formula 1, one pair selected from among $R_1$ and $R_2$, $R_2$ and $R_3$, and $R_3$ and $R_4$ may be bonded to each other to form a ring represented by Formula 2 below, and the remainder of $R_1$, $R_2$, $R_3$, and $R_4$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms:

[Formula 2]

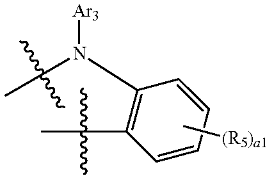

In Formula 2, $Ar_3$ may be a substituted or unsubstituted aryl group of 6 to 30 ring-forming carbon atoms, or a substituted or unsubstituted heteroaryl group of 2 to 30 ring-forming carbon atoms. In an embodiment, $Ar_3$ may be a substituted or unsubstituted phenyl group, an unsubstituted naphthyl group, an unsubstituted phenanthryl group, an unsubstituted triphenyl group, an unsubstituted naphthobenzofuran group, or an unsubstituted benzonaphthothiophene group.

In Formula 2, a1 may be an integer from 0 to 4. When a1 is an integer of 2 or more, multiple $R_5$(s) may be the same as each other or at least one may be different from the others.

In Formula 2, $R_5$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

Any one pair of $R_1$ and $R_2$, $R_2$ and $R_3$, or $R_3$ and $R_4$ may be bonded to form Formula 2. $R_1$ and $R_2$ may be bonded to form Formula 2, and N in Formula 2 may be bonded to $R_1$ or $R_2$. $R_2$ and $R_3$ may be bonded to form Formula 2, and N in Formula 2 may be bonded to $R_2$ or $R_3$. $R_3$ and $R_4$ may be bonded to form Formula 2, and N in Formula 2 may be bonded to $R_3$ or $R_4$.

In an embodiment, Formula 1 may be represented by any one among Formula 1-1 to Formula 1-6 below. Formula 1-1 represents the case where $R_2$ and $R_3$ are bonded to form Formula 2, and N in Formula 2 is bonded to $R_2$. Formula 1-2 represents the case where $R_1$ and $R_2$ are bonded to form Formula 2, and N in Formula 2 is bonded to $R_1$. Formula 1-3 represents the case where $R_1$ and $R_2$ are bonded to form Formula 2, and N in Formula 2 is bonded to $R_2$. Formula 1-4 represents the case where $R_2$ and $R_3$ are bonded to form Formula 2, and N in Formula 2 is bonded to $R_3$. Formula 1-5 represents the case where $R_3$ and $R_4$ are bonded to form Formula 2, and N in Formula 2 is bonded to $R_3$. Formula 1-6 represents the case where $R_3$ and $R_4$ are bonded to form Formula 2, and N in Formula 2 is bonded to $R_4$.

[Formula 1-1]

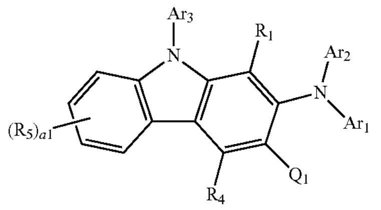

[Formula 1-2]

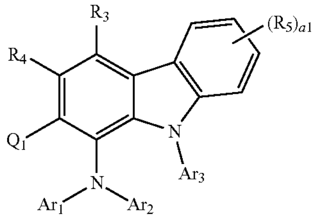

[Formula 1-3]

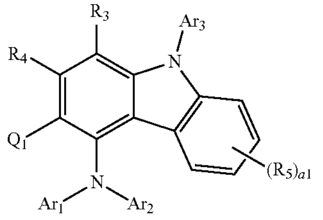

[Formula 1-4]

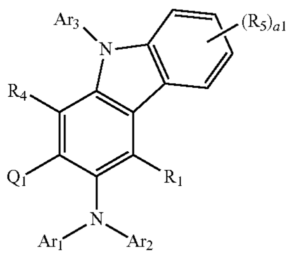

-continued

[Formula 1-5]

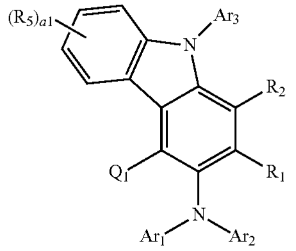

[Formula 1-6]

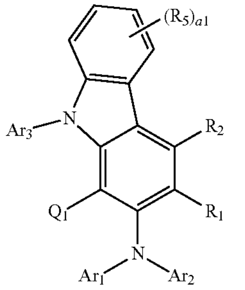

In Formula 1-1 to Formula 1-6, $Q_1$, $Ar_1$ to $Ar_3$, a1, $R_1$ to $R_5$ may be the same as defined in connection with Formula 1. In an embodiment, in Formula 1-2 to Formula 1-6, $Q_1$ may be a substituted or unsubstituted dibenzofuran group, or a substituted or unsubstituted dibenzothiophene group. For example, in Formula 1-2 to Formula 1-6, $Ar_1$ and $Ar_2$ may be unsubstituted biphenyl groups, and $Ar_3$ may be an unsubstituted phenyl group.

In an embodiment, Formula 1 may be represented by Formula 3 below. Formula 3 represents the case where $Q_1$ is an unsubstituted dibenzofuran group, $Ar_1$ and $Ar_2$ are substituted or unsubstituted biphenyl groups, and $Ar_3$ is a substituted or unsubstituted phenyl group.

[Formula 3]

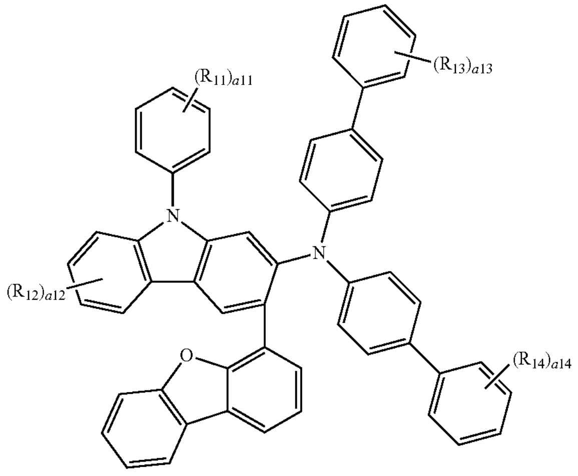

In Formula 3, a11, a13, and a14 may each independently be an integer from 0 to 5. In Formula 3, a12 may be an integer from 0 to 4. At least one of $R_{11}$ to $R_{14}$ may be a deuterium atom, and the remainder of $R_{11}$ to $R_{14}$ may be hydrogen atoms. In an embodiment, at least one of a11 to a14 may not be 0.

For example, a11 may be 5, a12 to a14 may be 0, and multiple $R_{11}$(s) may be deuterium atoms. For example, a12 may be 5, a11, a13 and a14 may be 0, and multiple $R_{12}$(s) may be deuterium atoms. For example, a13 and a14 may be 5, all and a12 may be 0, and multiple $R_{13}$(s) and multiple $R_{14}$(s) may be deuterium atoms.

The amine compound represented by Formula 1 of an embodiment may be represented by any one among the compounds of Compound Group 1 below. The hole transport region HTR of the light emitting device ED of an embodiment may include at least one among the amine compounds disclosed in Compound Group 1 below:

[Compound Group 1]

1

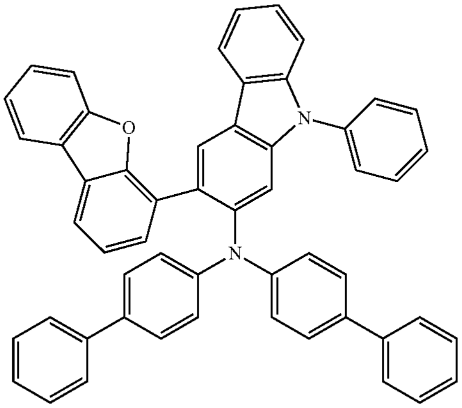

2

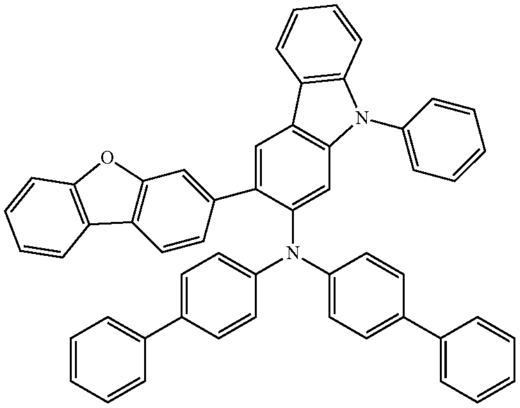

3

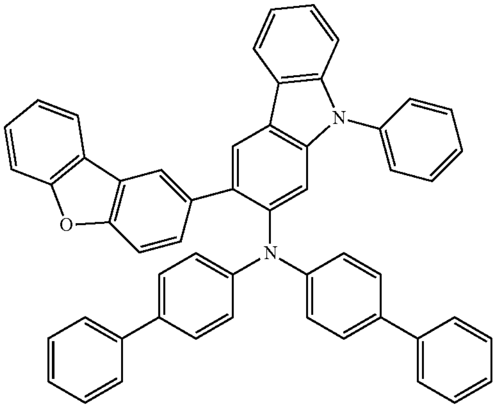

-continued

4

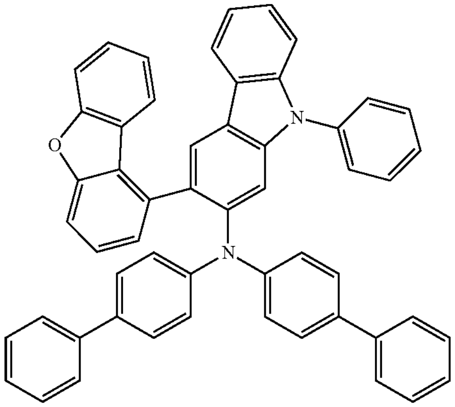

5

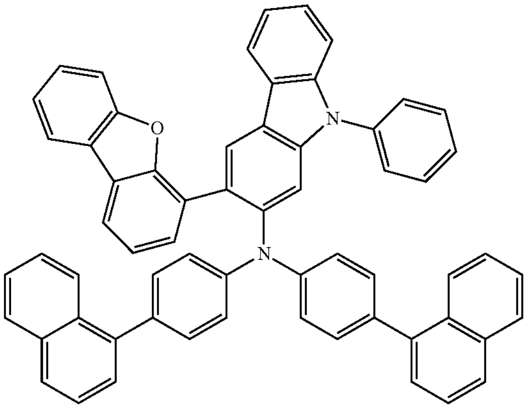

6

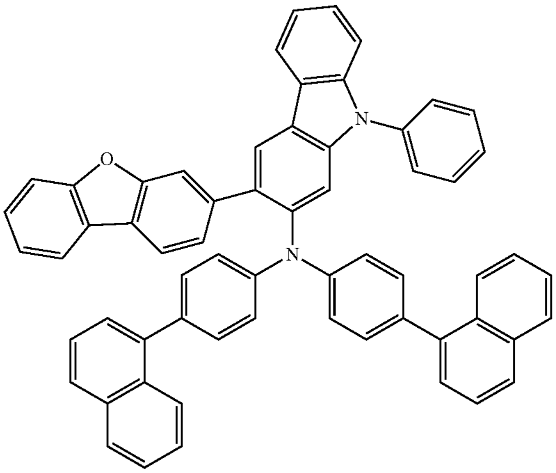

-continued
7
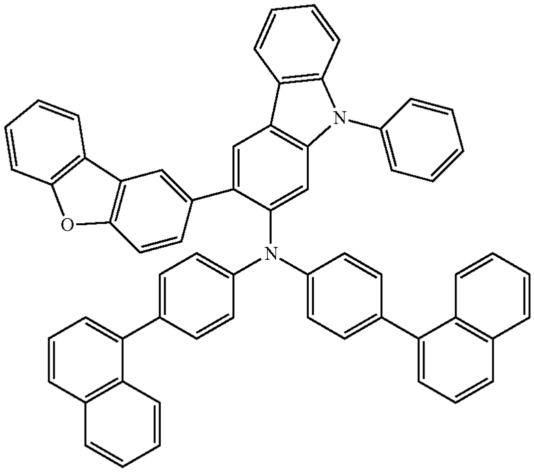
8
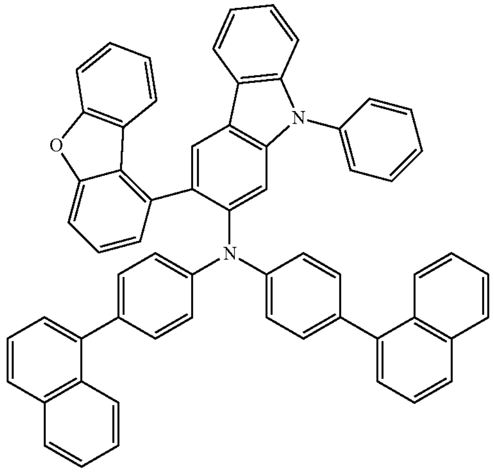
9
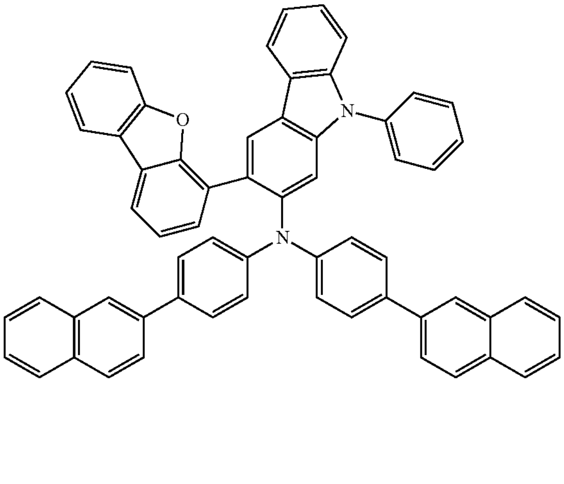
-continued
10
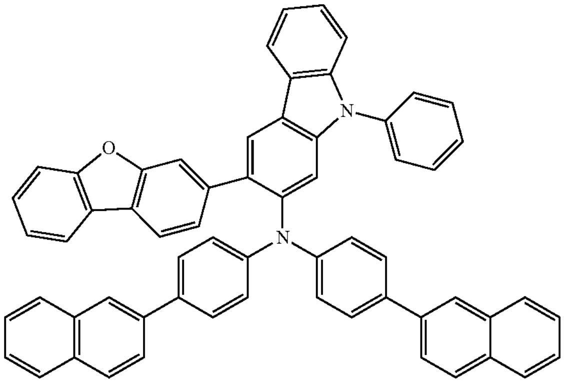
11
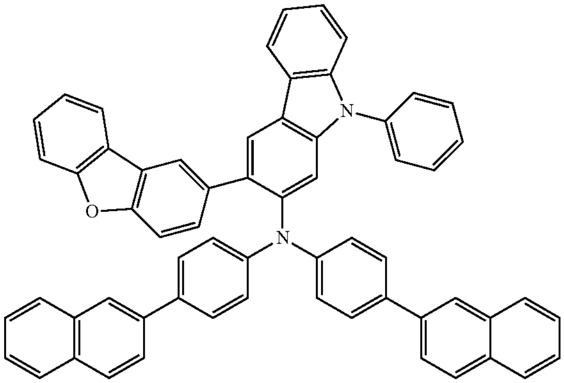
12
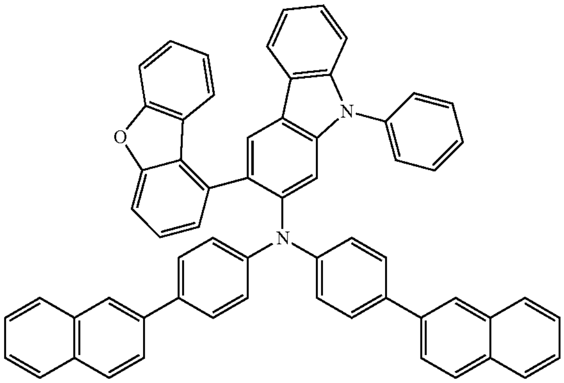
13
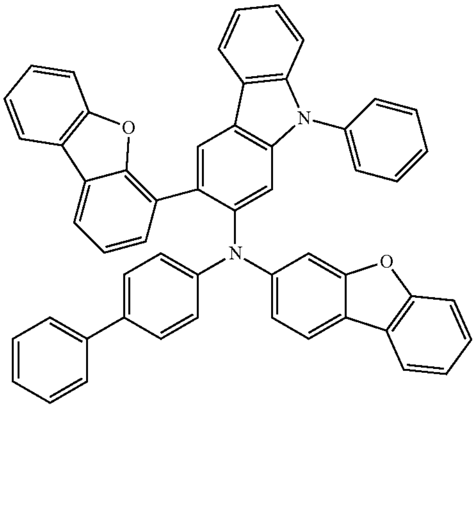

-continued
14
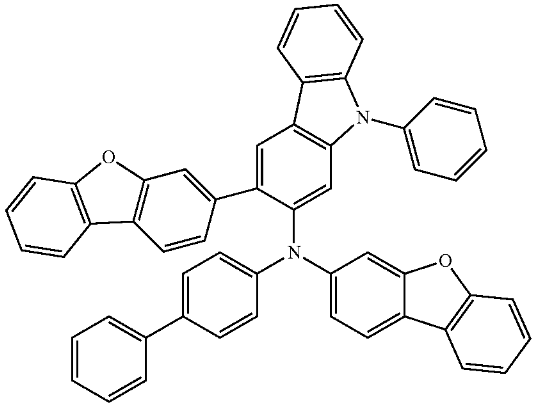
15
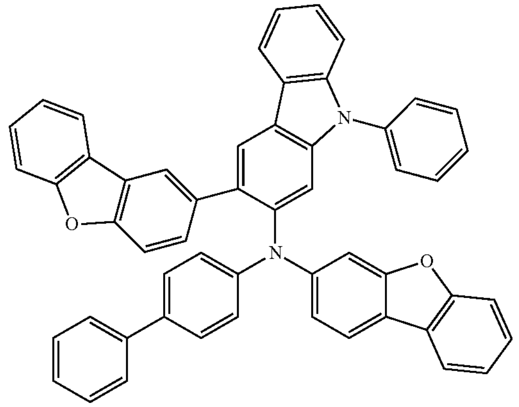
16
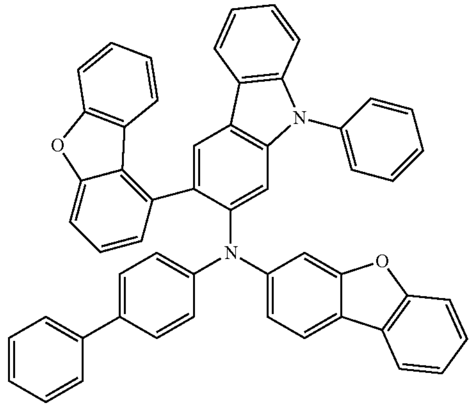
17
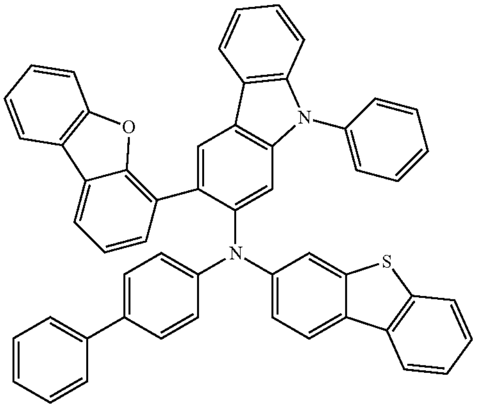
-continued
18
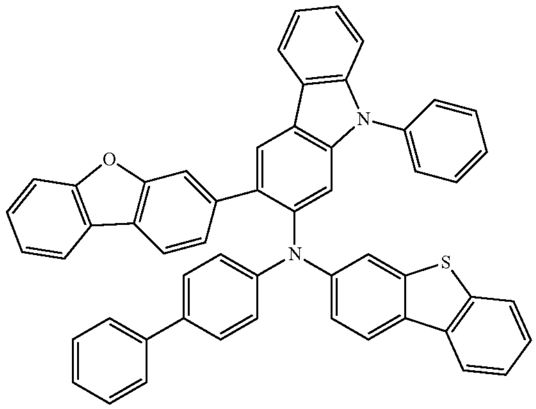
19
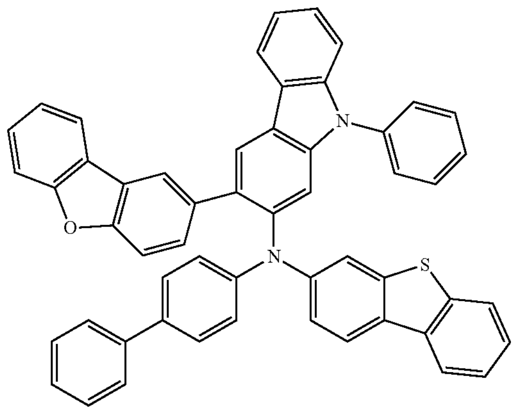
20
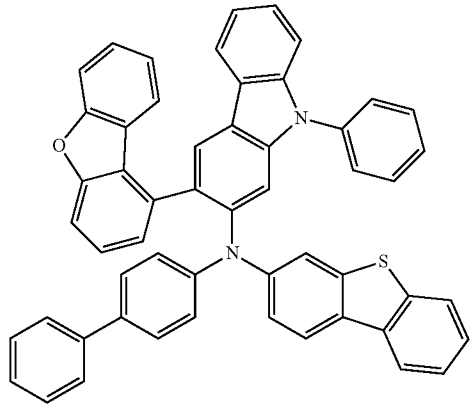

-continued
21
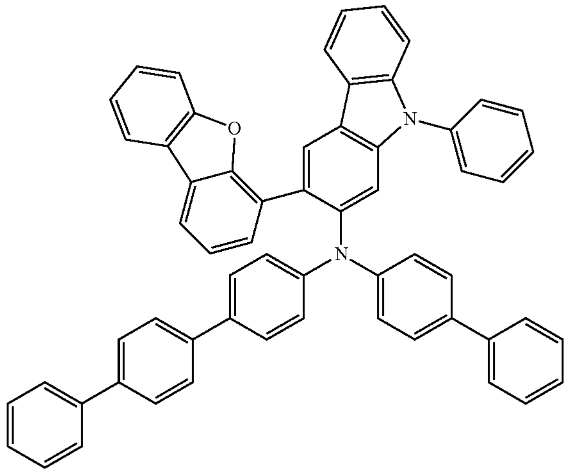
22
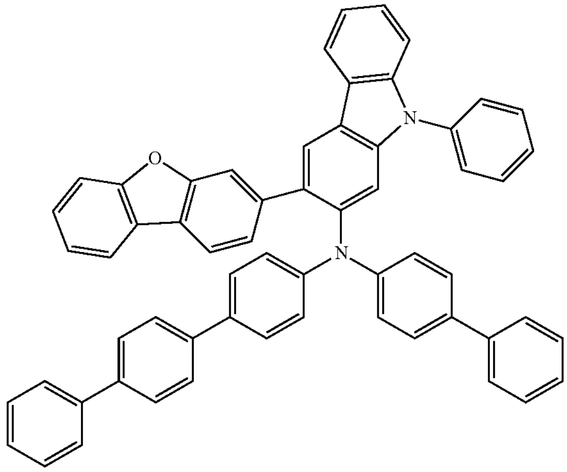
23
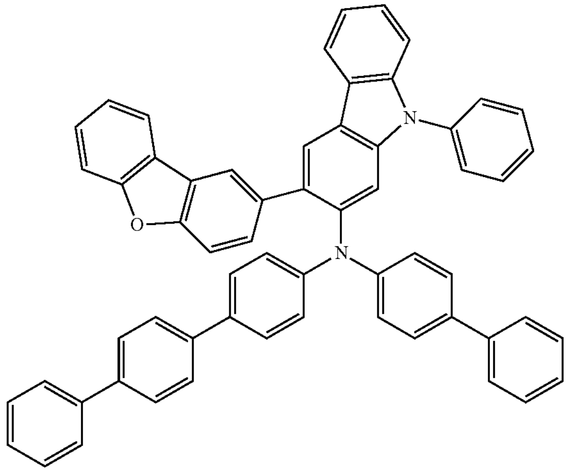
-continued
24
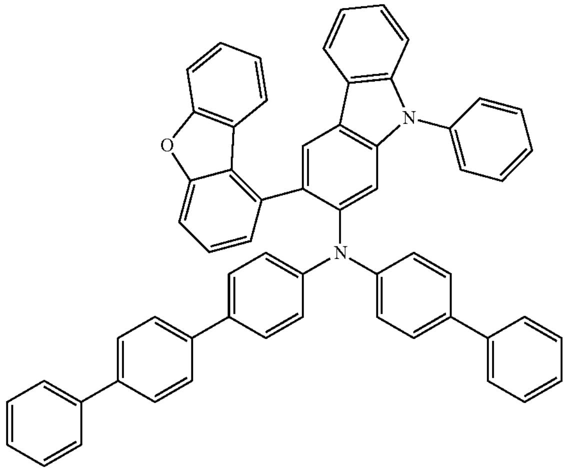
25
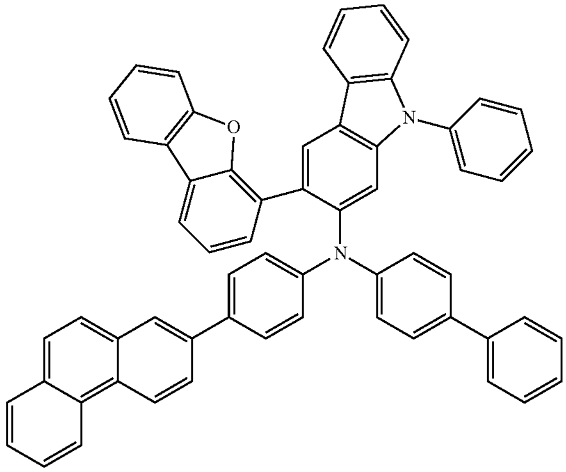
26
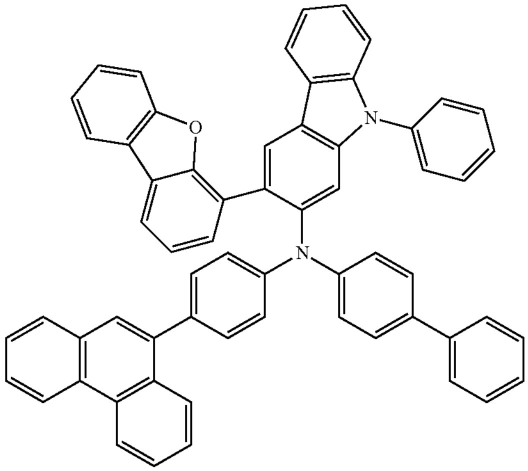

-continued
27
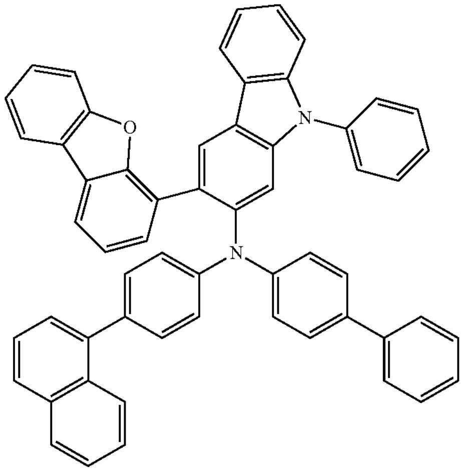
28
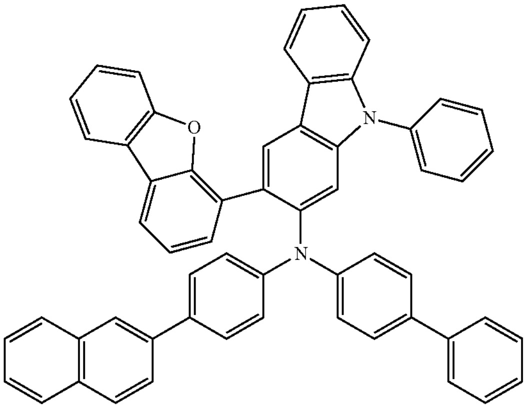
29
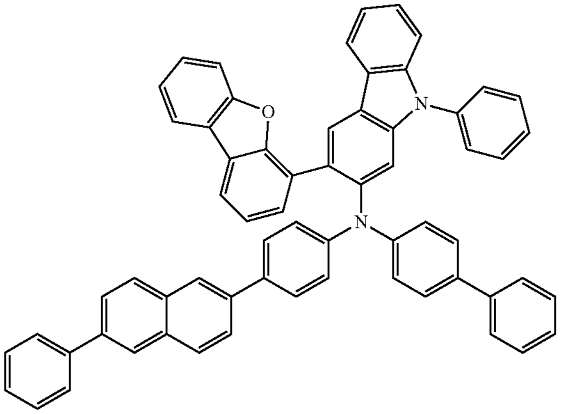
-continued
30
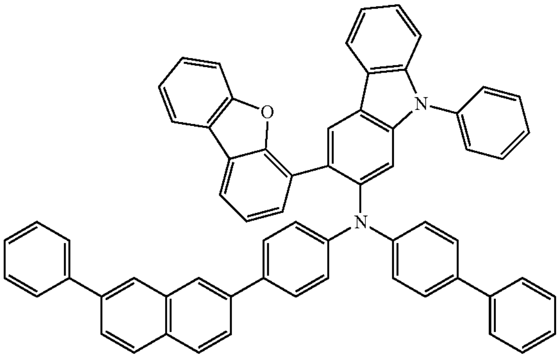
31
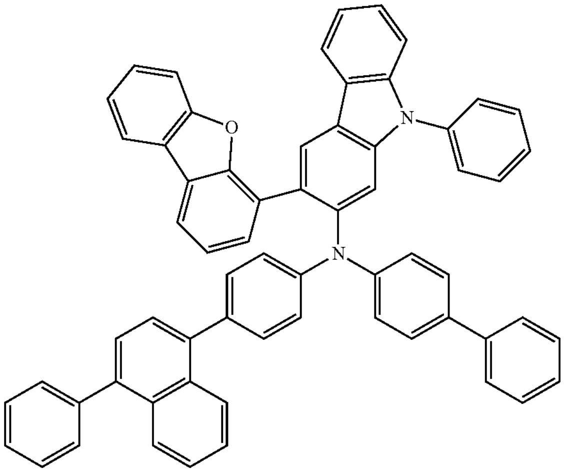
32
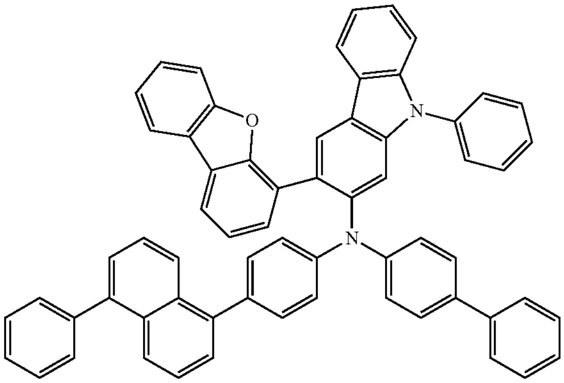

-continued
33
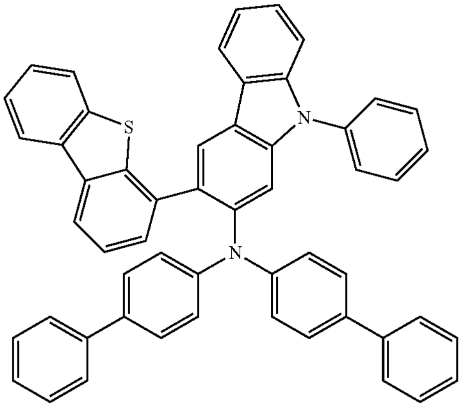
34
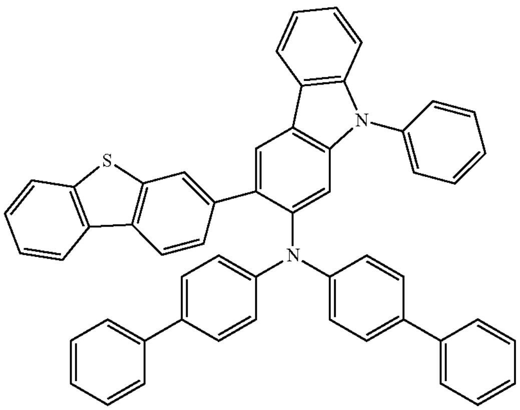
35
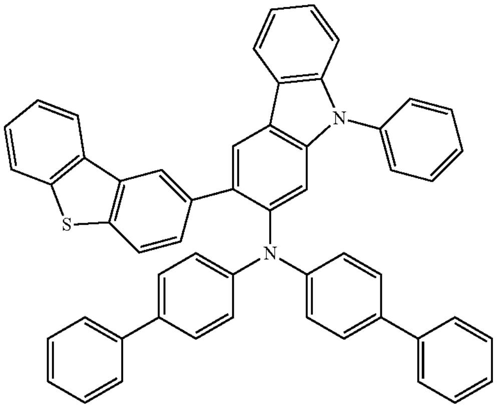
-continued
36
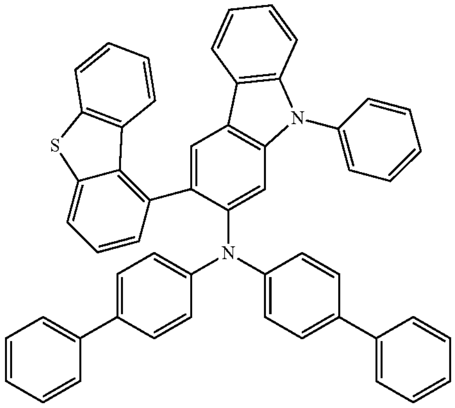
37
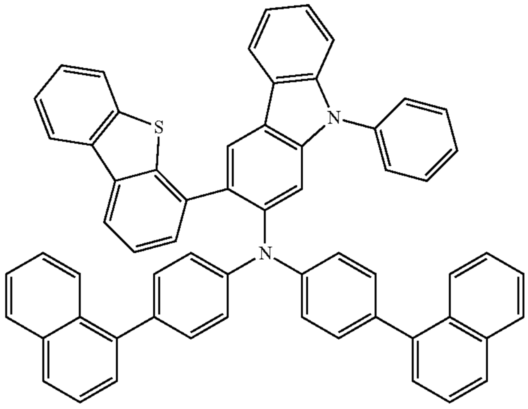
38
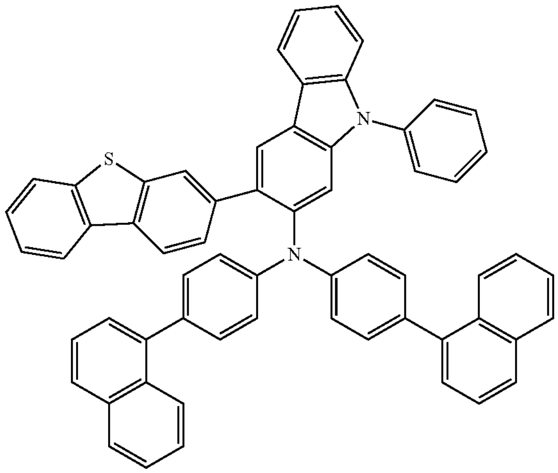

-continued
39
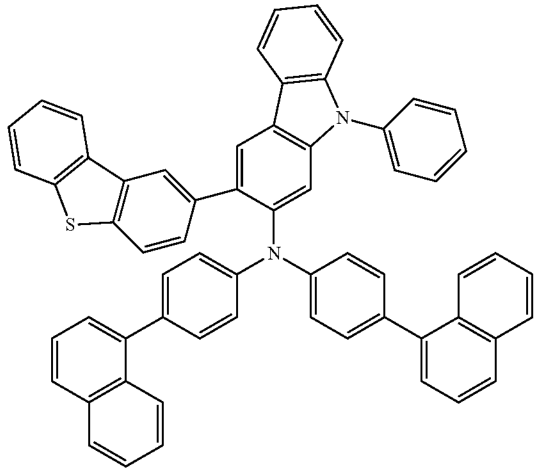
40
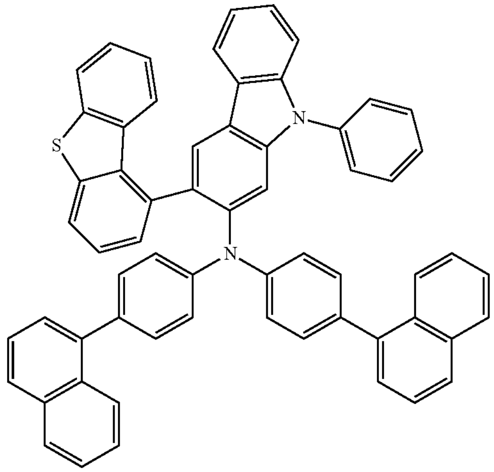
41
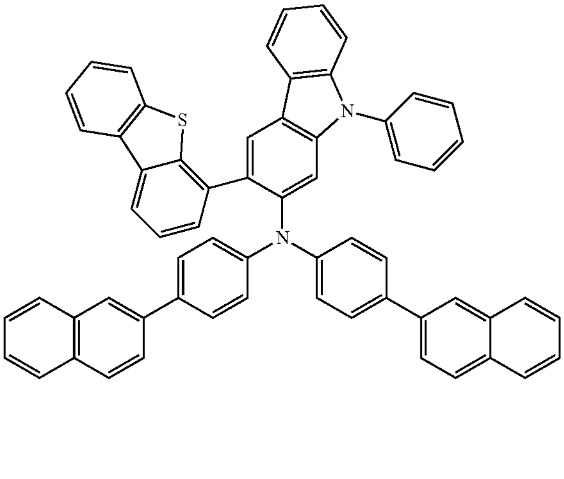
-continued
42
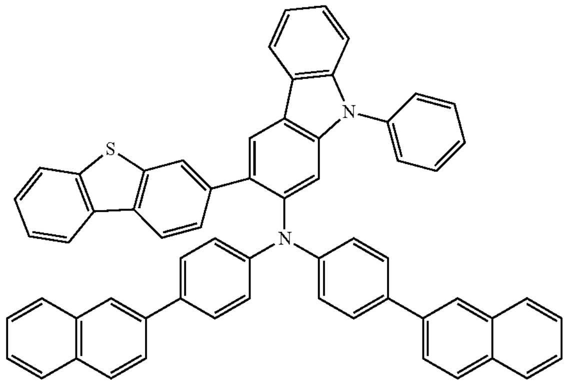
43
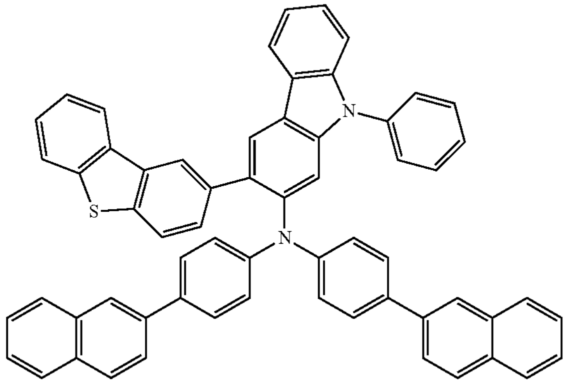
44
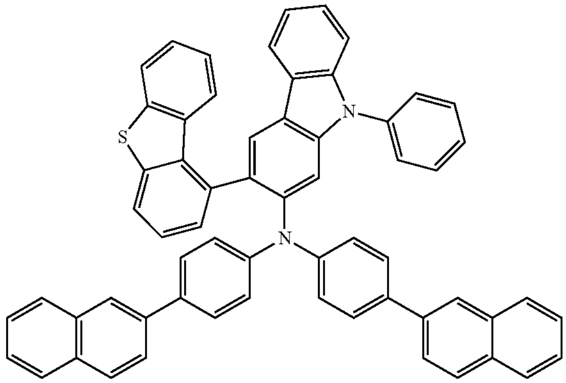
45
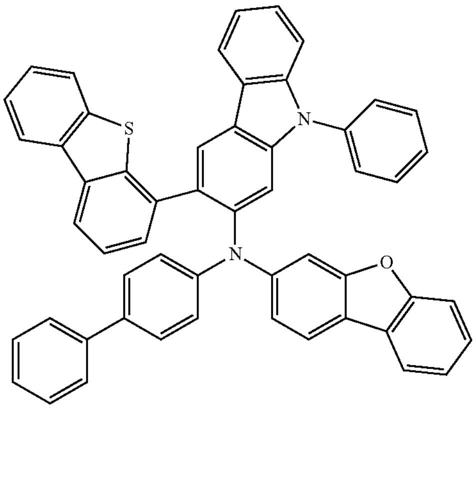

-continued
46
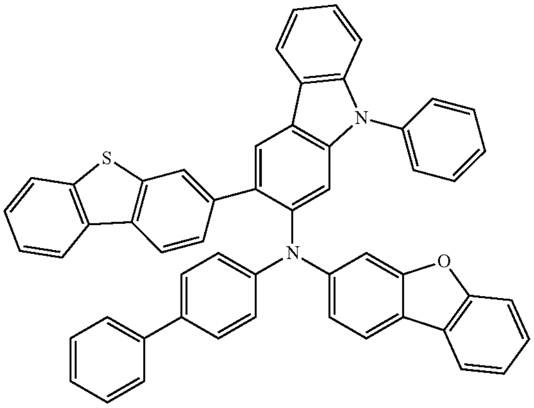
47
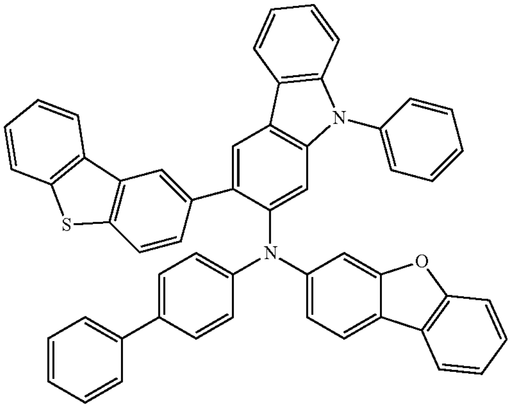
48
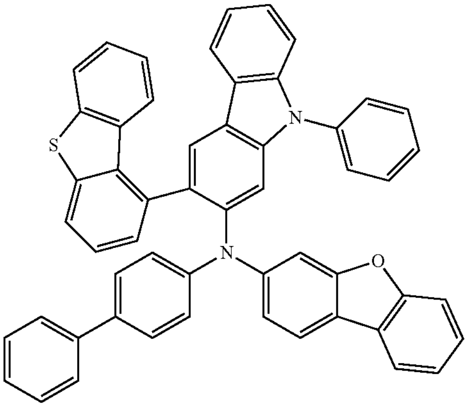
-continued
49
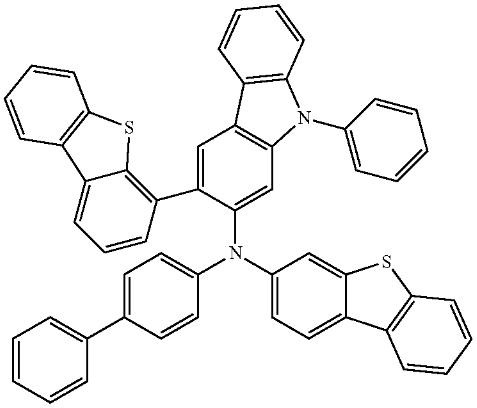
50
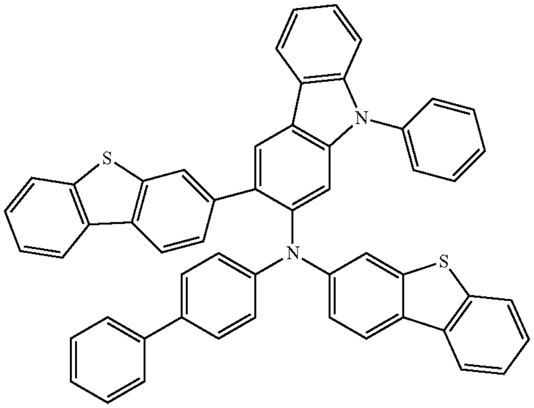
51
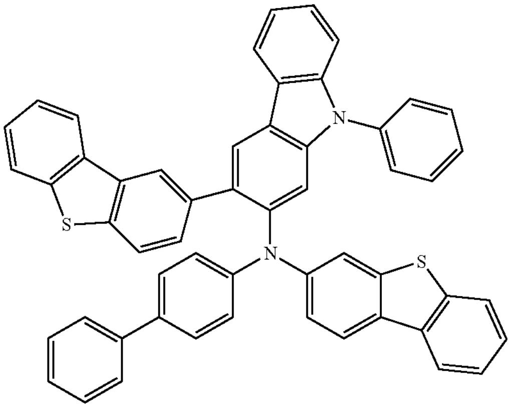

-continued
52
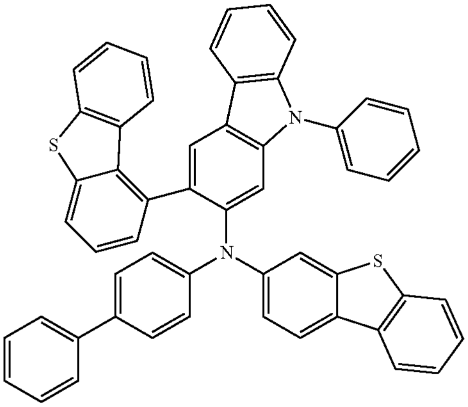
53
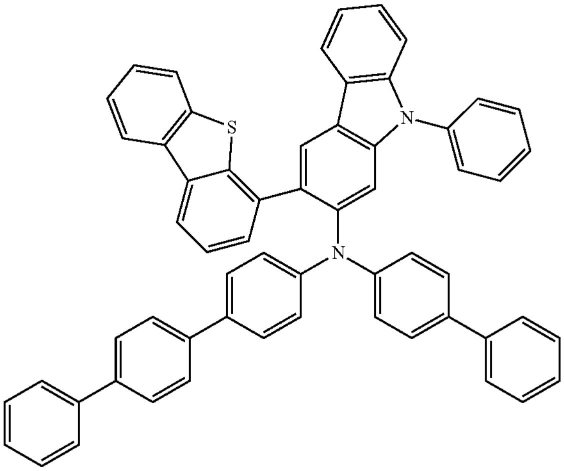
54
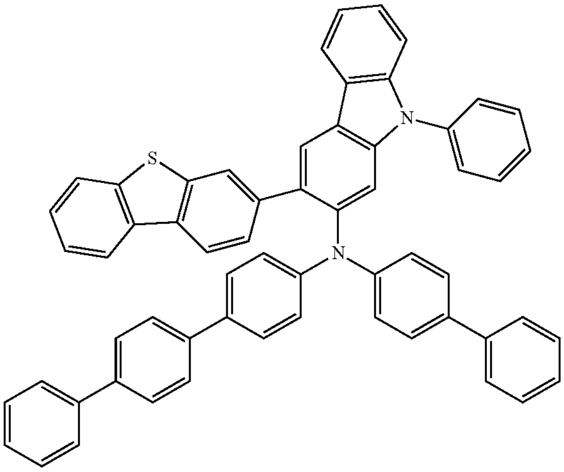
-continued
55
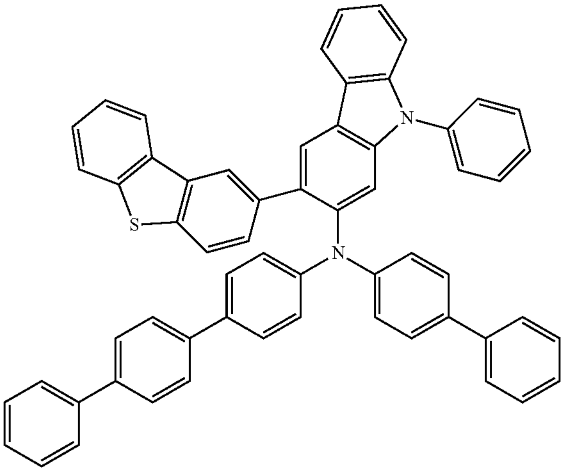
56
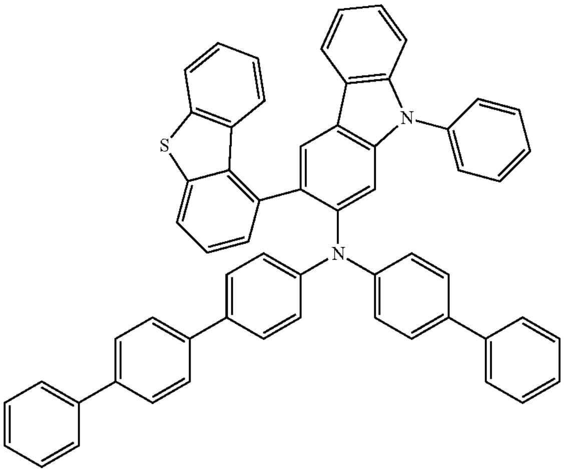
57
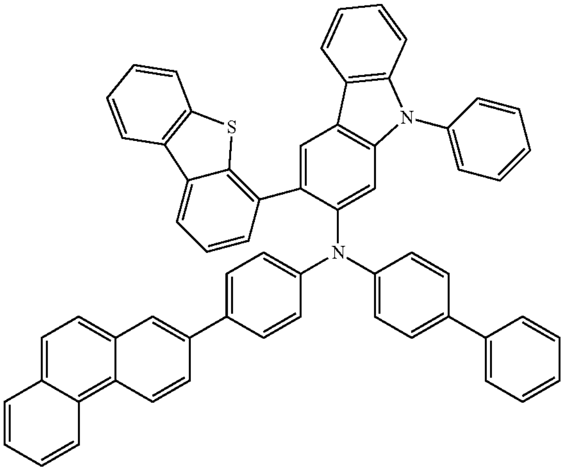

-continued
58
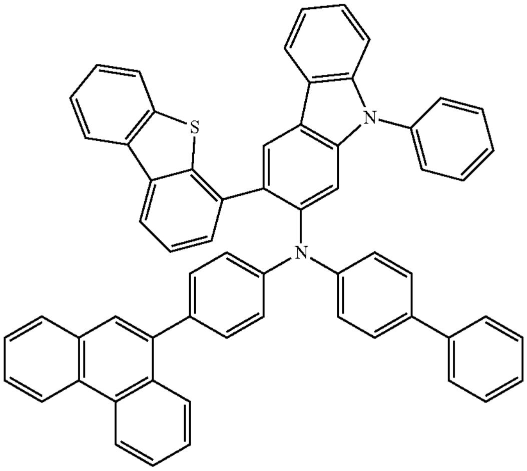
59
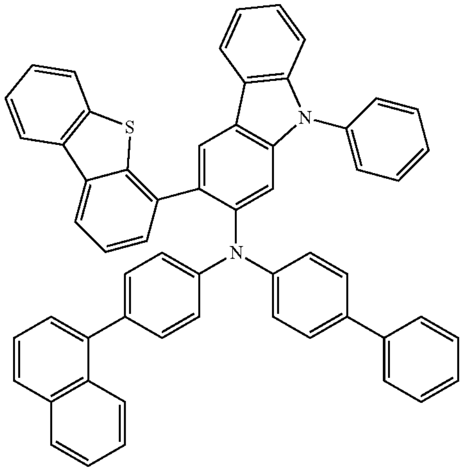
60
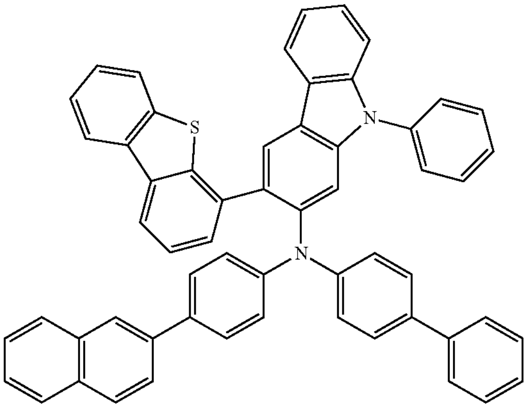
-continued
61
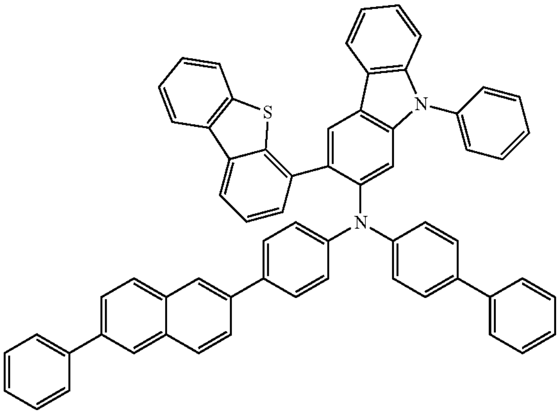
62
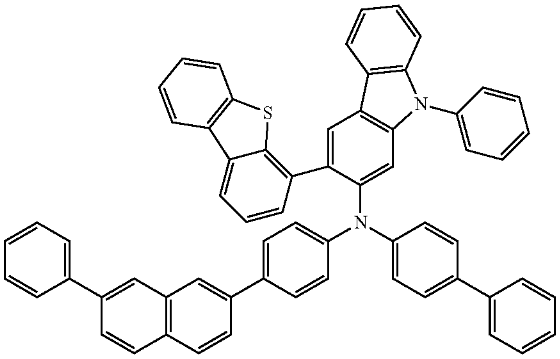
63
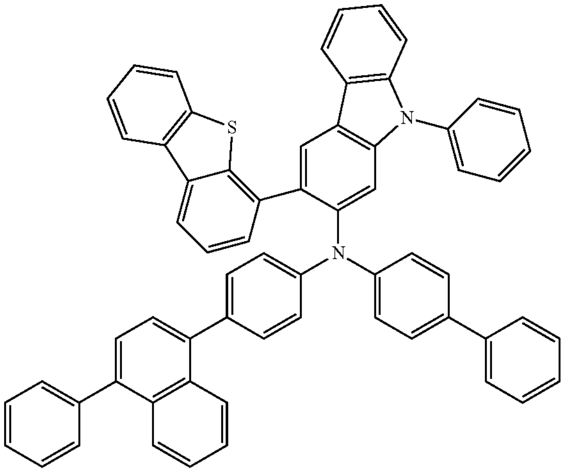

64
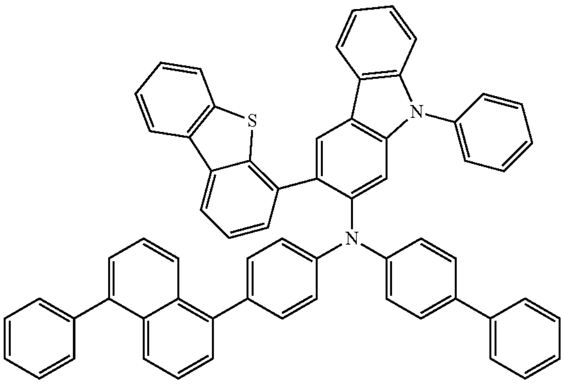
65
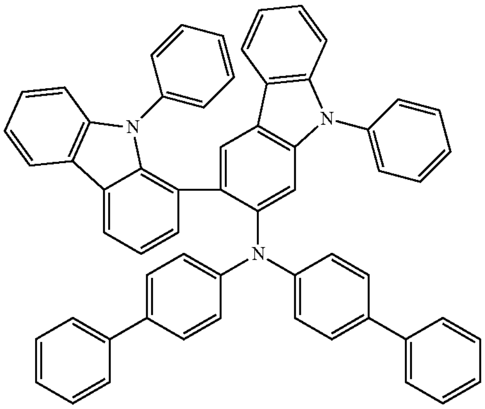
66
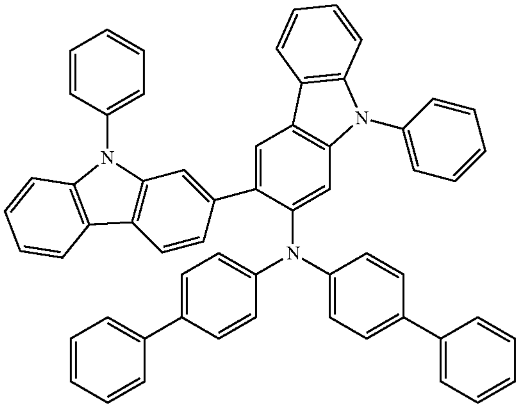
67
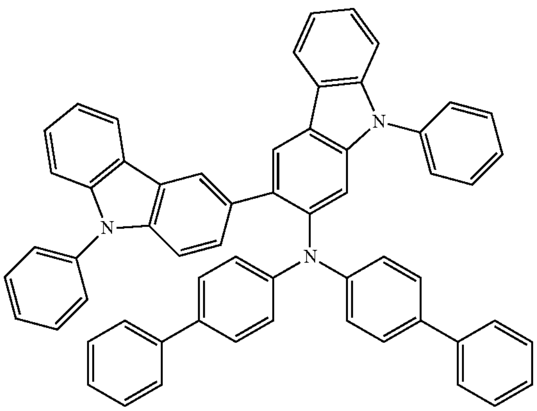
68
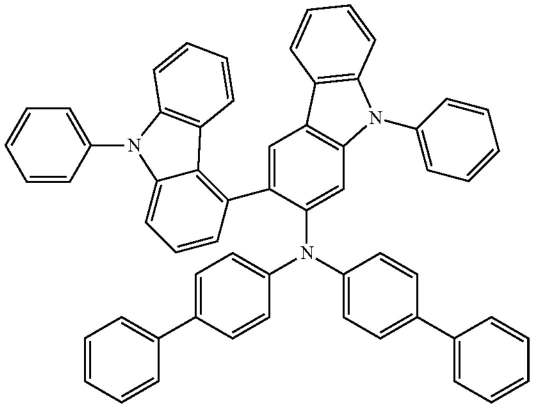
69
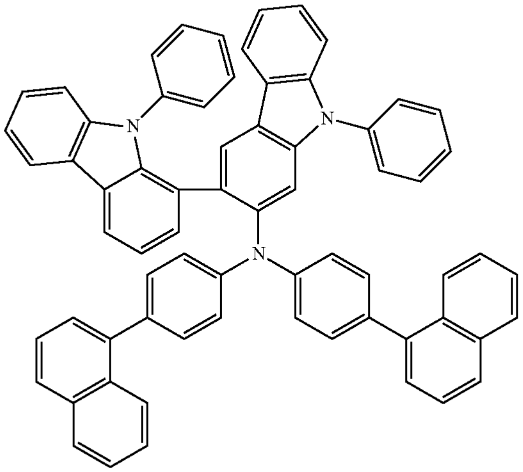
70
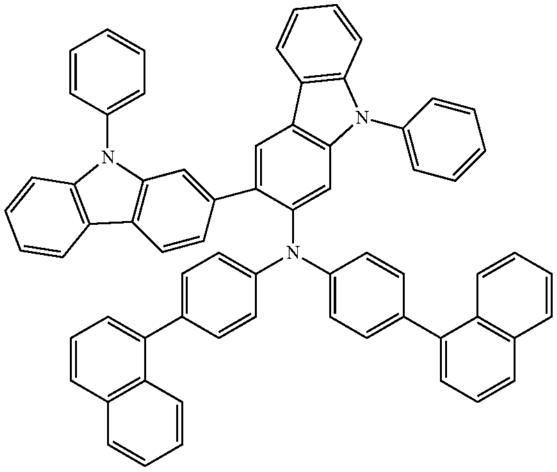

-continued
71
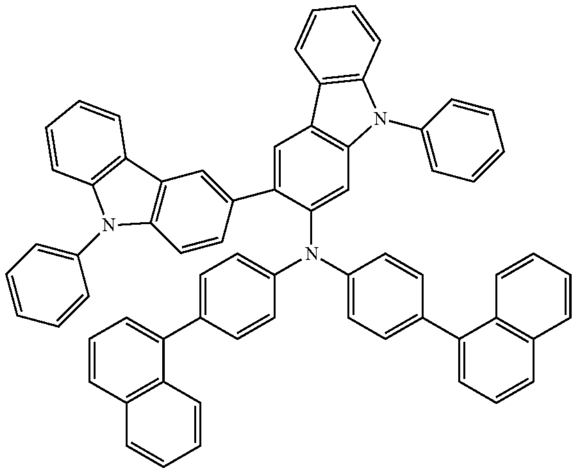
72
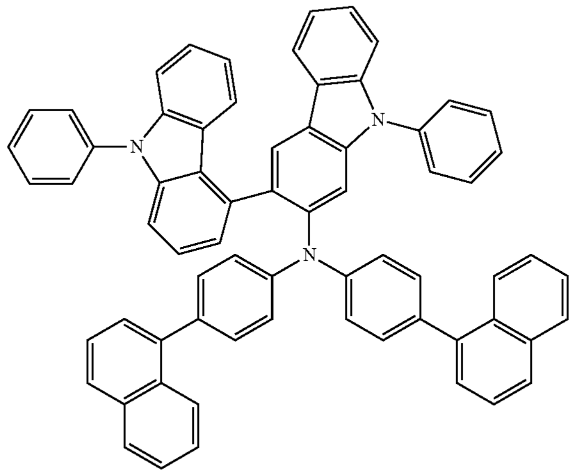
73
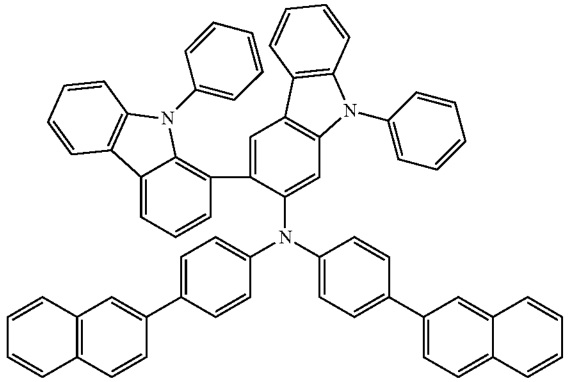
-continued
74
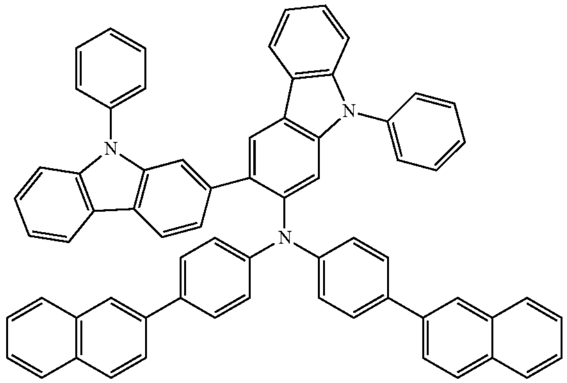
75
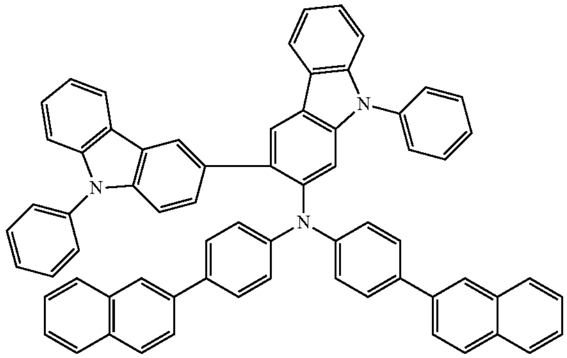
76
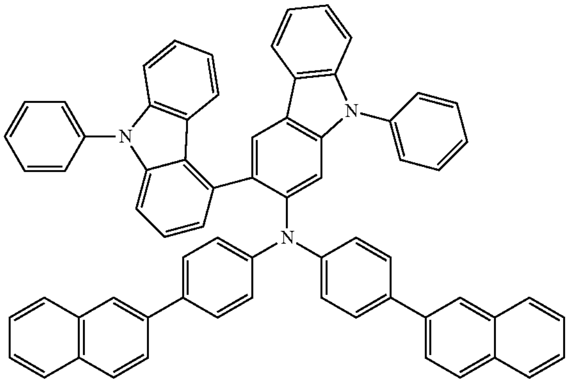
77
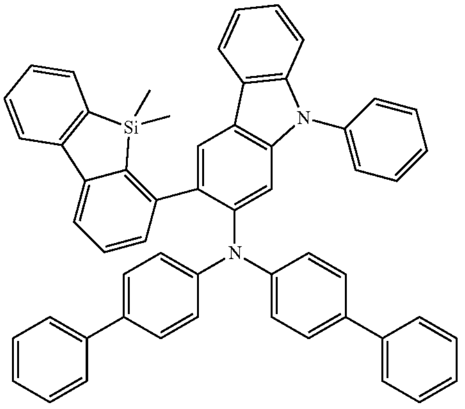

-continued
78
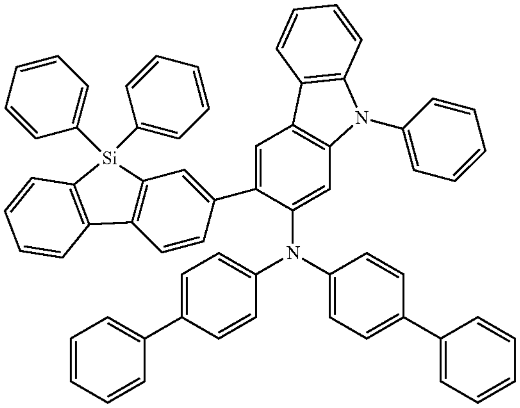
79
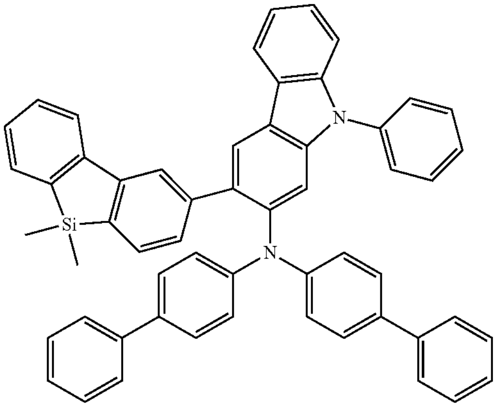
80
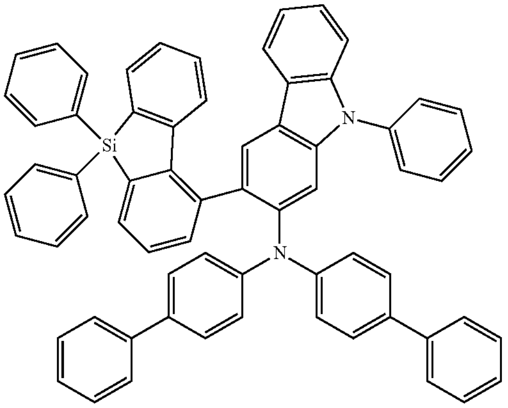
-continued
81
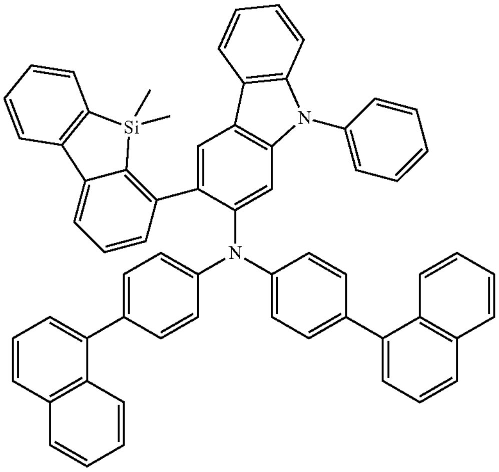
82
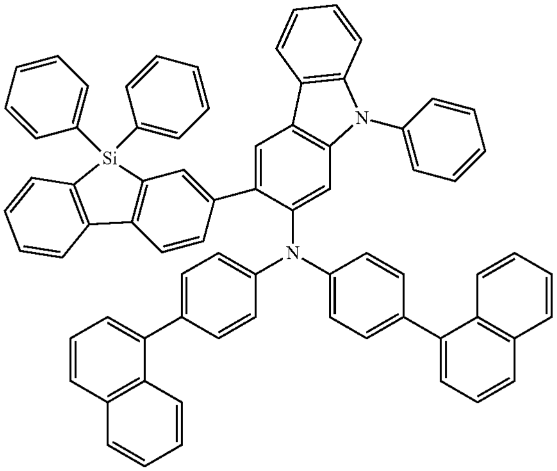
83
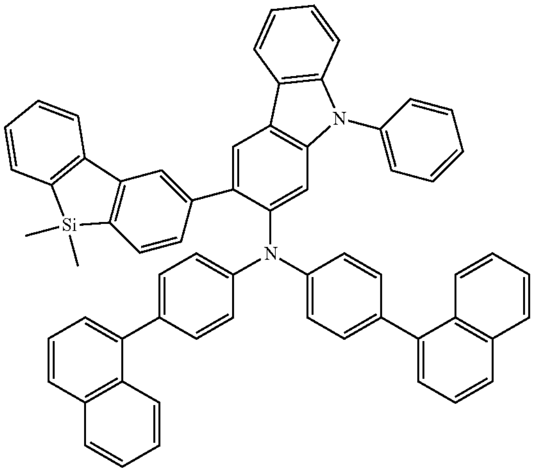

-continued
84
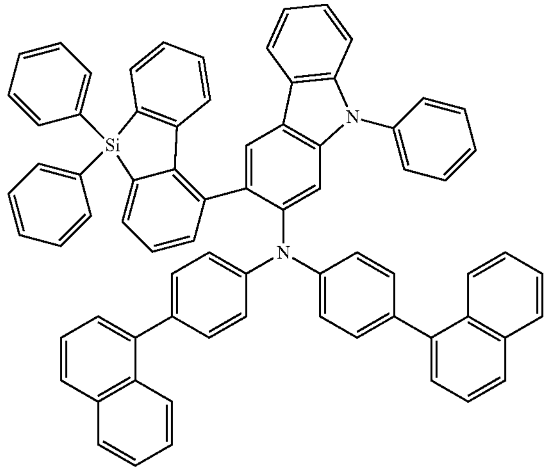
85
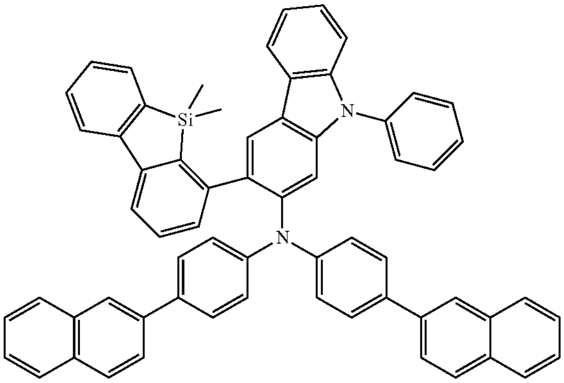
86
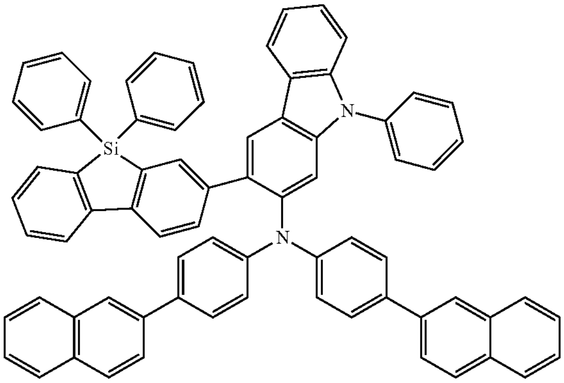
-continued
87
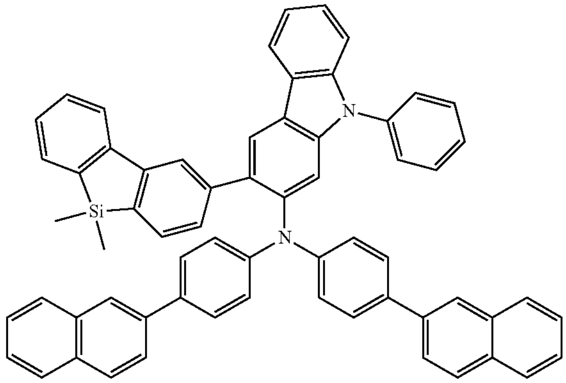
88
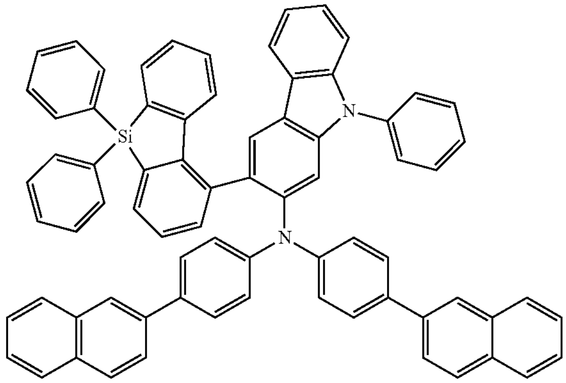
89
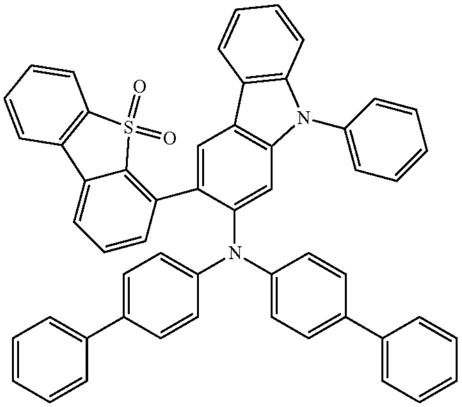
90
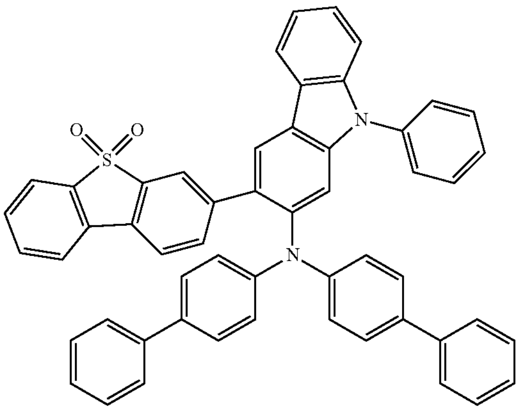

-continued
91
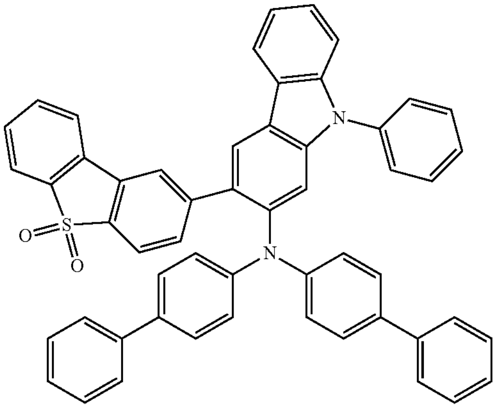
92
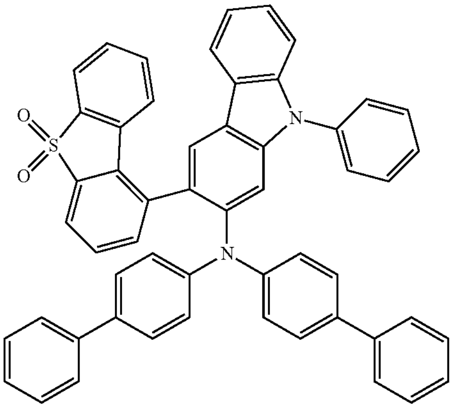
93
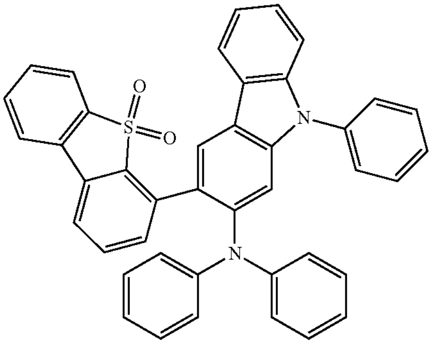
94
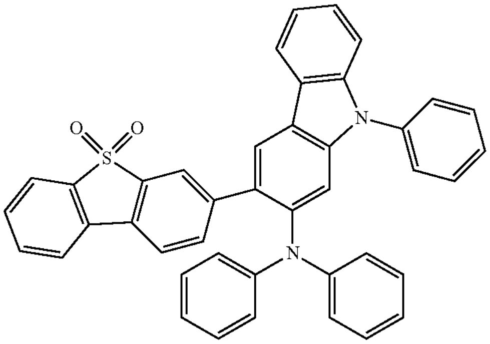
-continued
95
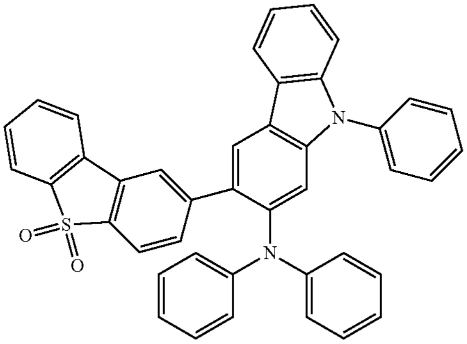
96
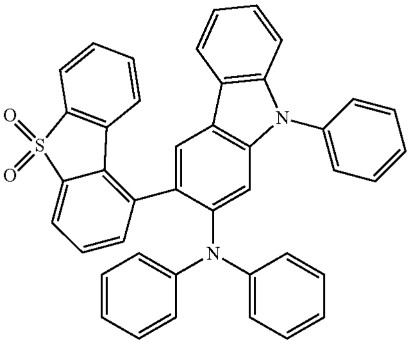
97
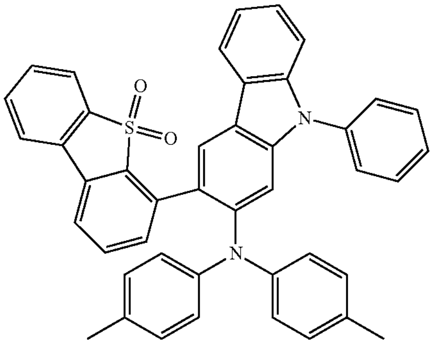
98
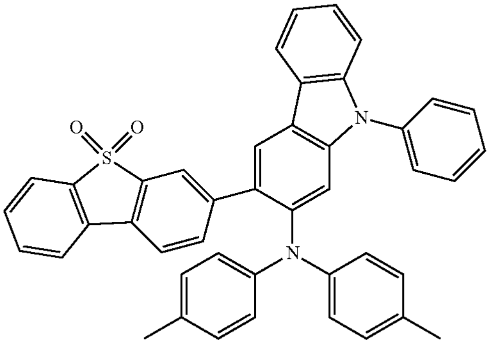

99
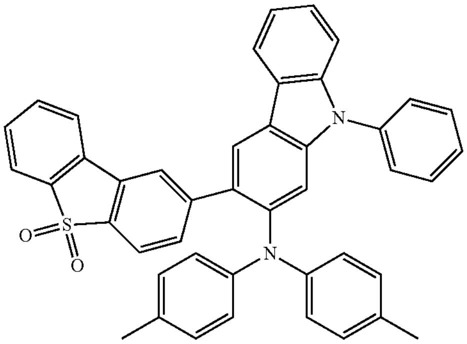
100
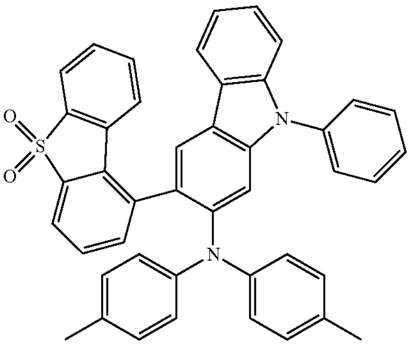
101
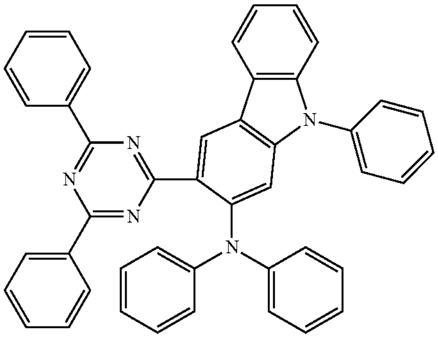
102
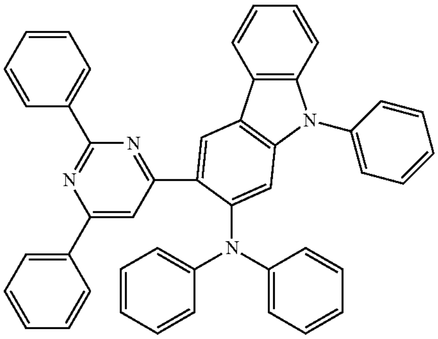
103
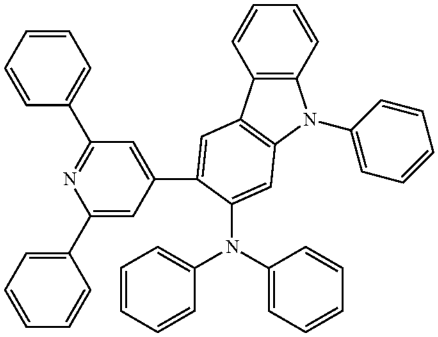
104
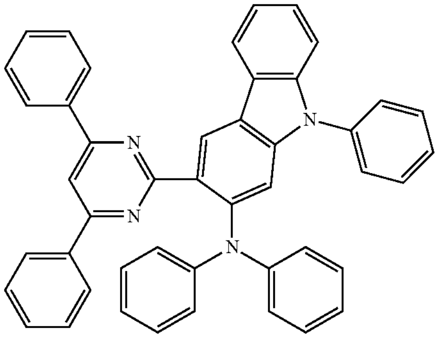
105
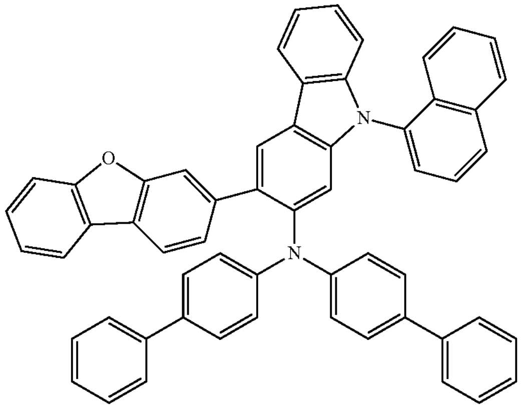
106
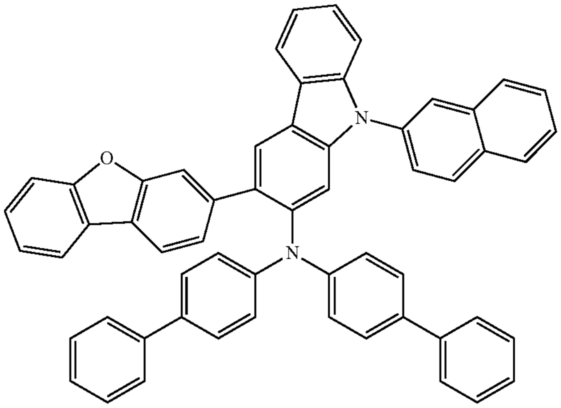

107
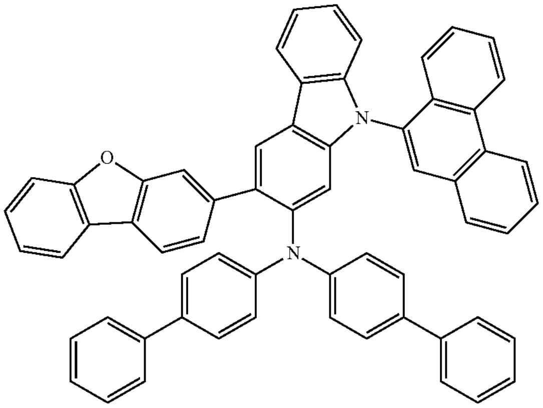
108
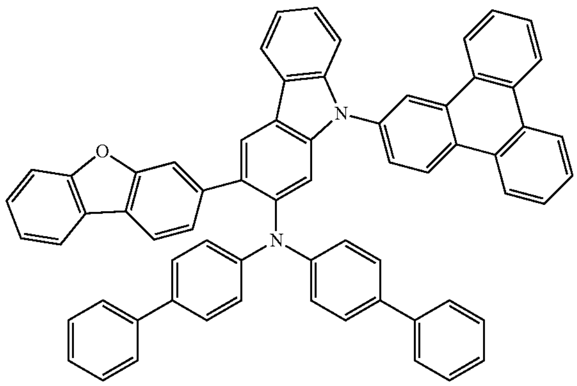
109
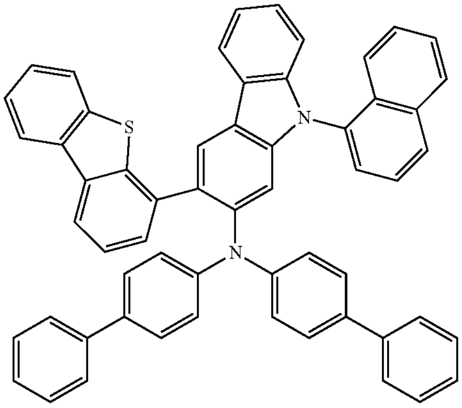
110
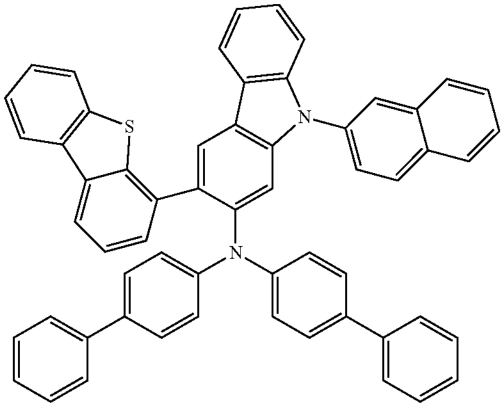
111
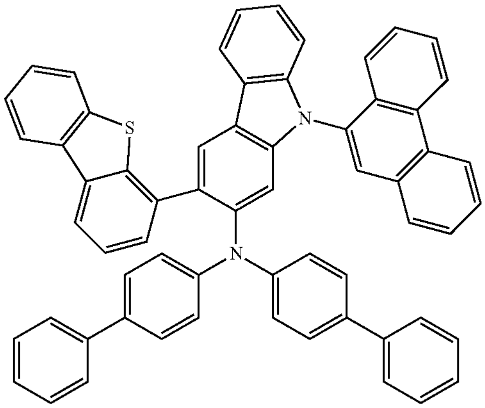
112
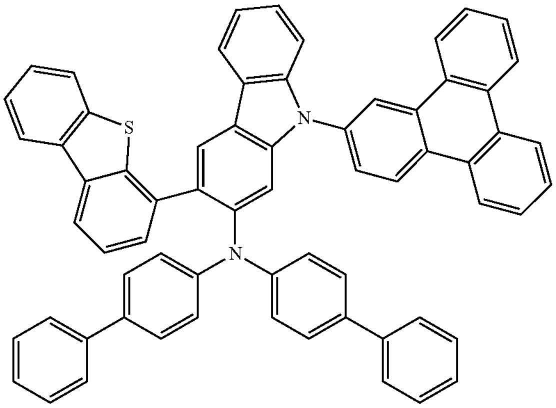

-continued
113
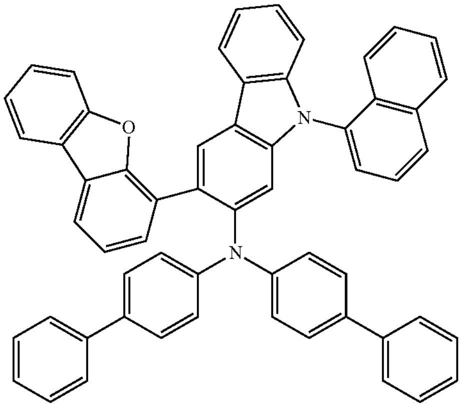
114
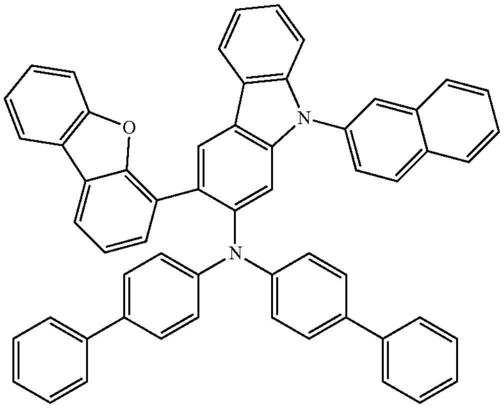
115
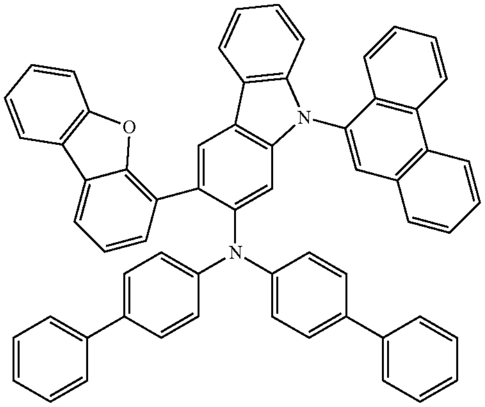
-continued
116
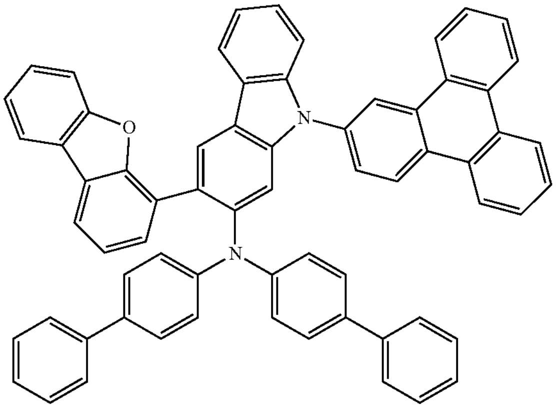
117
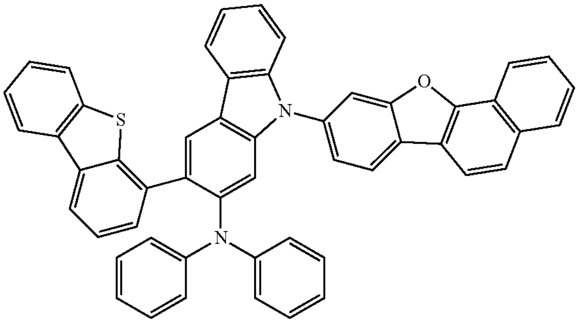
118
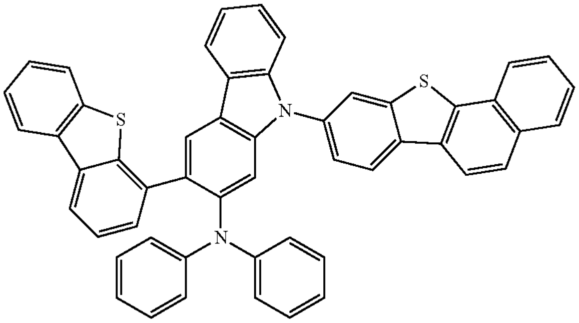
119
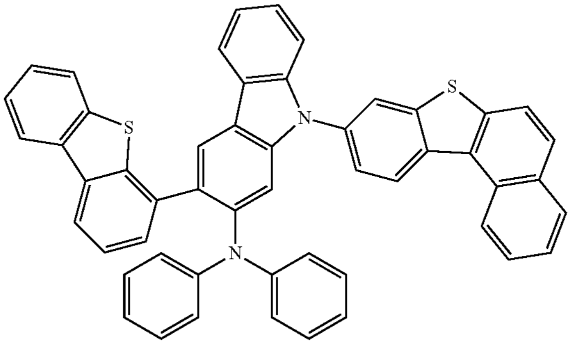

-continued
120
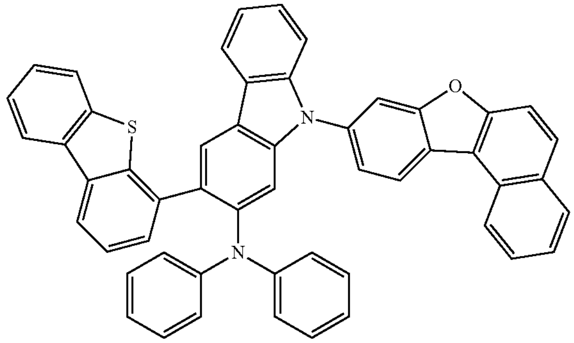
121
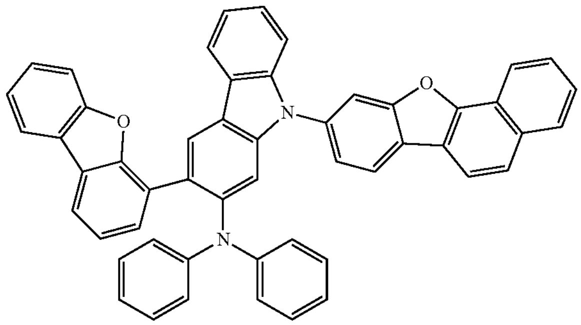
122
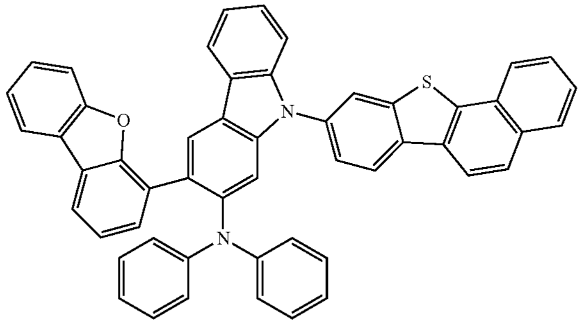
123
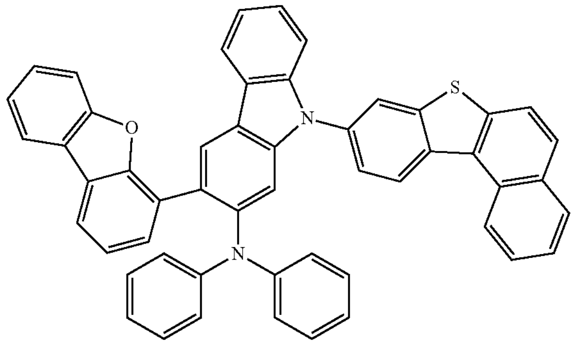
-continued
124
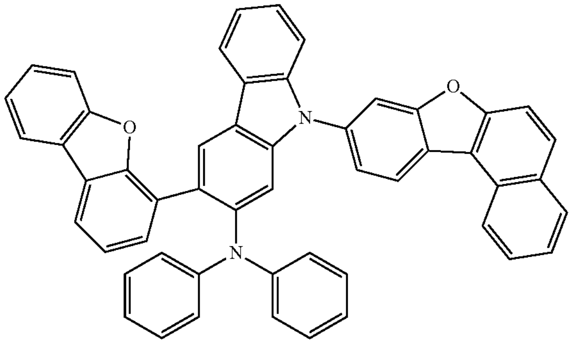
125
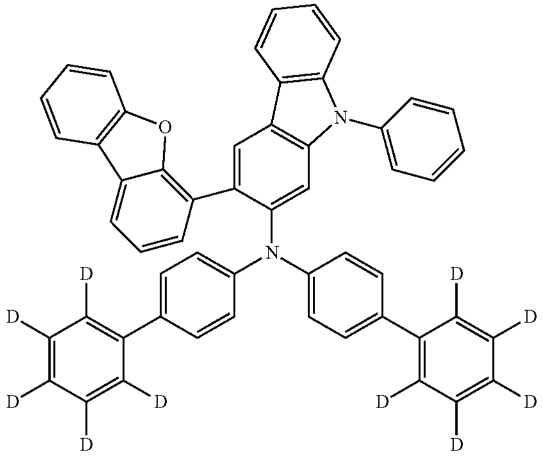
126
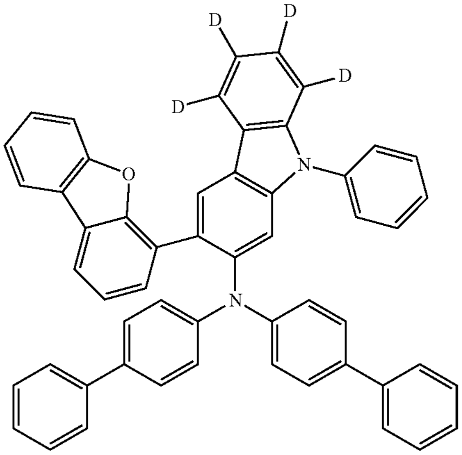

-continued
127
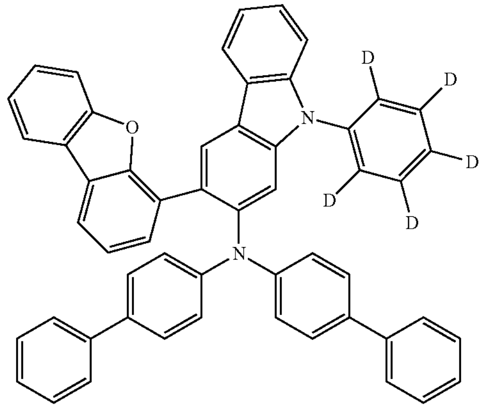
128
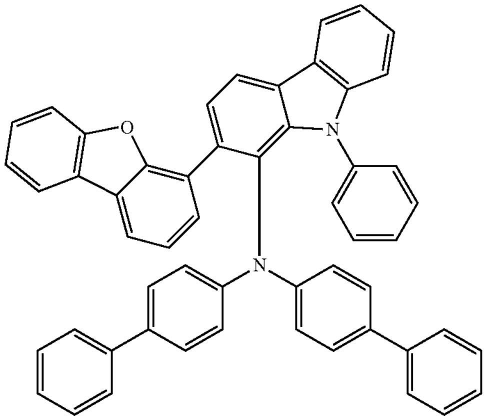
129
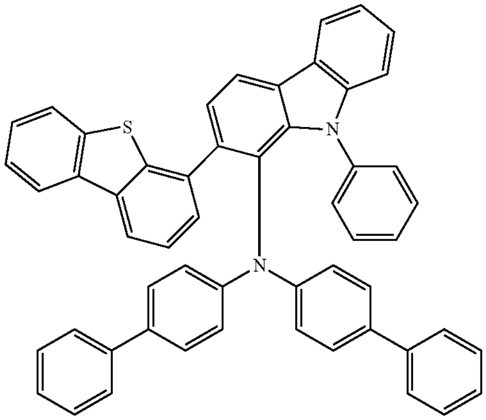
-continued
130
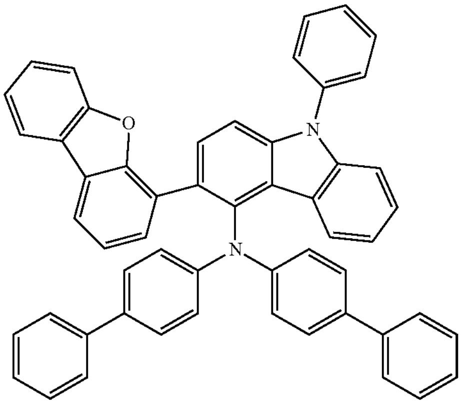
131
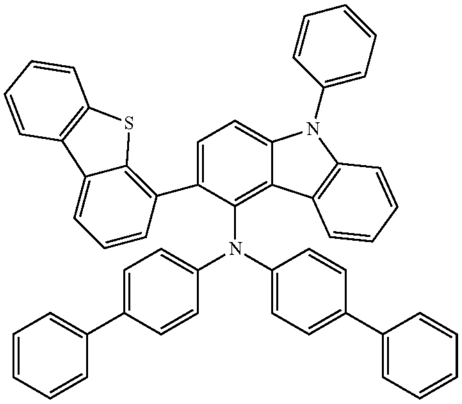
132
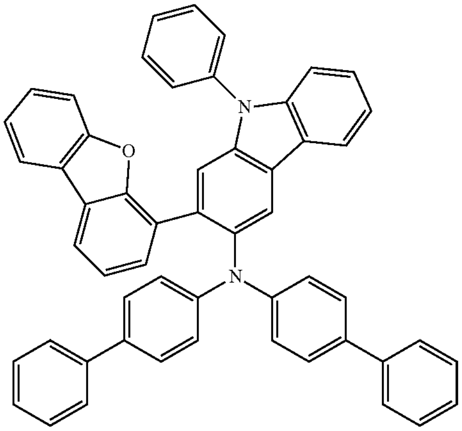

-continued

133

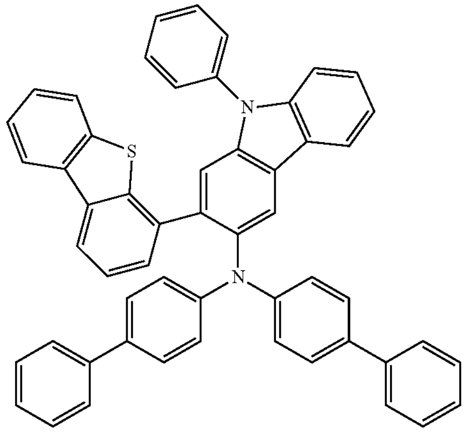

134

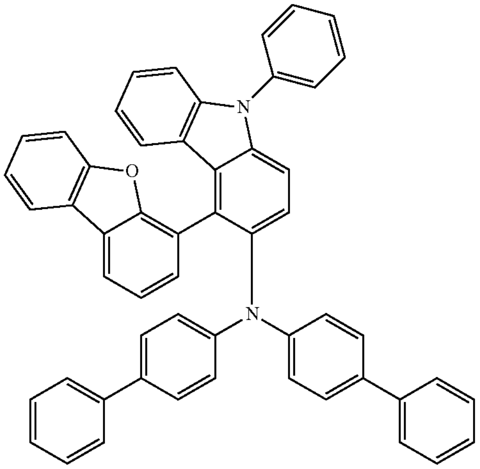

135

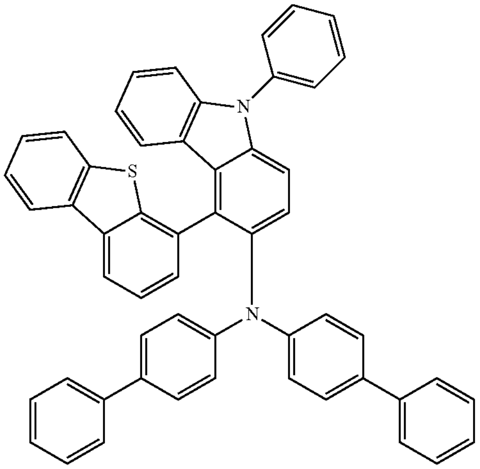

-continued

136

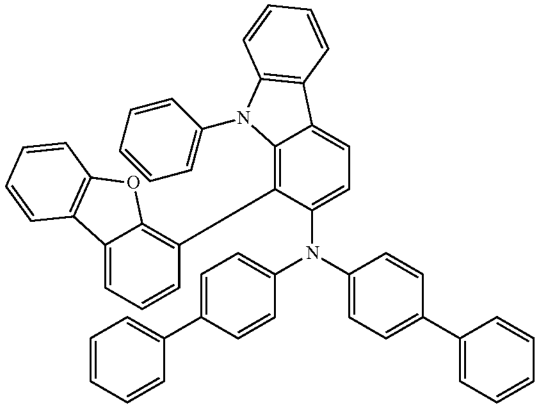

137

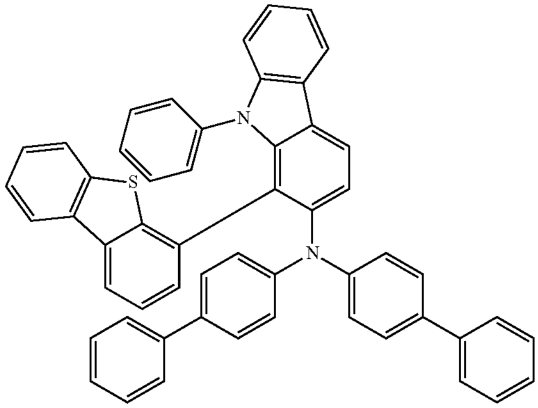

In Compound 125 to Compound 127, D is a deuterium atom.

The amine compound represented by Formula 1 of an embodiment may include a heteroaryl group and a substituted carbazole group. The heteroaryl group and the amine group may be bonded at the ortho position in the benzene ring of the carbazole group. The heteroaryl group bonded to the carbazole group may improve charge transport characteristics of the nitrogen atom of the amine group. In the hole transport region including the amine compound of an embodiment, the hole transport characteristic may be increased and the recombination probability of holes and electrons in the emission layer may be improved. Therefore, the light emitting device including the amine compound of an embodiment may exhibit an excellent luminous efficiency characteristic.

In an embodiment, the hole transport layers HTL, HTL-1, and HTL-2 of the hole transport region HTR may include the amine compound of an embodiment. When the hole transport region HTR includes the first hole transport layer HTL-1 and the second hole transport layer HTL-2, at least one of the first hole transport layer HTL-1 and the second hole transport layer HTL-2 may include the amine compound of an embodiment.

The hole transport region HTR may include at least one of a hole injection layer HIL, a hole transport layer HTL, a buffer layer (not shown), an emission-auxiliary layer (not shown), and an electron blocking layer EBL. For example, the hole transport region HTR may include the hole injection layer HIL, the hole transport layer HTL, and the electron blocking layer EBL, and the hole transport layer HTL may include the amine compound of an embodiment.

A thickness of the hole transport region HTR may be, for example, in a range of about 50 Å to about 15,000 Å. The hole transport region HTR may have a single layer formed of a single material, a single layer formed of different materials, or a multilayer structure including multiple layers formed of different materials.

For example, the hole transport region HTR may have a single layer structure of the hole transport layer HTL, and may have a single layer structure formed of a hole injection material and a hole transport material. The hole transport region HTR may have a single layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in order from the first electrode EL1, but embodiments are not limited thereto.

The hole transport region HTR may be formed by using various methods such as a vacuum deposition method, a spin coating method, a cast method, a Langmuir-Blodgett (LB) method, an inkjet printing method, a laser printing method, and a laser induced thermal imaging (LITI) method.

The light emitting device ED of an embodiment may further include a hole transport material, which will be described below, in addition to the above-described amine compound of an embodiment. The hole transport region HTR may include a compound represented by Formula H-1 below:

[Formula H-1]

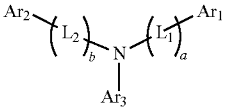

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. In Formula H-1, when a or b is an integer of 2 or greater, multiple $L_1$(s) and $L_2$(s) may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 above may be a monoamine compound. In another embodiment, the compound represented by Formula H-1 above may be a diamine compound in which at least one among $Ar_1$ to $Ar_3$ includes an amine group as a substituent. The compound represented by Formula H-1 above may be a carbazole-based compound including a substituted or unsubstituted carbazole group in at least one of $Ar_1$ and $Ar_2$, or a fluorene-based compound including a substituted or unsubstituted fluorene group in at least one of $Ar_1$ and $Ar_2$.

The compound represented by Formula H-1 may be represented by any one among the compounds of Compound Group H below. However, the compounds listed in Compound Group H below are examples, and the compounds represented by Formula H-1 are not limited to those represented by Compound Group H below:

[Compound Group H]

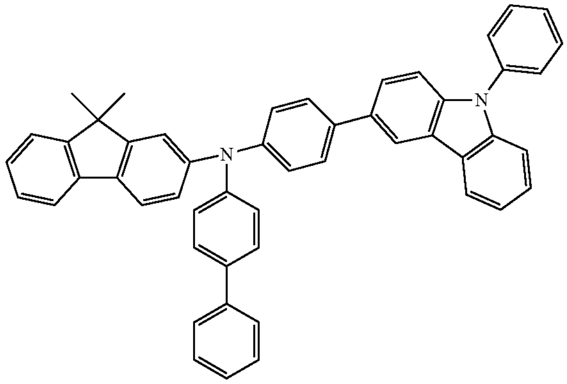

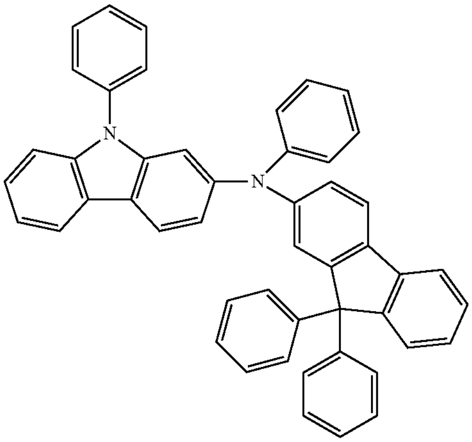

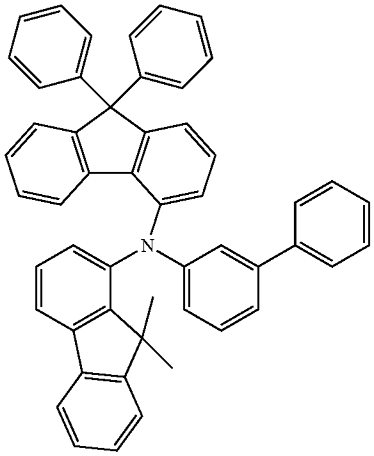

-continued
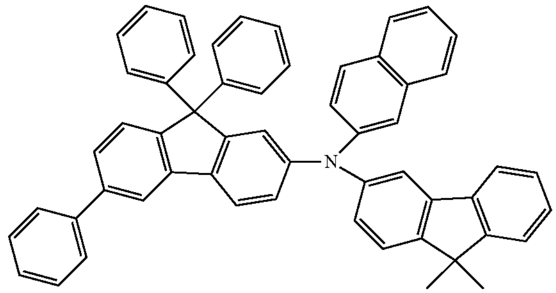
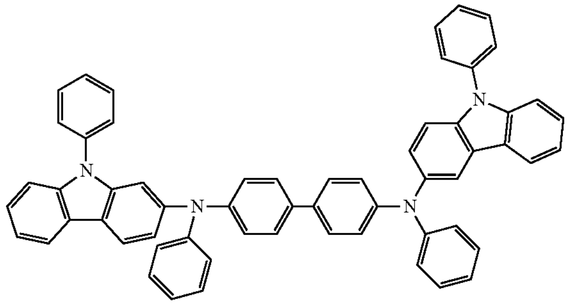
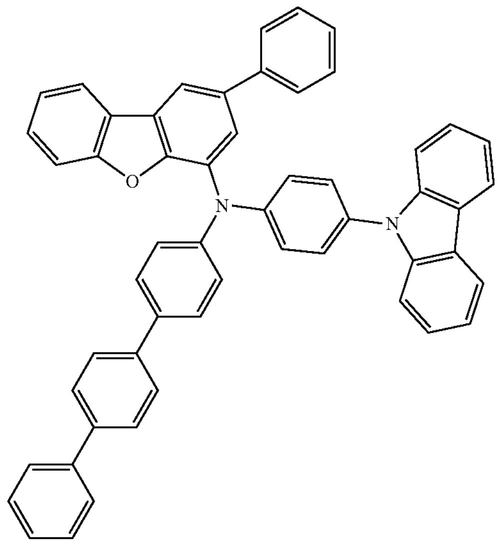
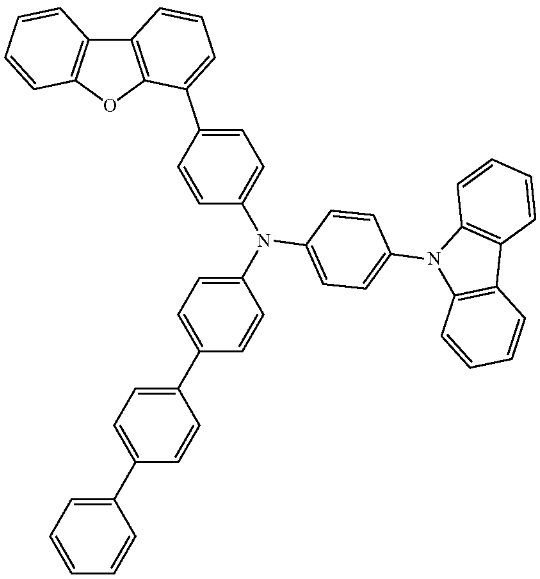
-continued
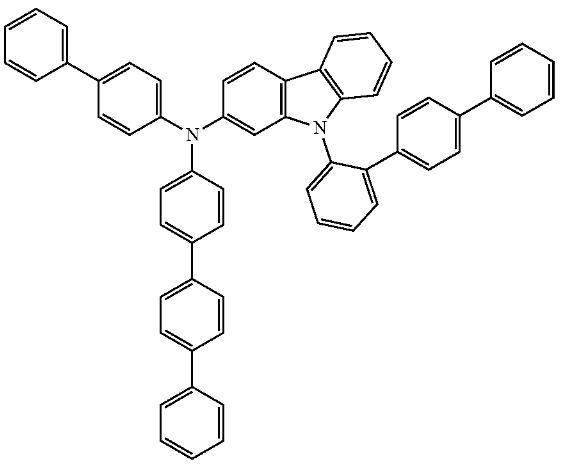
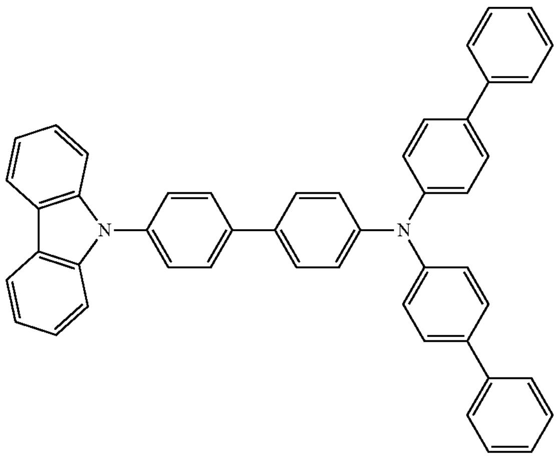
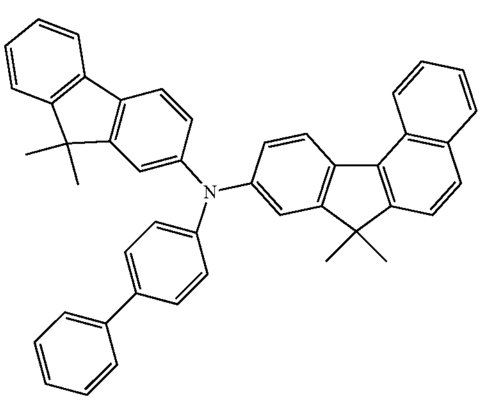

-continued
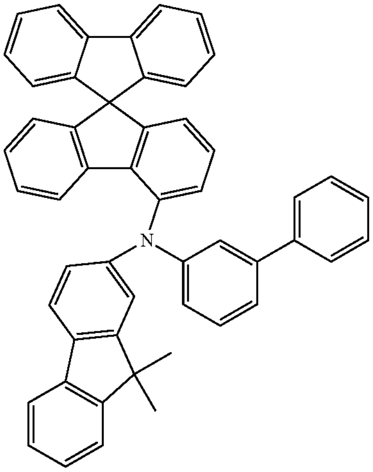
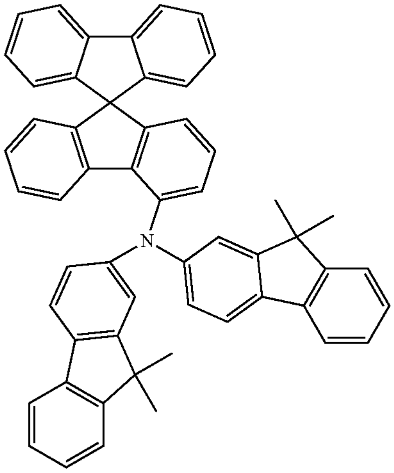
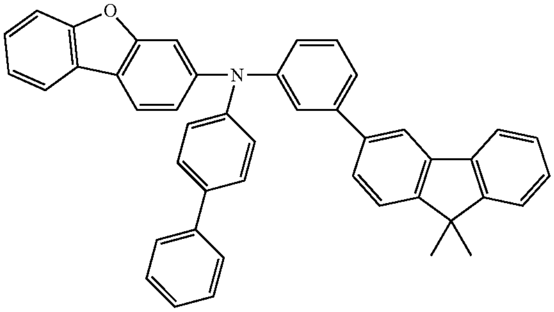
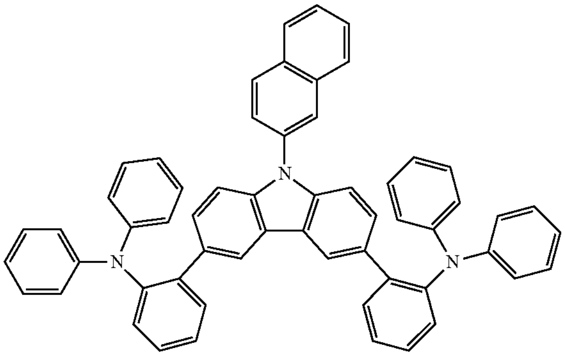
-continued
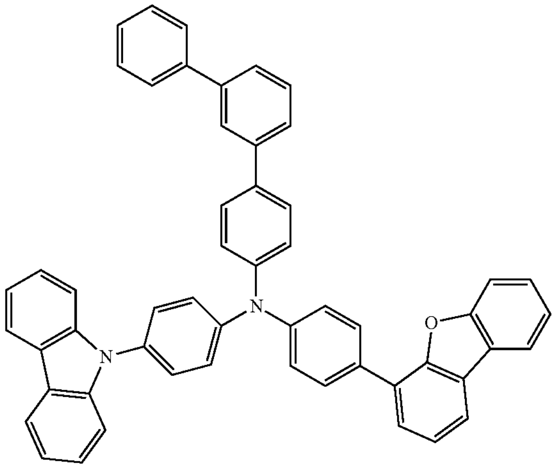
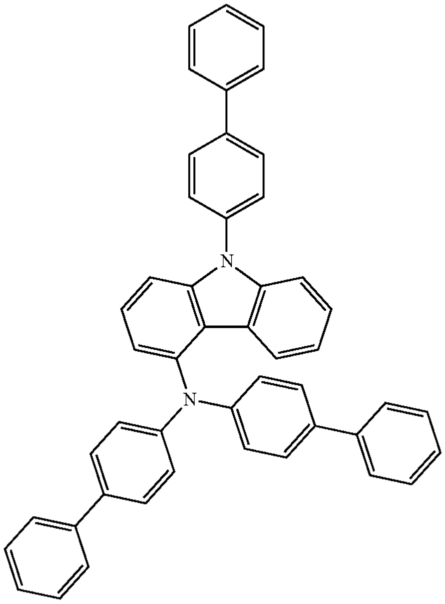
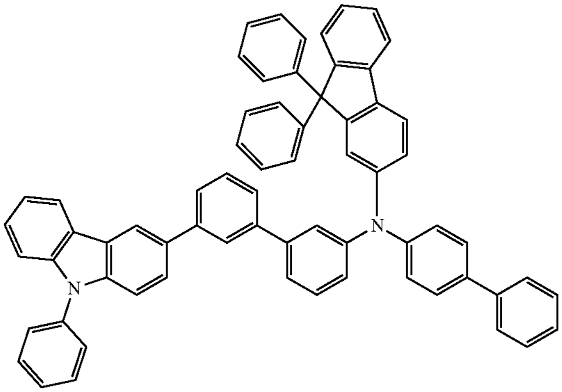

-continued

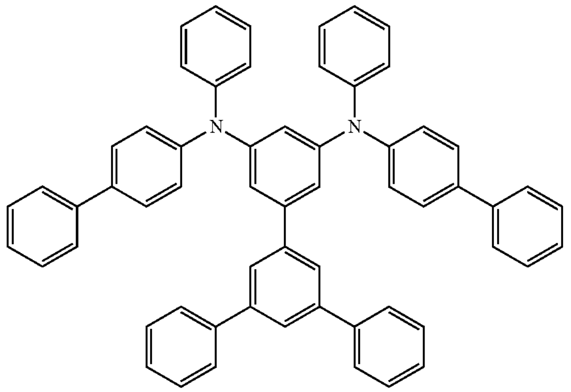

The hole transport region HTR may further include a phthalocyanine compound such as copper phthalocyanine; $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may further include carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4"-tris(N-carbazolyl)triphenylamine (TCTA), N,N'-di(naphthalene-1-yl)-N,N'-diplienyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl) benzene (mCP), 1,3-bis(1,8-dimethyl-9H-carbazol-9-yl) benzene (mDCP), etc.

The hole transport region HTR may include the above-described compound of the hole transport region in at least one of a hole injection layer HIL, a hole transport layer HTL, and an electron blocking layer EBL.

In an embodiment, the thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. For example, when the hole transport region HTR includes the electron blocking layer EBL, the electron blocking layer EBL may have a thickness in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport characteristic may be achieved without a substantial increase in a driving voltage.

The hole transport region HTR may further include a charge generating material in order to increase conductivity in addition to the above-described materials. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, and a cyano group-containing compound, but embodiments are not limited thereto. For example, the p-dopant may include metal halides such as CuI and RbI, quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide and molybdenum oxide, dipyrazino[2,3-f: 2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanom ethyl]-2,3,5,6-tetrafluorobenzonitrile, etc., but embodiments are not limited thereto.

As described above, the hole transport region HTR may further include at least one of the buffer layer (not shown) and the electron blocking layer EBL in addition to the hole injection layer HIL and the hole transport layer HTL. The buffer layer (not shown) may compensate a resonance distance according to the wavelength of light emitted from the emission layer EML and may thus increase light emission efficiency. Materials which may be included in the hole transport region HTR may be used as materials to be included in the buffer layer (not shown). The electron blocking layer EBL is a layer that may prevent electrons from being injected from the electron transport region ETR to the hole transport region HTR.

The emission layer EML is provided on the hole transport region HTR. In the light emitting device ED of an embodiment, the emission layer EML may include the above-described amine compound of an embodiment. The amine compound of an embodiment may be used as a dopant material or a host material.

In the light emitting device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In each light emitting device ED of embodiments illustrated in FIGS. 3 to 6, the emission layer EML may include a host and a dopant, and the emission layer EML may include a compound represented by Formula E-1 below. The compound represented by Formula E-1 below may be used as a fluorescence host material.

[Formula E-1]

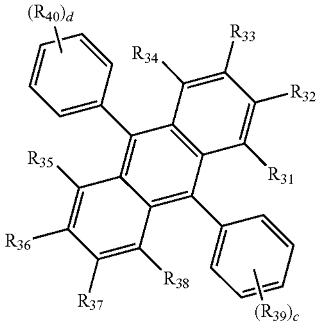

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or an unsaturated hydrocarbon ring.

In Formula E-1, c and d may each independently be integer from 0 to 5. The compound represented by Formula E-1 may be selected from any one among Compound E1 to Compound E19 below:

E1

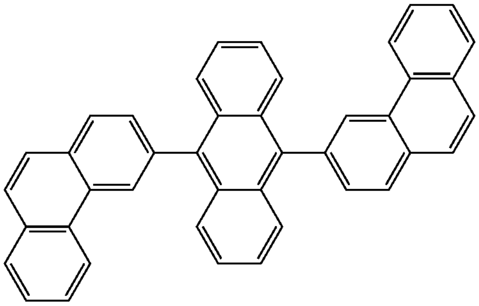

E2

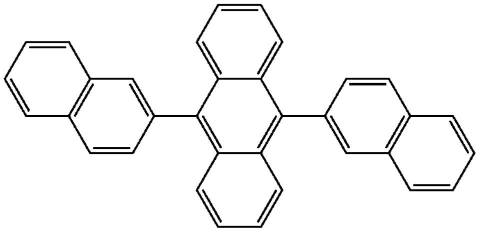

E3

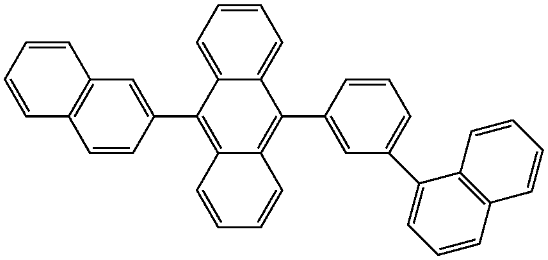

-continued

E4

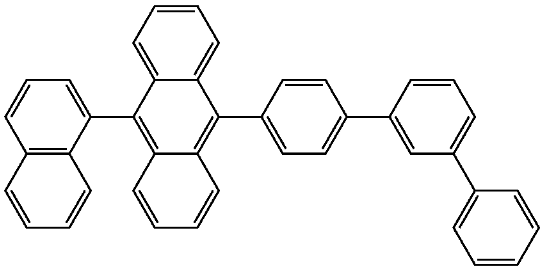

E5

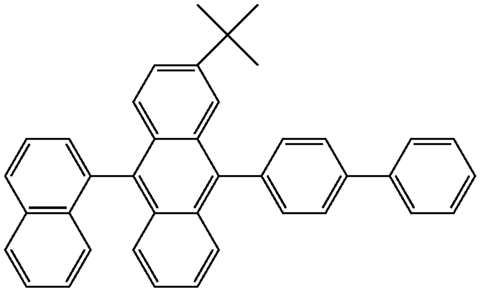

E6

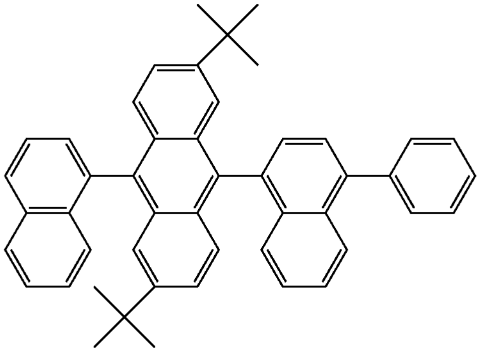

E7

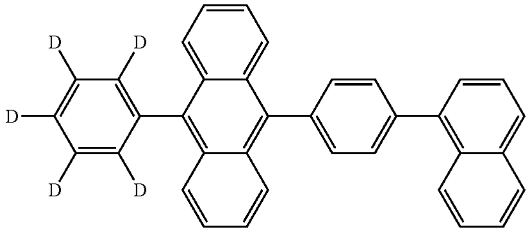

E8

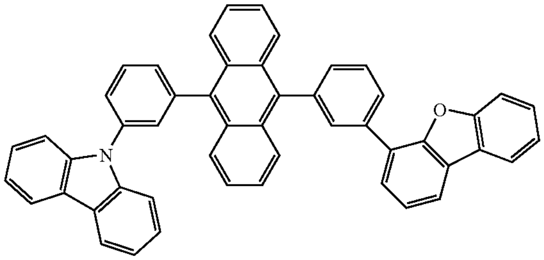

-continued
E9
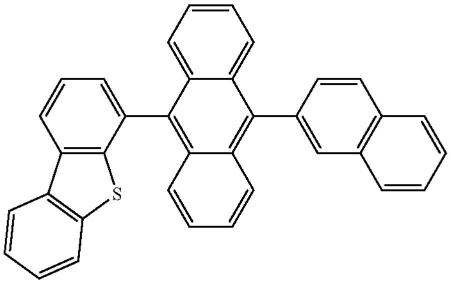
E10
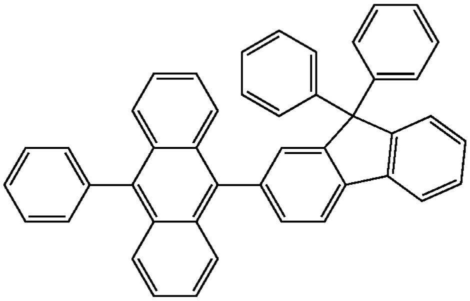
E11
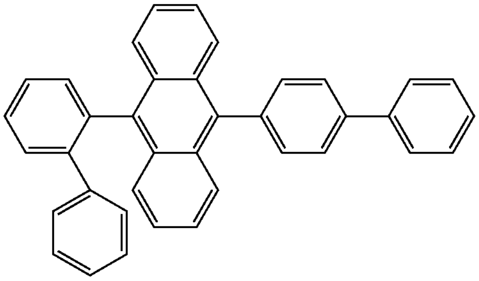
E12
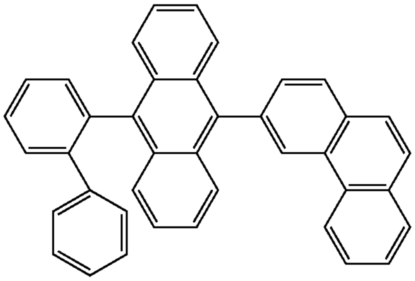
E13
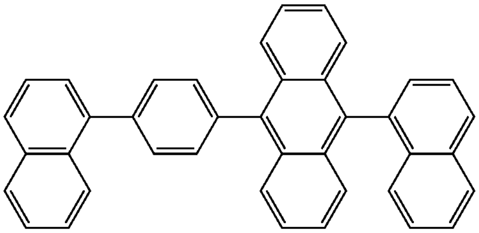
-continued
E14
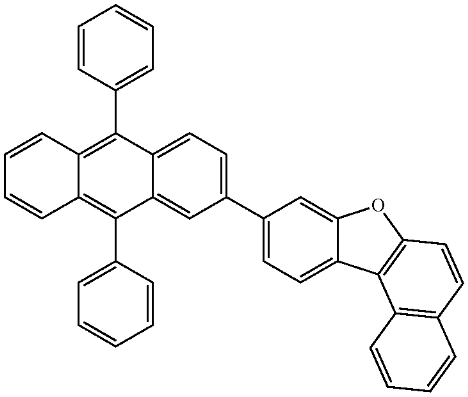
E15
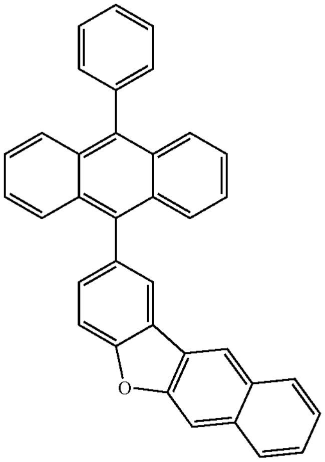
E16
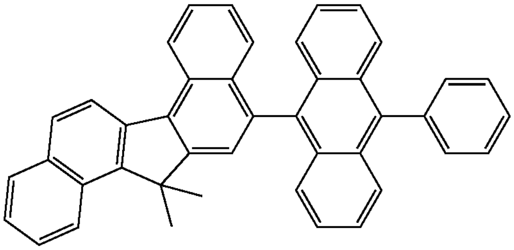
E17
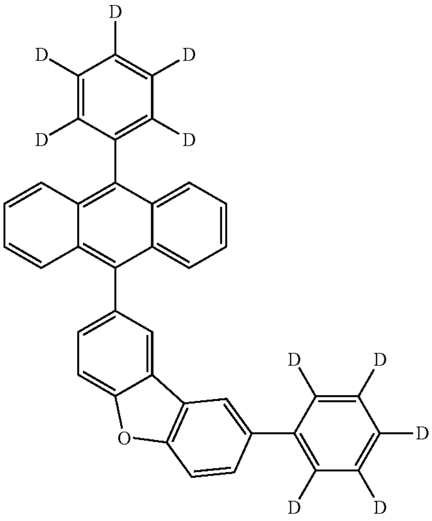

-continued

E18

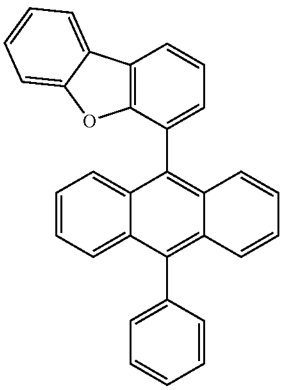

E19

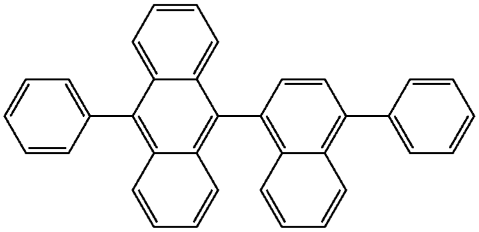

In an embodiment, the emission layer EML may include a compound represented by Formula E-2a or Formula E-2b below. The compound represented by Formula E-2a or Formula E-2b below may be used as a phosphorescence host material.

[Formula E-2a]

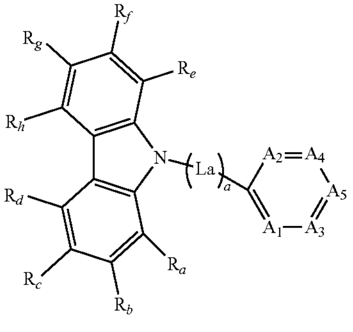

In Formula E-2a, a may be an integer from 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2a, when a is an integer of 2 or greater, multiple $L_a$(s) may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1)-(L_b)_b-(Cbz2)$$

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is an integer of 2 or more, multiple $L_b$(s) may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be selected from any one among the compounds of Compound Group E-2 below. However, the compounds listed in Compound Group E-2 below are examples, the compound represented by Formula E-2a or Formula E-2b is not limited to those represented by Compound Group E-2 below.

[Compound Group E-2]

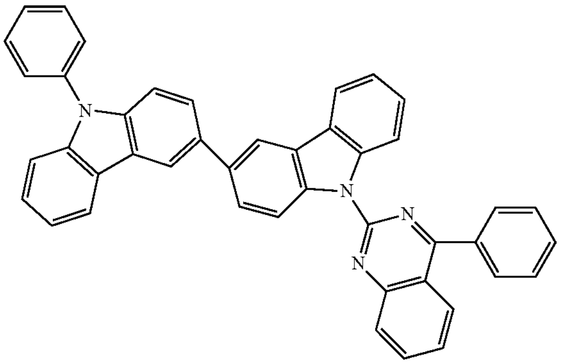

-continued
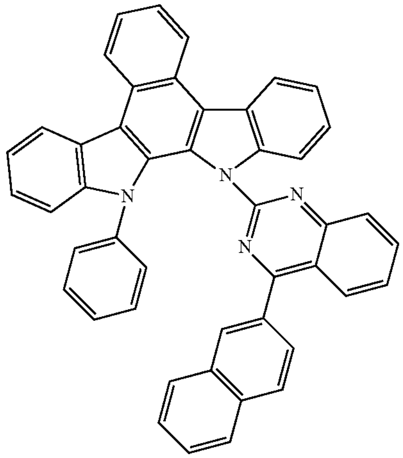
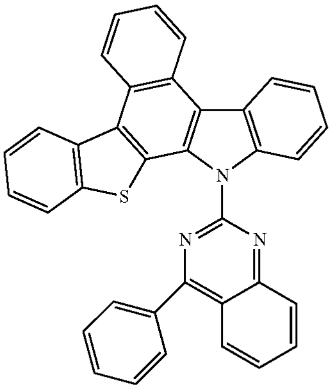
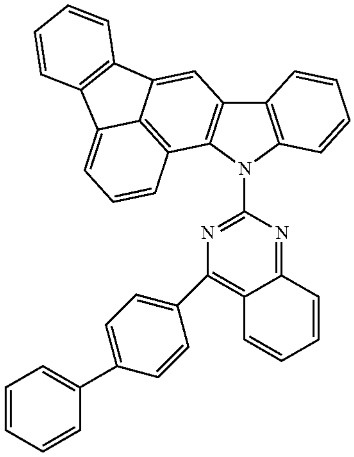
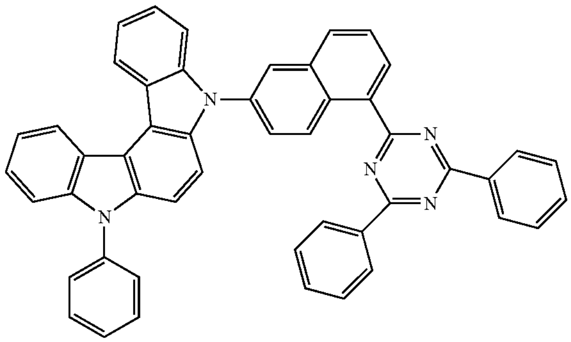
-continued
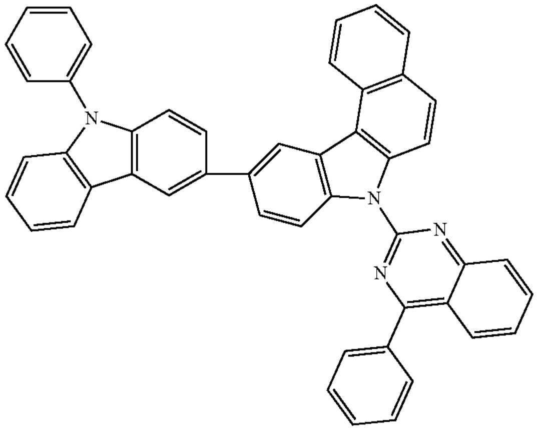
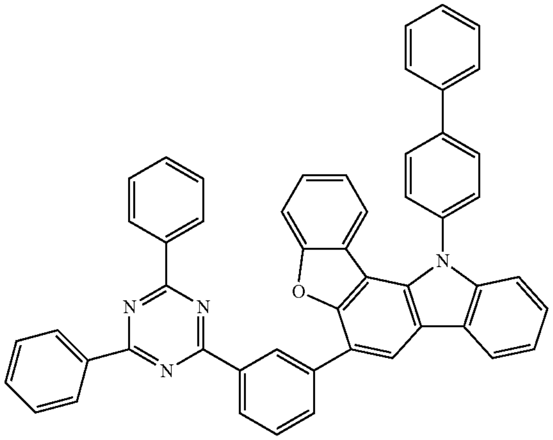
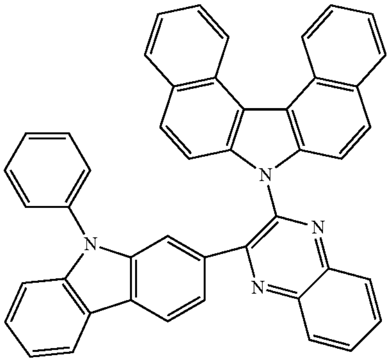
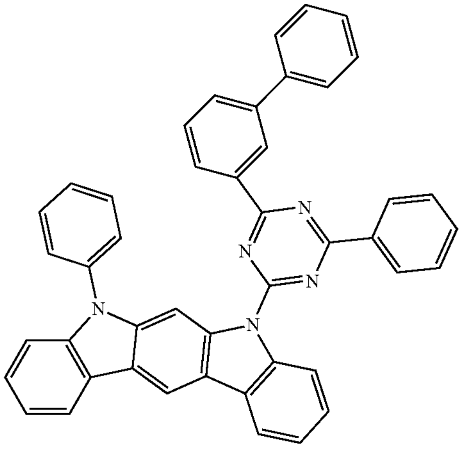

-continued
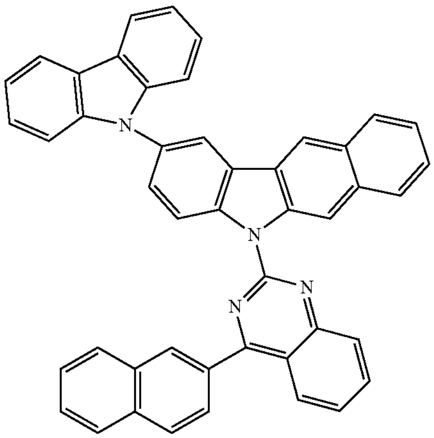
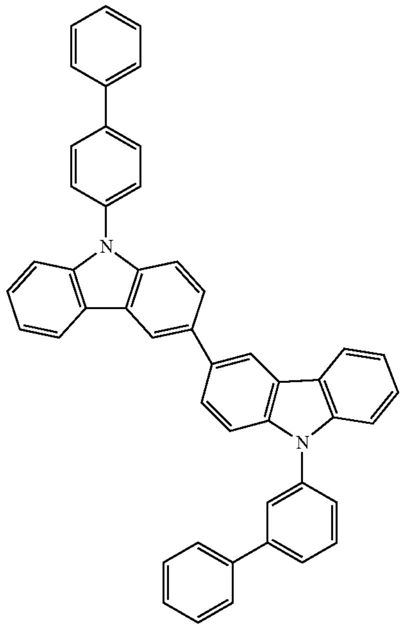
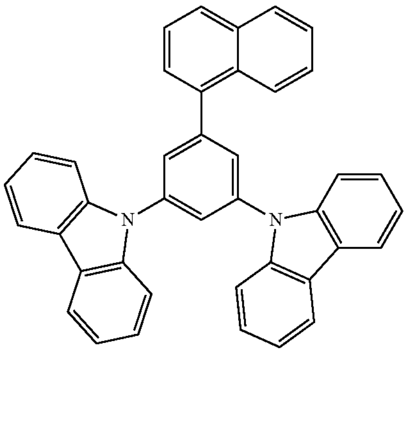
-continued
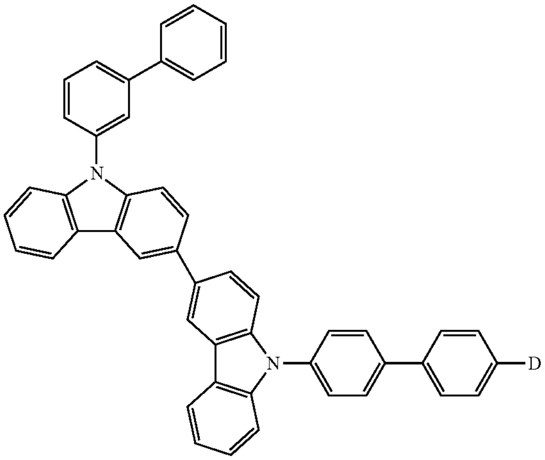
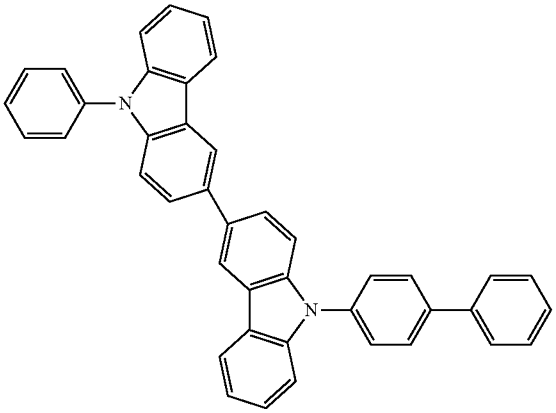
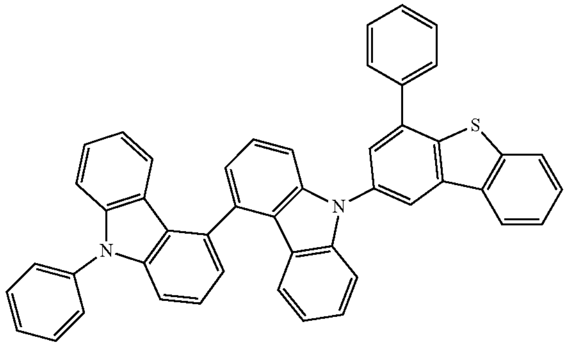
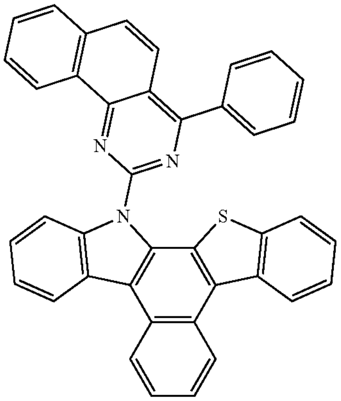

-continued

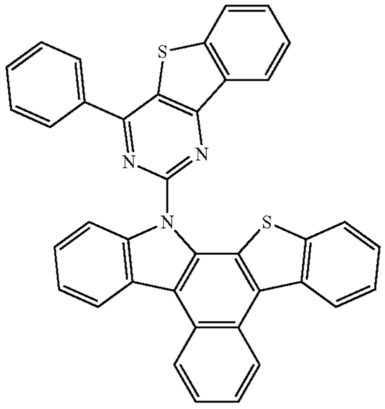

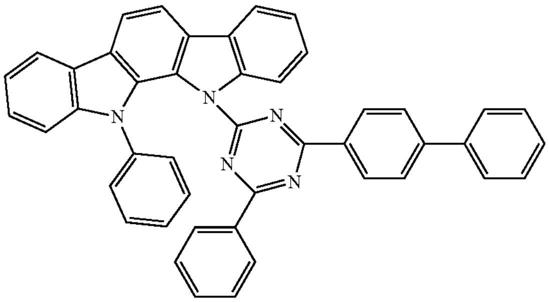

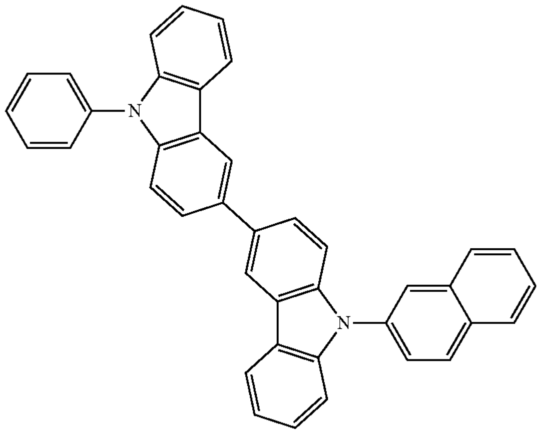

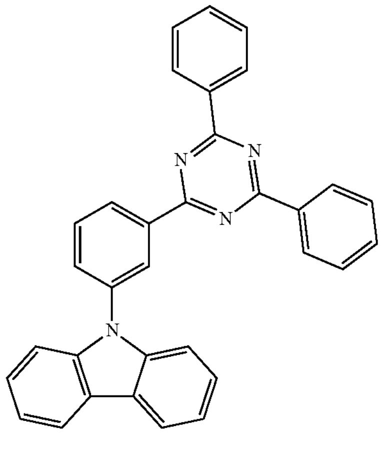

-continued

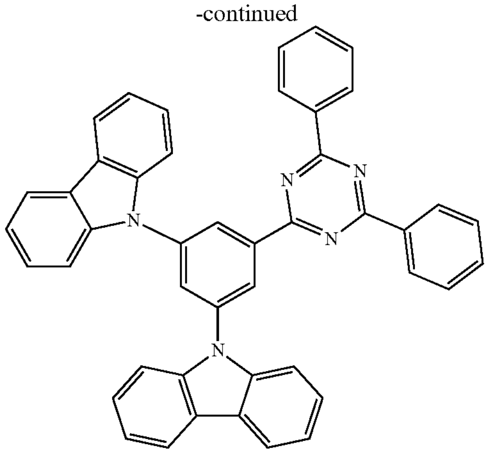

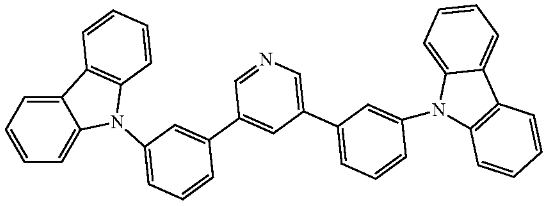

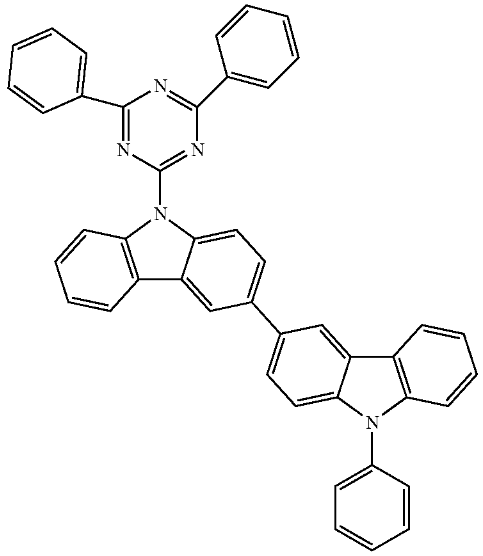

The emission layer EML may further include a general material in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis (carbazol-9-yl)benzene (mCP), 2,8-bis(diphenylphosphoryl) dibenzo[b,d]furan (PPF), 4,4',4"-tris(carbazol-9-yl)-triphenylamine (TCTA), and 1,3,5-tris(1-phenyl-1H-benzo[d] imidazole-2-yl)benzene (TPBi). However, embodiments are not limited thereto, and for example, tris(8-hydroxyquinolino)aluminum (Alq3), 4,4'-bis(N-carbazolyl)-1,1'-biphenyl (CBP), poly(n-vinylcabazole (PVK), 9,10-di(naphthalene-2-yl)anthracene (ADN), 4,4',4"-Tris(carbazol-9-yl)-triphenylamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as a host material.

The emission layer EML may include a compound represented by Formula M-a or Formula M-b below. The compound represented by Formula M-a or Formula M-b below may be used as a phosphorescence dopant material.

[Formula M-a]

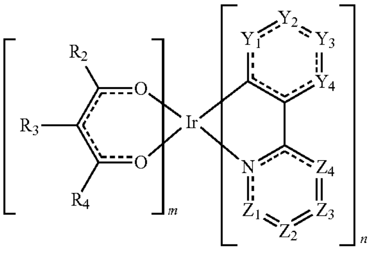

In Formula M-a above, $Y_1$ to $Y_4$ and $Z_1$ to $Z_4$ may each independently be $C(R_1)$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a red phosphorescence dopant or a green phosphorescence dopant.

The compound represented by Formula M-a may be selected from any one among Compound M-a1 to Compound M-a19 below. However, Compounds M-a1 to M-a19 below are examples, and the compound represented by Formula M-a is not limited to those represented by Compounds M-a1 to M-a19 below.

M-a1

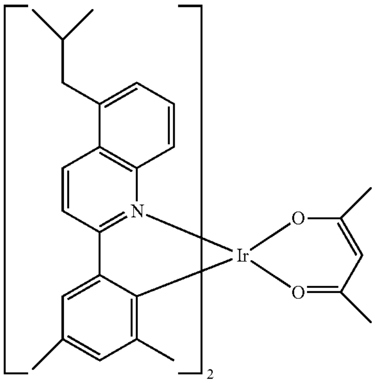

-continued

M-a2

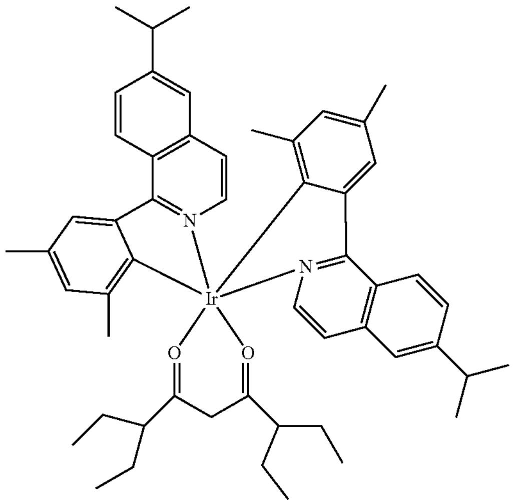

M-a3

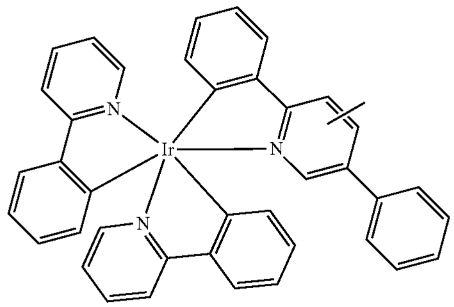

M-a4

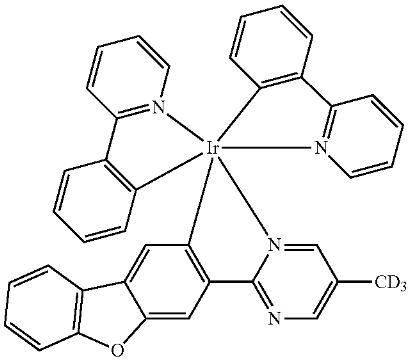

M-a5

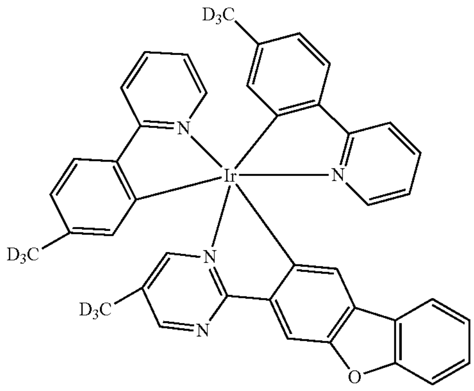

-continued
M-a6
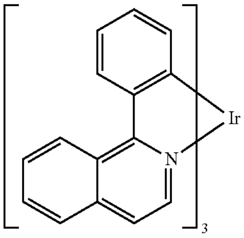
M-a7
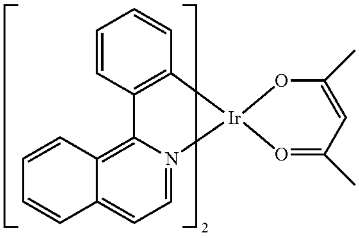
M-a8
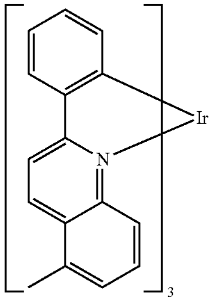
M-a9
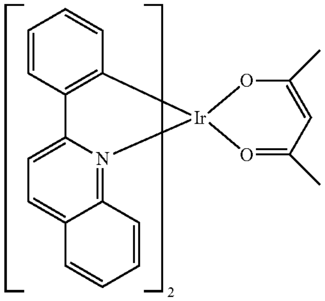
M-a10
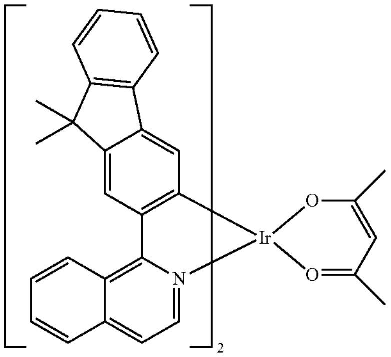
-continued
M-a11
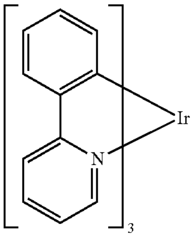
M-a12
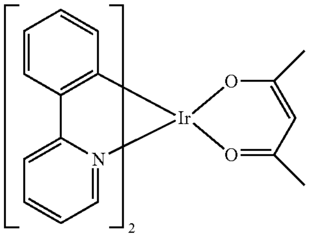
M-a13
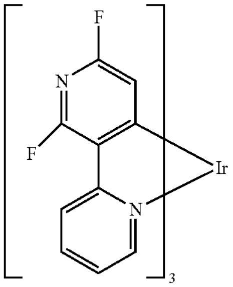
M-a14
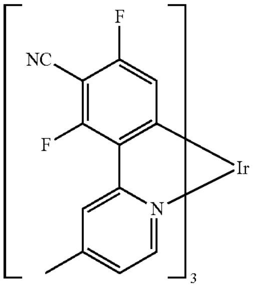
M-a15
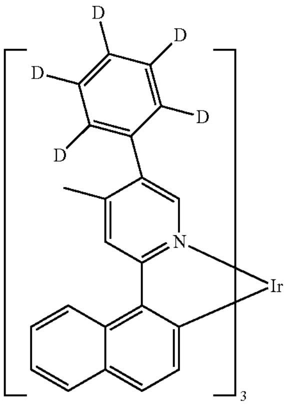

-continued

M-a16

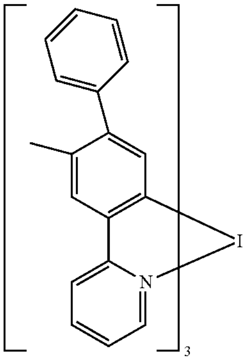

M-a17

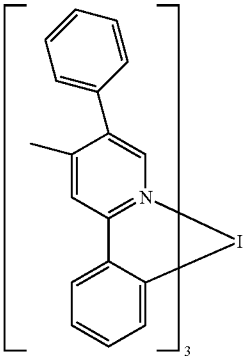

M-a18

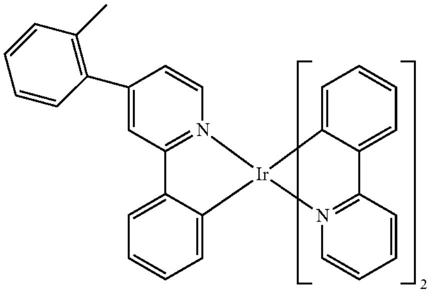

M-a19

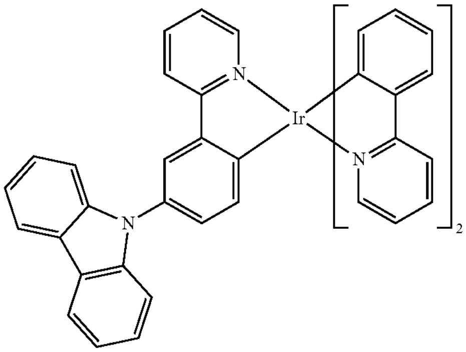

Compound M-a1 and Compound M-a2 may be used as a red dopant material, and Compound M-a3 to Compound M-a5 may be used as a green dopant material.

[Formula M-b]

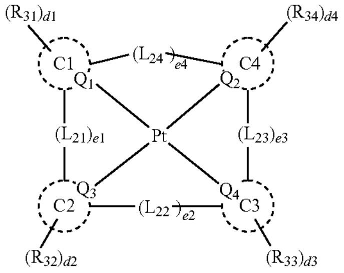

In Formula M-b, $Q_1$ to $Q_4$ may each independently be C or N, and $C_1$ to $C_4$ may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

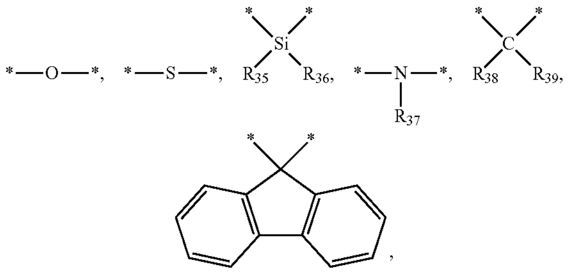

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be selected from any one among the compounds below. However, the compounds below are examples, and the compound represented by Formula M-b is not limited to those represented by the compounds below.

-continued
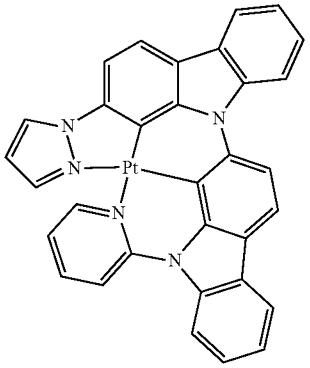
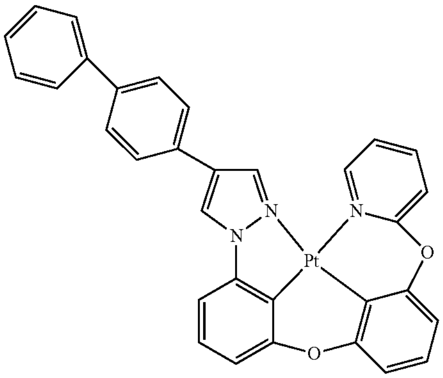
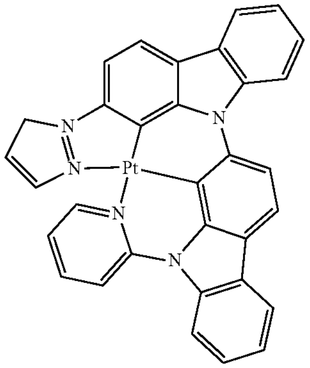
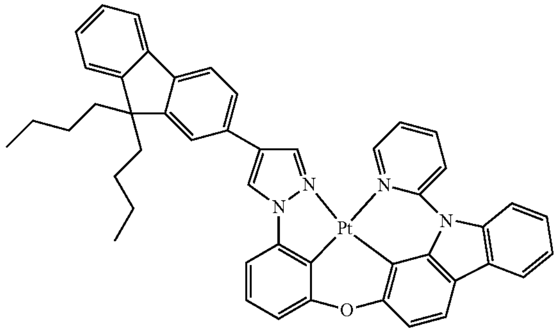
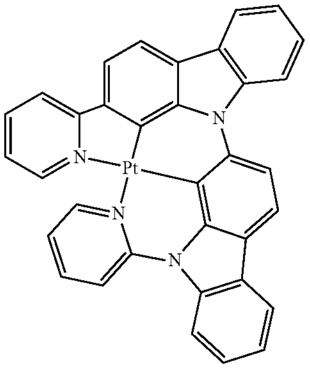
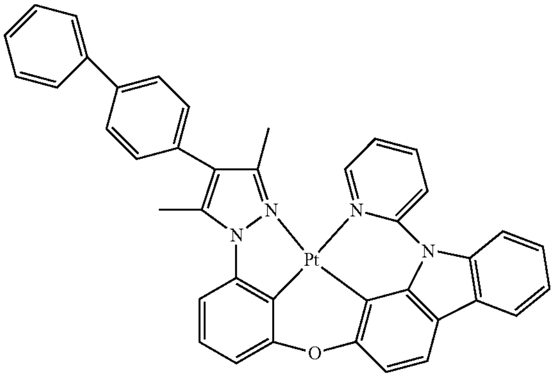
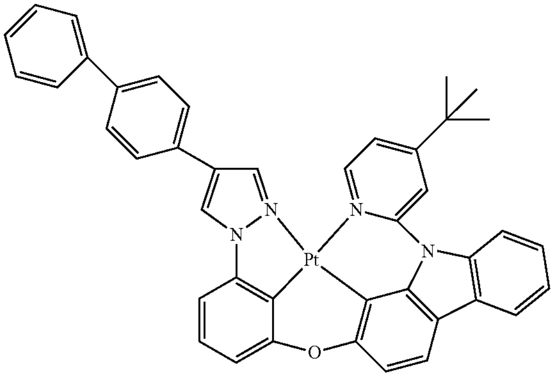
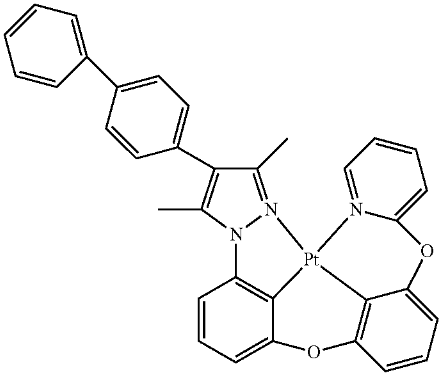

-continued

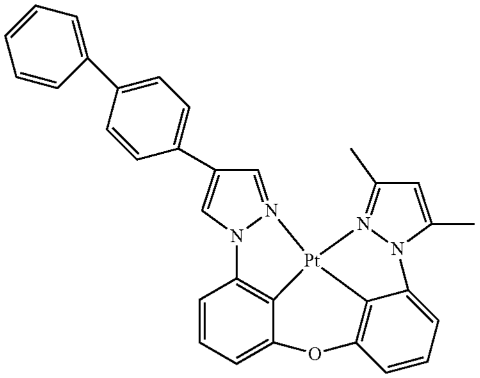

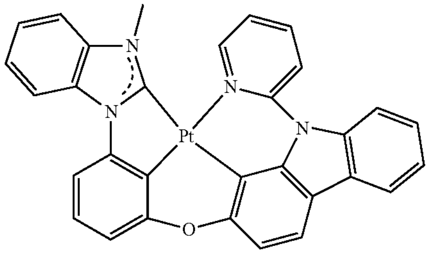

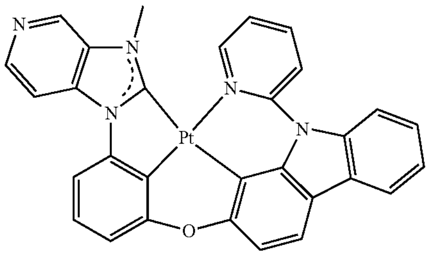

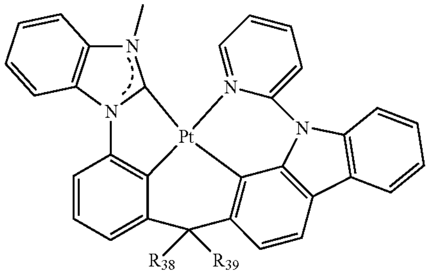

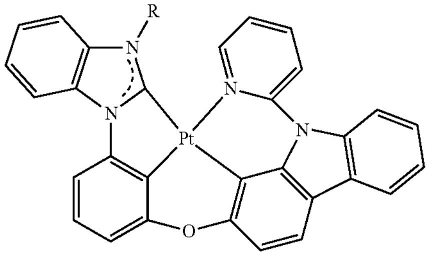

In the above compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one among Formula F-a to Formula F-c below. The compound represented by Formula F-a to Formula F-c below may be used as a fluorescence dopant material.

[Formula F-a]

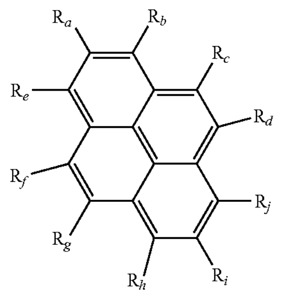

In Formula F-a, two selected from among $R_a$ to $R_j$ may each independently be substituted with *—$NAr_1Ar_2$. The remainder of $R_a$ to $R_j$, which are not substituted with *—$NAr_1Ar_2$, may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and $Ar_2$ may be a heteroaryl group containing O or S as a ring-forming atom.

[Formula F-b]

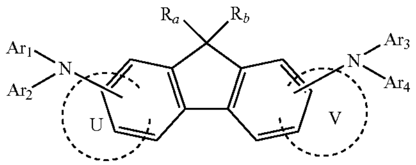

in Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, it means that when the number of U or V is 1, one ring forms a condensed ring at a part described as U or V, and when the number of U or V is 0, a ring described as U or V is not present. When the number of U is 0 and the number of V is 1, or when the number of U is 1 and the number of V is 0, the condensed ring having a fluorene core of Formula F-b may be a four-ring cyclic compound. When each number of U and V is 0, the condensed ring of Formula F-b may be a three-ring cyclic compound. When each number of U and V is 1, the condensed ring having a fluorene core of Formula F-b may be a five-ring cyclic compound.

[Formula F-c]

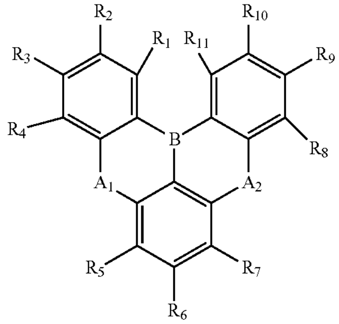

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

In Formula F-c, $A_1$ and $A_2$ may each independently be bonded to substituents of an adjacent ring to form a condensed ring. For example, when $A_1$ and $A_2$ are each independently $N(R_m)$, $A_1$ may be bonded to $R_4$ or $R_5$ to form a ring. In an embodiment, in Formula F-c, $A_2$ may be bonded to $R_7$ or $R_8$ to form a ring.

In an embodiment, the emission layer EML may include, as a dopant material, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzena mine (N-BDAVBi), 4,4'-bis[2-(4-(N,N-diphenylamino)phenyl)vinyl]biphenyl (DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may include a phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as a phosphorescence dopant. However, embodiments are not limited thereto.

The emission layer EML may include a quantum dot material. The core of the quantum dot may be selected from among a Group II-VI compound, a Group III-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

A Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

For example, a binary compound, a ternary compound, or a quaternary compound may be present in particles in a uniform concentration distribution, or may be present in the same particle in a partially different concentration distribution. In an embodiment, the quantum dot may have a core/shell structure in which one quantum dot surrounds another quantum dot. An interface between the core and the shell may have a concentration gradient in which the concentration of an element present in the shell becomes lower towards the center.

In some embodiments, a quantum dot may have the above-described core-shell structure including a core having nanocrystals and a shell surrounding the core. The shell of the quantum dot may serve as a protection layer to prevent the chemical deformation of the core so as to maintain semiconductor properties, and/or a charging layer to impart electrophoresis properties to the quantum dot. The shell may be a single layer or a multilayer. An interface between the core and the shell may have a concentration gradient in which the concentration of an element present in the shell becomes lower towards the center. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of a light emission wavelength spectrum equal or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Within the aforementioned ranges, color purity or color reproducibility may be improved. Light emitted through such a quantum dot may be emitted in all directions, and thus a wide viewing angle may be improved.

The form of a quantum dot is not particularly limited, as long as it is a form used in the art. For example, a quantum dot may have a spherical, a pyramidal, a multi-arm, or a cubic shape, or the quantum dot may be in the form of nanoparticles, nanotubes, nanowires, nanofibers, nanoparticles, etc.

A quantum dot may control the color of emitted light according to the particle size thereof and thus the quantum dot may have various light emission colors such as green, red, etc.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, and the electron injection layer EIL, but embodiments are not limited thereto.

The electron transport region ETR may have a single layer formed of a single material, a single layer formed of different materials, or a multilayer structure including multiple layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL and a hole blocking layer HBL/electron transport layer ETL/electron injection layer EIL are stacked in order from the emission layer EML, but embodiments are not limited thereto. The electron transport region ETR may have a thickness, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

[Formula ET-1]

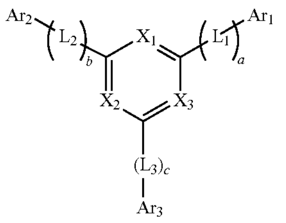

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are an integer of 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or a mixture thereof.

The electron transport region ETR may include a metal halide such as LiF, NaCl, CsF, RbCl, RbI, CuI, or KI, a lanthanide metal such as Yb, and a co-deposited material of the metal halide and the lanthanide metal. For example, the electron transport region ETR may include KI:Yb, RbI:Yb, etc. as a co-deposited material. The electron transport region ETR may be formed by using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. The organometallic salt may include, for example, metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP), and 4,7-diphenyl-1,10-phenanthroline (Bphen) in addition to the above-described materials, but embodiments are not limited thereto.

The electron transport region ETR may include the above-described compounds of the hole transport region in at least one of the electron injection layer EIL, the electron transport layer ETL, and the hole blocking layer HBL.

When the electron transport region ETR includes an electron transport layer ETL, the electron transport layer ETL may have a thickness in a range of about 100 Å to about 1,000 Å. For example, the thickness of the electron transport layer ETL may be in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown, the second electrode EL2 may be electrically connected to an auxiliary electrode. If the second electrode EL2 is electrically connected to the auxiliary electrode, the resistance of the second electrode EL2 may be decreased.

A capping layer CPL may further be disposed on the second electrode EL2 of the light emitting device ED of an embodiment. The capping layer CPL may be a single layer or a multilayer.

In an embodiment, the capping layer CPL may include an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., or an epoxy resin, or acrylate such as methacrylate. However, embodiments are not limited thereto, and the capping layer CPL may include at least one among Compounds P1 to P5 below:

P1

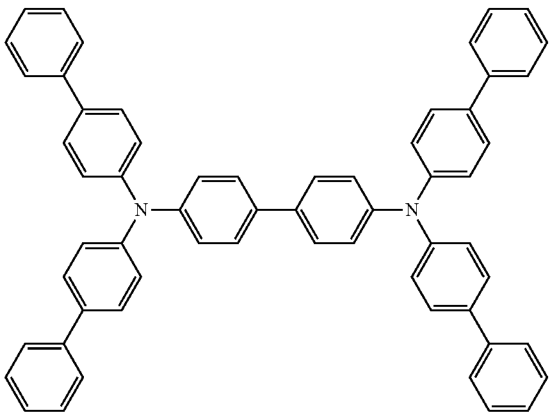

P2

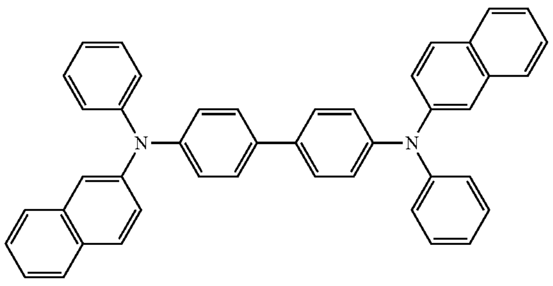

-continued

P3

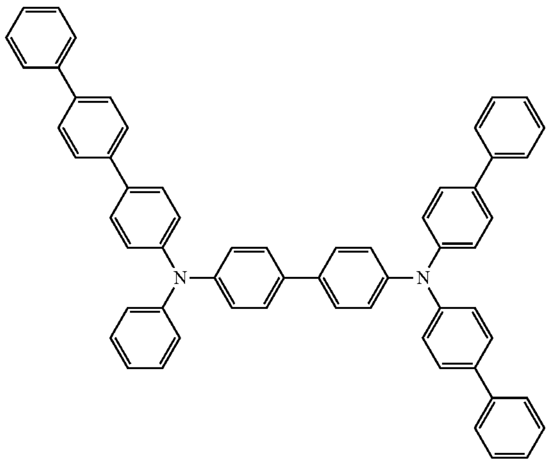

P4

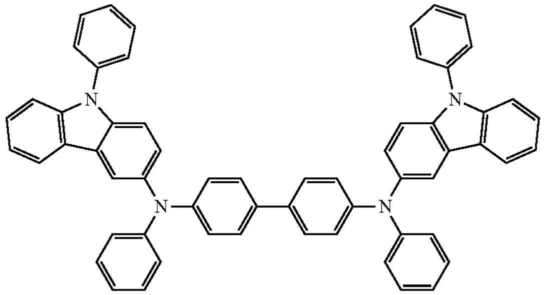

P5

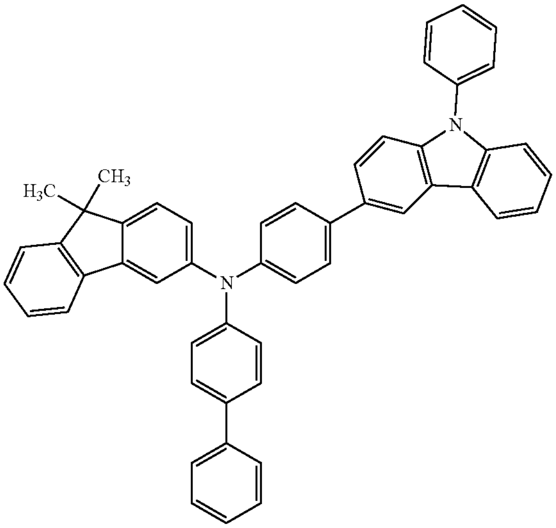

A refractive index of the capping layer CPL may be equal to or greater than about 1.6. For example, the refractive index of the capping layer CPL may be equal to or greater than 1.6 with respect to light in a wavelength range of about 550 nm to about 660 nm.

Figure 7:
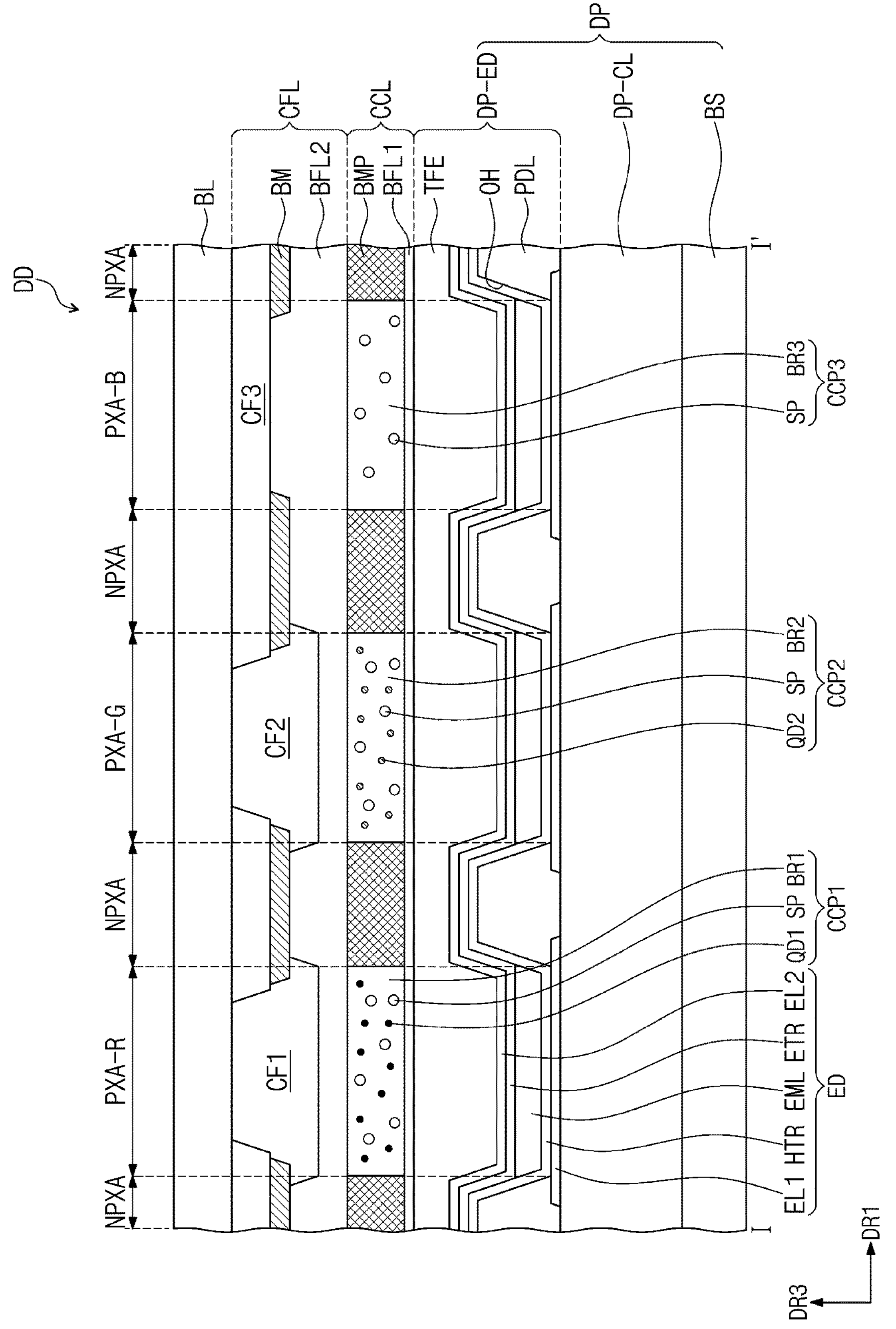
FIG. 7 is a schematic cross-sectional view illustrating a display apparatus according to an embodiment.
Figure 8:
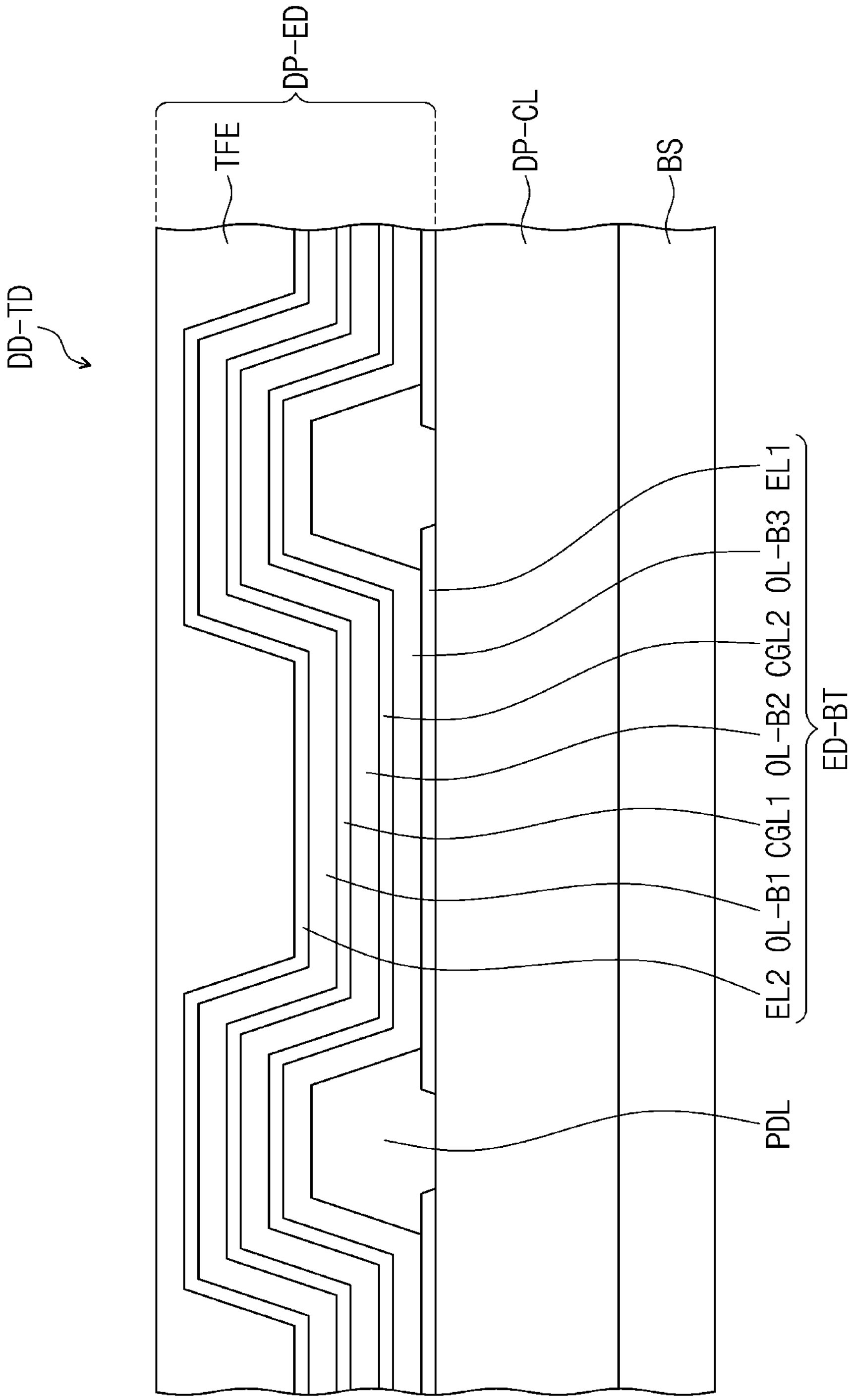
FIG. 8 is a schematic cross-sectional view illustrating a display apparatus according to an embodiment.

FIGS. 7 and 8 each are a schematic cross-sectional view of a display apparatus according to an embodiment. Hereinafter, in describing the display apparatus of an embodiment with reference to FIGS. 7 and 8, the duplicated features which have been described in FIGS. 1 to 6 will not be described again, but their differences will be described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structures of the light emitting devices of FIGS. 3 to 6 as described above may be equally applied to the structure of the light emitting device ED shown in FIG. 7.

Referring to FIG. 7, the emission layer EML may be disposed in an opening OH defined in a pixel defining film PDL. For example, the emission layer EML which is divided by the pixel defining film PDL and provided corresponding to each of the light emitting regions PXA-R, PXA-G, and PXA-B may emit light in a same wavelength range. In the display apparatus DD of an embodiment, the emission layer EML may emit blue light. While it is not shown in the drawings, in another embodiment, the emission layer EML may be provided as a common layer in the entire light emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may emit provided light by converting the wavelength thereof. For example, the light control layer CCL may be a layer containing the quantum dot or a layer containing the phosphor.

The light control layer CCL may include light control units CCP1, CCP2, and CCP3. The light control units CCP1, CCP2, and CCP3 may be spaced apart from one another.

Referring to FIG. 7, divided patterns BMP may be disposed between the light control units CCP1, CCP2, and CCP3 which are spaced apart from each other, but embodiments are not limited thereto. FIG. 7 illustrates that the divided patterns BMP do not overlap the light control units CCP1, CCP2, and CCP3, but at least a portion of the edges of the light control units CCP1, CCP2, and CCP3 may overlap the divided patterns BMP.

The light control layer CCL may include a first light control unit CCP1 containing a first quantum dot QD1 which converts first color light provided from the light emitting device ED into second color light, a second light control unit CCP2 containing a second quantum dot QD2 which converts the first color light into third color light, and a third light control unit CCP3 which transmits the first color light.

In an embodiment, the first light control unit CCP1 may provide red light that is the second color light, and the second light control unit CCP2 may provide green light that is the third color light. The third light control unit CCP3 may provide light by transmitting blue light that is the first color light provided in the light emitting device ED. For example, the first quantum dot QD1 may be a red quantum dot, and the second quantum dot QD2 may be a green quantum dot. The same as described above may be applied with respect to the quantum dots QD1 and QD2.

In an embodiment, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be inorganic particles. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 may respectively include base resins BR1, BR2, and BR3 in which the quantum dots QD1 and QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may prevent the penetration of moisture and/or oxygen (hereinafter, referred to as 'moisture/oxygen'). The barrier layer BFL1 may be disposed on the light control units CCP1, CCP2, and CCP3 to block the light control units CCP1, CCP2, and CCP3 from being exposed to moisture/oxygen. In an embodiment, the barrier layer BFL1 may cover the light control units CCP1, CCP2, and CCP3. The barrier layer BFL1 may be provided between the light control units CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be formed of a single layer or of multiple layers.

In the display apparatus DD of an embodiment, the color filter layer CFL may be disposed on the light control layer CCL. For example, the color filter layer CFL may be directly disposed on the light control layer CCL, and the barrier layer BFL2 may be omitted.

The color filter layer CFL may include a light shielding unit BM and filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may be a yellow filter. The first filter CF1 and the second filter CF2 may not be separated but may be provided as one filter.

The light shielding unit BM may be a black matrix. The light shielding unit BM may include an organic light shielding material or an inorganic light shielding material containing a black pigment or dye. The light shielding unit BM may prevent light leakage, and may separate boundaries between the adjacent filters CF1, CF2, and CF3. In an embodiment, the light shielding unit BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may be a member which provides a base surface in which the color filter layer CFL, the light control layer CCL, and the like are disposed. The base substrate BL may be a glass substrate, a metal substrate, a plastic substrate, etc. However, embodiments are not limited thereto, and the base substrate BL may be an inorganic layer, an organic layer, or a composite material layer. While it is not shown in the drawings, in another embodiment, the base substrate BL may be omitted.

FIG. 8 is a schematic cross-sectional view illustrating a part of a display apparatus according to an embodiment. FIG. 8 illustrates a schematic cross-sectional view of a part corresponding to the display panel DP of FIG. 7. In the display apparatus DD-TD of an embodiment, the light emitting device ED-BT may include light emitting structures OL-B1, OL-B2, and OL-B3. The light emitting device ED-BT may include a first electrode EL1 and a second electrode EL2 which face each other, and the light emitting structures OL-B1, OL-B2, and OL-B3 sequentially stacked in a thickness direction between the first electrode EL1 and the second electrode EL2. The light emitting structures OL-B1, OL-B2, and OL-B3 may each include an emission layer EML (FIG. 7) and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including multiple emission layers.

In an embodiment illustrated in FIG. 8, light emitted from each of the light emitting structures OL-B1, OL-B2, and OL-B3 may be blue light. However, embodiments are not limited thereto, and the light emitted from each of the light emitting structures OL-B1, OL-B2, and OL-B3 may be in a wavelength range different from each other. For example, the light emitting device ED-BT including the light emitting structures OL-B1, OL-B2, and OL-B3 which emit light in a wavelength range different from each other may emit white light.

Charge generation layers CGL1 and CGL2 may be disposed between neighboring light emitting structures OL-B1, OL-B2, and OL-B3. The charge generation layers CGL1 and CGL2 may include a p-type charge generation layer and/or an n-type charge generation layer.

Hereinafter, with reference to Examples and Comparative Examples, a compound according to an embodiment and a light emitting device of an embodiment will be described in detail. The Examples shown below are illustrated only for the understanding of the disclosure, and the scope of the disclosure is not limited thereto.

EXAMPLES

1. Synthesis of Amine Compound of One Example

First, a synthesis method of an amine compound according to the present embodiment will be described in detail by illustrating synthesis methods of Compounds 1, 2, 33, 41, 99 and 101. In the following descriptions, the synthesis method of the amine compound is provided as an example, but the synthesis method according to an embodiment is not limited to Examples below.

(1) Synthesis of Compound 1

Amine Compound 1 according to an example may be synthesized by, for example, the steps shown in Reaction Scheme 1 below:

[Reaction Scheme 1]

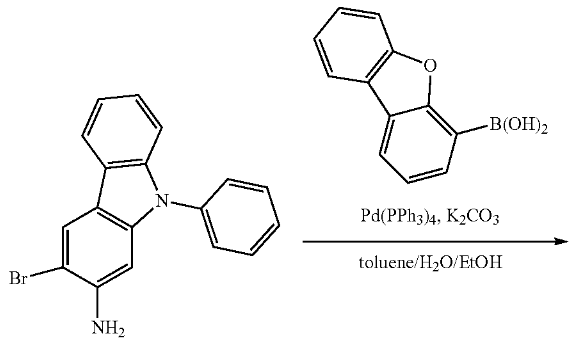

A

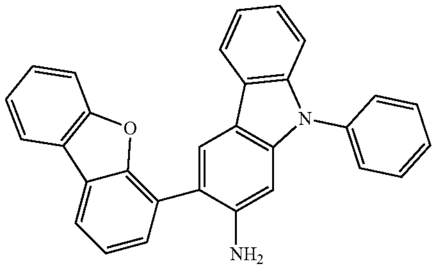

B

-continued

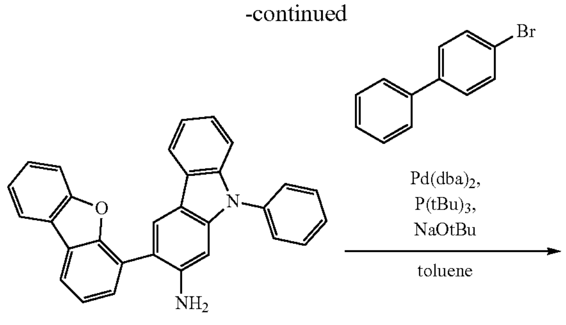

B

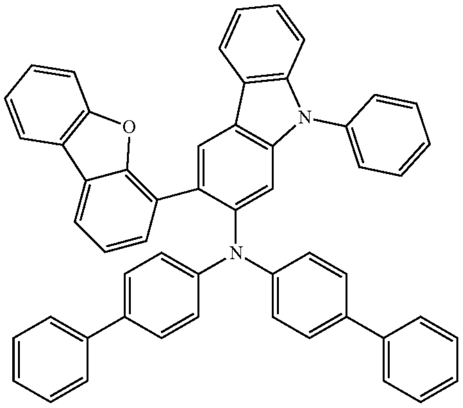

1

Synthesis of Intermediate B

In an argon atmosphere, in a 500 mL three-neck flask, Compound A (5.0 g), dibenzofuran 4-boronic acid (3.2 g), tetrakis(triphenylphosphine)palladium(0) ($Pd(PPh_3)_4$, 1.7 g), and potassium carbonate ($K_2CO_3$, 4.1 g) were added and dissolved in a mixed solvent of toluene, water, and ethanol (10:2:1, 200 mL), and the mixture was heated and stirred at about 80° C. for about 12 hours. The resultant mixture was extracted with dichloromethane ($CH_2Cl_2$) by adding water to obtain organic layers. The obtained organic layers were combined and dried over magnesium sulfate ($MgSO_4$), and the solvent was removed by distillation under reduced pressure. The resulting crude product was purified by silica gel column chromatography to obtain Intermediate B (4.7 g, yield: 75%). The molecular weight of Intermediate B measured by FAB-MS measurement was 424.

Synthesis of Compound 1

In an argon atmosphere, in a 500 mL three-neck flask, Intermediate B (4.0 g), 4-bromobiphenyl (4.4 g), bis(dibenzylideneacetone)palladium(0) ($Pd(dba)_2$, 0.5 g), and sodium tert-butoxide (NaOtBu, 2.7 g) were added and dissolved in toluene (100 mL), and tri-tert-butylphosphine ($P(tBu)_3$, 2.0 M in toluene, 1.0 mL) was added thereto, and the mixture was heated under reflux for about 4 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 1 (4.6 g, yield: 68%). The molecular weight of Compound 1 measured by FAB-MS measurement was 728.

(2) Synthesis of Compound 2
Amine Compound 2 according to an example may be synthesized by, for example, the steps shown in Reaction Scheme 2 below:
[Reaction Scheme 2]
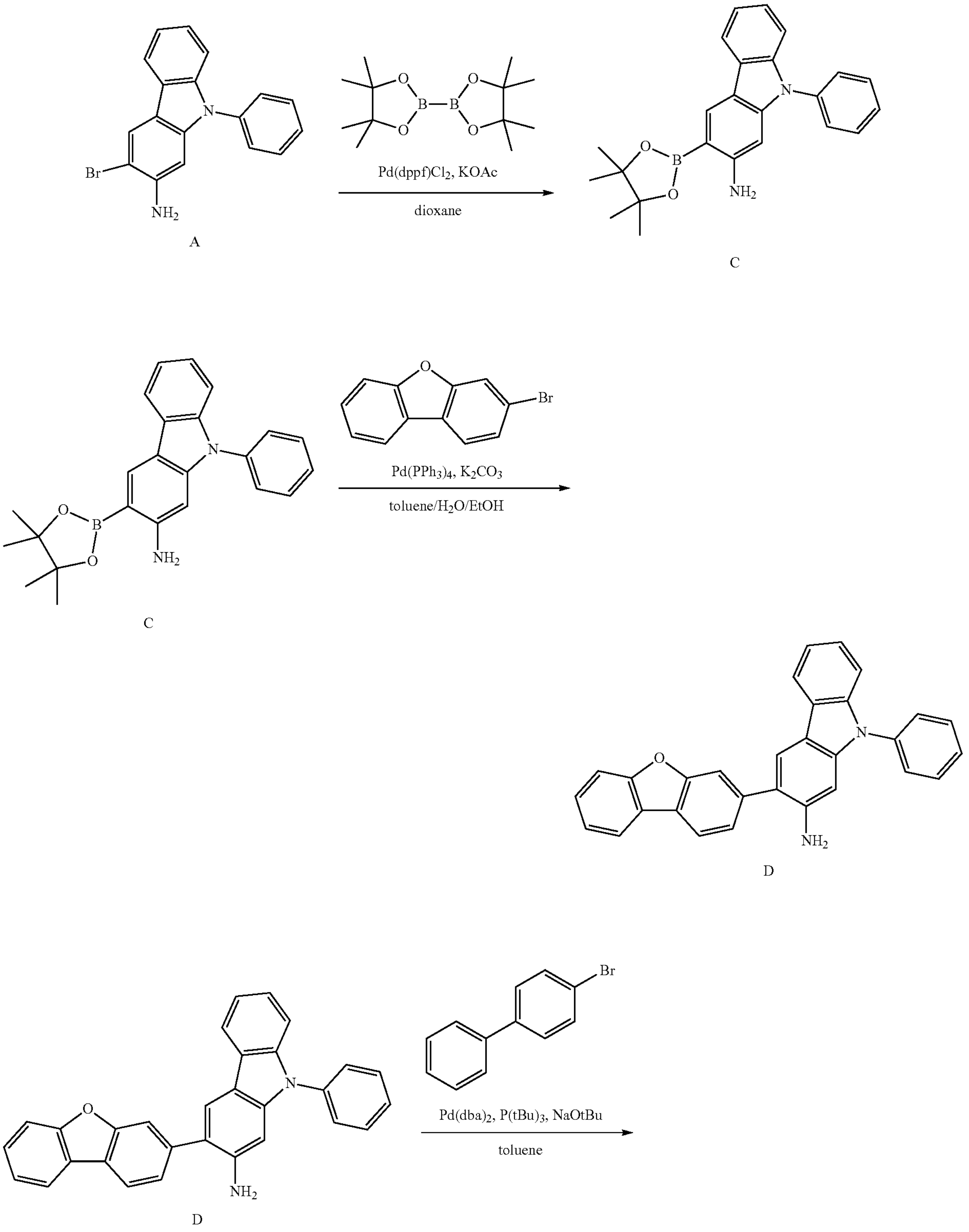

-continued

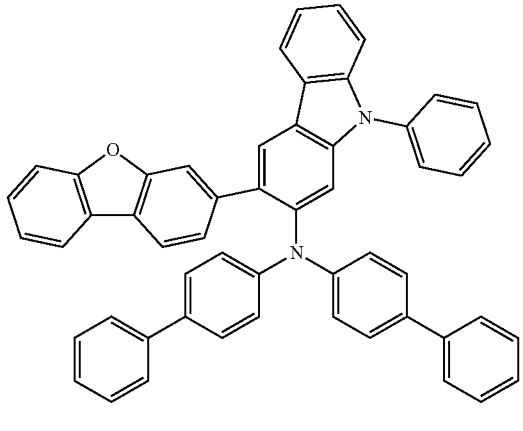

2

Synthesis of Intermediate C

In an argon atmosphere, in a 1000 mL three-neck flask, Intermediate A (25.0 g), bis(pinacolato)diboron (29.2 g), [1,1'-bis(diphenylphosphino)ferrocene]dichloropalladium (II) dichloromethane adduct (Pd(dppf)$Cl_2$, 7.85 g), and potassium acetate (KOAc, 28.1 g) were added and dissolved in dioxane (300 mL), and the mixture was heated and stirred at about 90° C. for about 4 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate C (19.2 g, yield: 65%). The molecular weight of Intermediate C measured by FAB-MS measurement was 308.

Synthesis of Intermediate D

Intermediate D (5.4 g, yield: 62%) was obtained in the same manner as the synthesis of Intermediate B by using Intermediate C (8.0 g) instead of Compound A (5.0 g), and using 3-bromodibenzofuran (5.1 g) instead of dibenzofuran-4-boronic acid (3.2 g). The molecular weight of Intermediate D measured by FAB-MS measurement was 424.

Synthesis of Compound 2

Compound 2 (5.5 g, yield: 65%) was obtained in the same manner as the synthesis of Compound 1 by using Intermediate D (5.0 g) instead of Intermediate B (4.0 g) and using 4-bromobiphenyl (5.1 g) instead of 4-bromobiphenyl (4.4 g). The molecular weight of Compound 2 measured by FAB-MS measurement was 728.

(3) Synthesis of Compound 33

Amine Compound 33 according to an example may be synthesized by, for example, the steps shown in Reaction Scheme 3 below:

[Reaction Scheme 3]

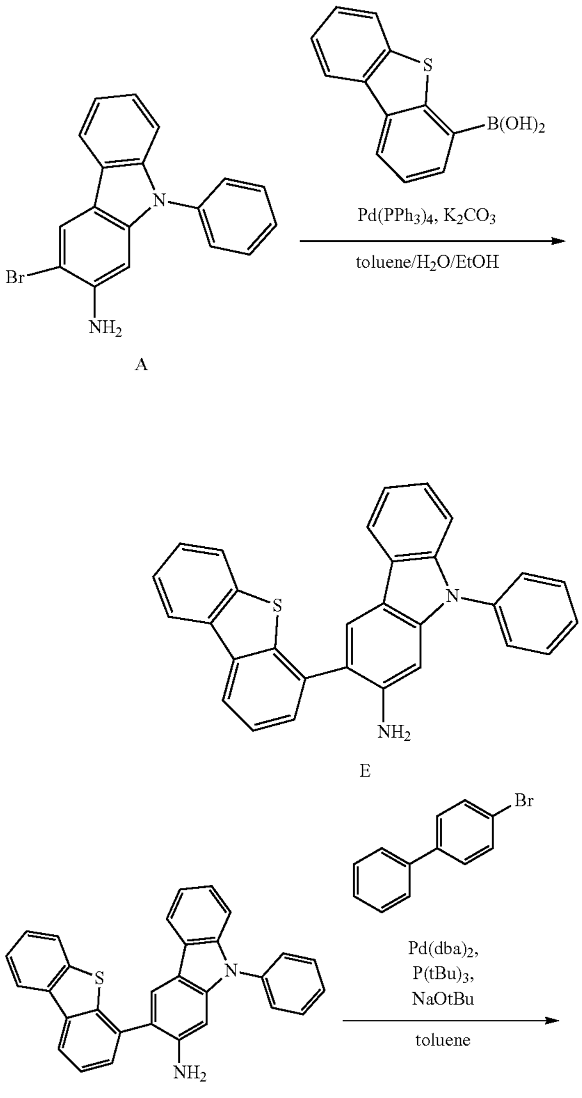

-continued

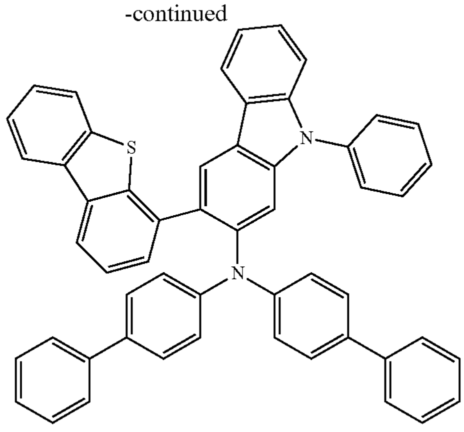

33

Synthesis of Intermediate E

Intermediate E (4.5 g, yield: 70%) was obtained in the same manner as the synthesis of Intermediate B by using Compound A (5.0 g) and dibenzothiophene-4-boronic acid (3.4 g) instead of dibenzofuran-4-boronic acid (3.2 g). The molecular weight of Intermediate E measured by FAB-MS measurement was 440.

Synthesis of Compound 33

Compound 33 (4.0 g, yield: 60%) was obtained in the same manner as the synthesis of Compound 1 by using Intermediate E (4.0 g) instead of Intermediate B (4.0 g) and using 4-bromobiphenyl (4.3 g). The molecular weight of Compound 33 measured by FAB-MS measurement was 744.

(4) Synthesis of Compound 41

Amine Compound 41 according to an example may be synthesized by, for example, the steps shown in Reaction Scheme 4 below:

[Reaction Scheme 4]

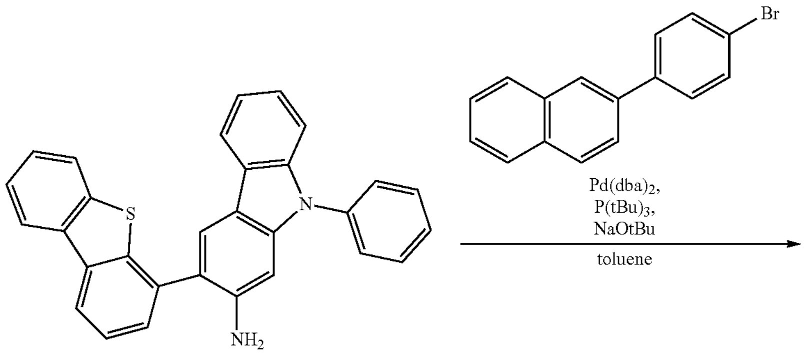

E

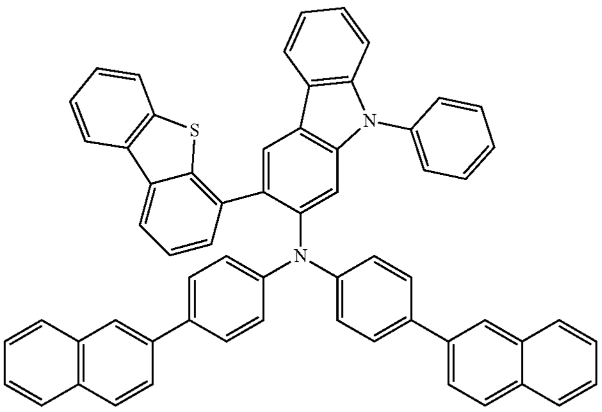

41

Compound 41 (6.3 g, yield: 66%) was obtained in the same manner as the synthesis of Compound 1 by using Intermediate E (5.0 g) instead of Intermediate B (4.0 g) and using 2-(4-bromophenyl)naphthalene (6.5 g) instead of 4-bromobiphenyl (4.4 g). The molecular weight of Compound 41 measured by FAB-MS measurement was 845.

(5) Synthesis of Compound 99

Amine Compound 99 according to an example may be synthesized by, for example, the steps shown in Reaction Scheme 5 below:

[Reaction Scheme 5]

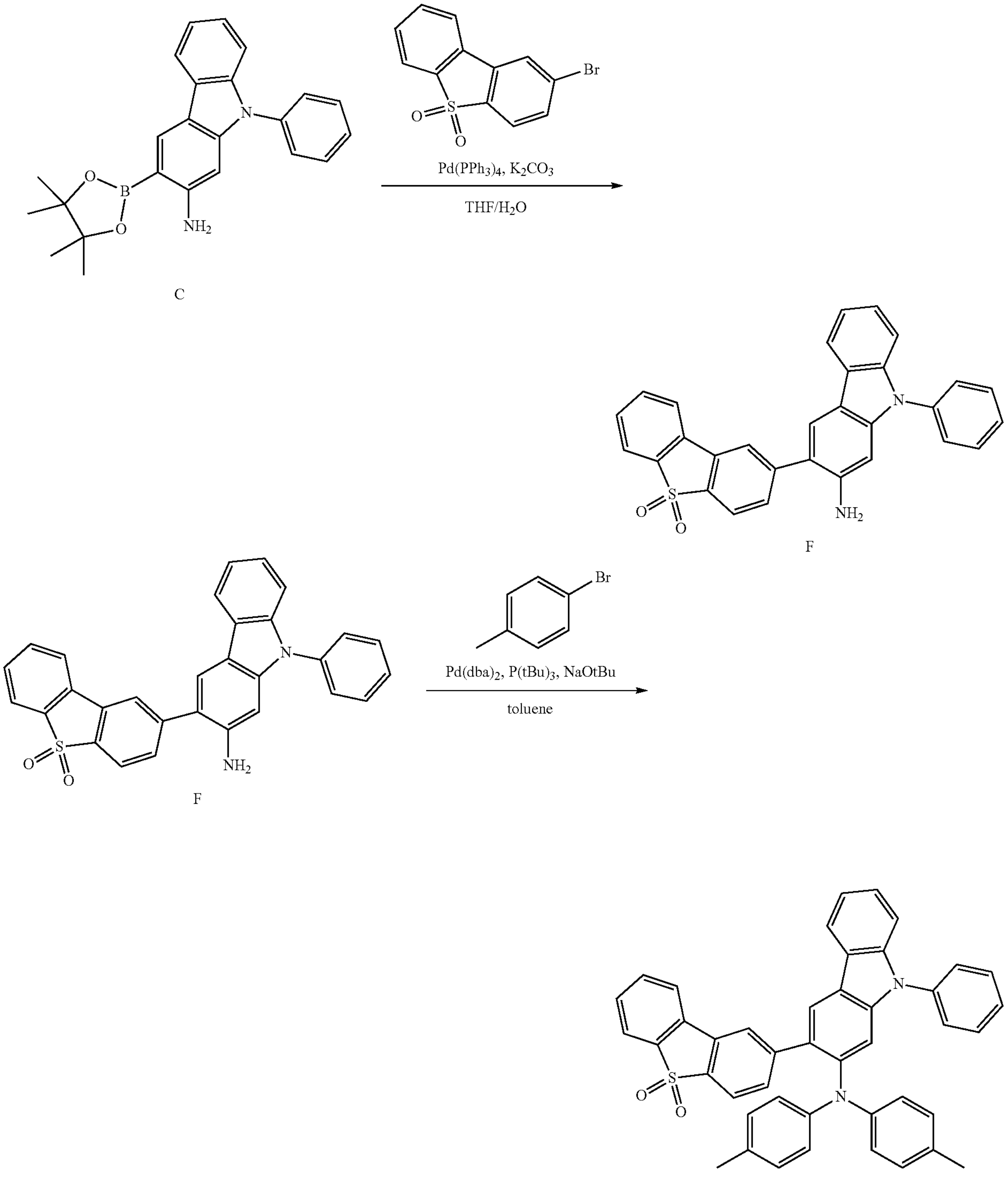

C

F

F

99

Synthesis of Intermediate F

In an argon atmosphere, in a 500 mL three-neck flask, Intermediate C (5.0 g), 2-bromodibenzothiophene 5,5-dioxide (4.2 g), $Pd(PPh_3)_4$ (1.5 g), and $K_2CO_3$ (5.4 g) were added and dissolved in a mixed solvent of tetrahydrofuran (THF) and water (1:1, 200 mL), and the mixture was heated and stirred at about 80° C. for about 12 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate F (5.0 g, yield: 82%). The molecular weight of Intermediate F measured by FAB-MS measurement was 472.

Synthesis of Compound 99

Compound 99 (4.8 g, yield: 70%) was obtained in the same manner as the synthesis of Compound 1 by using Intermediate F (5.0 g) instead of Intermediate B (4.0 g) and using 4-bromotoluene (3.6 g) instead of 4-bromobiphenyl (4.4 g). The molecular weight of Compound 99 measured by FAB-MS measurement was 652.

(6) Synthesis of Compound 101

Amine Compound 101 according to an example may be synthesized by, for example, the steps shown in Reaction Scheme 6 below:

[Reaction Scheme 6]

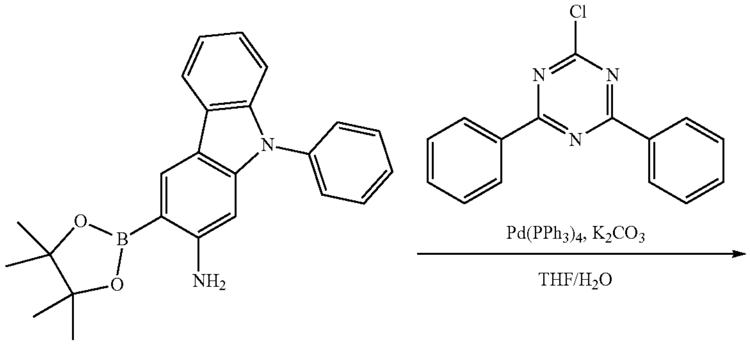

C

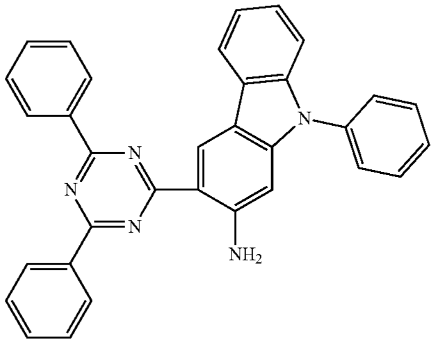

G

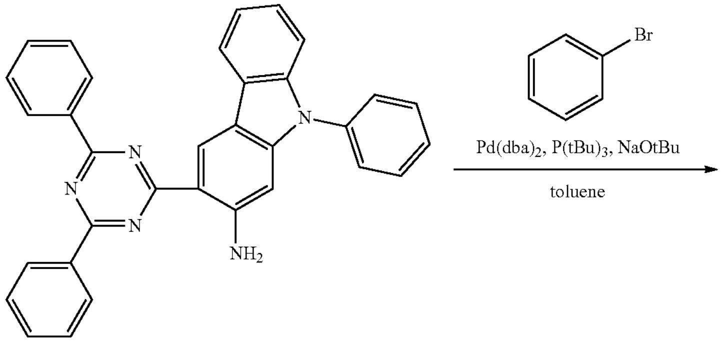

G

-continued

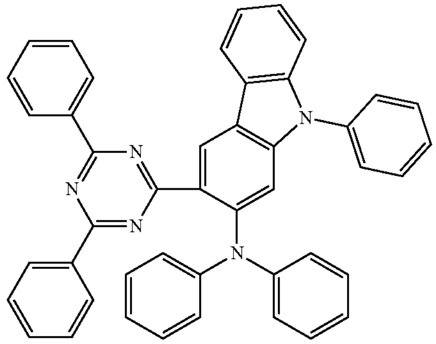

101

Synthesis of Intermediate G

Intermediate G (5.1 g, yield: 81%) was obtained in the same manner as the synthesis of Intermediate F by using Intermediate C (5.0 g) and 2-chloro-4,6-diphenyl-1,3,5-triazine (3.8 g) instead of bromodibenzothiophene 5,5-dioxide (4.2 g). The molecular weight of Intermediate G measured by FAB-MS measurement was 489.

Synthesis of Compound 101

Compound 101 (4.4 g, yield: 68%) was obtained in the same manner as the synthesis of Compound 1 by using Intermediate G (5.0 g) instead of Intermediate B (4.0 g) and using bromobenzene (3.2 g) instead of 4-bromobiphenyl (4.4 g). The molecular weight of Compound 101 measured by FAB-MS measurement was 641.

2. Manufacture and Evaluation of Light Emitting Device

(1) Manufacture and Evaluation of Light Emitting Devices of Comparative Examples 1 and 2 and Examples 1 to 4

Light emitting devices including an amine compound of an example or Comparative Example Compounds X-1 and X-2 in a hole transport layer were manufactured as follows. Compound 1, Compound 2, Compound 33, and Compound 41 which are the amine compounds of examples were used as a hole transport layer material to manufacture the light emitting devices of Examples 1 to 4, respectively. Comparative Example Compound X-1 and X-2 were used in a hole transport layer to manufacture the light emitting devices of Comparative Examples 1 and 2, respectively.

A 1,500 Å-thick ITO was patterned on a glass substrate, the glass substrate was washed with ultrapure water, irradiated with ultraviolet rays for about 30 minutes, and treated with ozone. 2-TNATA was deposited thereon to a thickness of about 600 Å, and Example Compounds or Comparative Example Compounds were deposited to form a 300 Å-thick hole transport region.

TBP and ADN were co-deposited at a ratio of 3:97 to form a 250 Å-thick emission layer. A 250 Å-thick layer was formed on the emission layer with $Alq_3$ and a 10 Å-thick layer was formed with LiF to form an electron transport region. A 1,000 Å-thick second electrode was formed with aluminum (Al).

In the Examples, the hole transport region, the emission layer, the electron transport region, and the second electrode were formed by using a vacuum deposition apparatus. 2-TNATA, TBP, ADN, and $Alq_3$, which are materials used in the art, were used by sublimation purification of commercially available products.

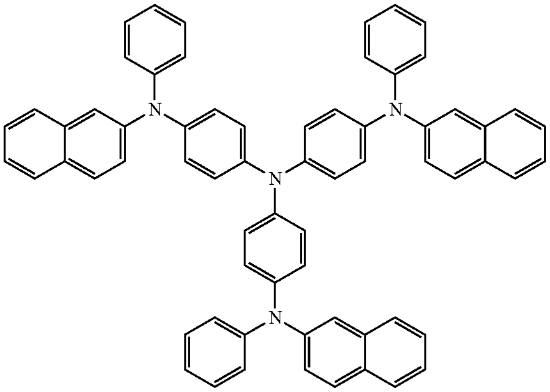

2-TNATA

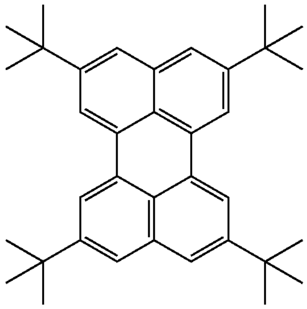

TBP

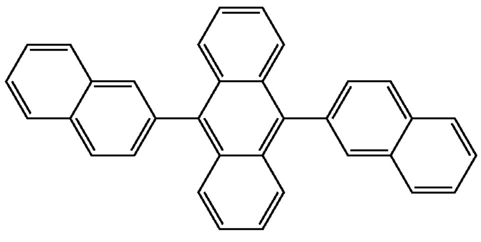

ADN

-continued

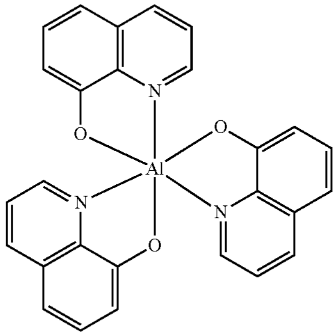

Alq3

(Example Compound)

1

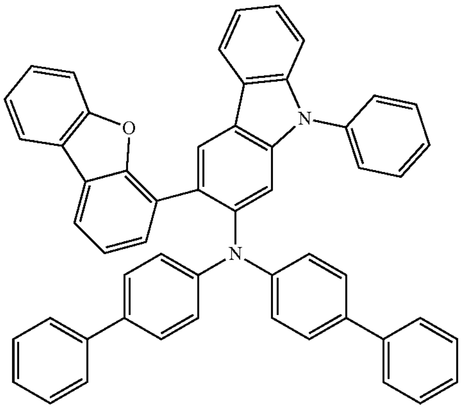

2

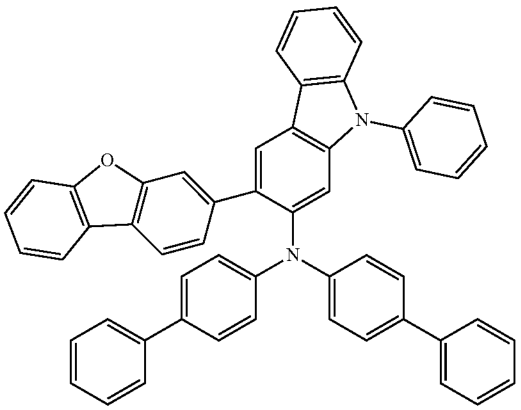

33

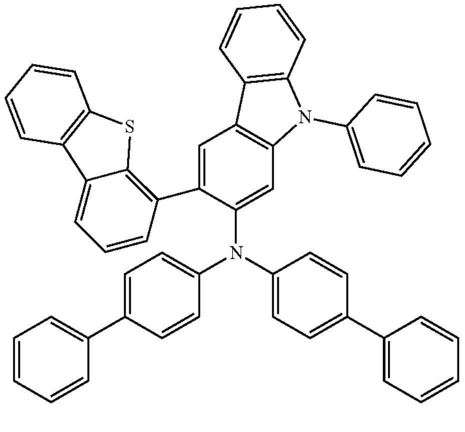

-continued

41

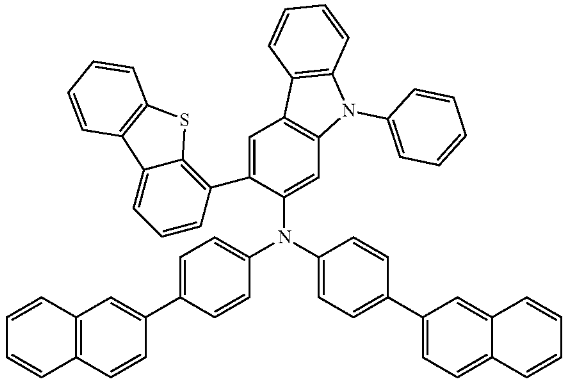

(Comparative Example Compound)

X-1

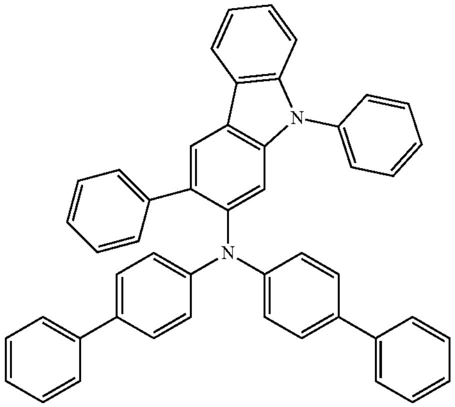

X-2

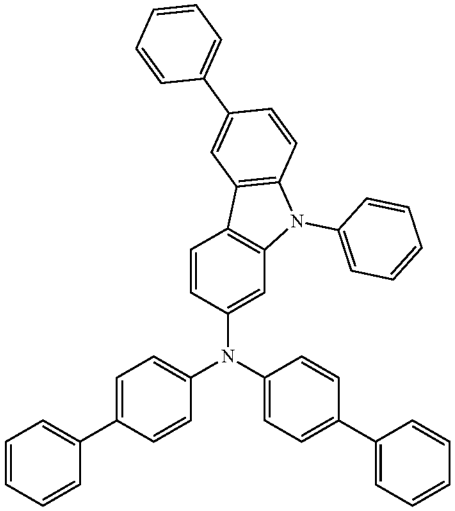

Luminous efficiencies and service lives of the light emitting devices of Examples and Comparative Examples are shown in Table 1 below. In Table 1, the luminous efficiencies and service lives are relative values, which are represented for comparison when it is assumed that the luminous efficiency and service life of the light emitting device of Comparative Example 1 are 100%. The luminous efficiency shows a luminous efficiency value with respect to a current density of 10 $mA/cm^2$. The luminous efficiency was measured by using a brightness light distribution characteristics measurement device, C9920-11 manufactured by Hamamatsu Photonics, inc. The device service life ($LT_{50}$) shows, for comparison, a time taken to reduce the brightness of the light emitting device to 50%.

TABLE 1

| Division | Hole transport layer | Luminous efficiency (%) | Device service life ($LT_{50}$) |
|---|---|---|---|
| Example 1 | Compound 1 | 110% | 110% |
| Example 2 | Compound 2 | 112% | 120% |
| Example 3 | Compound 33 | 115% | 120% |
| Example 4 | Compound 41 | 113% | 150% |
| Comparative Example 1 | Comparative Example Compound X-1 | 100% | 100% |
| Comparative Example 2 | Comparative Example Compound X-2 | 97% | 100% |

Referring to Table 1, it may be seen that the light emitting devices of Example 1 to 4 have excellent luminous efficiencies and device service lives compared to the light emitting devices of Comparative Examples 1 and 2.

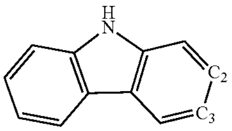

Carbazole

In Comparative Example Compounds and Example Compounds, the amine group is bonded to the 2-position carbon atom ($C_2$) of the carbazole group. In Comparative Example Compounds X-1 and X-2, the phenyl group is bonded to the 3-position carbon atom ($C_3$) of the carbazole group, and in Compounds 1, 2, 33, and 41 which are the amine compounds of examples, the heteroaryl group such as a dibenzofuran group or a dibenzothiophene group is bonded to the 3-position carbon atom ($C_3$) of the carbazole group. Compounds 1, 2, 33, and 41 include the heteroaryl group having a volume larger than the phenyl group, and thus may improve charge transport ability of the nitrogen atom contained in the amine group. In Compounds 1, 2, 33, and 41, the heteroaryl group having a relatively large volume is substituted near the nitrogen atom of the amine group, and thus the nitrogen atom of the amine group may be sterically protected, thereby improving stability of the compound. Thus, it is thought that the light emitting device including the amine compound of an example may exhibit excellent luminous efficiency and long service life characteristics.

(2) Manufacture and Evaluation of Light Emitting Devices of Comparative Examples 3 to 5 and Examples 5 to 9

Light emitting devices including an amine compound of an example or Comparative Example Compound in a hole transport layer were manufactured as follows. Compound 1, Compound 2, and Compound 33, Compound 99, and Compound 101 which are the amine compounds of examples were used as a material for a hole transport layer or an emission layer to manufacture the light emitting devices of Examples 5 to 9, respectively. Comparative Example Compounds X-1 and X-2 were used in a hole transport layer to manufacture the light emitting devices of Comparative Examples 4 and 5, respectively. The light emitting devices of Example 8, Example 9 and Comparative Example 3 were manufactured by using mCP as a hole transport layer material.

A 1,500 Å-thick ITO was patterned on a glass substrate, the glass substrate was washed with ultrapure water, irradiated with ultraviolet rays for about 30 minutes, and treated with ozone. HAT-CN was deposited to a thickness of about 100 Å, α-NPD was deposited to a thickness of about 800 Å, and Example Compound or Comparative Example Compound was deposited to a thickness of about 50 Å to form a hole transport region.

In the manufacture of the light emitting devices of Examples 5 to 7, Compounds 1, 2, and 33 which are Example Compounds were used respectively to form a hole transport layer. In the manufacture of the light emitting devices of Example 8, Example 9 and Comparative Example 3, mCP was used to form a hole transport layer. In the manufacture of the light emitting devices of Comparative Examples 4 and 5, Comparative Example Compounds X-1 and X-2 were used respectively to form a hole transport layer.

A dopant material and mCBP were co-deposited at a ratio of 5:95 to form a 200 Å-thick emission layer. In the manufacture of the light emitting devices of Examples 5 to 7 and Comparative Examples 3 to 5, ACRSA was used as a dopant material. In the manufacture of the light emitting devices of Examples 8 and 9, Compounds 99 and 101 which are Example Compounds were used respectively as a dopant material.

A 300 Å-thick layer was formed on the emission layer with TPBi and a 5 Å-thick layer was formed with LiF to form an electron transport region. A 1,000 Å-thick second electrode was formed with Al. HAT-CN, α-NPD, mCP, mCBP, ACRSA, and TPBi, which are materials used in the art, were used by sublimation purification of commercially available products.

(Example Compound)

1

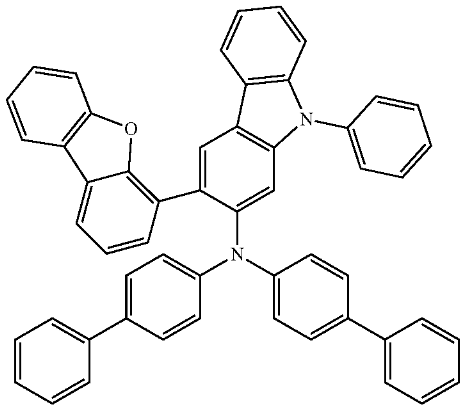

-continued

2

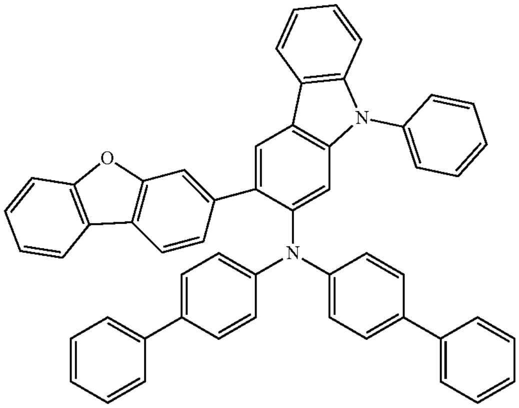

33

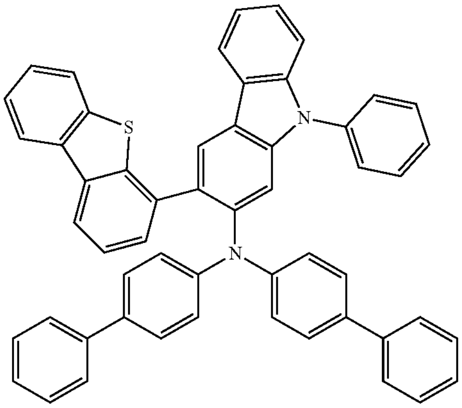

99

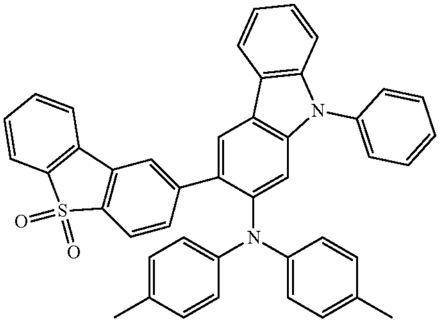

101

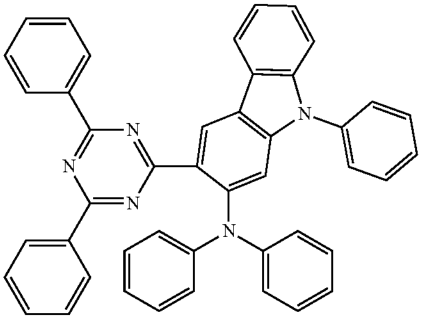

-continued (Comparative Example Compound)

X-1

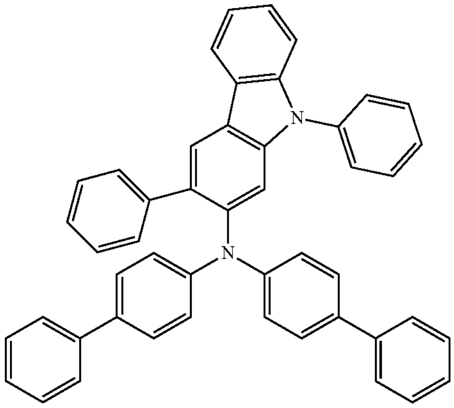

X-2

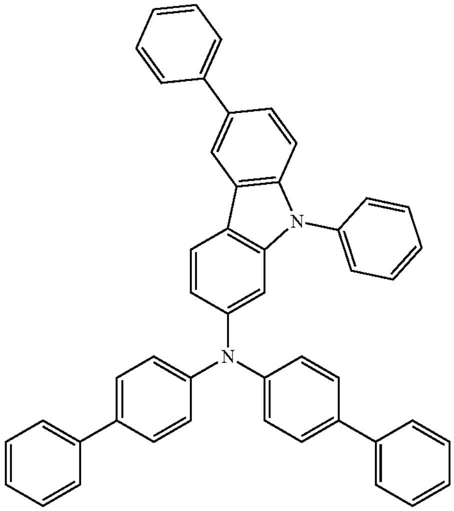

Emission wavelengths and luminous efficiencies of the light emitting devices of Examples and Comparative Examples are shown in Table 2 below. In Table 2, the emission wavelength represents the wavelength showing the maximum value in the emission spectrum. The luminous efficiency is a relative value, which is represented for comparison when it is assumed that the luminous efficiency of the light emitting device of Comparative Example 3 is 100%. The luminous efficiency shows a luminous efficiency value with respect to a current density of 10 mA/cm$^2$. The luminous efficiency was measured by using a brightness light distribution characteristics measurement device, C9920-11 manufactured by Hamamatsu Photonics, Inc.

TABLE 2

| Division | Hole transport layer | Emission layer dopant | Emission wavelength (nm) | Luminous efficiency (%) |
|---|---|---|---|---|
| Example 5 | Compound 1 | ACRSA | 485 | 130% |
| Example 6 | Compound 2 | ACRSA | 485 | 110% |
| Example 7 | Compound 33 | ACRSA | 485 | 120% |
| Example 8 | mCP | Compound 99 | 487 | 105% |
| Example 9 | mCP | Compound 101 | 488 | 108% |

TABLE 2-continued

| Division | Hole transport layer | Emission layer dopant | Emission wavelength (nm) | Luminous efficiency (%) |
|---|---|---|---|---|
| Comparative Example 3 | mCP | ACRSA | 485 | 100% |
| Comparative Example 4 | Comparative Example Compound X-1 | ACRSA | 485 | 103% |
| Comparative Example 5 | Comparative Example Compound X-2 | ACRSA | 485 | 95% |

It may be seen that the light emitting devices of Examples 8 and 9 exhibit improved luminous efficiencies compared to the light emitting device of Comparative Example 3 manufactured by using mCP and ACRSA which are materials of the art. It may be seen that the light emitting devices of Examples 5 to 7 have improved luminous efficiencies compared to the light emitting device of Comparative Example 3 manufactured by using mCP which is a material of the art.

It may be seen that the light emitting devices of Examples 5 to 9 and Comparative Examples 3 to 5 emit blue light from about 400 nm to about 500 nm. It may be seen that mCP, which is a material of the art, may be used as a hole transport material of a thermally activated delayed fluorescence (TADF) device that emits blue light. It may be seen that mCP may be used as a hole transport material of a phosphorescence device that emits blue light.

In Comparative Example Compounds X-1 and X-2, the phenyl group is bonded to the 3-position carbon atom of the carbazole group, and in Compounds 1, 2, and 33 which are the amine compounds of examples, the heteroaryl group is bonded to the 3-position carbon atom of the carbazole group. The heteroaryl group having a volume larger than the phenyl group may improve charge transport characteristics of the nitrogen atom of the amine group bonded to the carbazole group. Thus, it is thought that the amine compound of an example is used as a hole transport material to contribute to improving luminous efficiency.

(Evaluation of Energy Level of Compounds)

Table 3 shows energy levels of Compounds 99 and 101 which are Example Compounds, by evaluation of the energy levels. Lowest singlet exciton energy levels (Si levels), lowest triplet exciton energy levels (T1 levels), and $\Delta E_{ST}$ values of Example Compounds are shown in Table 3.

The energy level values in Table 3 were calculated by a non-empirical molecular orbital method. The value was calculated with B3LYP/6-31G(d) using Gaussian 09 from Gaussian, Inc. (Wallingford, CT, USA). $\Delta E_{ST}$ shows the difference between a lowest singlet exciton energy level (S1 level) and a lowest triplet exciton energy level (T1 level).

TABLE 3

| Division | S1 (eV) | T1 (eV) | $\Delta E_{ST}$ (eV) |
|---|---|---|---|
| Compound 99 | 2.78 | 2.69 | 0.09 |
| Compound 101 | 2.67 | 2.58 | 0.09 |
| ACRSA | 2.85 | 2.82 | 0.03 |

Referring to Table 3, it may be seen that each $\Delta E_{ST}$ of ACRSA and Compounds 99 and 101 which are the amine compounds of examples shows a small value of 0.2 or less. Thus, it is thought that the amine compound of an example is possible to be used as a TADF material. It is thought that referring to the evaluation results with respect to the light emitting devices of Examples 8 and 9 and Comparative Example 3 in Table 2 along with Table 3, Compound 99 and Compound 101 emit blue light by the mechanism similar to that of ACRSA which is a material of the art.

(3) Manufacture and Evaluation of Light Emitting Devices of Comparative Examples 6 to 10 and Examples 10 to 12

Light emitting devices including an amine compound of an example or Comparative Example Compound in a hole transport layer were manufactured as follows. Compound 1, Compound 2, and Compound 33 which are the amine compounds of examples were used as a hole transport layer material to manufacture the light emitting devices of Examples 10 to 12, respectively. The light emitting device of Comparative Example 6 was manufactured by using mCP as a hole transport layer material. Comparative Example Compounds X-1 to X-4 were used in a hole transport layer to manufacture the light emitting devices of Comparative Examples 7 to 10, respectively.

A 1,500 Å-thick ITO was patterned on a glass substrate, the glass substrate was washed with ultrapure water, irradiated with ultraviolet rays for about 30 minutes, and treated with ozone. HAT-CN was deposited to a thickness of about 100 Å, TAPC was deposited to a thickness of about 800 Å, and Example Compound or Comparative Example Compound was deposited to a thickness of about 50 Å to form a hole transport region.

In the manufacture of the light emitting devices of Examples 10 to 12, Compounds 1, 2, and 33 which are Example Compounds were used respectively to form a hole transport layer. In the manufacture of the light emitting devices of Comparative Example 6, mCP was used to form a hole transport layer. In the manufacture of the light emitting devices of Comparative Examples 7 to 10, Comparative Example Compounds X-1 to X-4 were used respectively to form a hole transport layer.

FIrpic and mCBP were co-deposited at a ratio of 5:95 to form a 200 Å-thick emission layer. A 300 Å-thick layer was formed on the emission layer with TmPyPB, and a 5 Å-thick layer was formed with LiF to form an electron transport region. A 1,000 Å-thick second electrode was formed with Al.

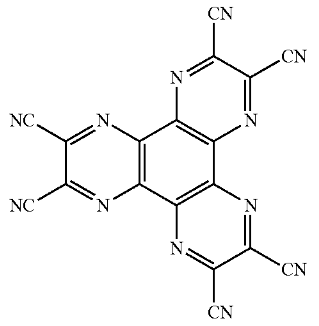

HAT-CN

-continued

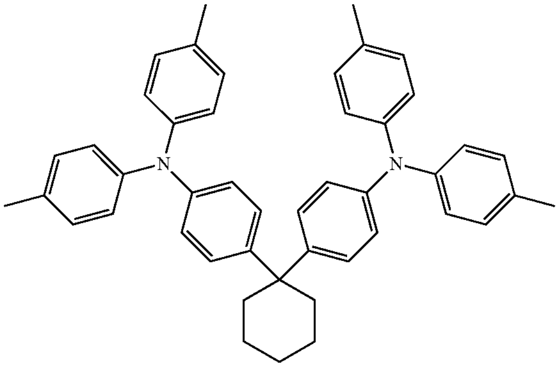

TAPC

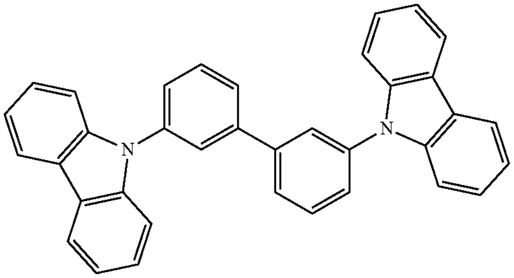

mCBP

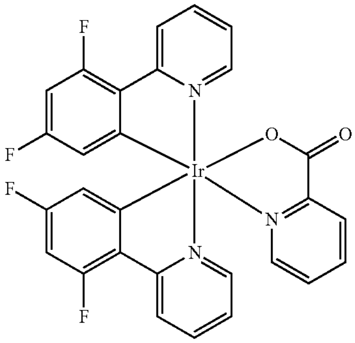

Firpic

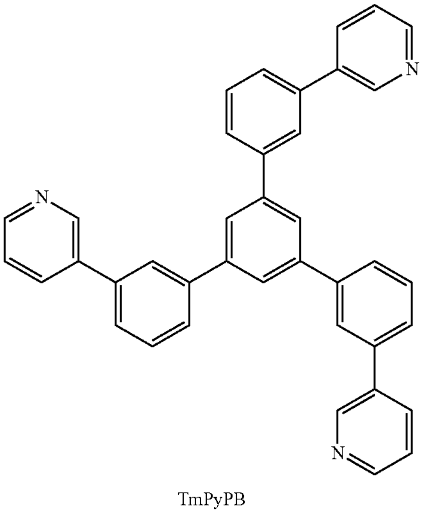 [SMILES: c1cncc(-c2cccc(-c3cc(-c4cccc(-c5cccnc5)c4)cc(-c4cccc(-c5cccnc5)c4)c3)c2)c1]

TmPyPB

In the Examples, the hole transport region, the emission layer, the electron transport region, and the second electrode were formed by using a vacuum deposition apparatus. HAT-CN, TAPC, mCBP, FIrpic, and TmPyPB, which are materials of the art, were used by sublimation purification of commercially available products.

(Example Compound)

1

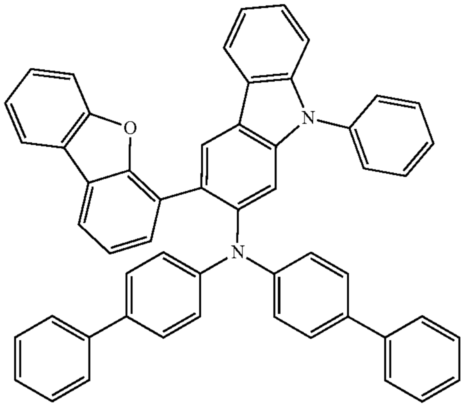

2

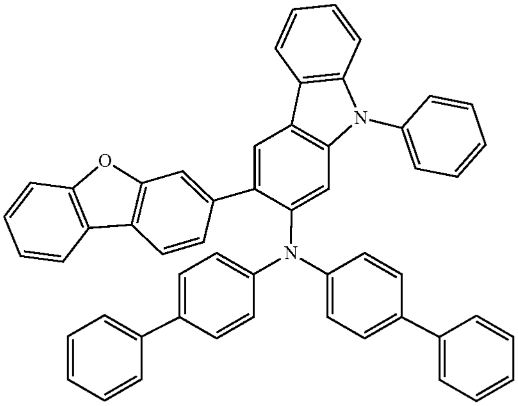

33

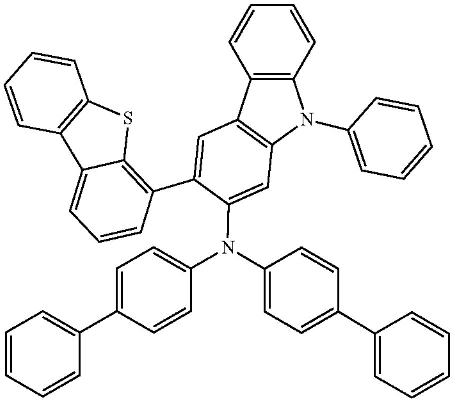

-continued (Comparative Example Compound)

X-1

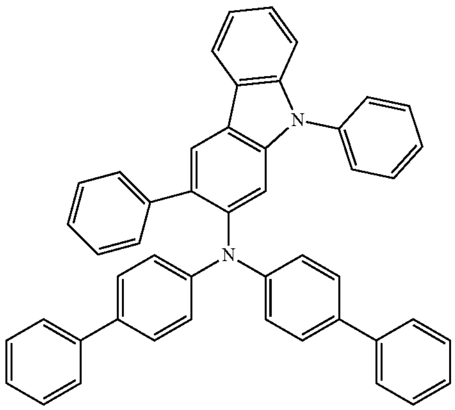

X-2

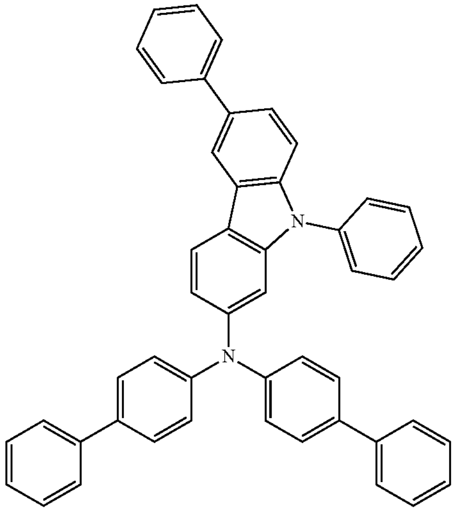

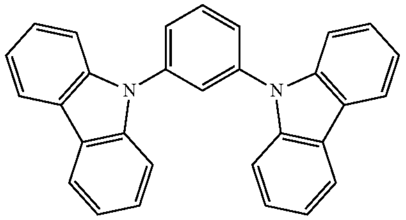

mCP

-continued

X-3

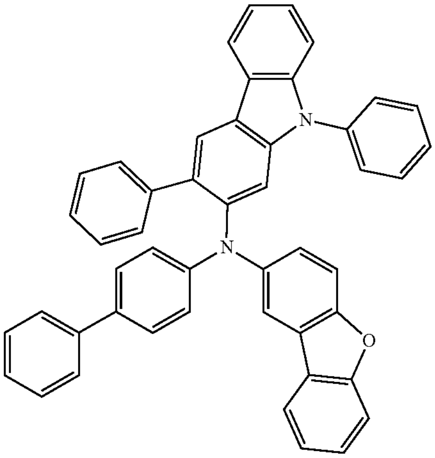

X-4

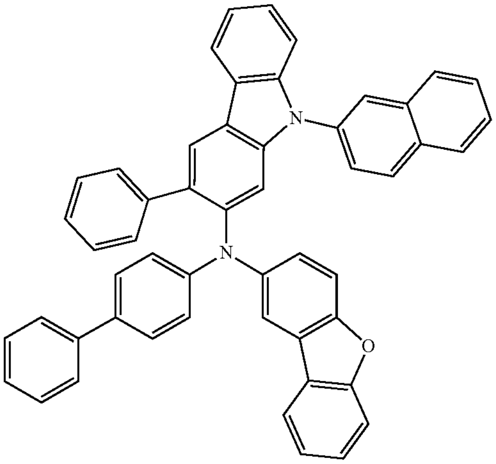

Luminous efficiencies of the light emitting devices of Examples and Comparative Examples are shown in Table 4 below. In Table 4, the luminous efficiency is a relative value, which is represented for comparison when it is assumed that the luminous efficiency of the light emitting device of Comparative Example 6 is 100%. The luminous efficiency shows a luminous efficiency value with respect to a current density of 10 mA/cm$^2$. The luminous efficiency was measured by using a brightness light distribution characteristics measurement device, C9920-11 manufactured by Hamamatsu Photonics, Inc.

TABLE 4

| Division | Hole transport layer | Emission layer dopant | Luminous efficiency (%) |
|---|---|---|---|
| Example 10 | Compound 1 | FIrpic | 122% |
| Example 11 | Compound 2 | FIrpic | 108% |
| Example 12 | Compound 33 | FIrpic | 115% |
| Comparative Example 6 | mCP | FIrpic | 100% |
| Comparative Example 7 | Comparative Example Compound X-1 | FIrpic | 102% |
| Comparative Example 8 | Comparative Example Compound X-2 | FIrpic | 96% |
| Comparative Example 9 | Comparative Example Compound X-3 | FIrpic | 105% |
| Comparative Example 10 | Comparative Example Compound X-4 | FIrpic | 95% |

Referring to Table 4, it may be seen that the light emitting devices of Examples 10 to 12 exhibit excellent luminous efficiencies compared to those of Comparative Examples 6 to 10. The light emitting devices of Examples 10 to 12 include Compounds 1, 2, and 33 which are the amine compounds of examples.

In the amine compounds of examples, the heteroaryl group is bonded to the 3-position carbon atom of the carbazole group, and in Comparative Example Compounds X-1, X-3, and X-4, the phenyl group is bonded to the 3-position carbon atom of the carbazole group. In Comparative Example Compound X-2, the phenyl group is bonded to the carbon atom of the carbazole group. The heteroaryl group having a volume larger than the phenyl group may contribute to improving charge transport characteristics of the nitrogen atom of the amine group bonded to the carbazole group. Thus, it is thought that the light emitting device including the amine compound of an example may exhibit improved luminous efficiency.

(4) Manufacture and Evaluation of Light Emitting Devices of Comparative Example 11 and Examples 13 to 22

Light emitting devices including an amine compound of an example or Comparative Example Compound in a hole transport layer or an emission layer were manufactured as follows. The light emitting devices of Comparative Example 11 and Examples 13 to 22 include a first hole transport layer and a second hole transport layer.

At least one of Compound 1, Compound 2, and Compound 33, which are amine compounds of an embodiment, was used in the first hole transport layer or the second hole transport layer to manufacture the light emitting devices of Examples 13 to 22. Any one of Compound 67 and Compound 102, which is the amine compound of an example, was used as a host material for an emission layer to manufacture the light emitting devices of Examples 19 to 22.

A 1,500 Å-thick ITO was patterned on a glass substrate, the glass substrate was washed with ultrapure water, irradiated with ultraviolet rays for about 30 minutes, and treated with ozone. TCTA or an Example Compound was deposited to a thickness of about 900 Å to form a first hole transport layer, and TCTA or an Example Compound was deposited to a thickness of about 50 Å to form a second hole transport layer.

In the light emitting devices of Examples 13 to 15 and 19 to 22, TCTA was used to form a first hole transport layer. In the manufacture of the light emitting devices of Examples 16 to 18, Compound 1, Compound 2, or Compound 33, which is the amine compound of an example, was used to form a first hole transport layer. In the manufacture of the light emitting devices of Examples 13 to 22, Compound 1, Compound 2, or Compound 33, which is the amine compound of an example, was used to form a second hole transport layer. In the light emitting device of Comparative Example 11, TCTA was used to form a first hole transport layer and a second hole transport layer.

Compound E-1 and a host material were co-deposited at a ratio of 7.5:92.5 to form a 300 Å-thick emission layer. On the emission layer, a 250 Å-thick layer was formed with Compound E-2, a 50 Å-thick layer was formed with $Alq_3$, and a 1 Å-thick layer was formed with LiF to form an electron transport region. A 1,000 Å-thick second electrode was formed with Al.

E-1

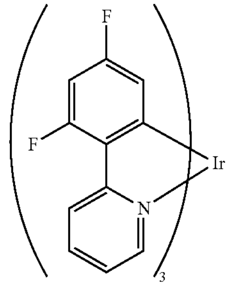

E-2

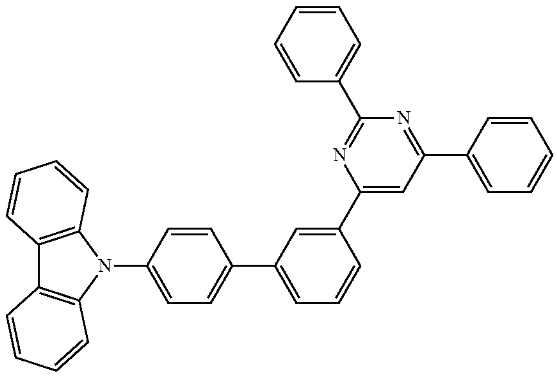

In the Examples, the hole transport region, the emission layer, the electron transport region, and the second electrode were formed by using a vacuum deposition apparatus.

(Example Compound)

1

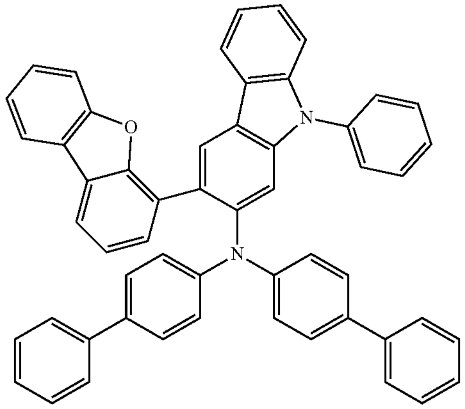

-continued

2

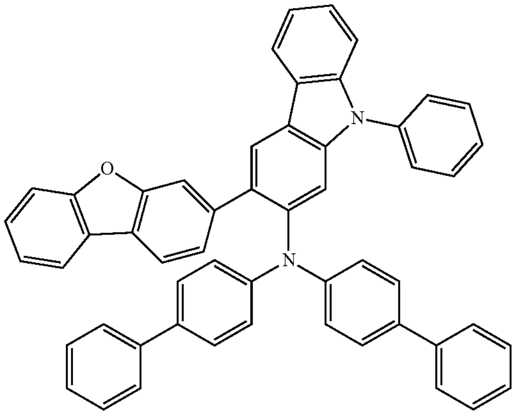

33

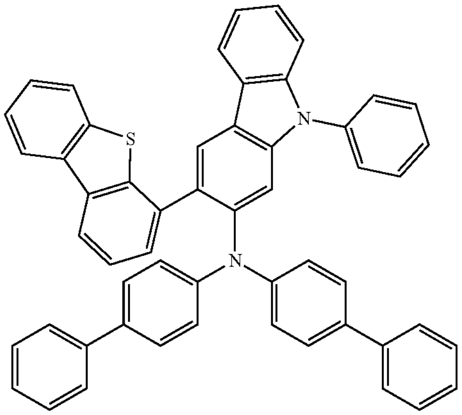

67

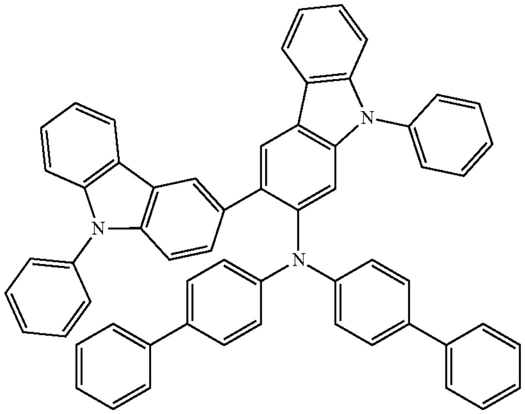

102

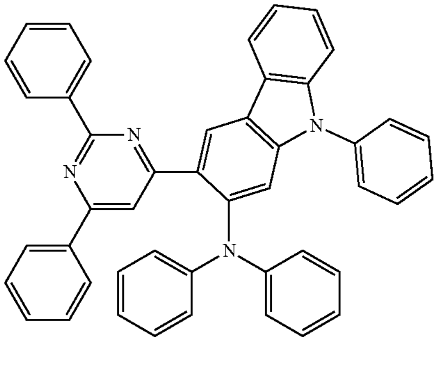

-continued (Comparative Example Compound)

TCTA

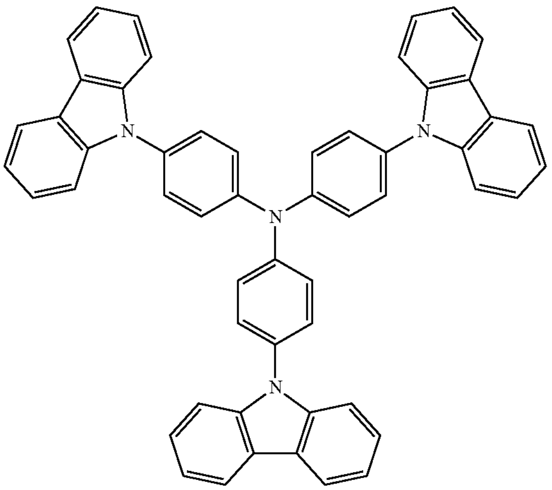

X-5

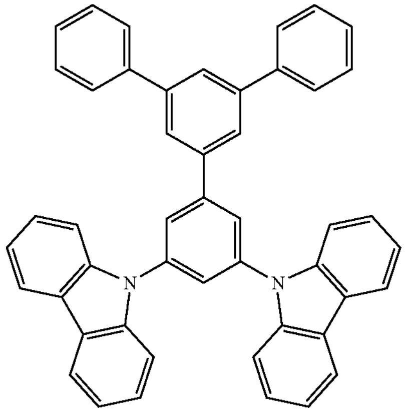

Luminous efficiencies of the light emitting devices of Examples and Comparative Examples are shown in Table 5 below. In Table 5, the luminous efficiency is a relative value, which is represented for comparison when it is assumed that the luminous efficiency of the light emitting device of Comparative Example 9 is 100%. The luminous efficiency shows a luminous efficiency value with respect to a current density of 10 $mA/cm^2$. The luminous efficiency was measured by using a brightness light distribution characteristics measurement device, C9920-11 manufactured by Hamamatsu Photonics, Inc.

TABLE 5

| Division | First hole transport layer | Second hole transport layer | Emission layer host | Luminous efficiency (%) |
|---|---|---|---|---|
| Example 13 | TCTA | Compound 1 | Comparative Example Compound X-5 | 160% |
| Example 14 | TCTA | Compound 2 | Comparative Example Compound X-5 | 140% |
| Example 15 | TCTA | Compound 33 | Comparative Example Compound X-5 | 150% |

TABLE 5-continued

| Division | First hole transport layer | Second hole transport layer | Emission layer host | Luminous efficiency (%) |
|---|---|---|---|---|
| Example 16 | Compound 1 | Compound 1 | Comparative Example Compound X-5 | 140% |
| Example 17 | Compound 2 | Compound 2 | Comparative Example Compound X-5 | 120% |
| Example 18 | Compound 33 | Compound 33 | Comparative Example Compound X-5 | 130% |
| Example 19 | TCTA | Compound 1 | Compound 67 | 130% |
| Example 20 | TCTA | Compound 1 | Compound 102 | 120% |
| Example 21 | TCTA | Compound 33 | Compound 67 | 120% |
| Example 22 | TCTA | Compound 33 | Compound 102 | 120% |
| Comparative Example 11 | TCTA | TCTA | Comparative Example Compound X-5 | 100% |

Referring to Table 5, it may be seen that the light emitting devices of Examples 13 to 22 exhibit excellent luminous efficiencies compared to that of Comparative Example 11. It may be seen that the light emitting devices of Examples 13 to 15 have better luminous efficiencies. Compounds 1, 2, and 33 each include one nitrogen atom except for the nitrogen atom of the carbazole group. It is thought that the light emitting devices of Examples 13 to 15 including Compounds 1, 2, and 33 each including one nitrogen atom except for the nitrogen atom of the carbazole group have improved transport characteristics of holes from the hole transport layer to the emission layer. Therefore, it is thought that the light emitting device, which includes the amine compound of an example in at least one of the hole transport layer and the emission layer, may exhibit improved luminous efficiency. The amine compound of an example may include a carbazole group, the amine group may be bonded to the 2-position carbon atom of the carbazole group, and the heteroaryl group may be bonded to the 3-position. The amine group and the heteroaryl group may be bonded to the ortho-position. The heteroaryl group having a large volume may contribute to improving charge transport ability of the nitrogen atom of the amine group. Therefore, the light emitting device including the amine compound of an example may have improved hole transport characteristics, and may exhibit excellent luminous efficiency characteristics due to the improvement of hole transport characteristics.

The light emitting device of an example may include the amine compound of an example in at least one functional layer of the emission layer and the hole transport region, thereby exhibiting excellent luminous efficiency and improved device service life characteristics.

The light emitting device of an embodiment may include the amine compound of an embodiment in the hole transport region, thereby exhibiting high efficiency and long service life characteristics.

The amine compound of an embodiment may improve luminous efficiency and a device service life of the light emitting device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device comprising:

a first electrode;

a second electrode disposed on the first electrode; and at least one functional layer disposed between the first electrode and the second electrode and comprising an amine compound represented by one of Formula 1-1, Formula 1-2, Formula 1-3, or Formula 1-6:

[Formula 1-1]

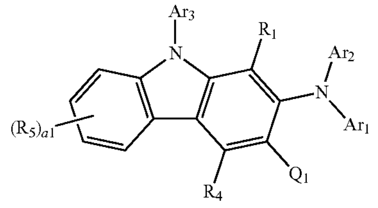

[Formula 1-2]

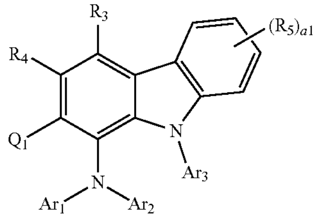

[Formula 1-3]

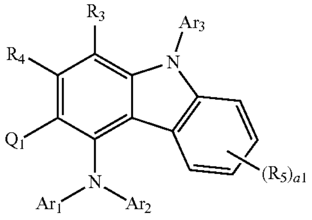

[Formula 1-6]

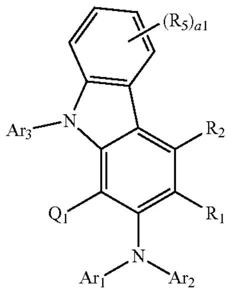

wherein in Formula 1-1, Formula 1-2, Formula 1-3, and Formula 1-6, $Q_1$ is a substituted or unsubstituted heteroaryl group having 2 to 30 ring-forming carbon atoms, $Ar_1$ and $Ar_2$ are each independently a substituted or unsubstituted aryl group having 6 to 30 ring-forming carbon atoms, or a substituted or unsubstituted heteroaryl group of 2 to 30 ring-forming carbon atoms, and $R_1$, $R_2$, $R_3$, and $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Ar_3$ is a substituted or unsubstituted aryl group having 6 to 30 ring-forming carbon atoms, or a substituted or unsubstituted heteroaryl group having 2 to 30 ring-forming carbon atoms, a1 is an integer from 0 to 4, and $R_5$ is a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

2. The light emitting device of claim 1, wherein $Q_1$ is a substituted or unsubstituted dibenzofuran group, a substituted or unsubstituted dibenzothiophene group, a substituted or unsubstituted carbazole group, a substituted or unsubstituted dibenzosilole group, a substituted or unsubstituted dibenzothiophene sulfone group, a substituted or unsubstituted pyridine group, a substituted or unsubstituted pyrimidine group, or a substituted or unsubstituted triazine group.

3. The light emitting device of claim 1, wherein the amine compound is represented by Formula 3:

[Formula 3]

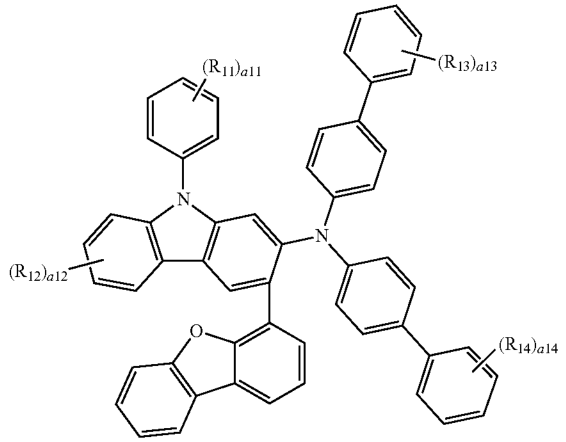

wherein in Formula 3, a11, a13, and a14 are each independently an integer from 0 to 5, a12 is an integer from 0 to 4, and at least one of $R_{11}$ to $R_{14}$ is a deuterium atom, and the remainder of $R_{11}$ to $R_{14}$ are hydrogen atoms.

4. The light emitting device of claim 1, wherein $Ar_1$ and $Ar_2$ are each independently represented by one of A-1 to A-3:

A-1

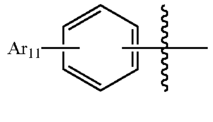

-continued

A-2

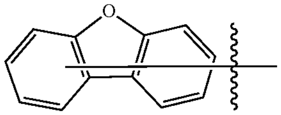

A-3

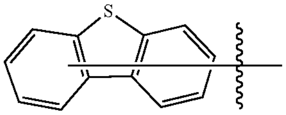

wherein in A-1, $Ar_{11}$ is a hydrogen atom, a methyl group, or a substituted or unsubstituted aryl group having 6 to 30 ring-forming carbon atoms, and wherein A-1 to A-3,

indicates a binding site to a neighboring atom.

5. The light emitting device of claim 1, wherein $Ar_1$ and $Ar_2$ are the same as each other.

6. The light emitting device of claim 1, wherein $Ar_3$ is a substituted or unsubstituted phenyl group, an unsubstituted naphthyl group, an unsubstituted phenanthryl group, an unsubstituted triphenyl group, an unsubstituted naphthobenzofuran group, or an unsubstituted benzonaphthothiophene group.

7. The light emitting device of claim 1, wherein the difference value between a lowest singlet exciton energy level and a lowest triplet exciton energy level of the amine compound is equal to or less than about 0.2 eV.

8. The light emitting device of claim 1, wherein the at least one functional layer comprises:

an emission layer;

a hole transport region disposed between the first electrode and the emission layer; and an electron transport region disposed between the emission layer and the second electrode, and at least one of the hole transport layer and the emission layer comprises the amine compound.

9. The light emitting device of claim 1, wherein the at least one functional layer comprises:

an emission layer;

a hole transport region disposed between the first electrode and the emission layer; and an electron transport region disposed between the emission layer and the second electrode, the hole transport region comprises:

a hole injection layer disposed on the first electrode;

a hole transport layer disposed on the hole injection layer; and an electron blocking layer disposed on the hole transport layer, and at least one of the hole injection layer, the hole transport layer, and the electron blocking layer comprises the amine compound.

10. The light emitting device of claim 1, wherein the amine compound is one selected from Compound Group 1:

[Compound Group 1]
1
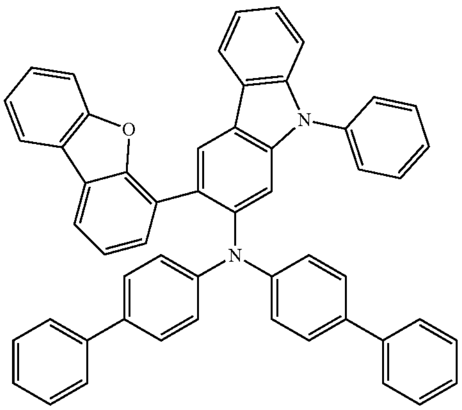
2
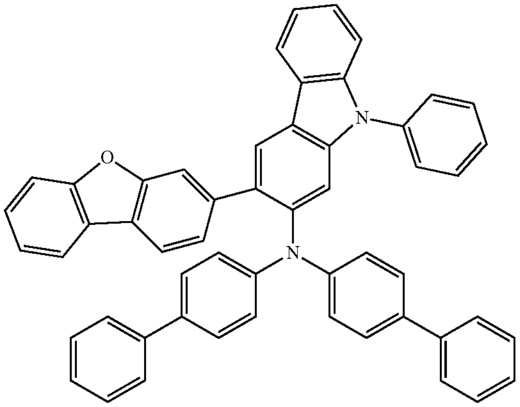
3
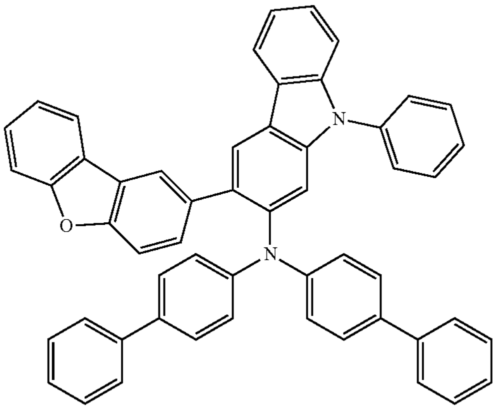
-continued
4
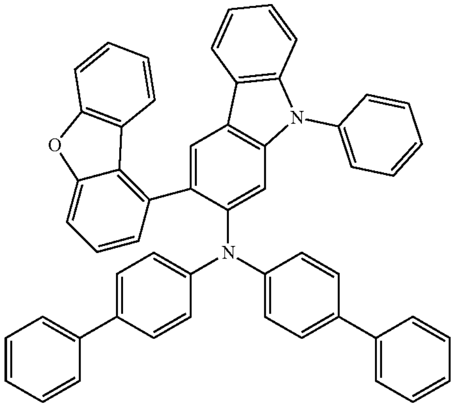
5
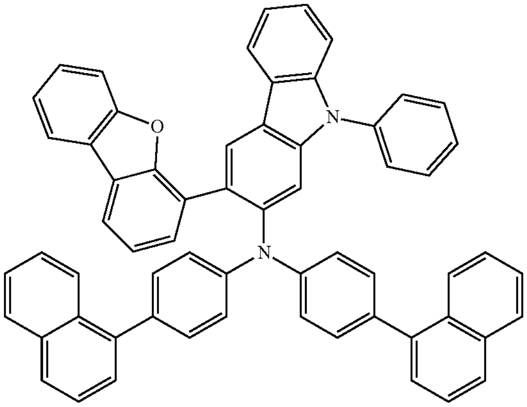
6
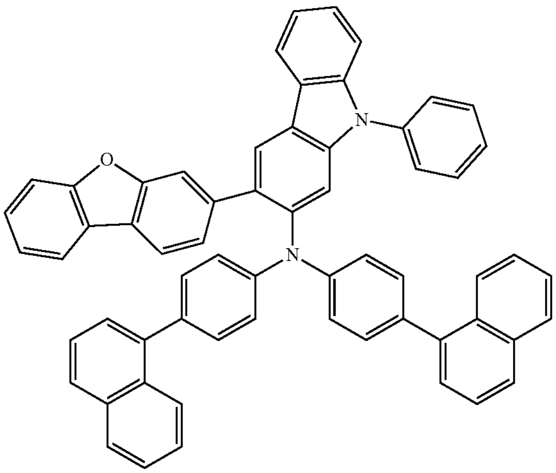

-continued
7
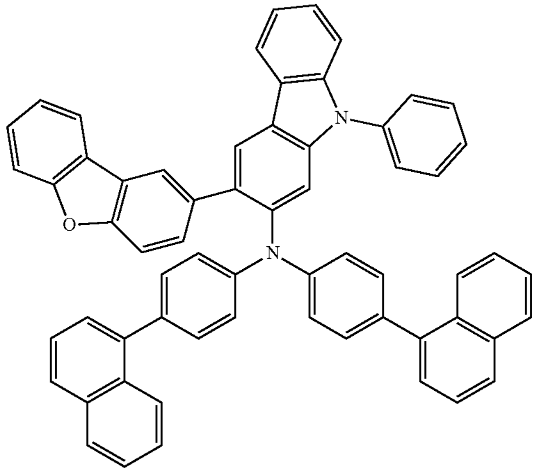
8
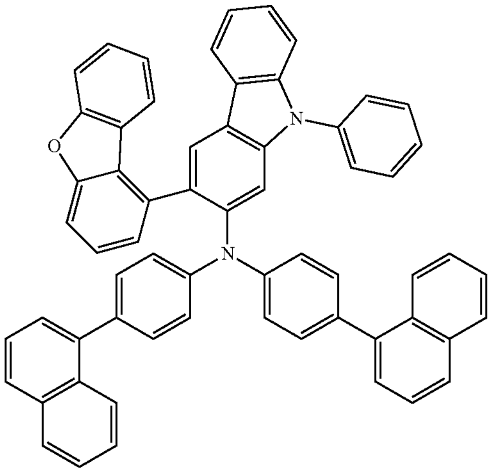
9
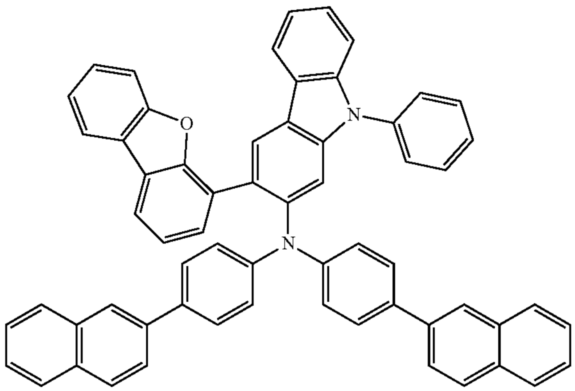
-continued
10
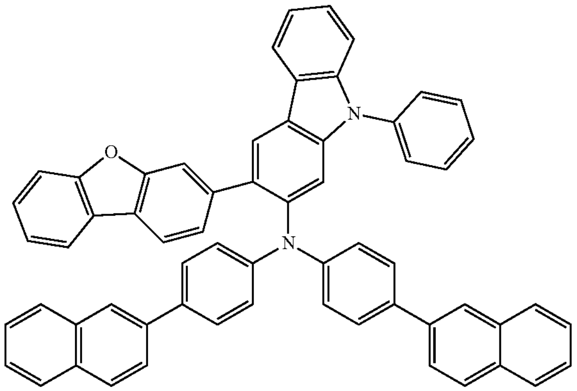
11
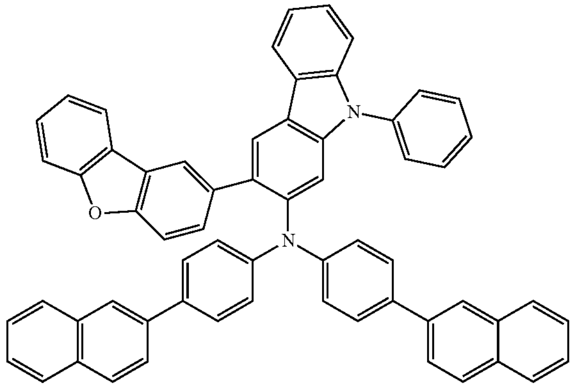
12
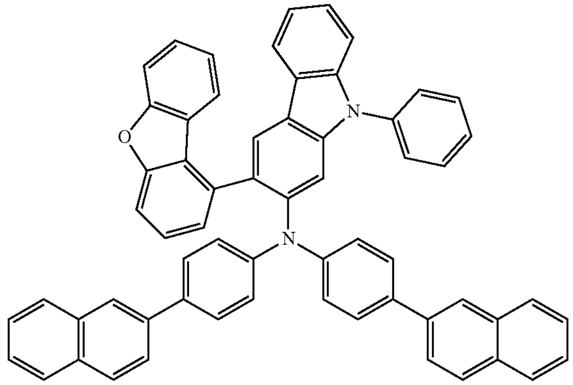
13
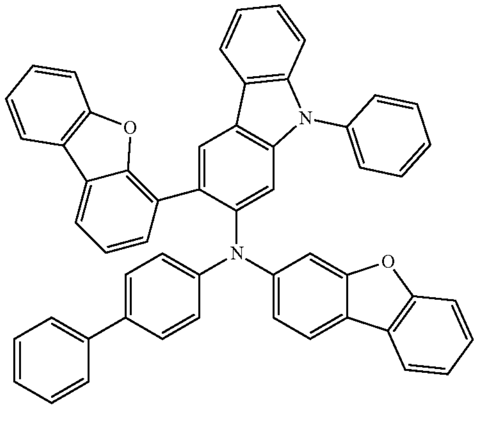

-continued
14
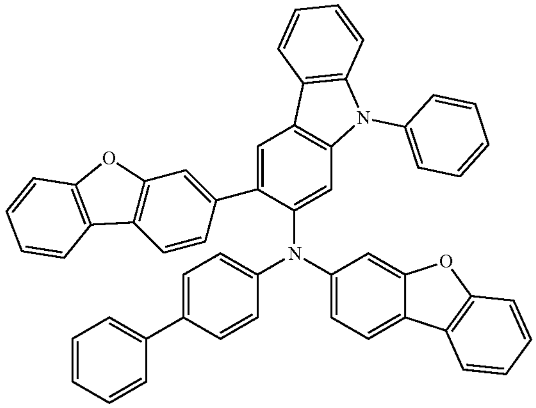
15
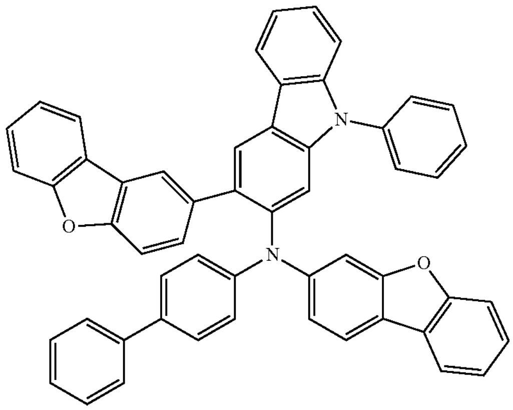
16
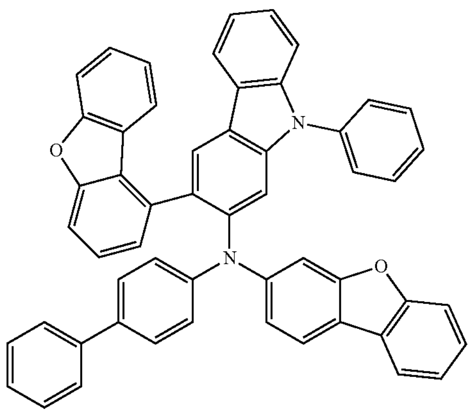
-continued
17
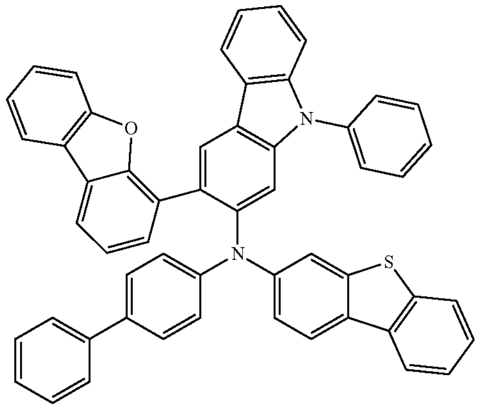
18
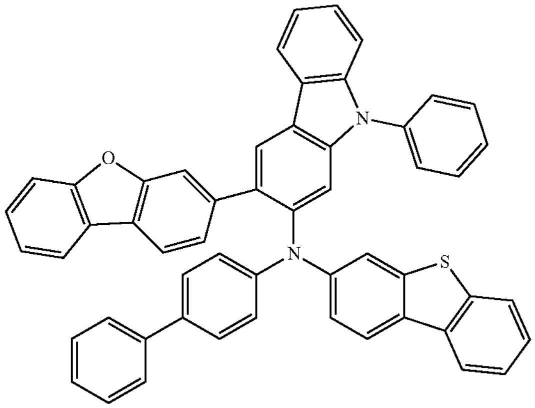
19
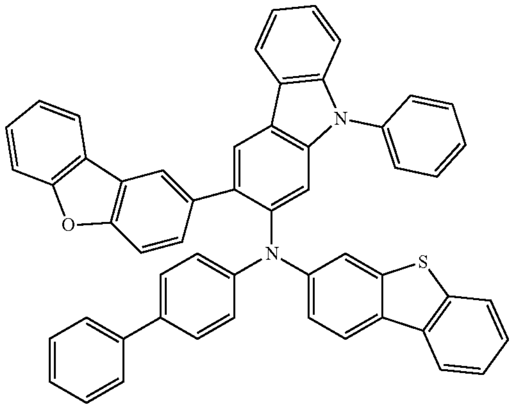

-continued
20
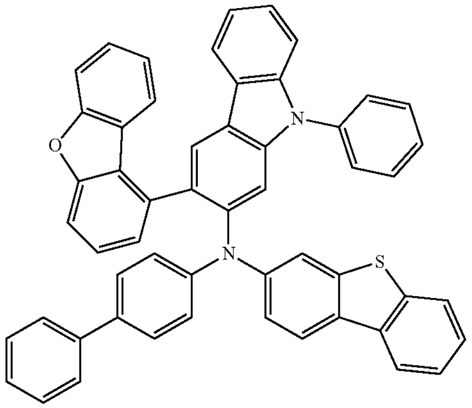
21
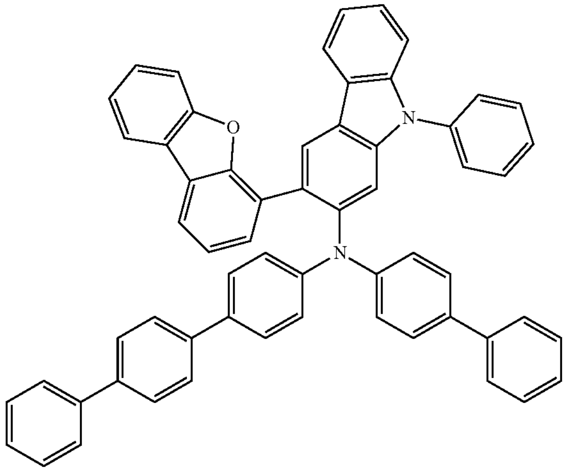
22
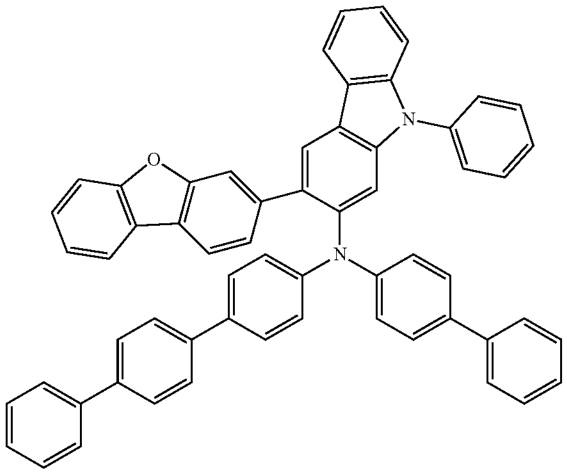
-continued
23
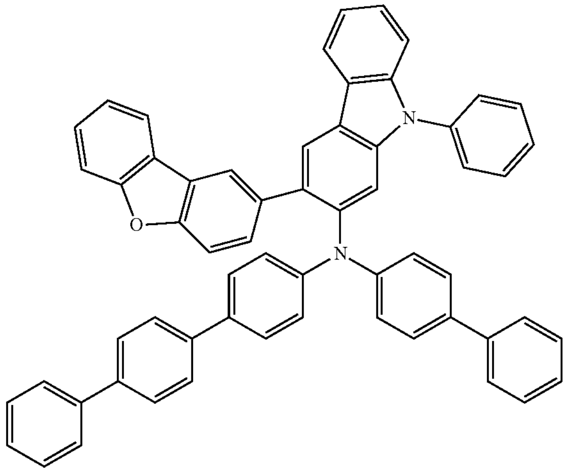
24
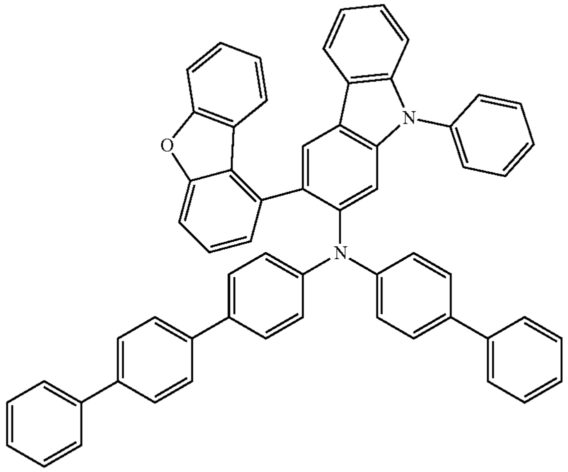
25
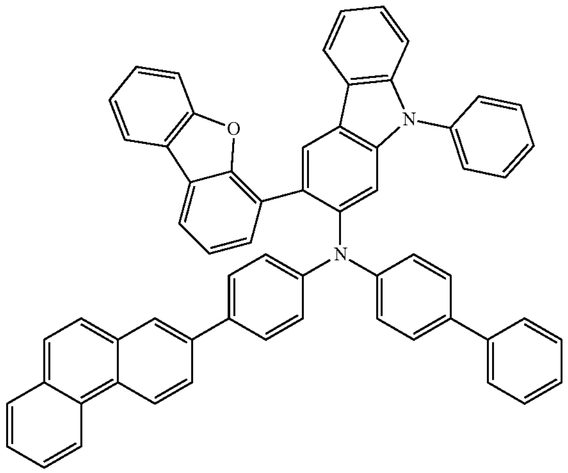

-continued
26
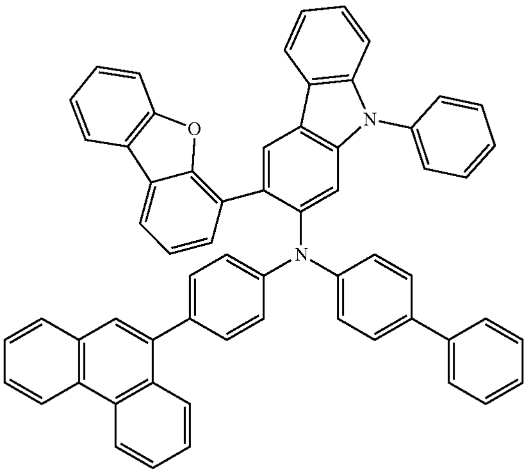
27
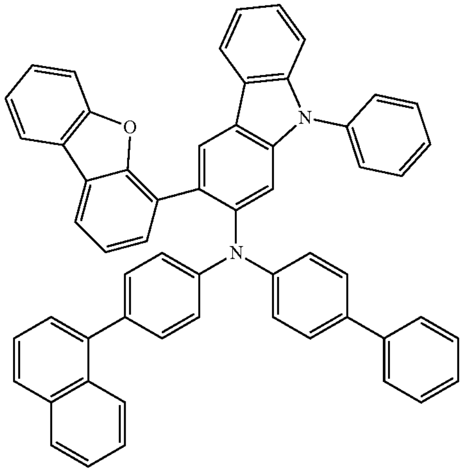
28
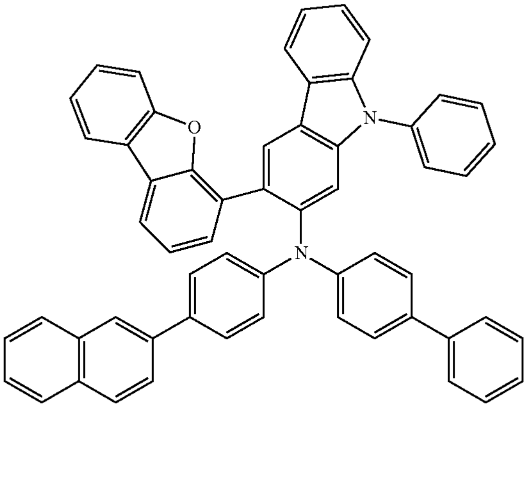
-continued
29
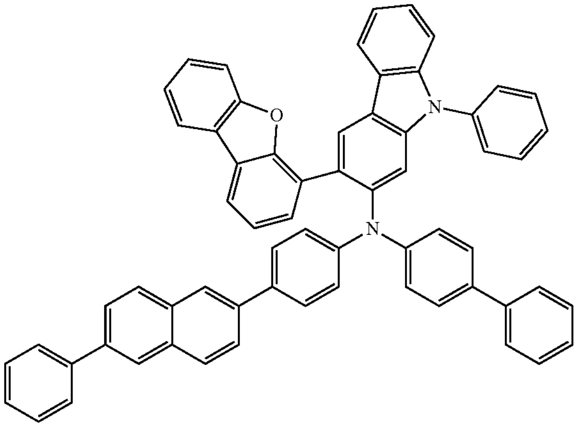
30
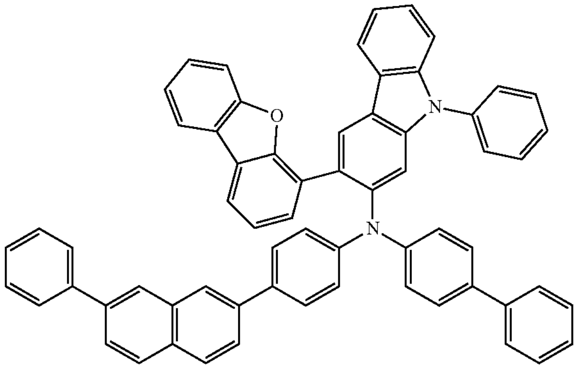
31
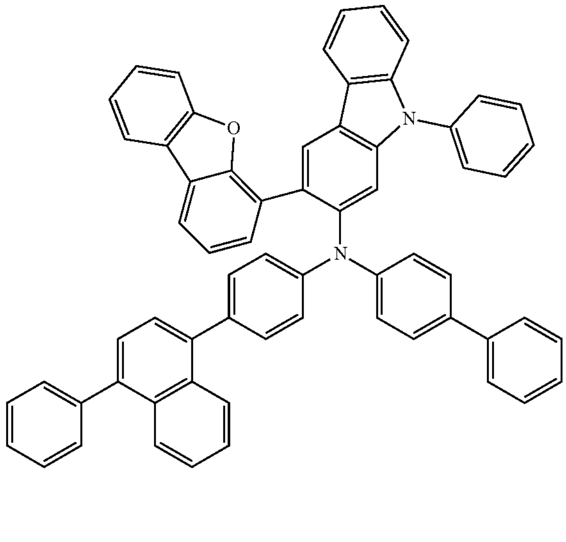

-continued
32
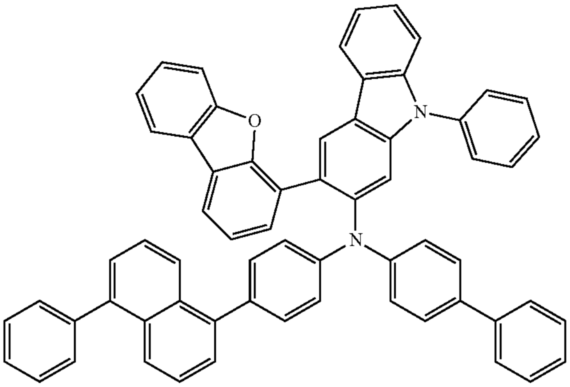
33
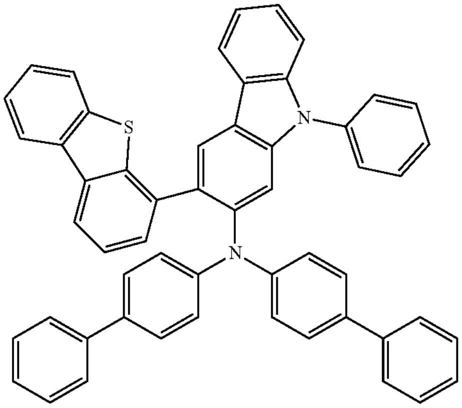
34
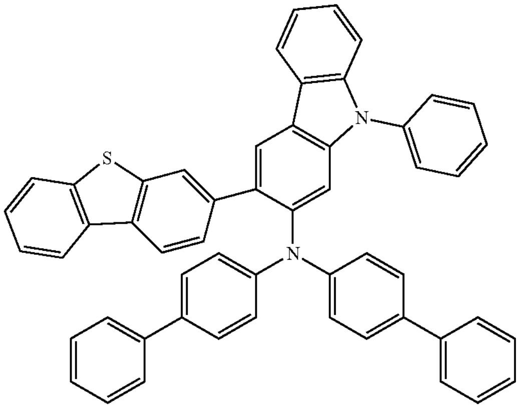
-continued
35
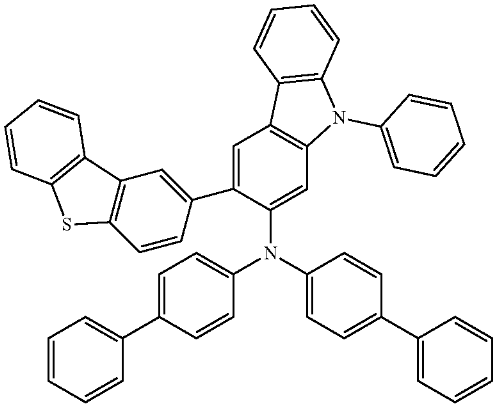
36
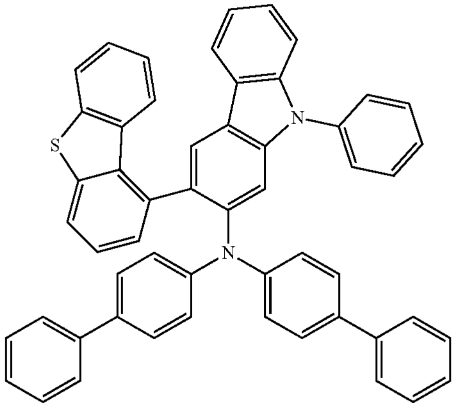
37
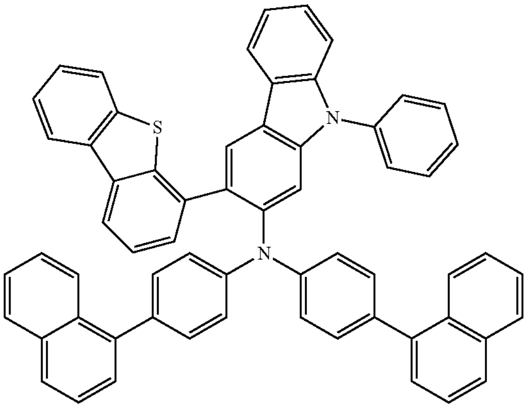

-continued
38
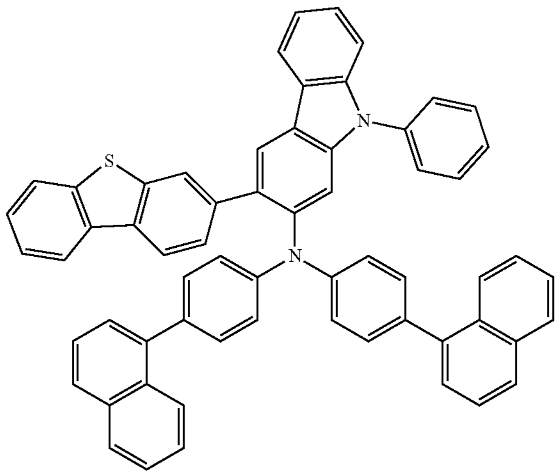
39
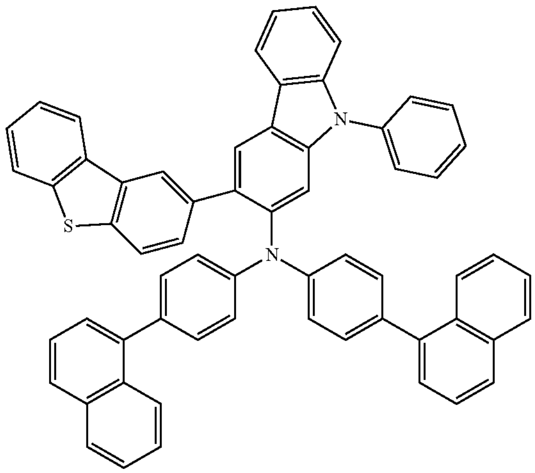
40
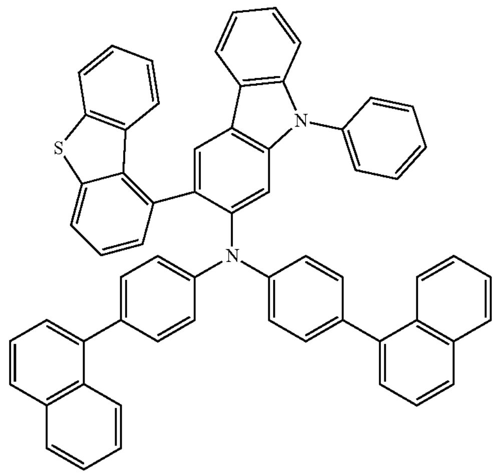
-continued
41
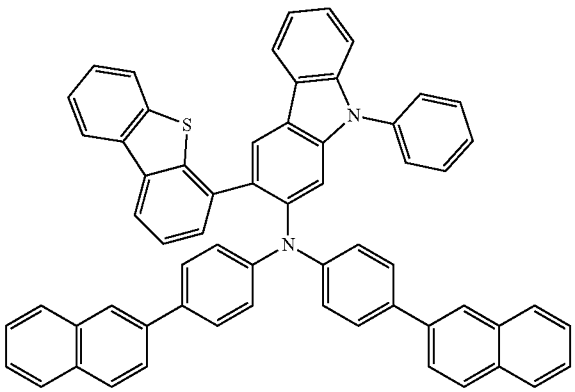
42
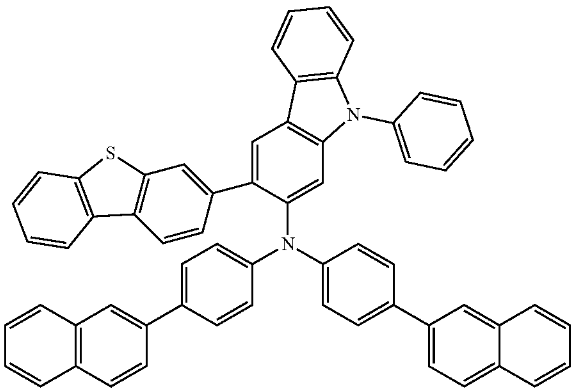
43
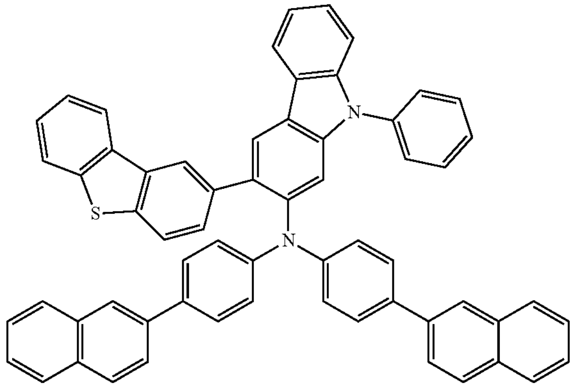
44
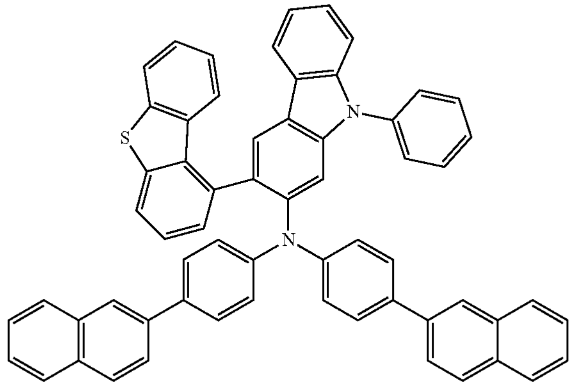

-continued
45
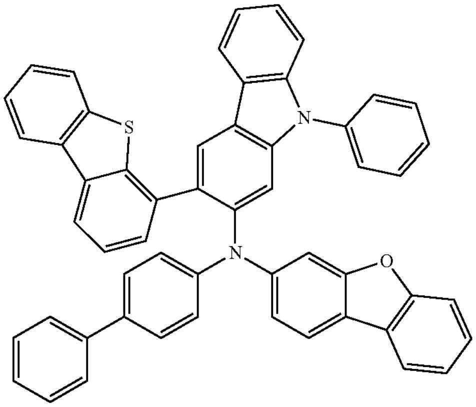
46
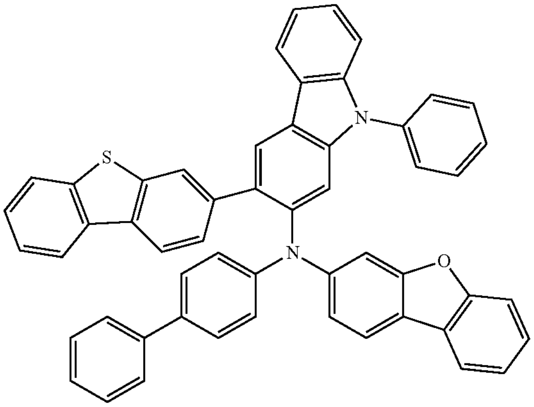
47
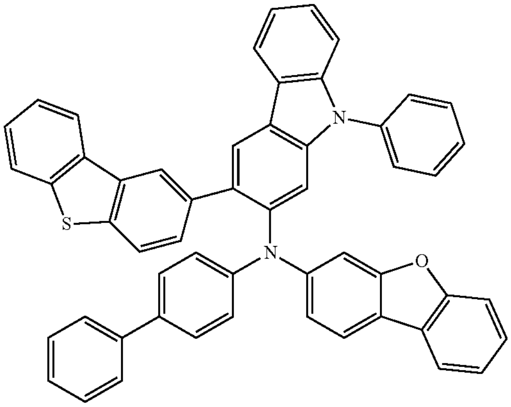
-continued
48
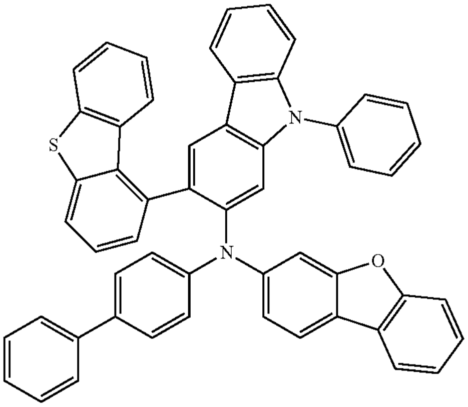
49
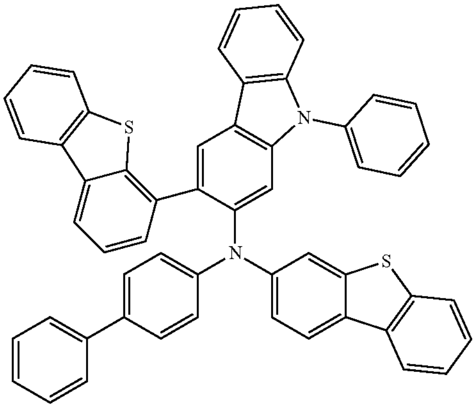
50
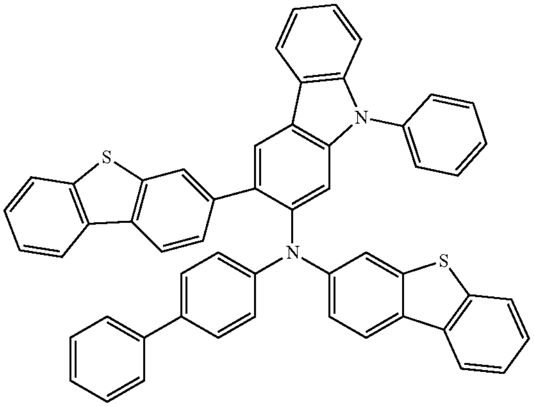

-continued
51
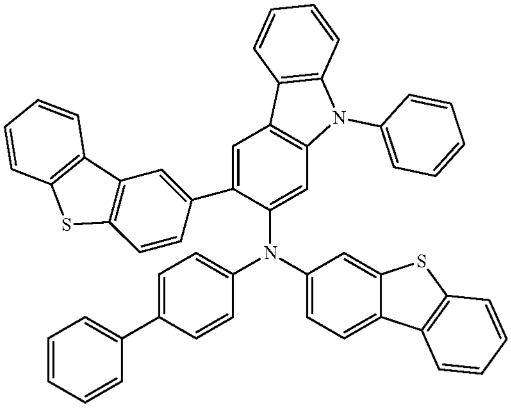
52
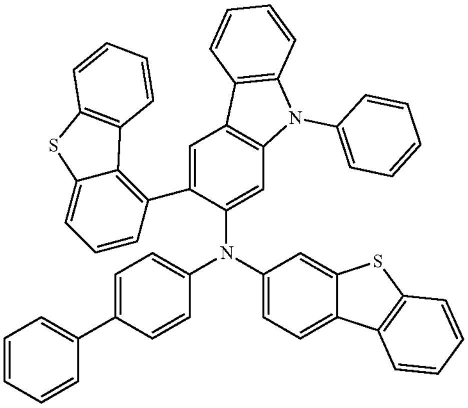
53
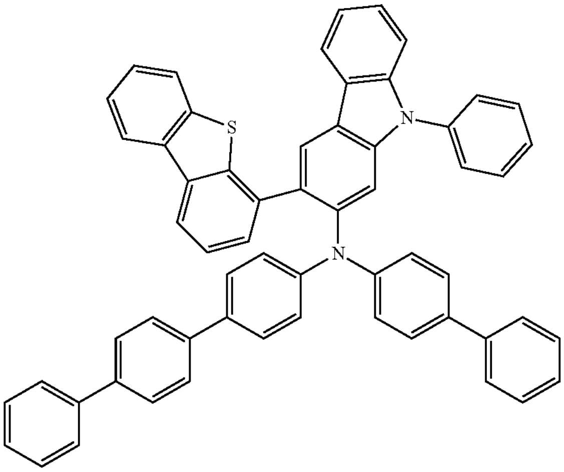
-continued
54
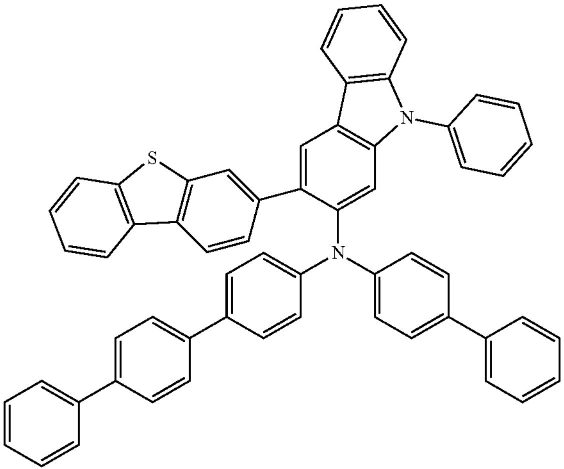
55
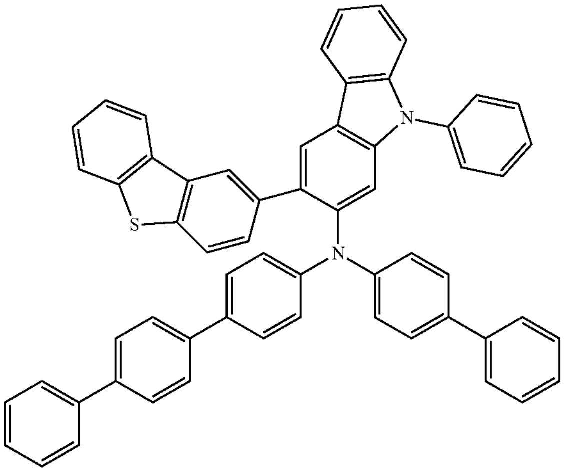
56
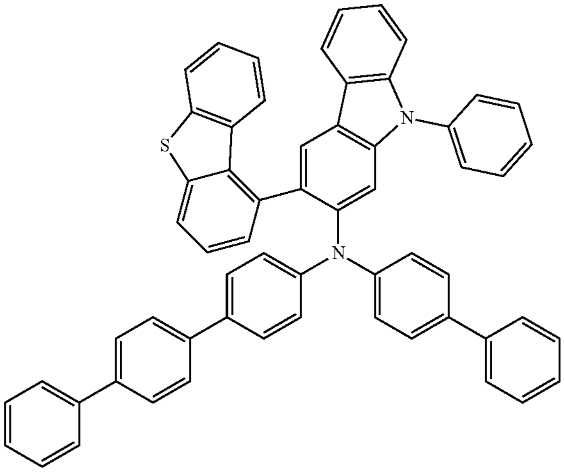

154
-continued
57
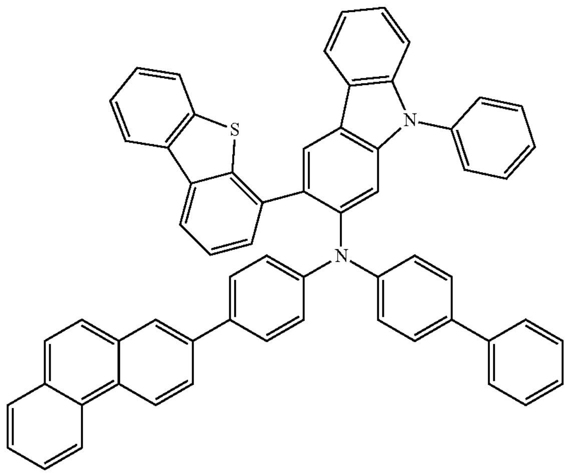
58
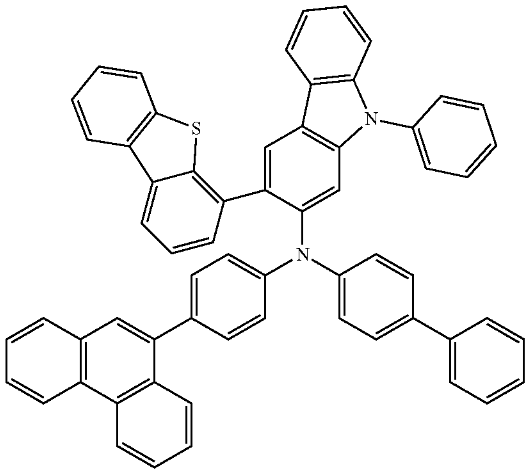
59
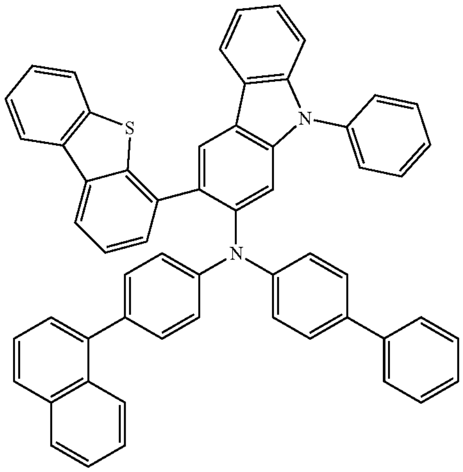
60
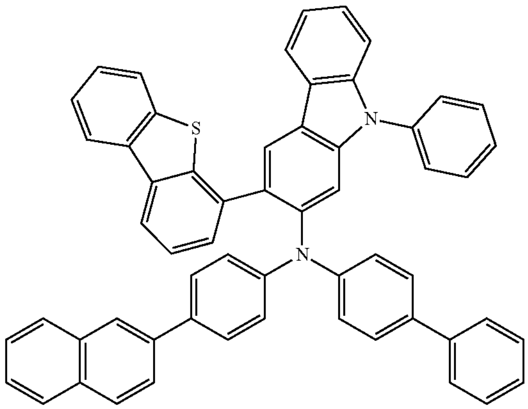
61
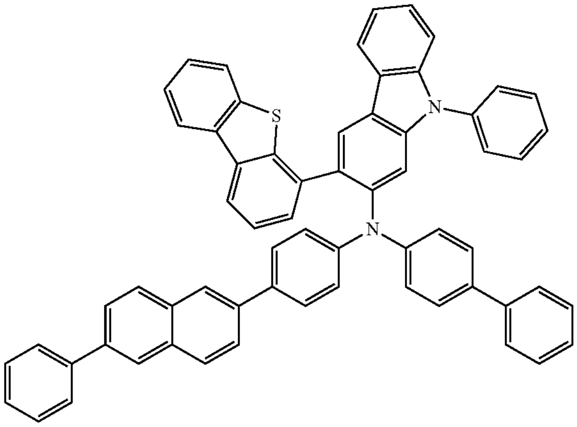
62
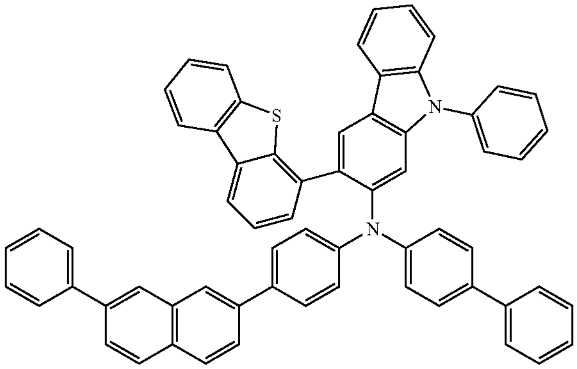

-continued
63
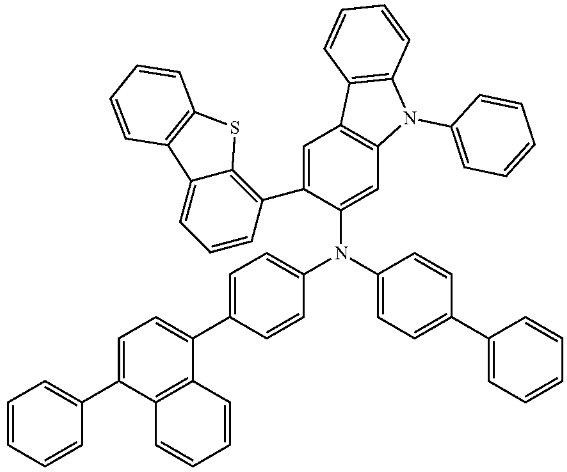
64
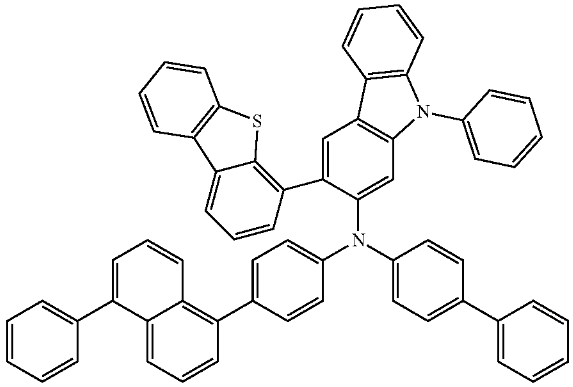
65
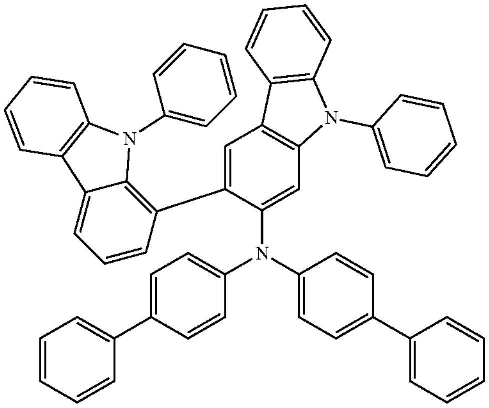
-continued
66
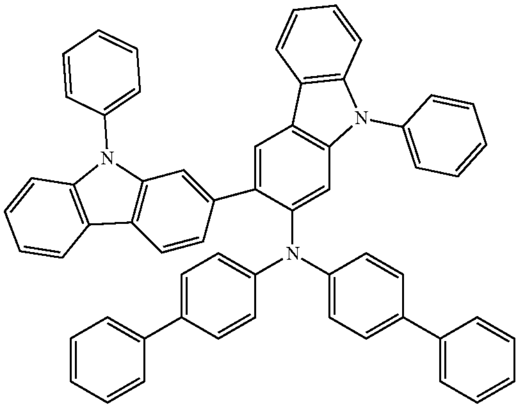
67
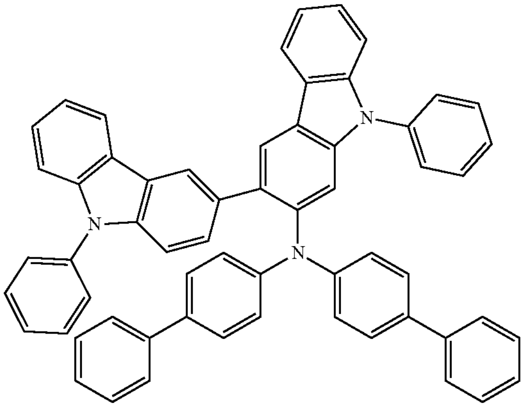
68
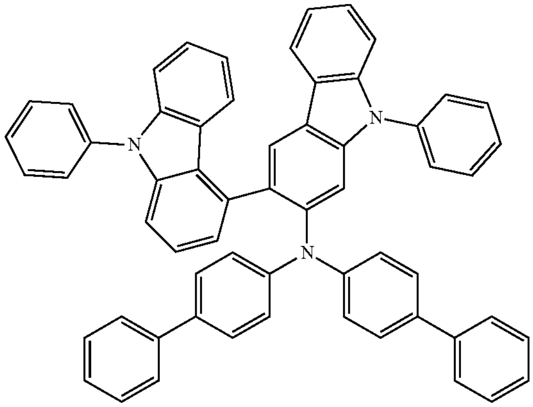

-continued
69
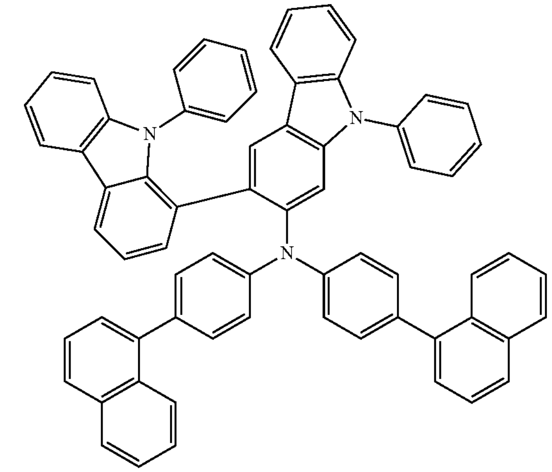
70
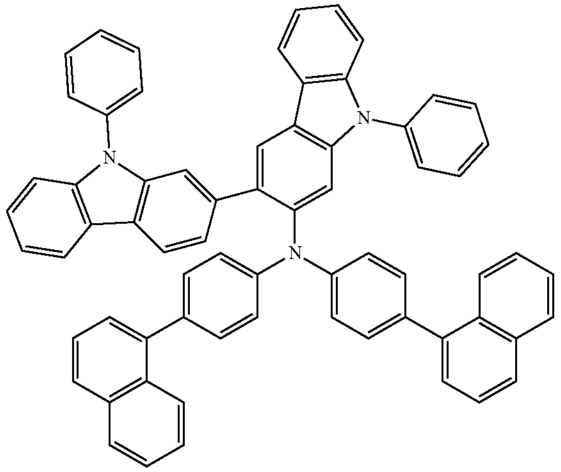
71
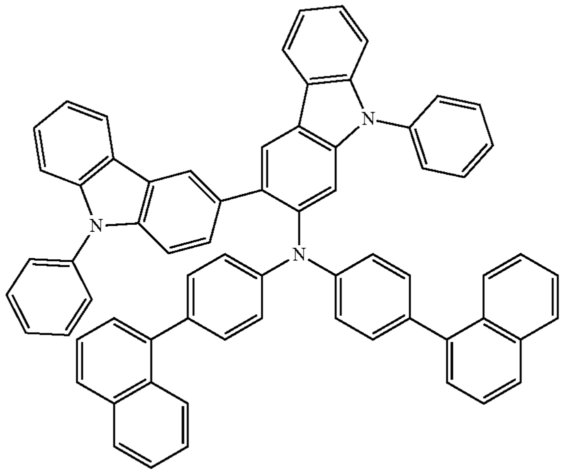
-continued
72
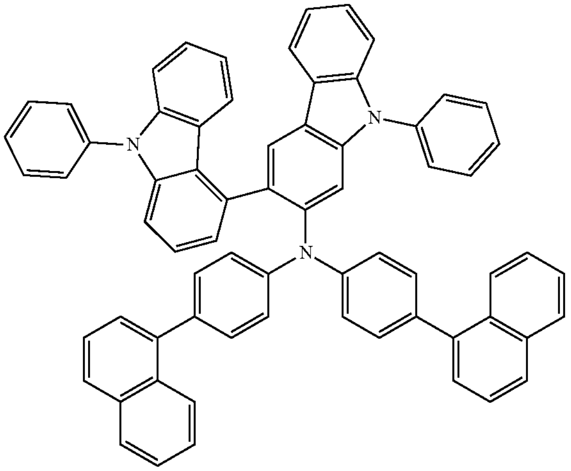
73
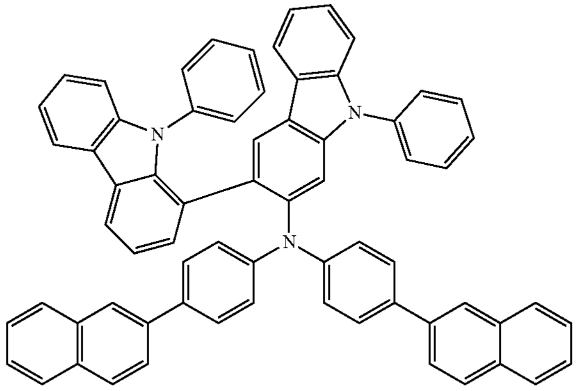
74
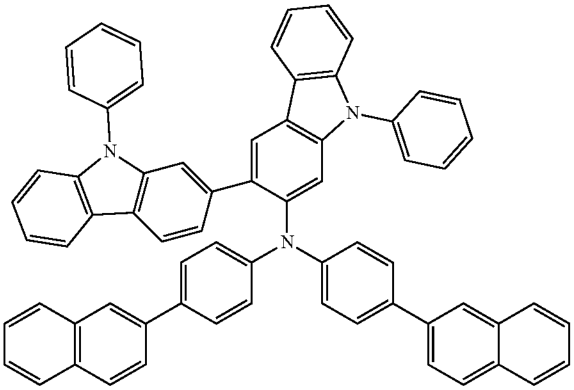

-continued
75
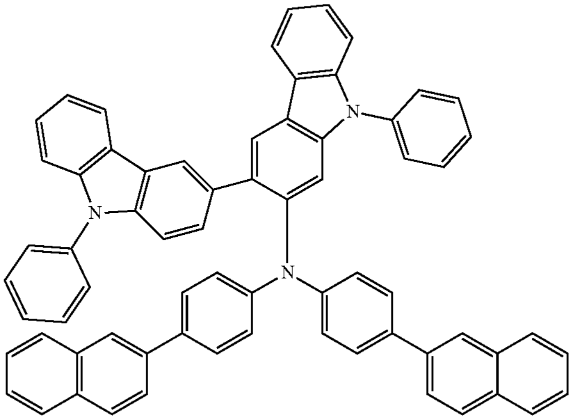
76
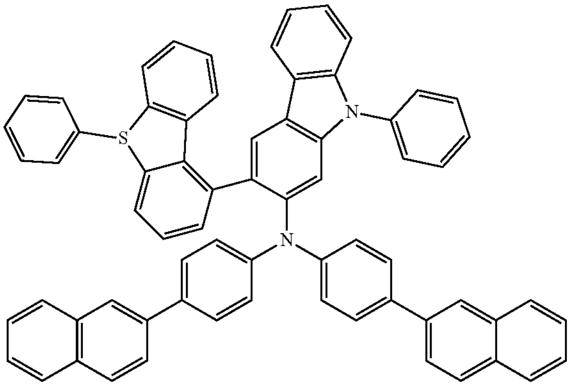
77
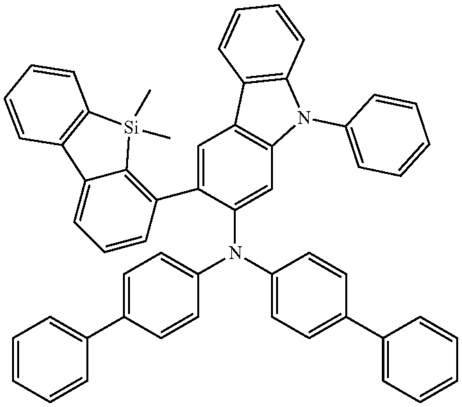
-continued
78
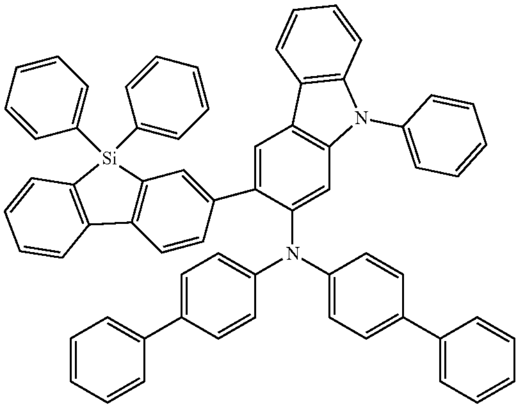
79
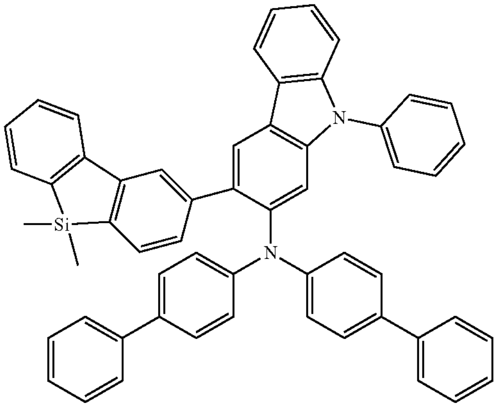
80
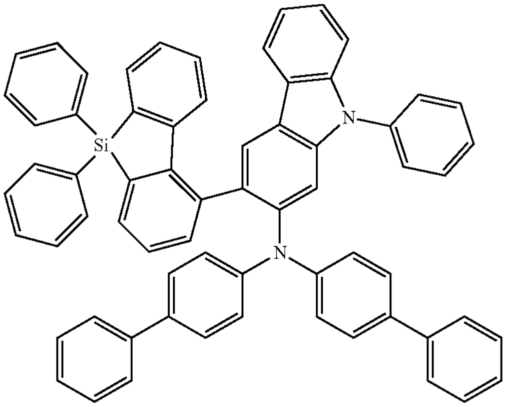

-continued
81
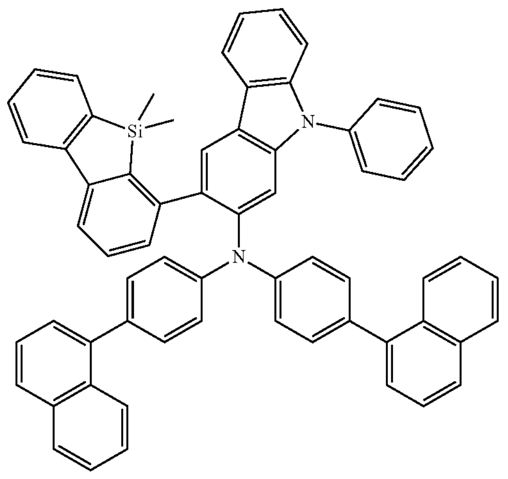
82
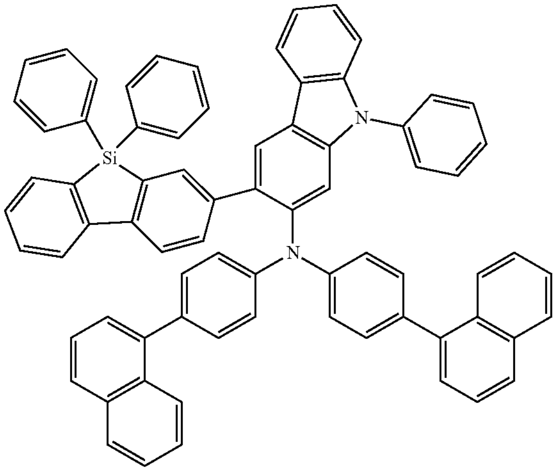
83
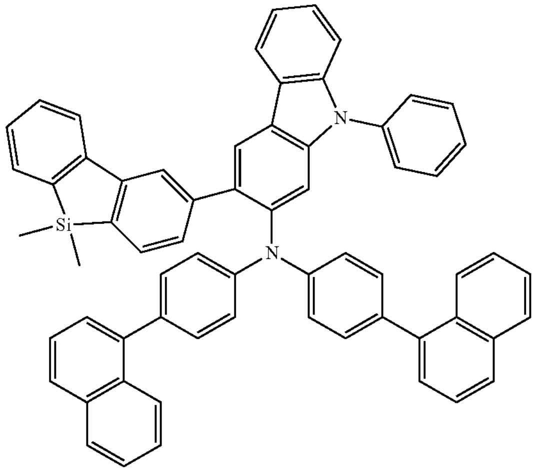
-continued
84
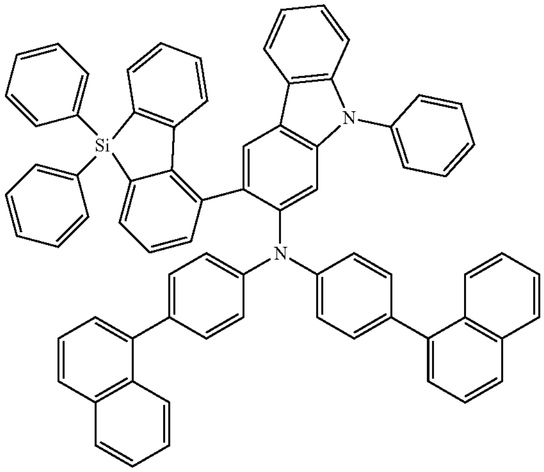
85
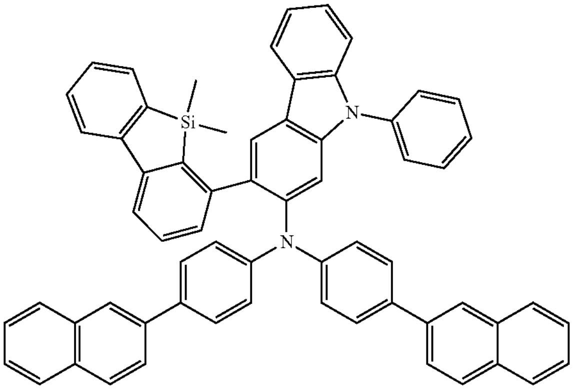
86
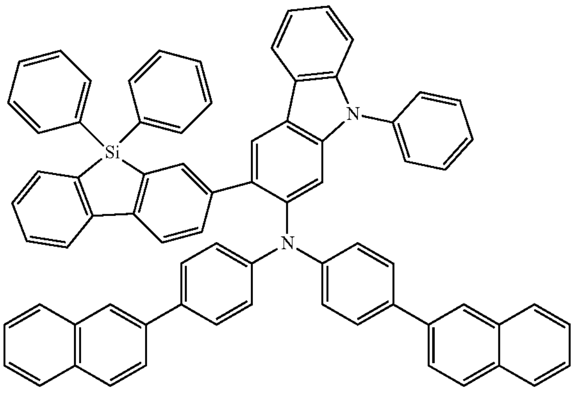

-continued
87
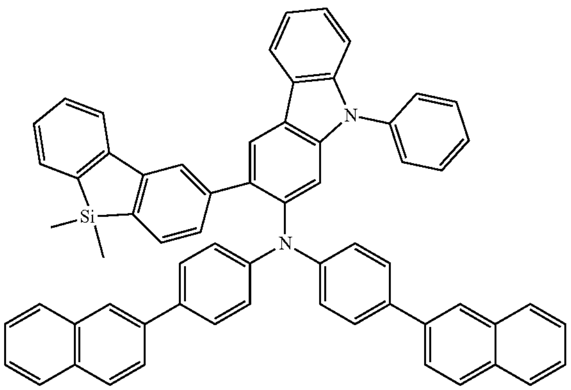
88
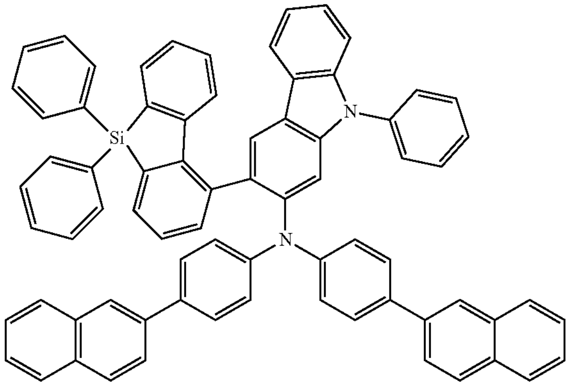
89
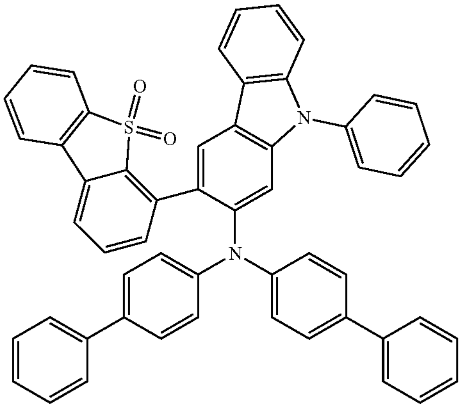
90
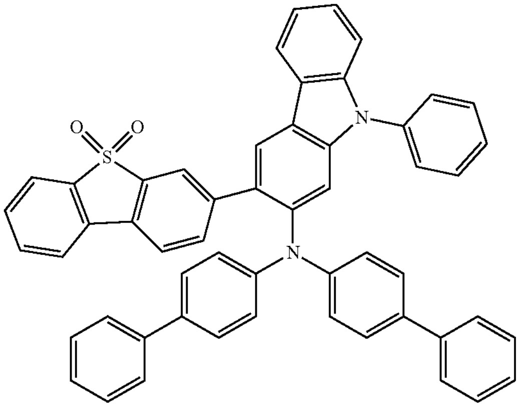
-continued
91
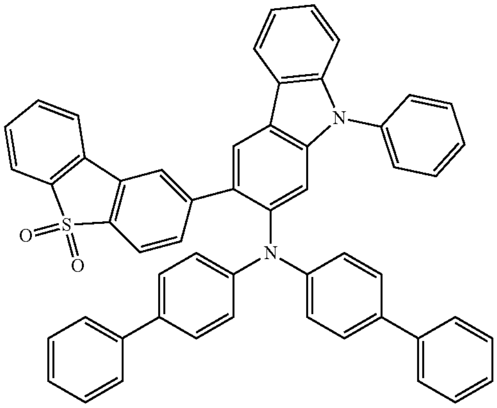
92
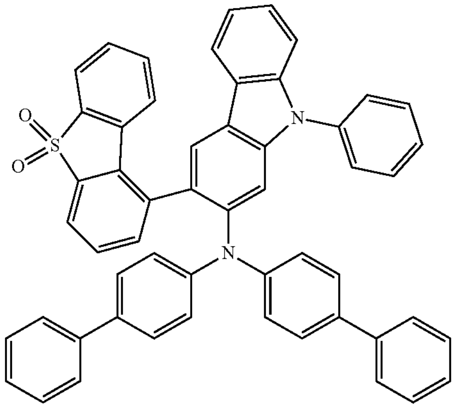
93
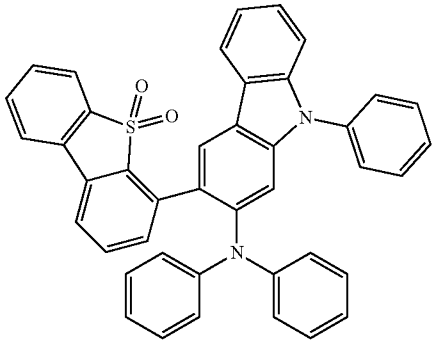
94
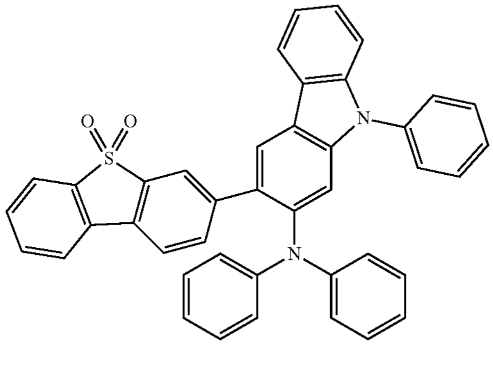

-continued
95
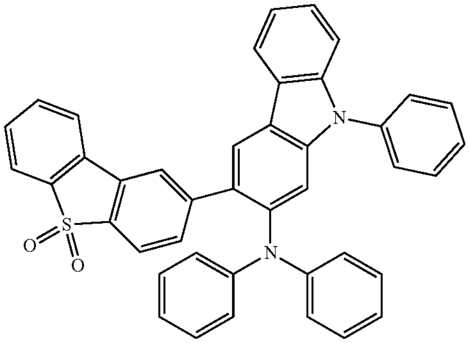
96
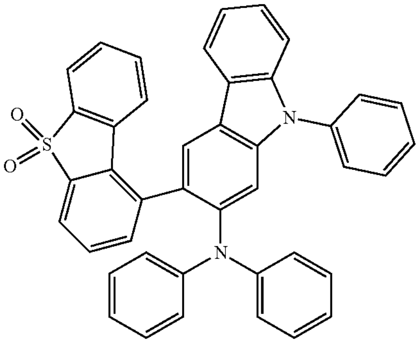
97
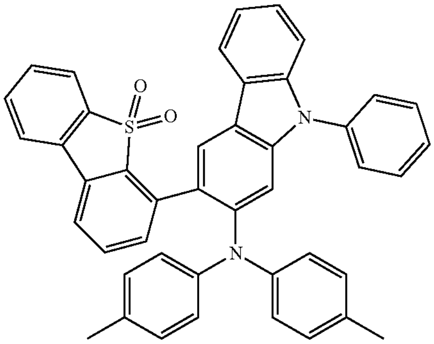
98
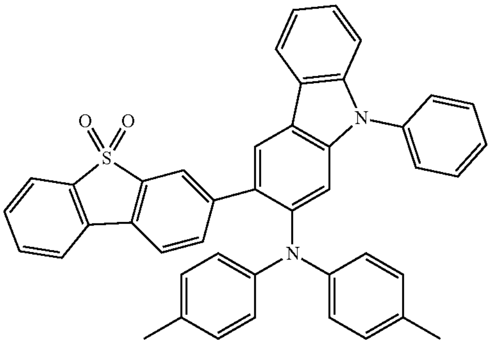
-continued
99
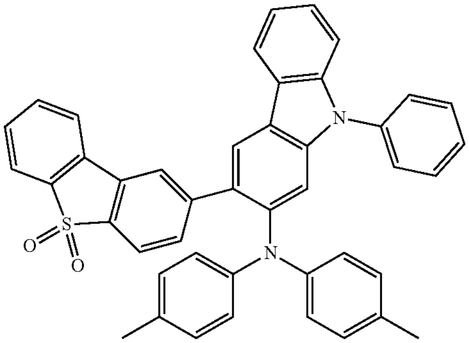
100
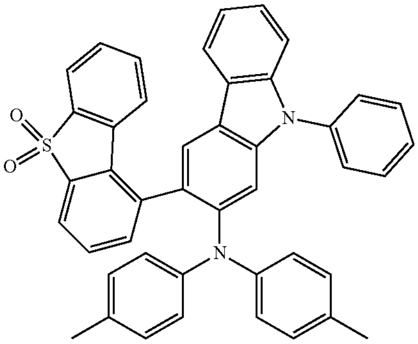
101
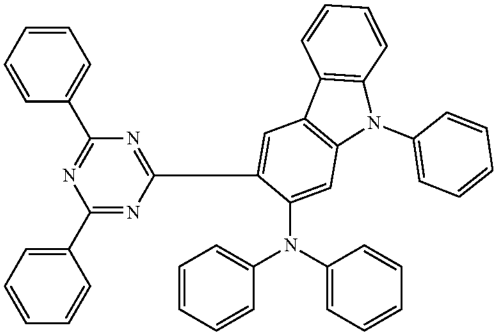
102
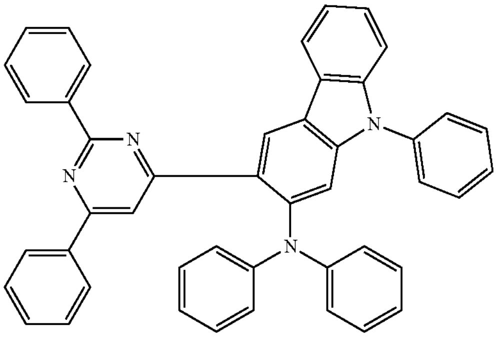

-continued
103
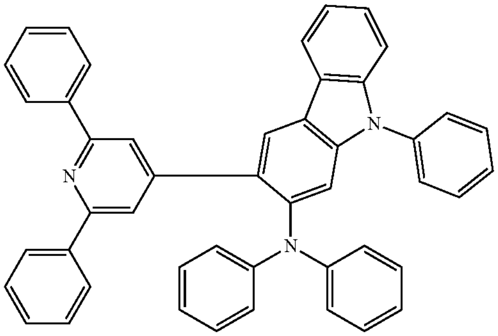
104
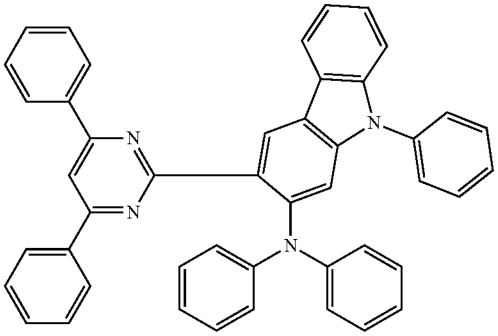
105
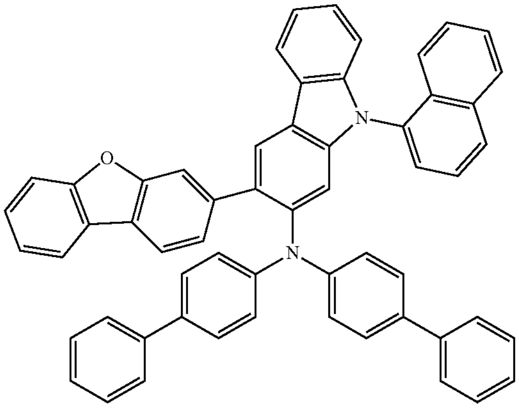
106
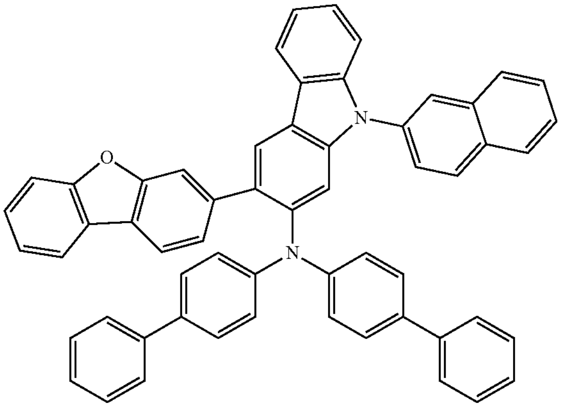
-continued
107
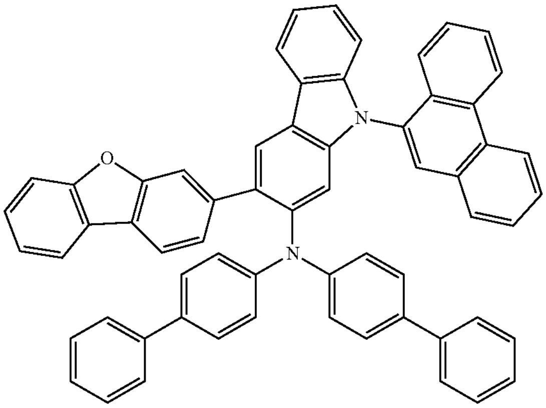
108
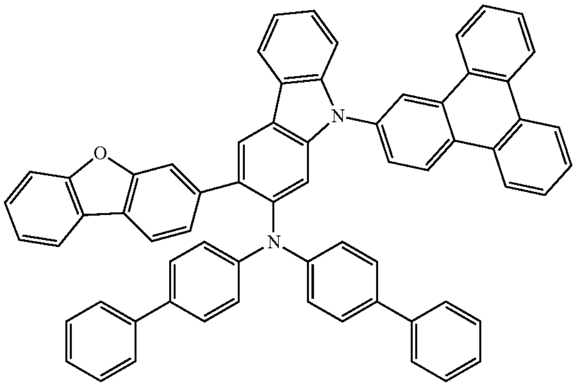
109
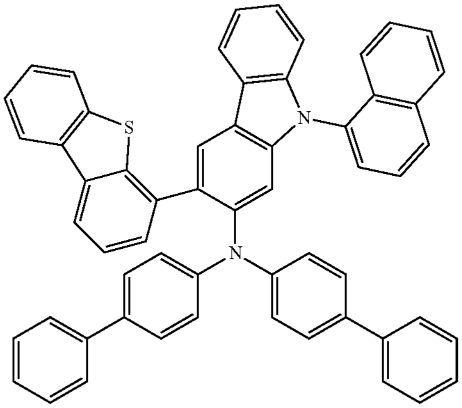

-continued
110
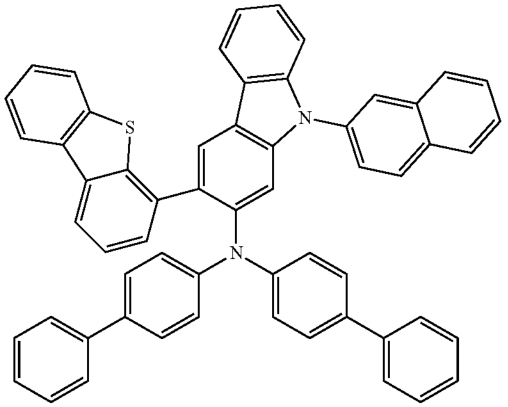
111
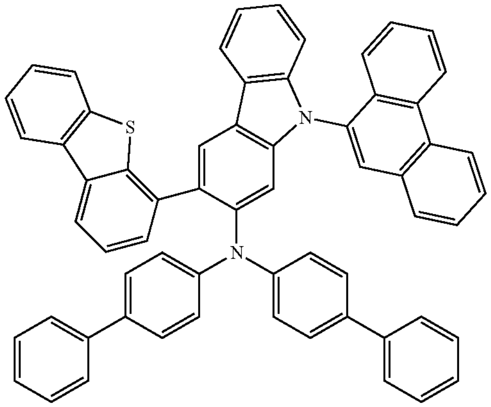
112
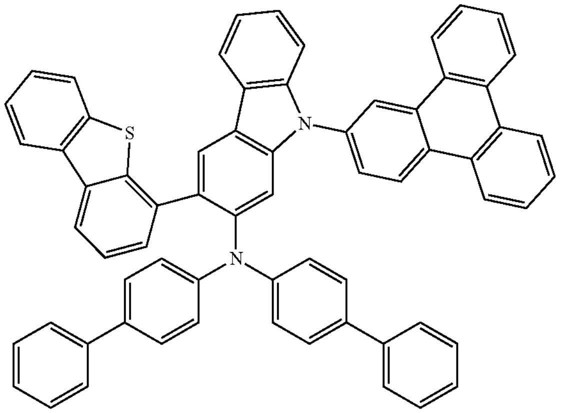
-continued
113
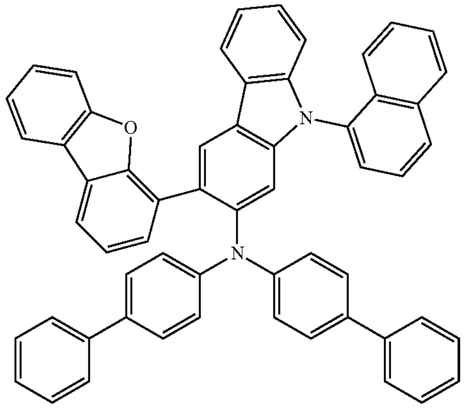
114
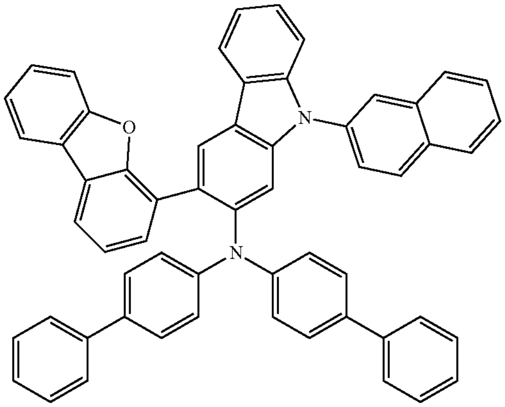
115
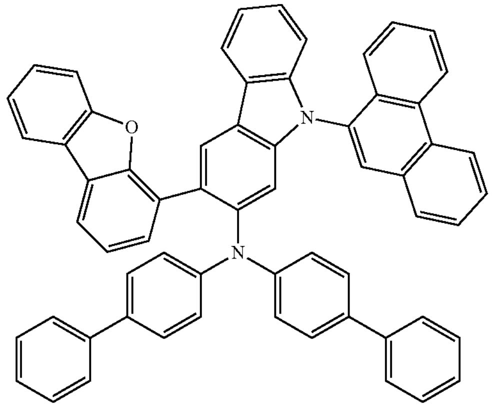

-continued
116
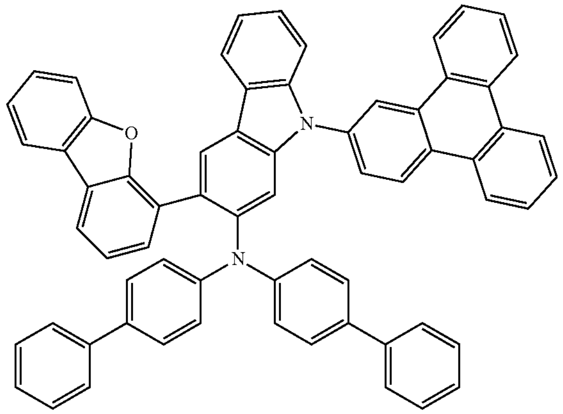
117
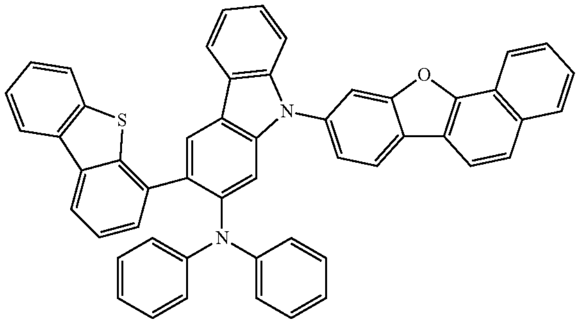
118
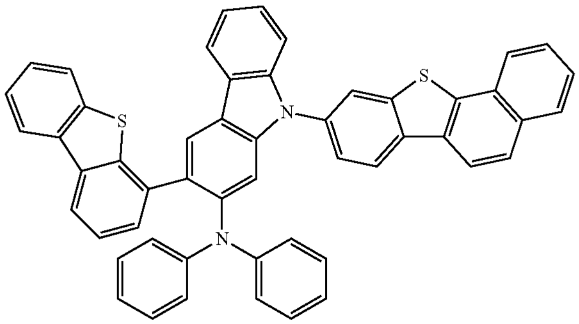
119
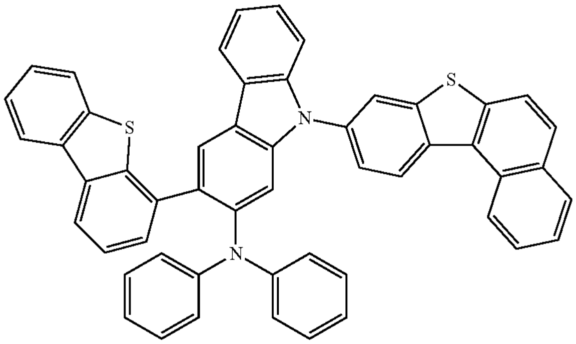
-continued
120
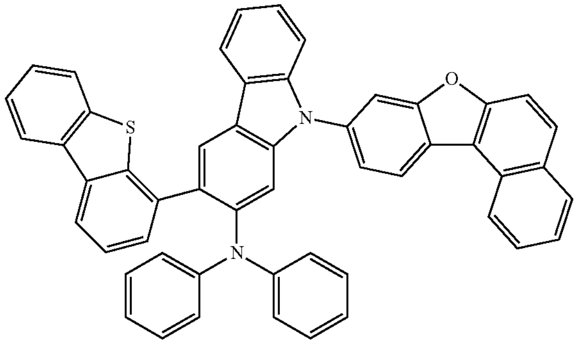
121
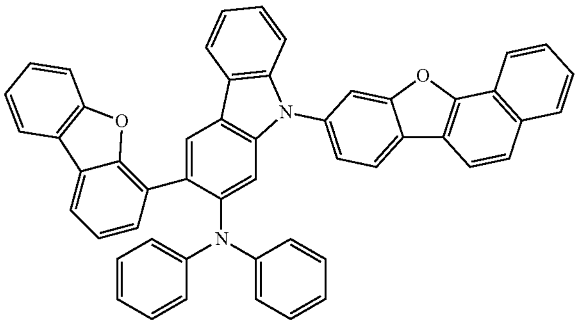
122
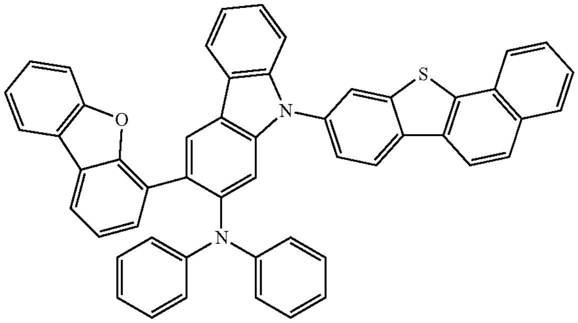
123
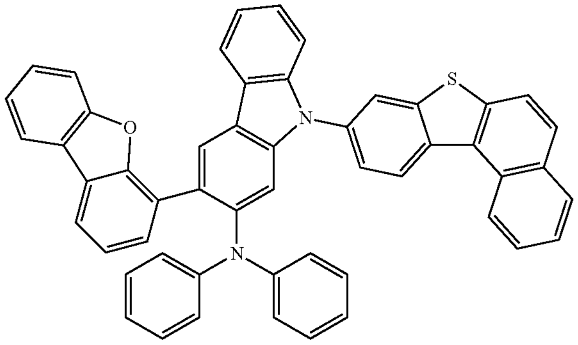

124
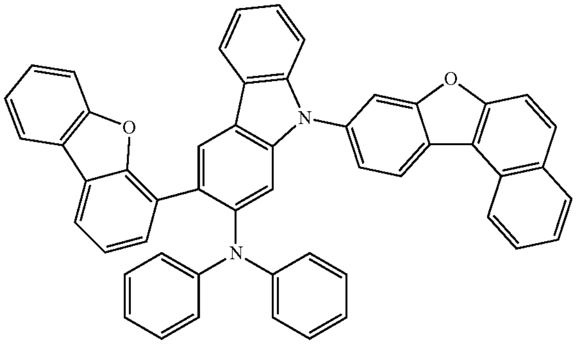
125
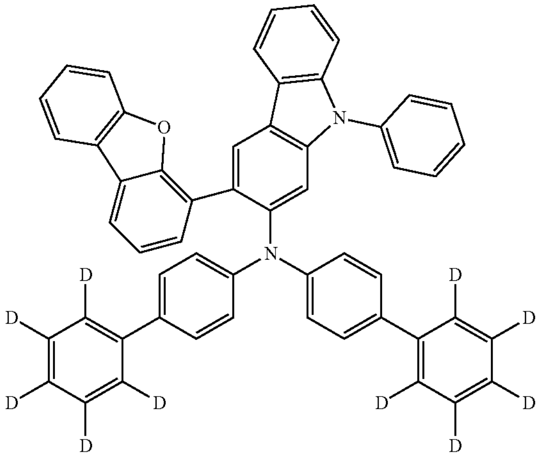
126
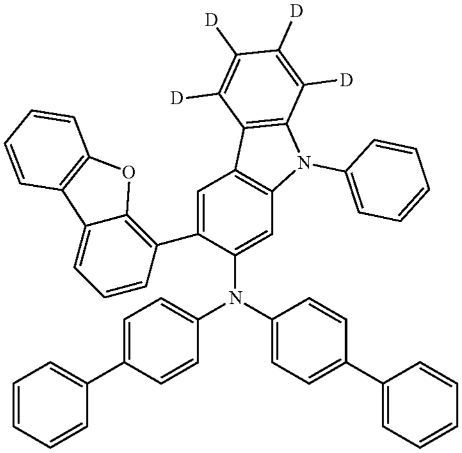
127
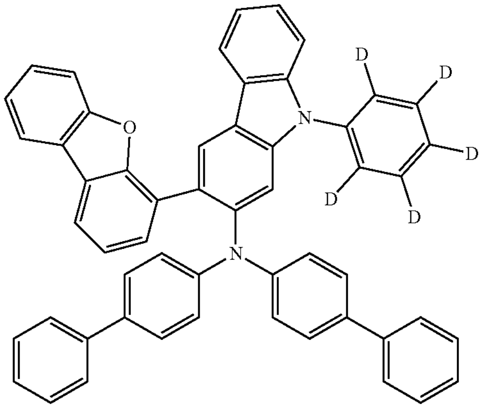
128
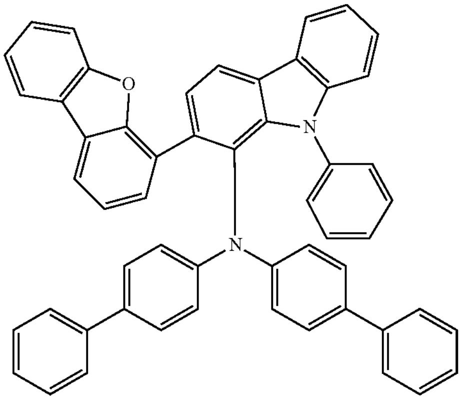
129
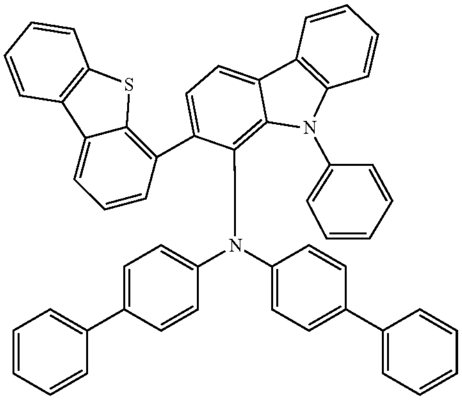
130
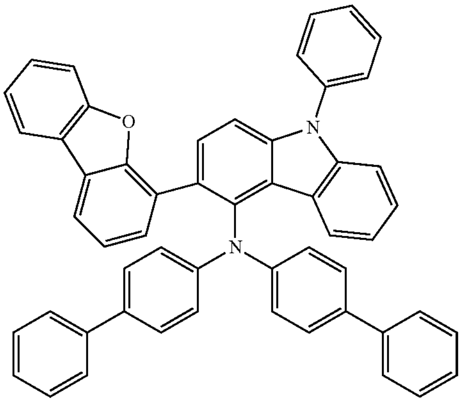

-continued

131

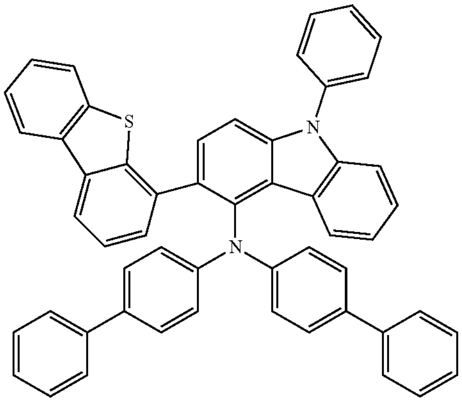

136

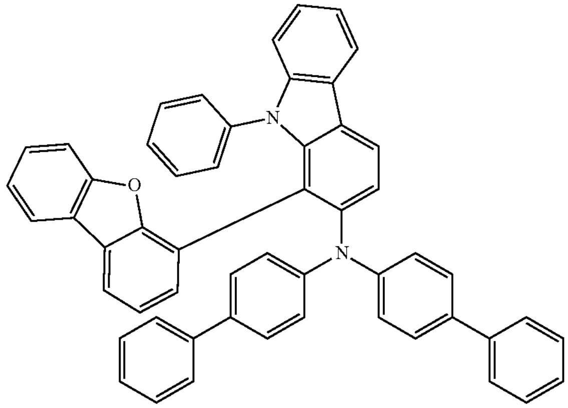

137

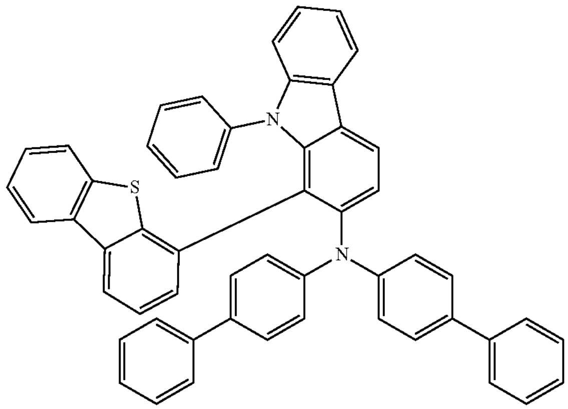

wherein in Compound 125 to Compound 127,

D is a deuterium atom.

11. An amine compound represented by Formula lone of Formula 1-1, Formula 1-2, Formula 1-3, or Formula 1-6:

[Formula 1-1]

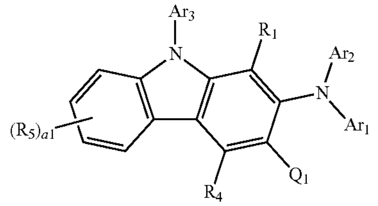

[Formula 1-2]

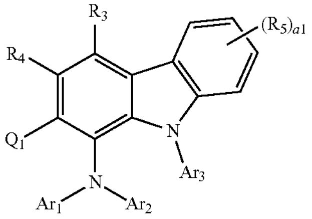

[Formula 1-3]

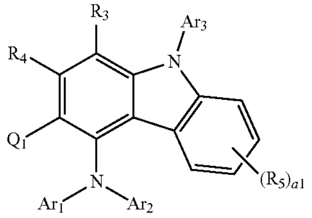

[Formula 1-6]

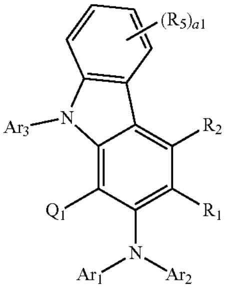

wherein in Formula 1-1, Formula 1-2, Formula 1-3, and Formula 1-6, $Q_1$ is a substituted or unsubstituted heteroaryl group having 2 to 30 ring-forming carbon atoms, $Ar_1$ and $Ar_2$ are each independently a substituted or unsubstituted aryl group having 6 to 30 ring-forming carbon atoms, or a substituted or unsubstituted heteroaryl group of 2 to 30 ring-forming carbon atoms, and $R_1$, $R_2$, $R_3$, and $R_4$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $Ar_3$ is a substituted or unsubstituted aryl group having 6 to 30 ring-forming carbon atoms, or a substituted or unsubstituted heteroaryl group having 2 to 30 ring-forming carbon atoms, a1 is an integer from 0 to 4, and $R_5$ is a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

12. The amine compound of claim 11, wherein in Formula 1-2, Formula 1-3, and Formula 1-6, $Q_1$ is a substituted or unsubstituted dibenzofuran group, or a substituted or unsubstituted dibenzothiophene group.

13. The amine compound of claim 11, wherein $Q_1$ is represented by one of Q-1 to Q-8:

Q-1

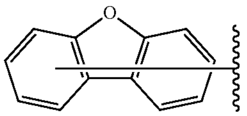

Q-2

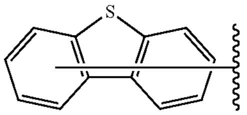

Q-3

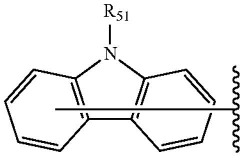

Q-4

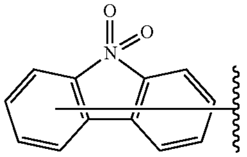

Q-5

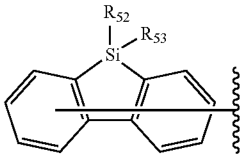

Q-6

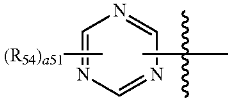

Q-7

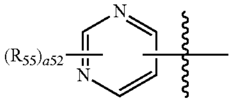

Q-8

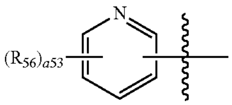

wherein in Q-6, a51 is an integer from 0 to 2, in Q-7, a52 is an integer from 0 to 3, in Q-8, a53 is an integer from 0 to 4, in Q-3 and Q-5 to Q-8, $R_{51}$ to $R_{56}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and in Q-1 to Q-8,

indicates a binding site to a neighboring atom.

14. The amine compound of claim 11, wherein $Ar_1$ and $Ar_2$ are each independently represented by one of A-1 to A-3:

A-1

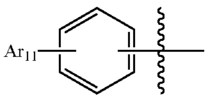

A-2

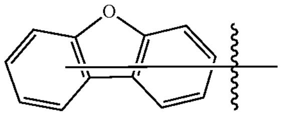

A-3

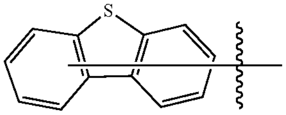

wherein in A-1, $Ar_{11}$ is a hydrogen atom, a methyl group, or a substituted or unsubstituted aryl group having 6 to 30 ring-forming carbon atoms, and wherein in A-1 to A-3,

indicates a binding site to a neighboring atom.

15. The amine compound of claim 11, wherein $Ar_1$ and $Ar_2$ are the same as each other.

16. The amine compound of claim 11, wherein $Ar_3$ is a substituted or unsubstituted phenyl group, an unsubstituted naphthyl group, an unsubstituted phenanthryl group, an unsubstituted triphenyl group, an unsubstituted naphthobenzofuran group, or an unsubstituted benzonaphthothiophene group.

17. The amine compound of claim 11, wherein the amine compound is represented by Formula 3:

[Formula 3]
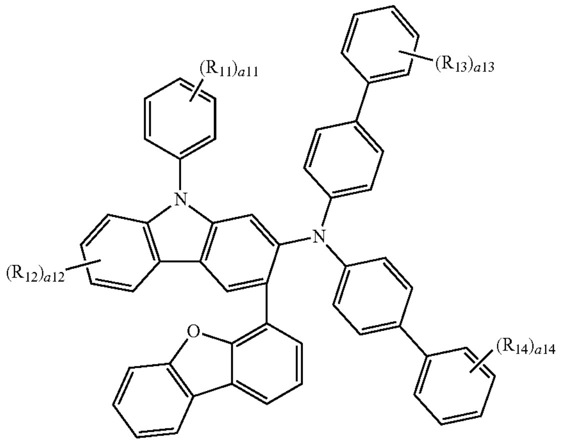
wherein in Formula 3,
a11, a13, and a14 are each independently an integer from 0 to 5,
a12 is an integer from 0 to 4,
at least one of $R_{11}$ to $R_{14}$ is a deuterium atom, and
the remainder of $R_{11}$ to $R_{14}$ are hydrogen atoms.
18. The amine compound of claim 11, wherein the amine compound is one selected from Compound Group 1:
[Compound Group 1]
1
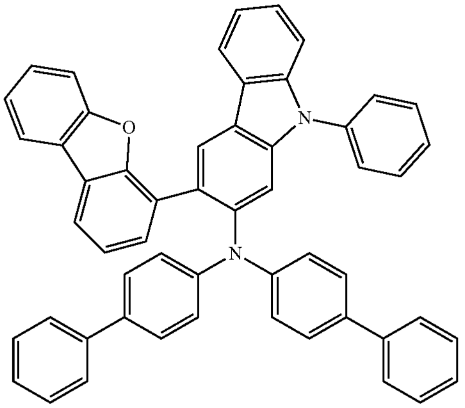
2
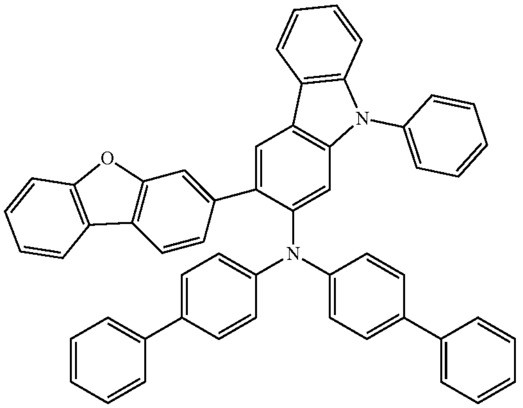
-continued
3
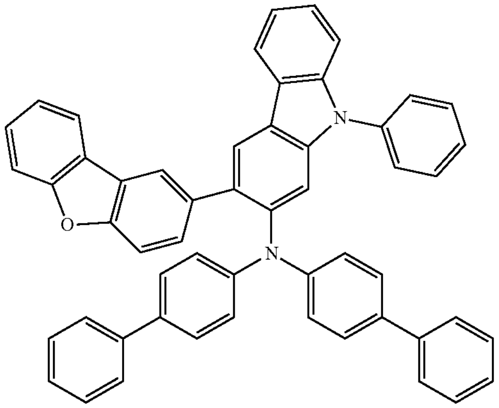
4
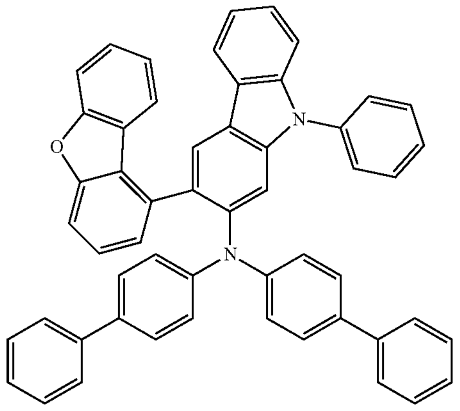
5
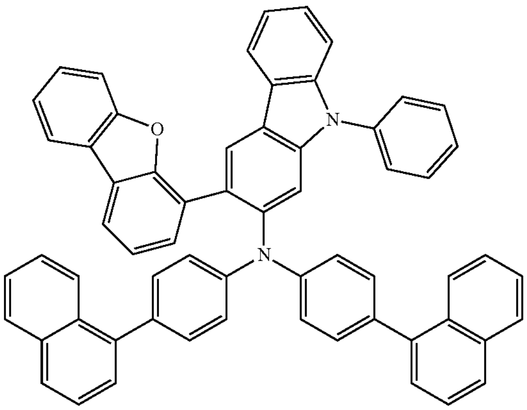

-continued
6
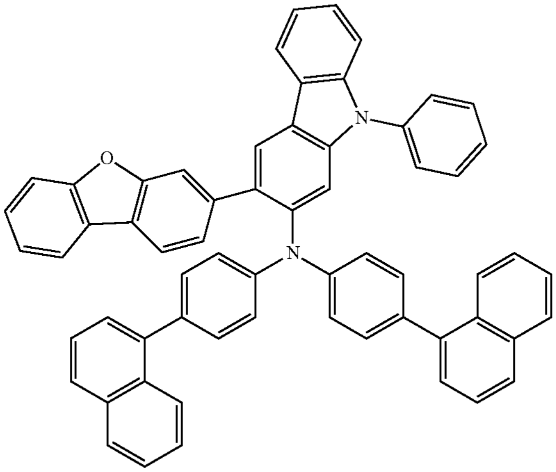
7
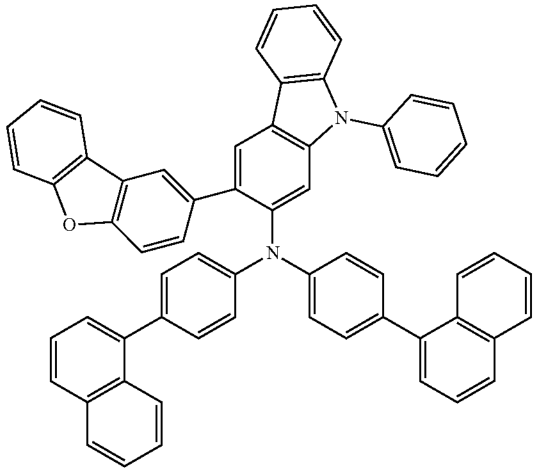
8
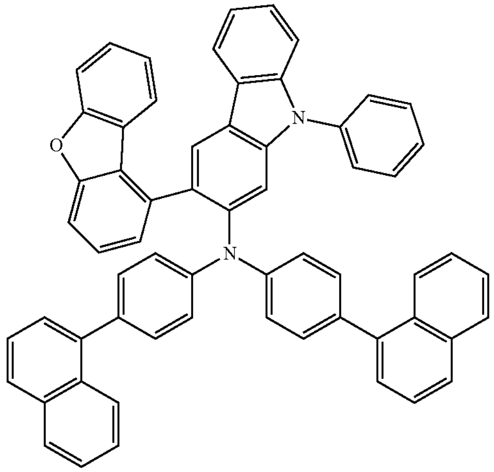
-continued
9
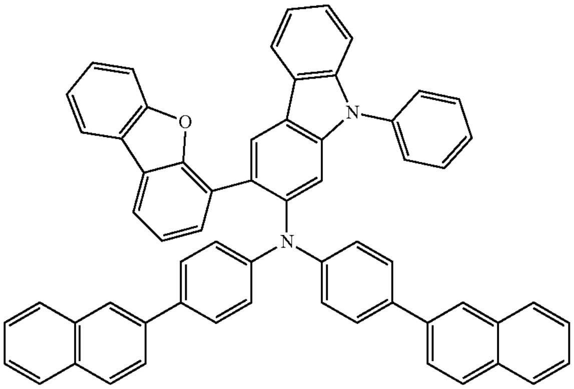
10
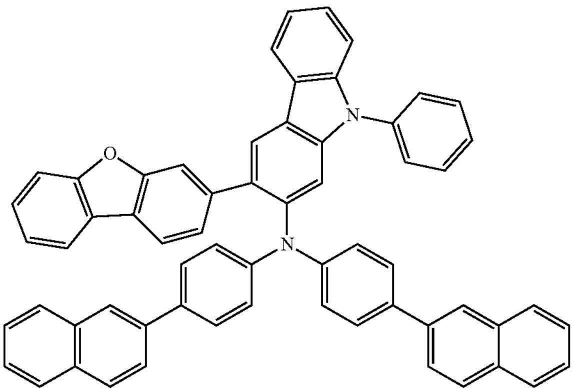
11
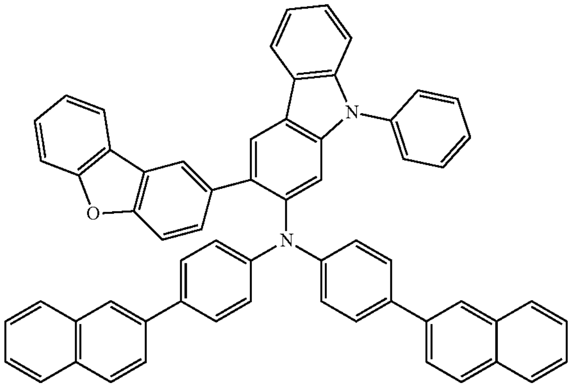
12
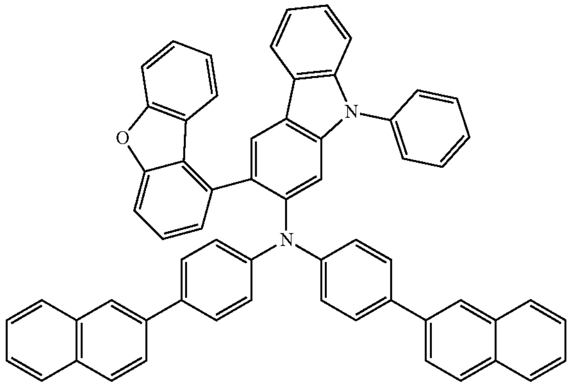

-continued
13
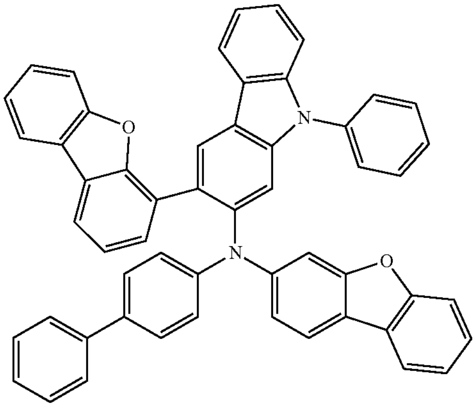
14
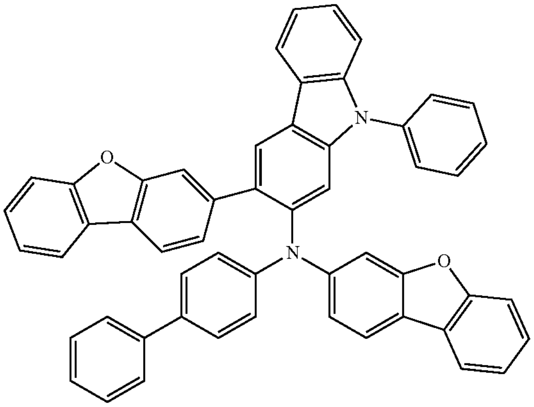
15
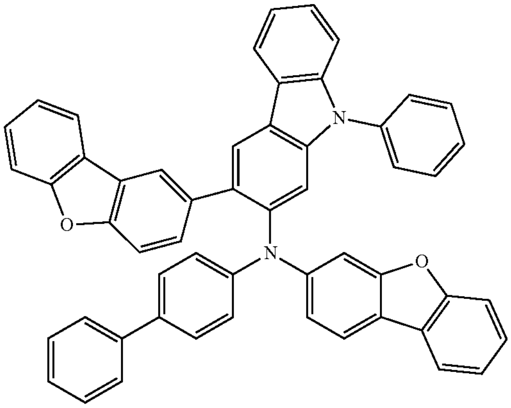
-continued
16
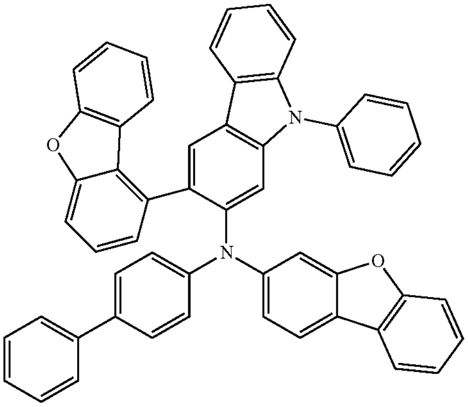
17
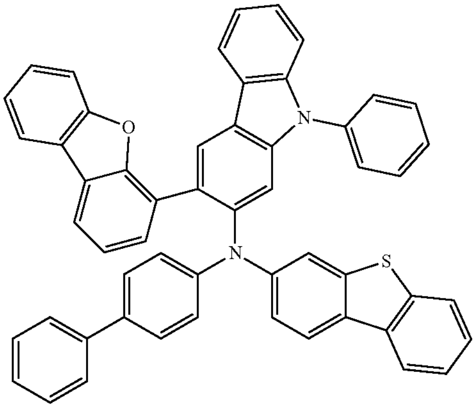
18
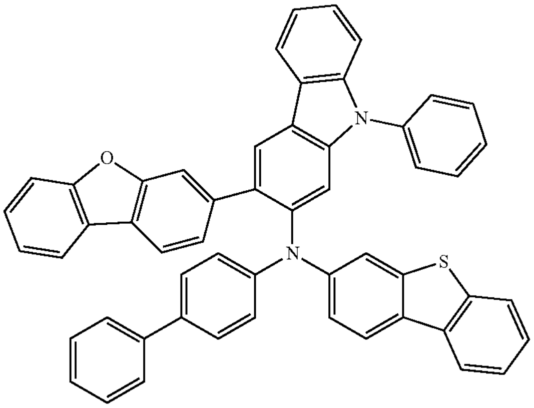

-continued
19
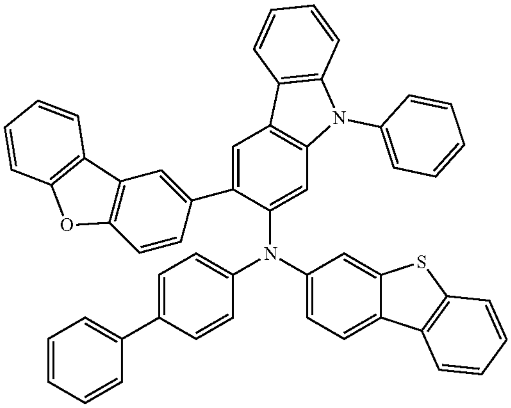
20
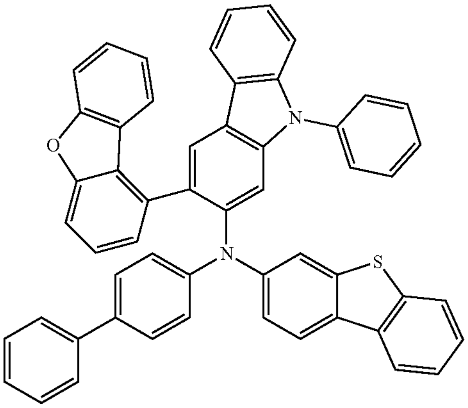
21
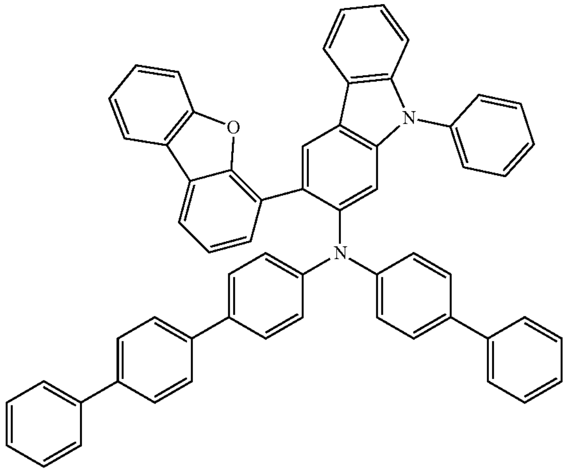
-continued
22
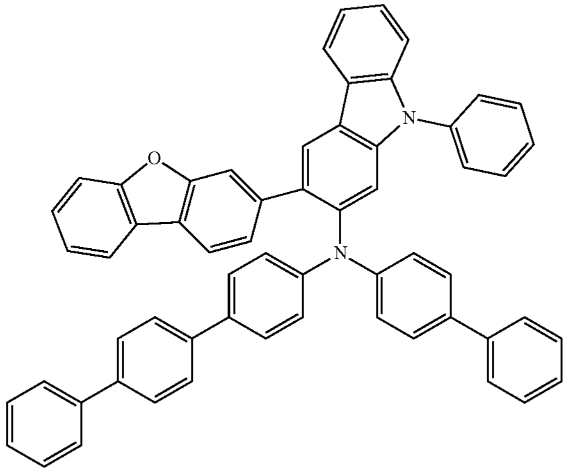
23
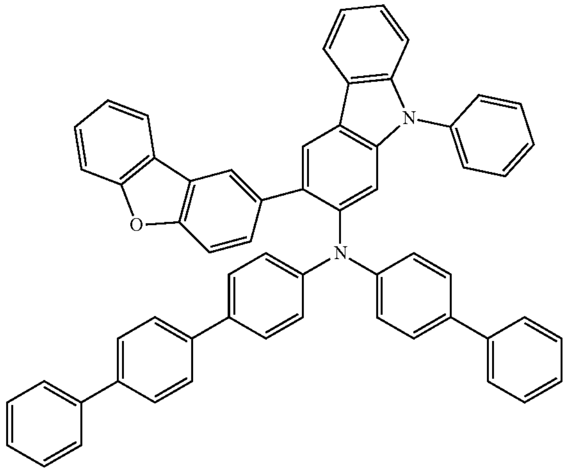
24
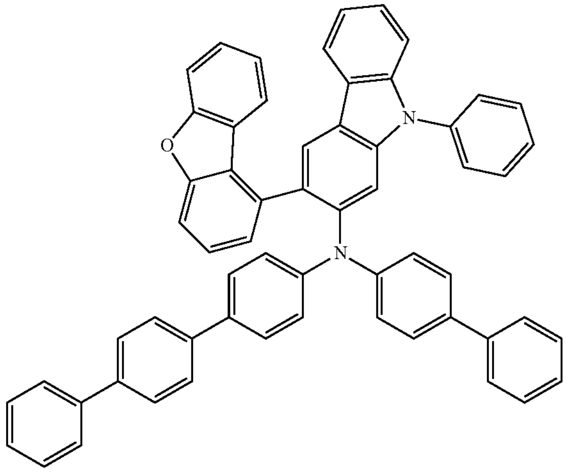

-continued
25
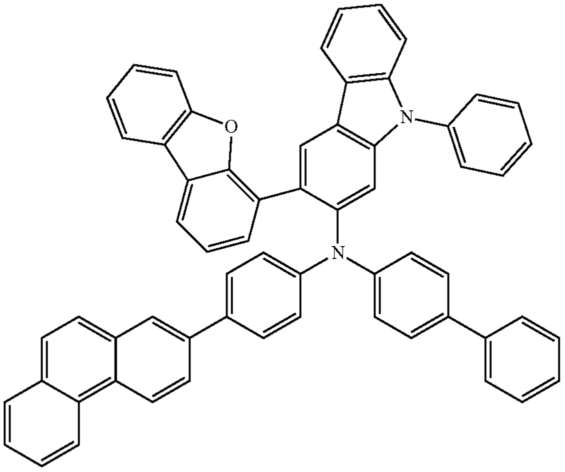
26
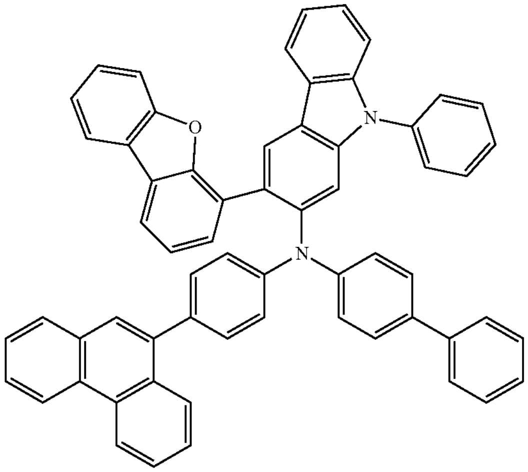
27
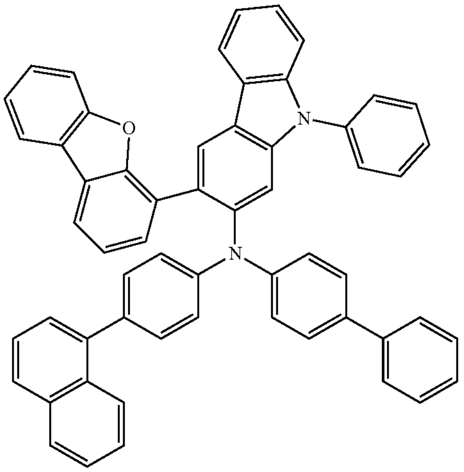
-continued
28
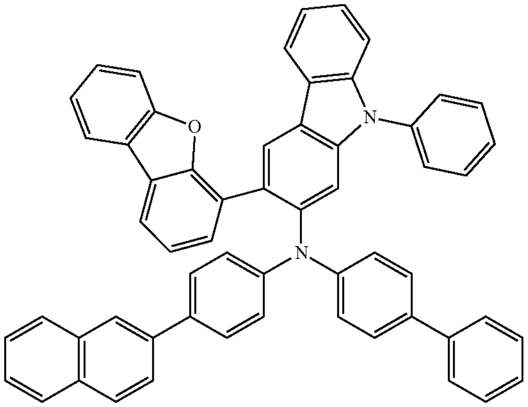
29
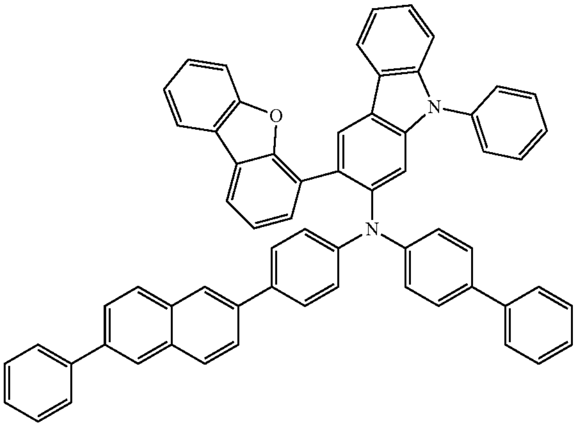
30
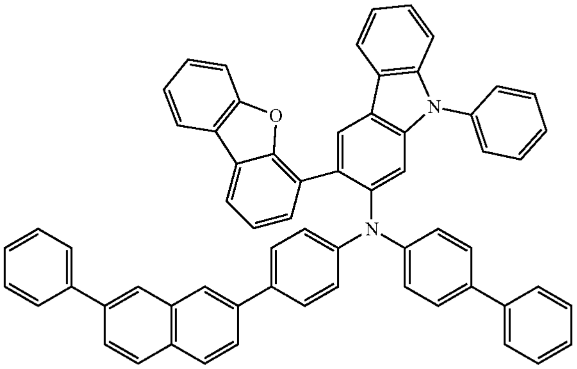

-continued
31
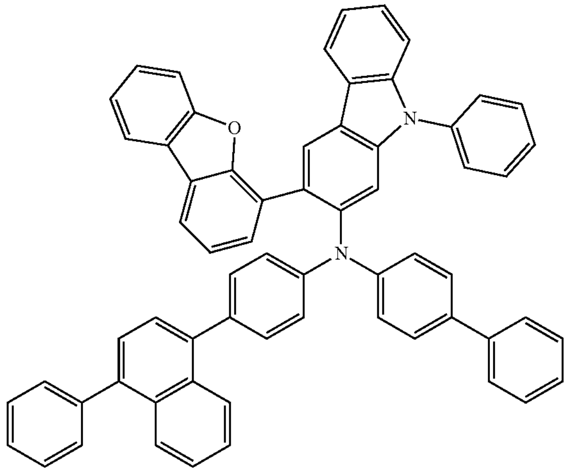
32
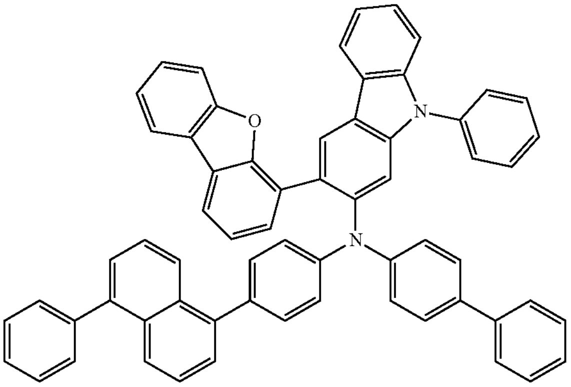
33
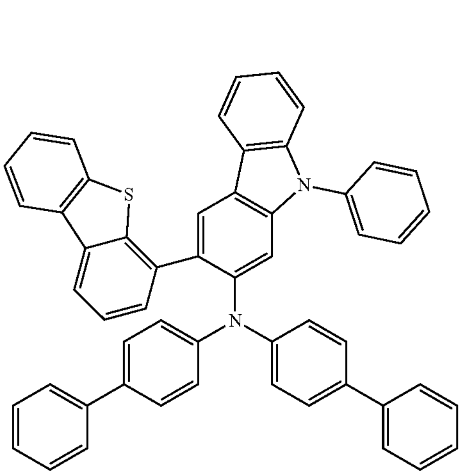
-continued
34
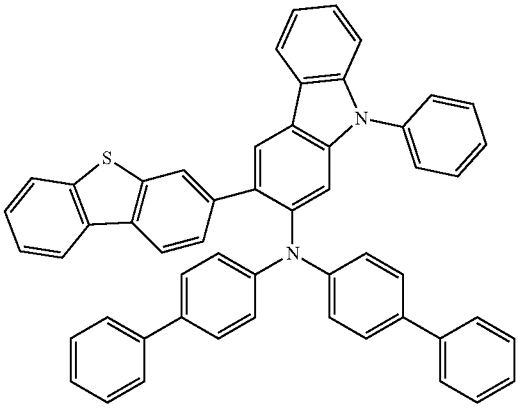
35
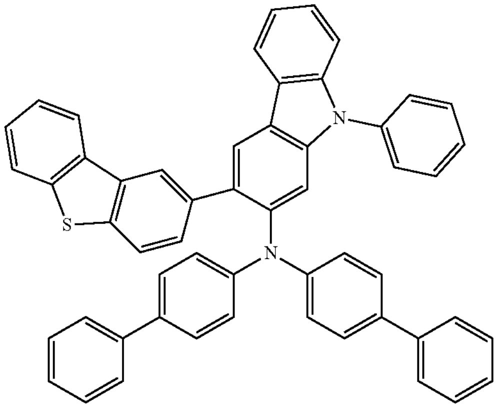
36
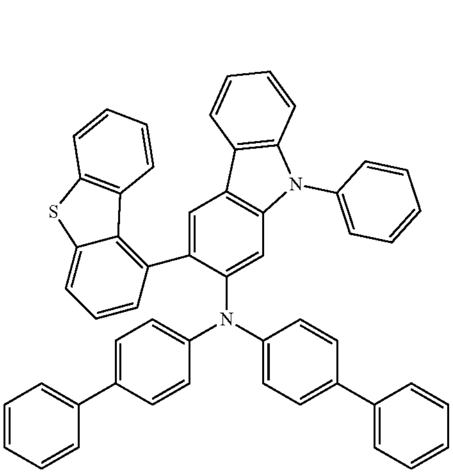

-continued
37
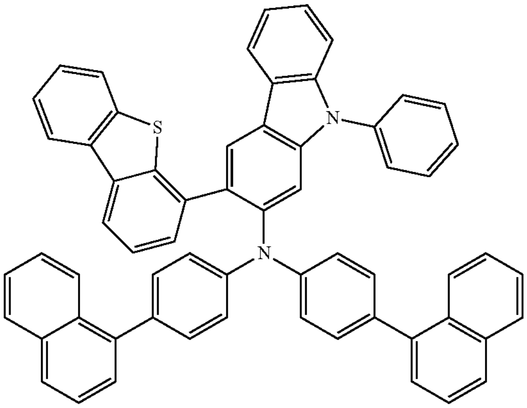
38
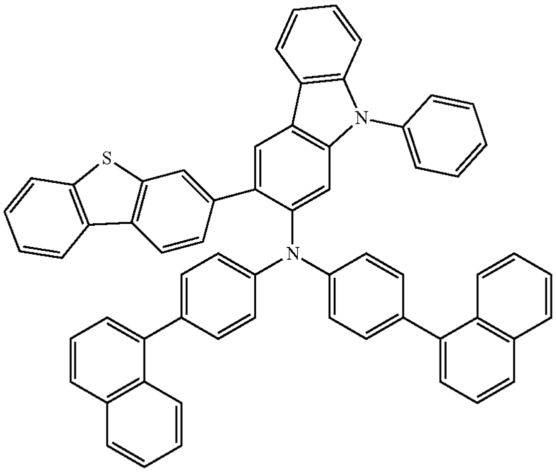
39
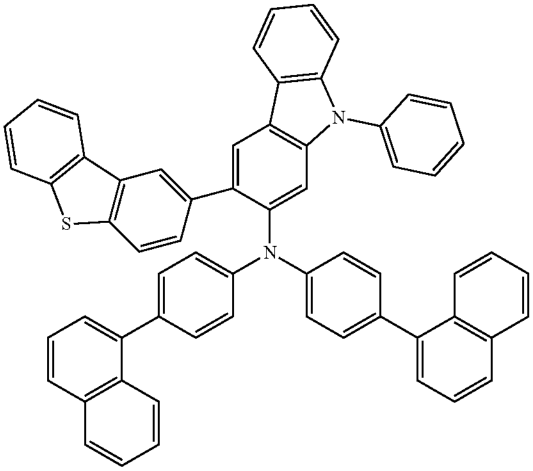
-continued
40
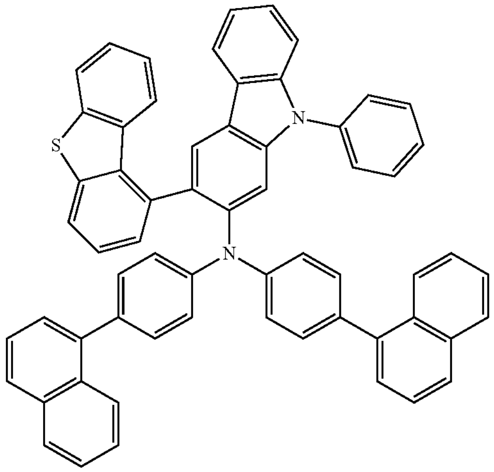
41
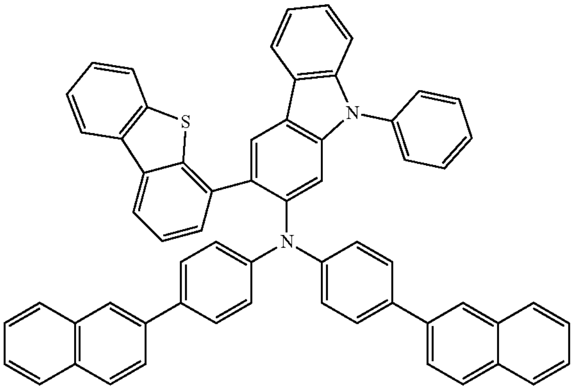
42
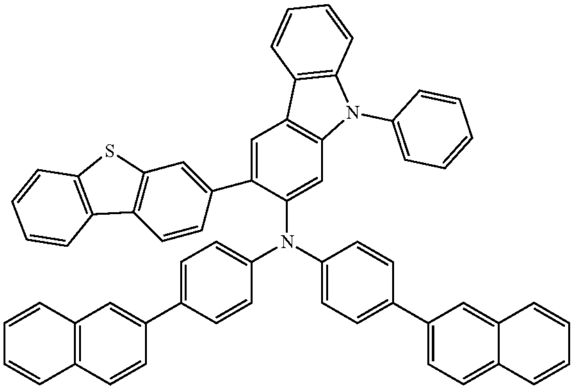

-continued
43
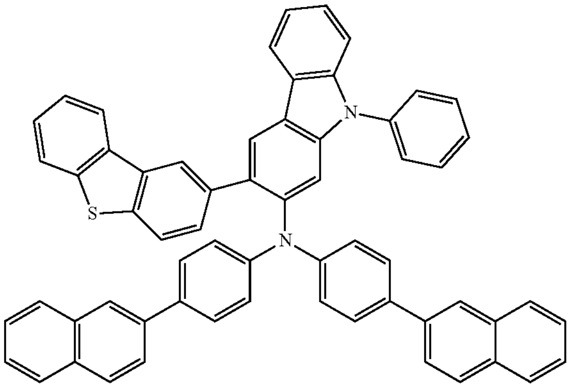
44
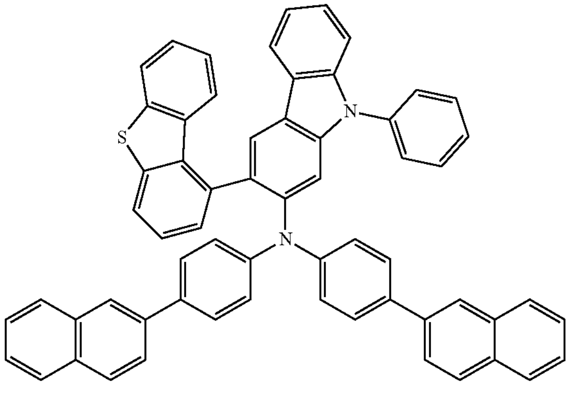
45
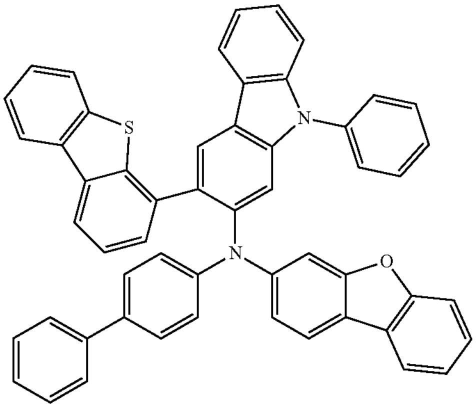
-continued
46
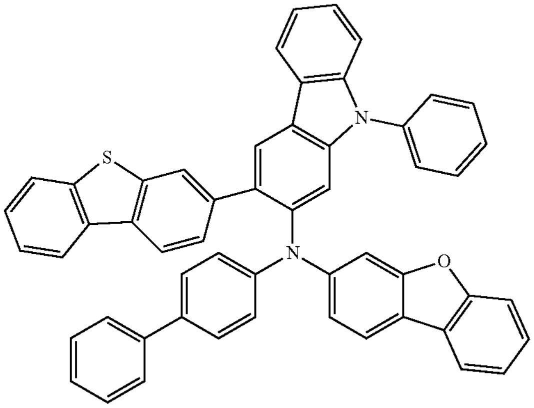
47
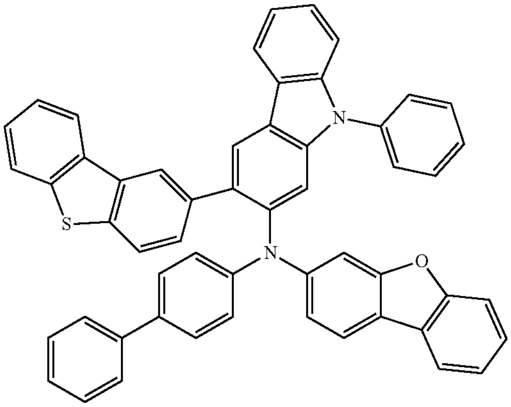
48
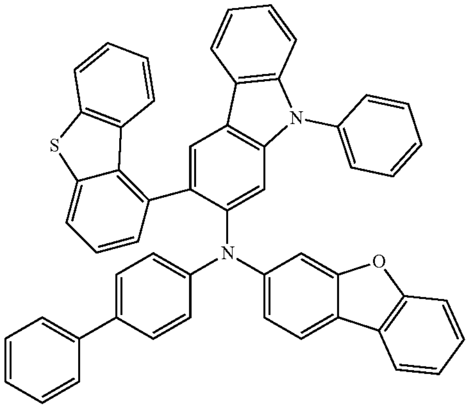

-continued
49
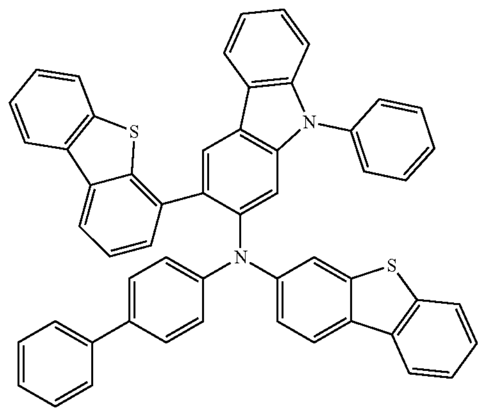
50
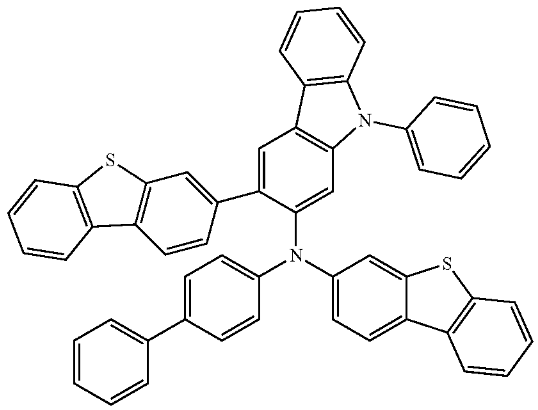
51
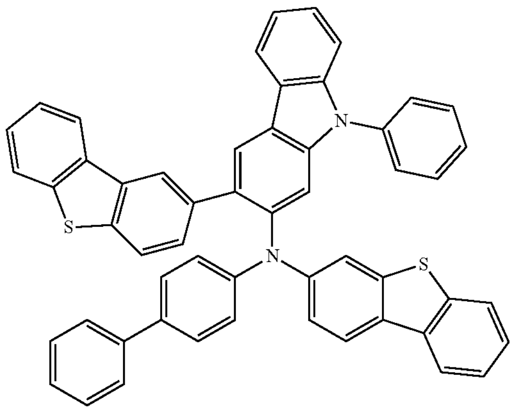
-continued
52
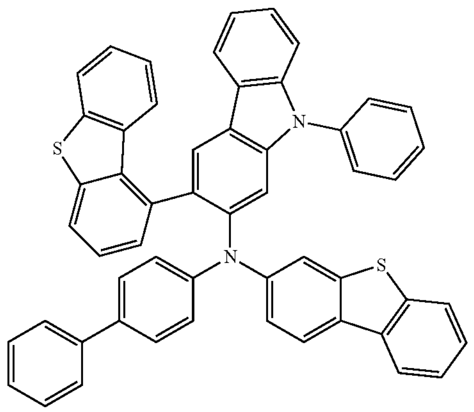
53
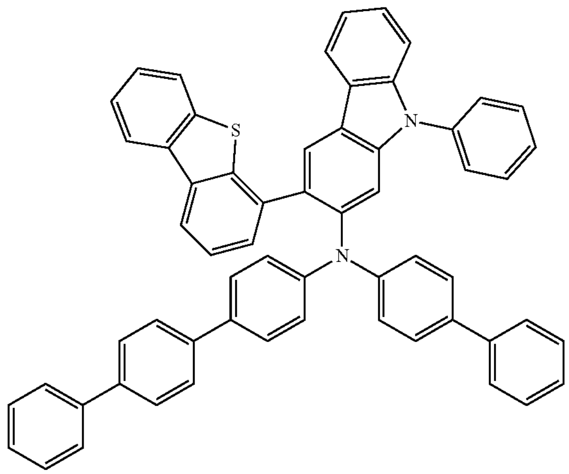
54
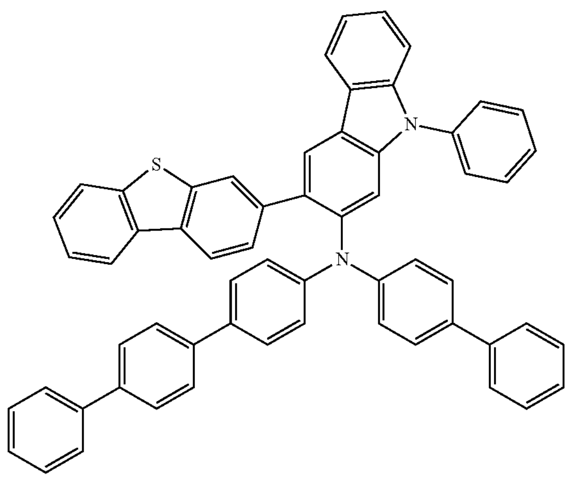

-continued
55
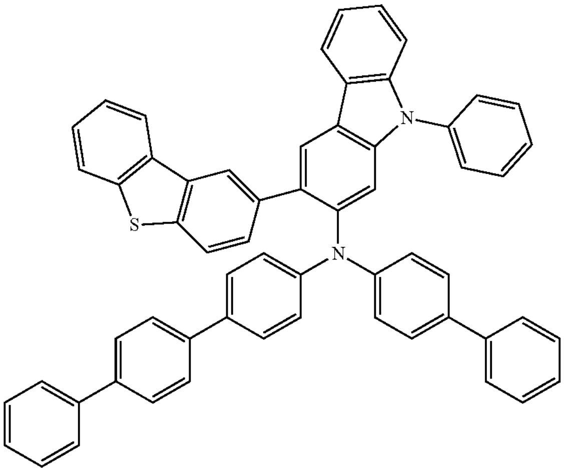
56
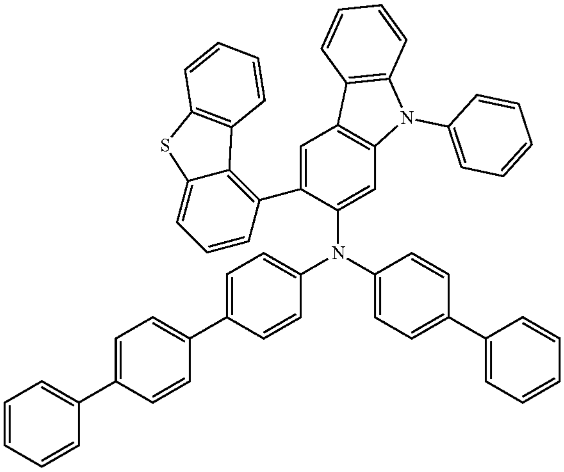
57
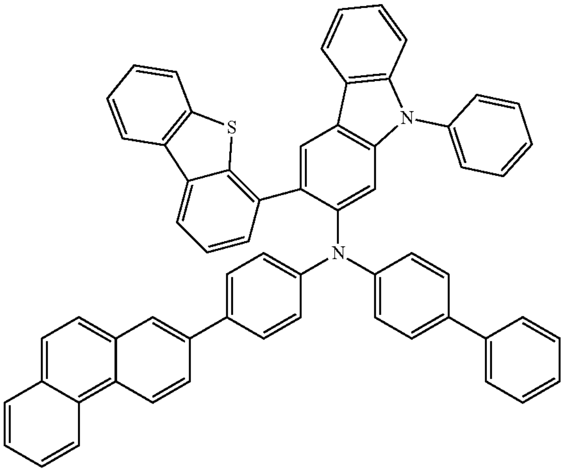
-continued
58
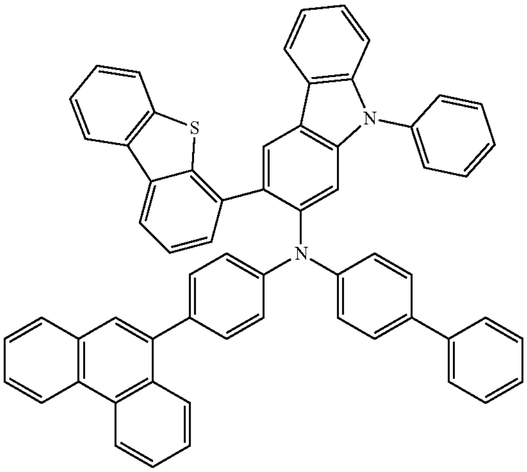
59
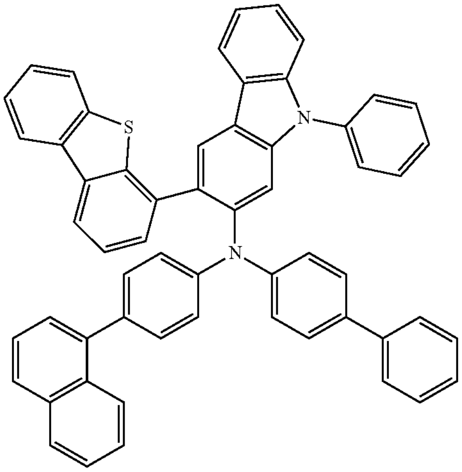
60
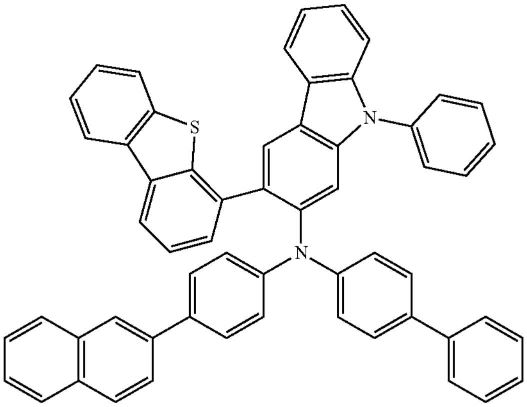

-continued
61
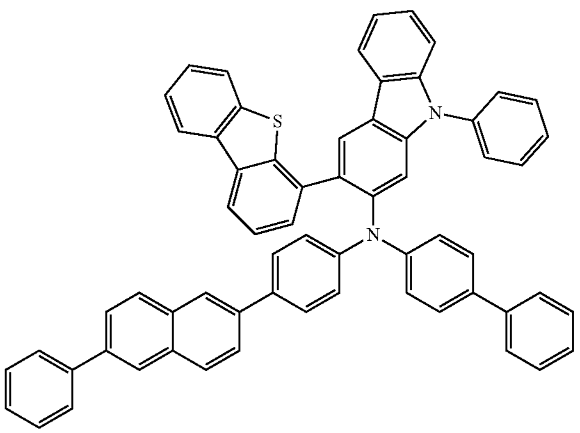
62
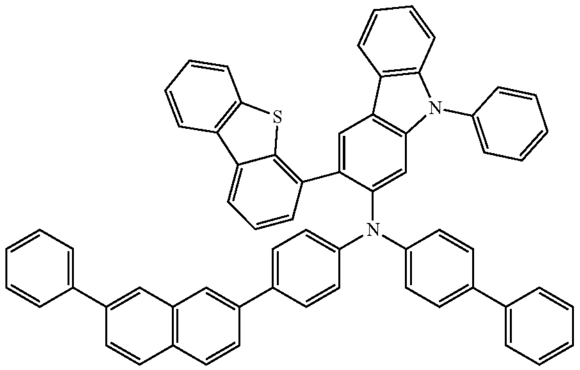
63
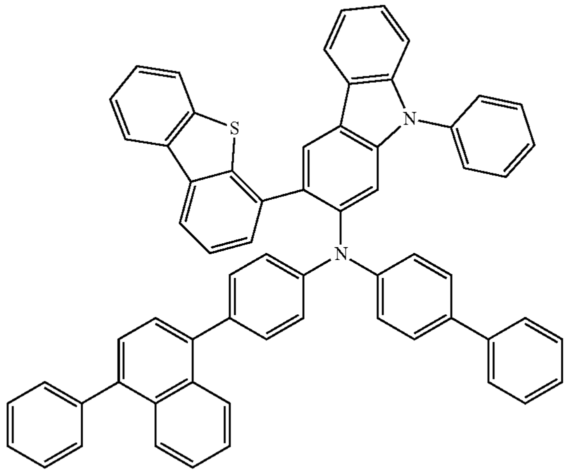
-continued
64
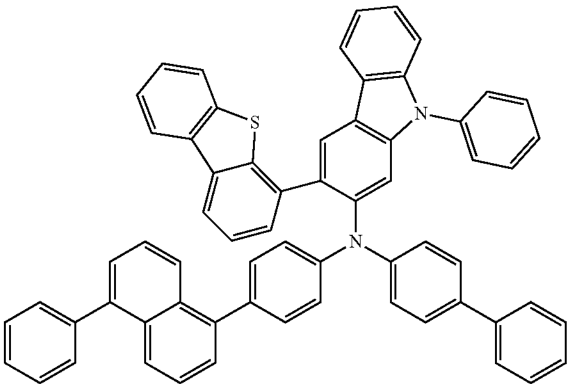
65
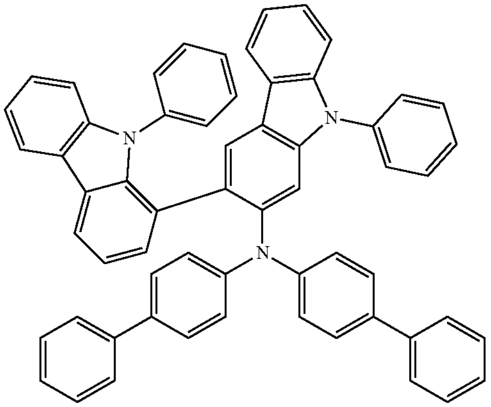
66
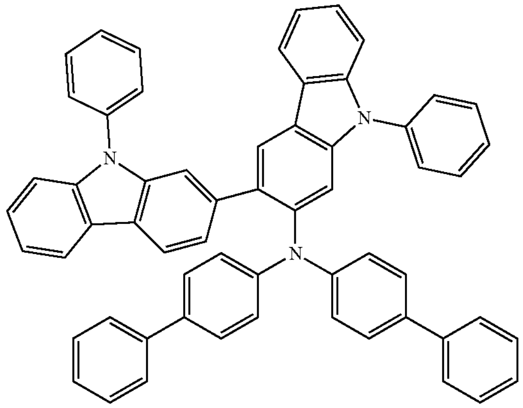
67
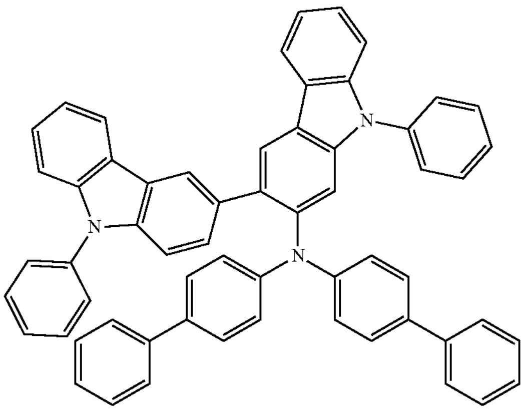

-continued
68
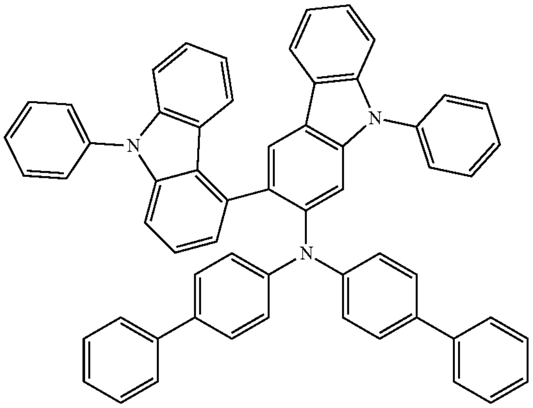
69
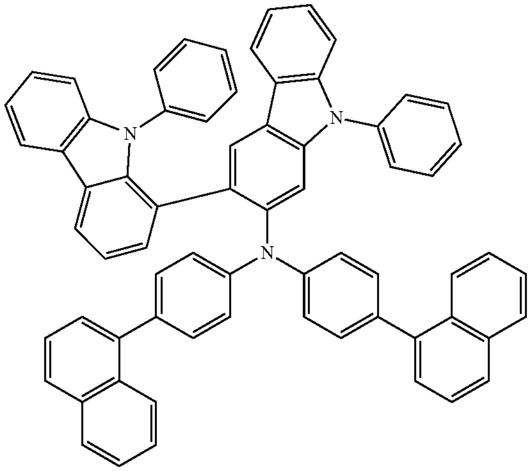
70
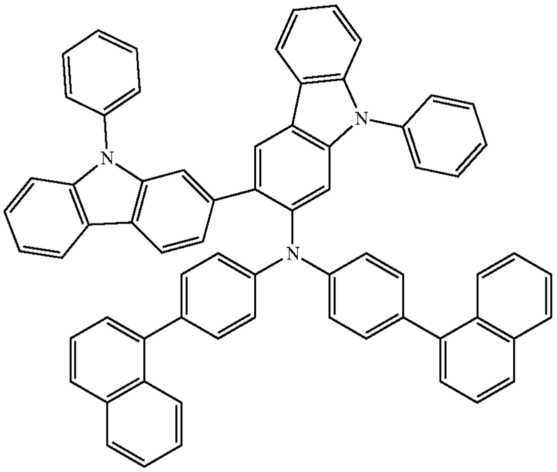
-continued
71
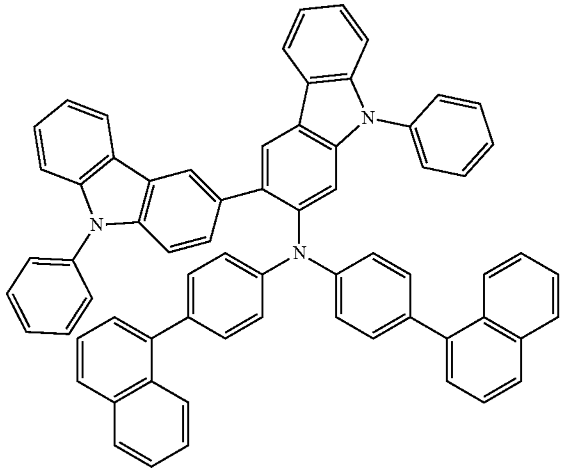
72
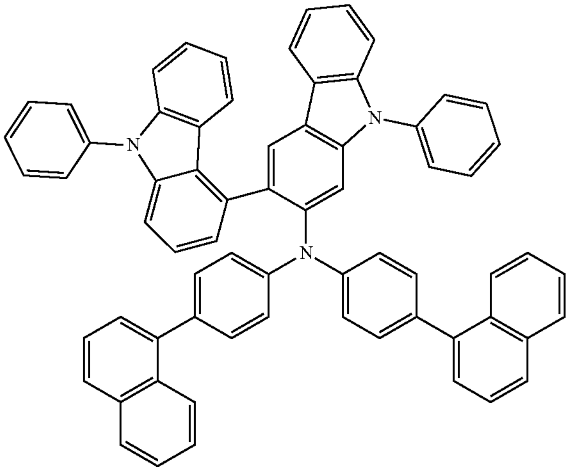
73
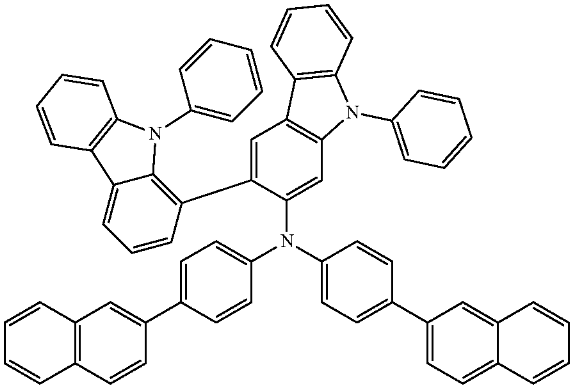

-continued
74
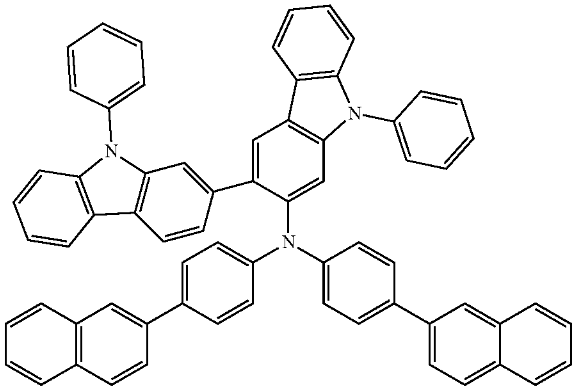
75
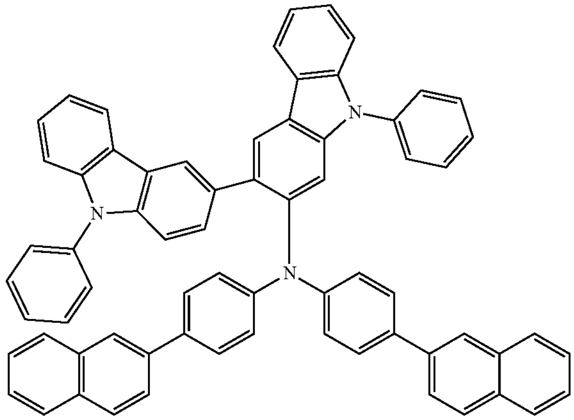
76
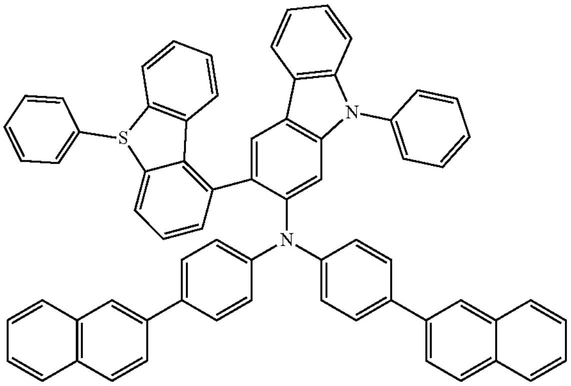
-continued
77
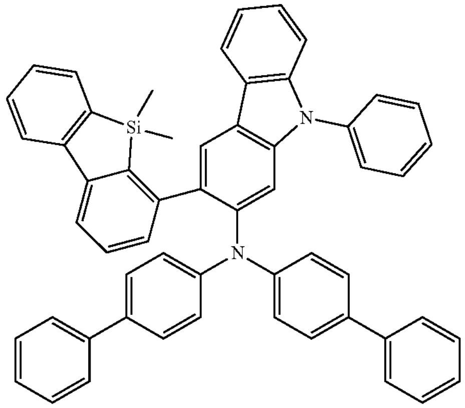
78
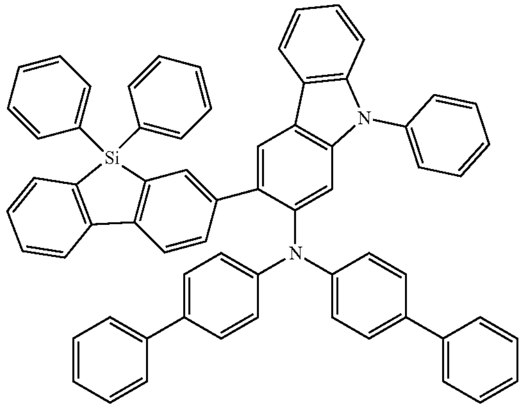
79
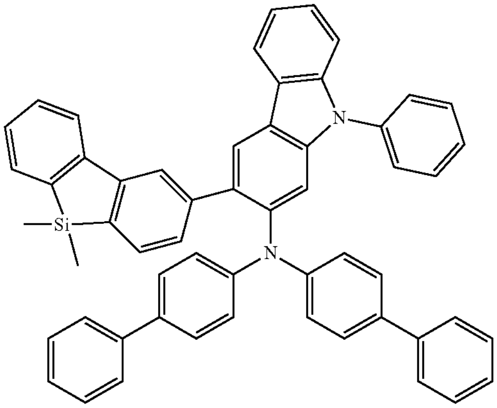
80
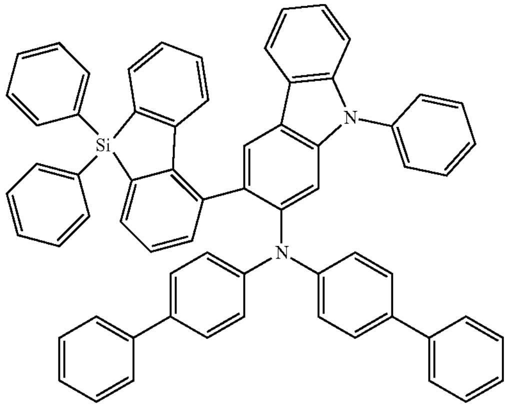

-continued
81
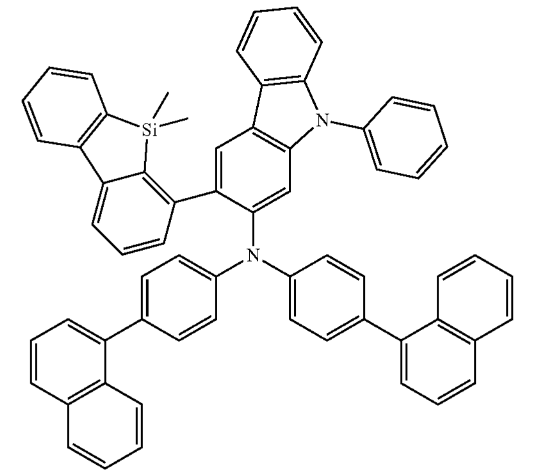
82
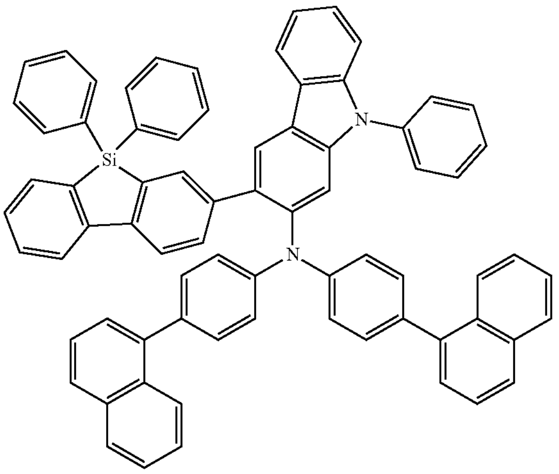
83
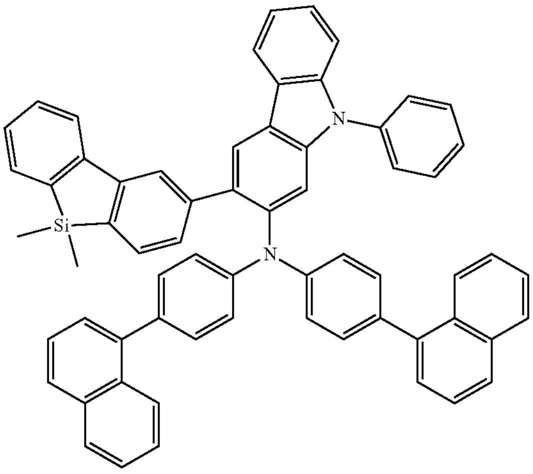
-continued
84
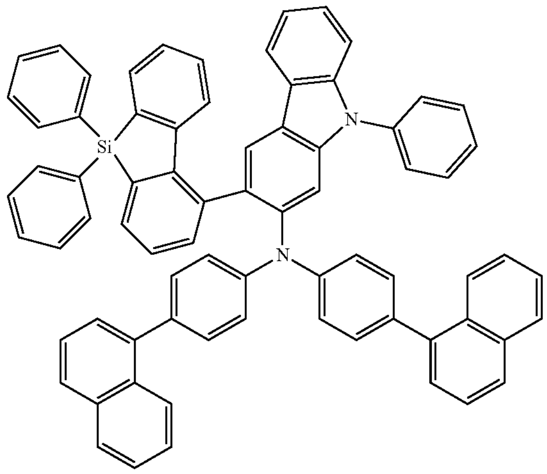
85
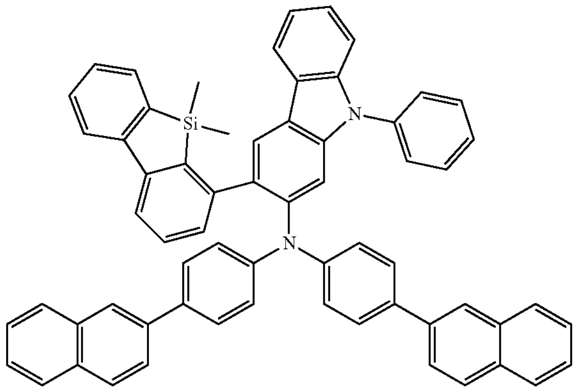
86
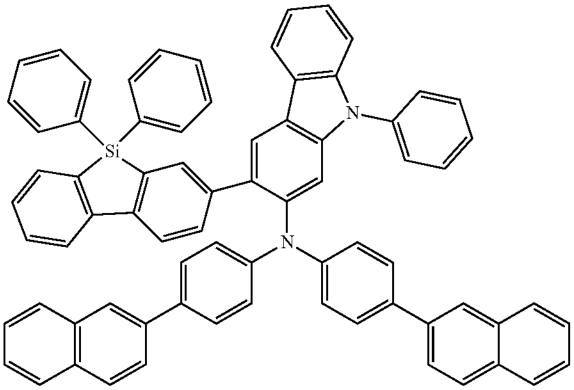

-continued
87
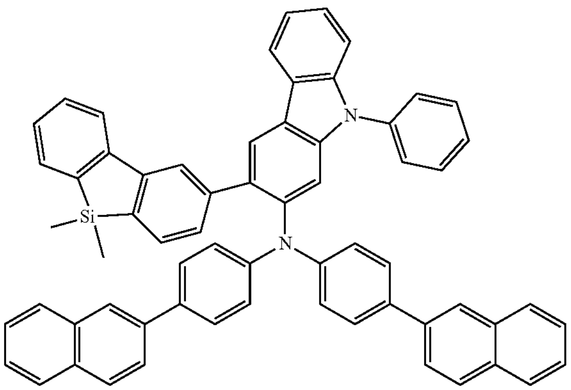
88
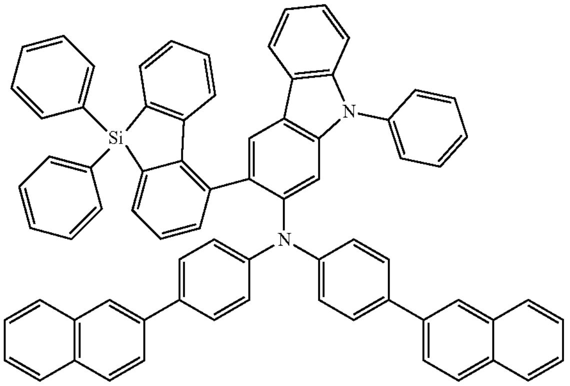
89
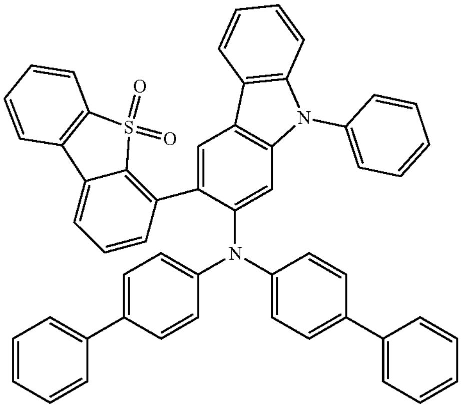
90
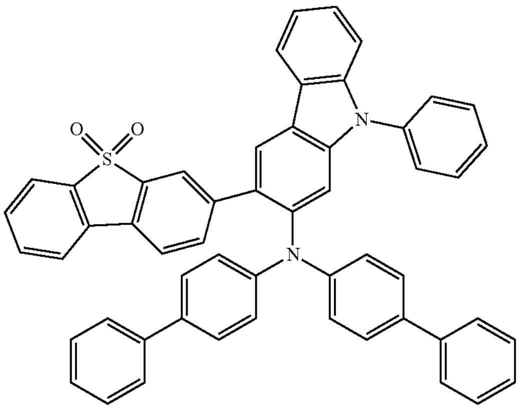
-continued
91
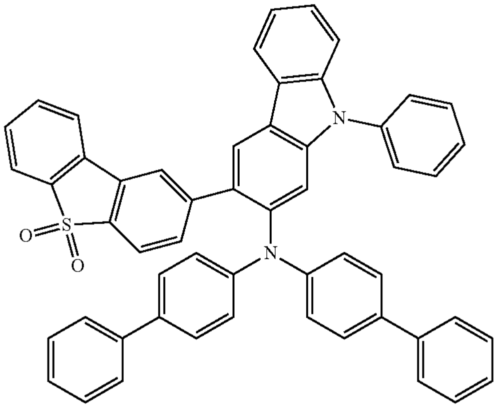
92
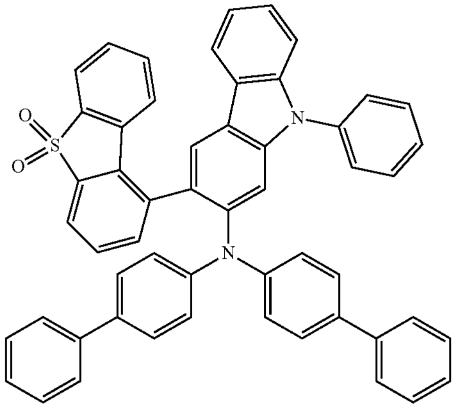
93
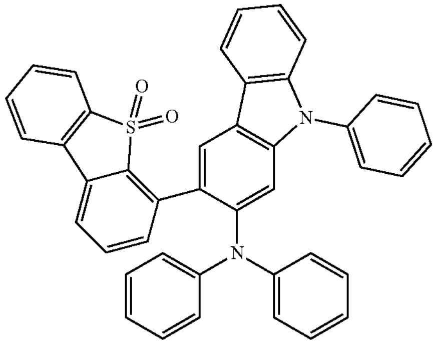
94
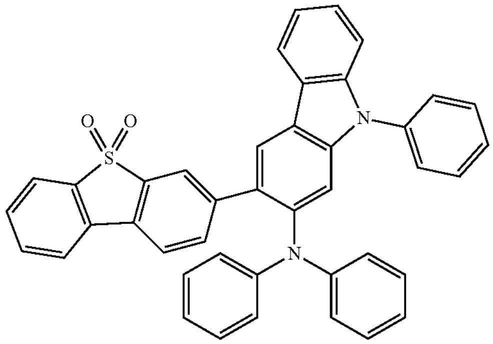

-continued
95
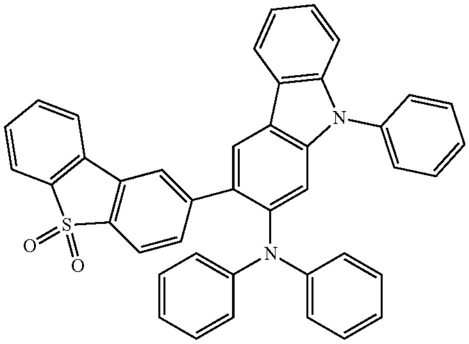
96
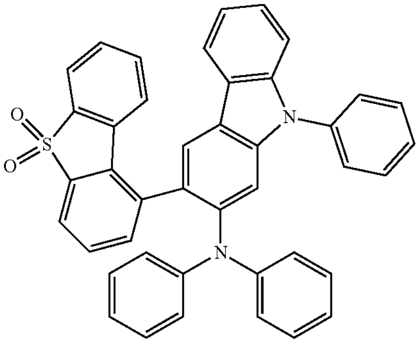
97
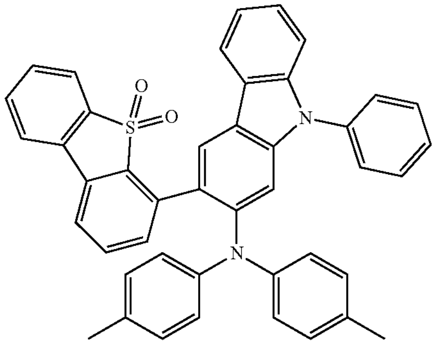
98
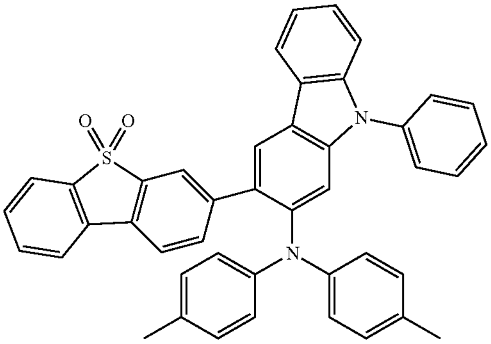
-continued
99
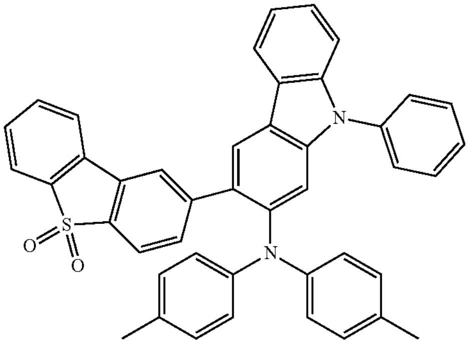
100
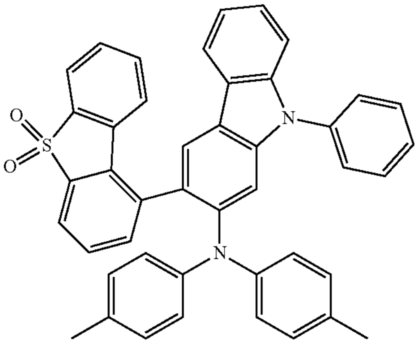
101
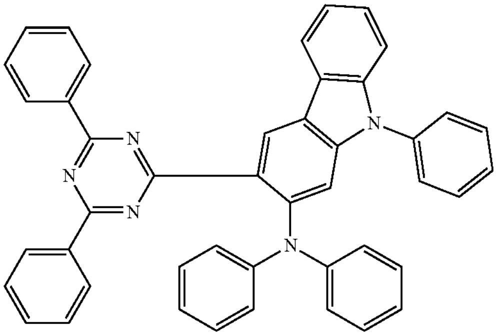
102
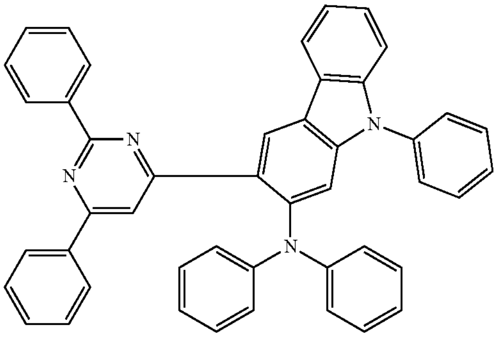

-continued
103
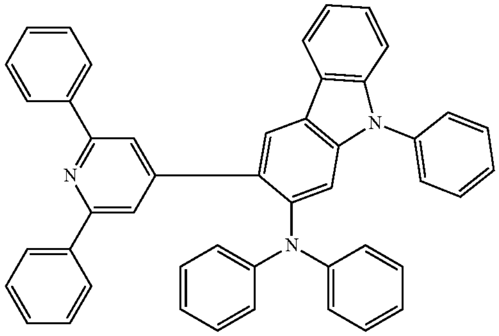
104
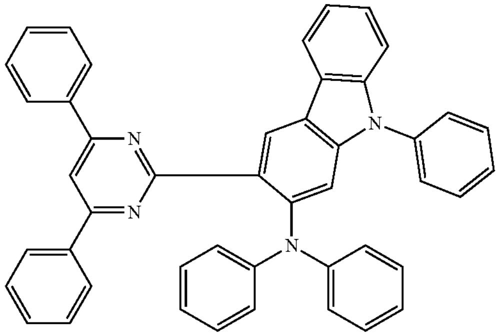
105
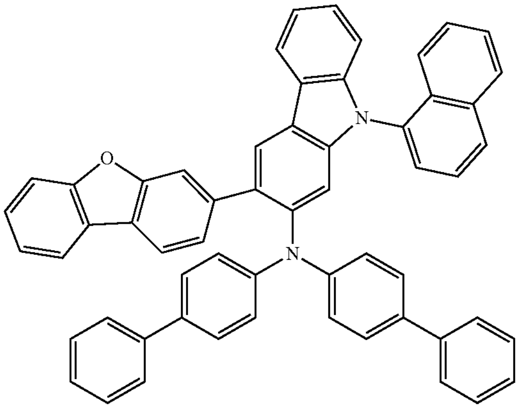
106
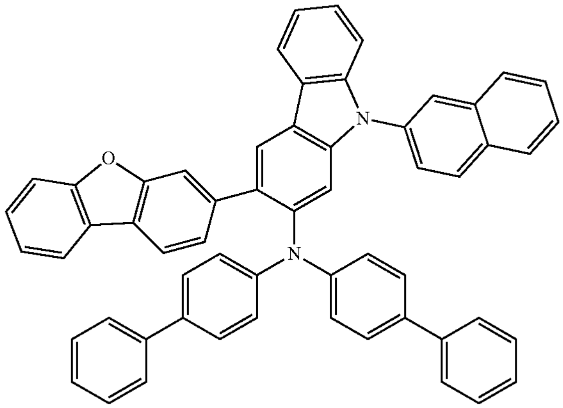
-continued
107
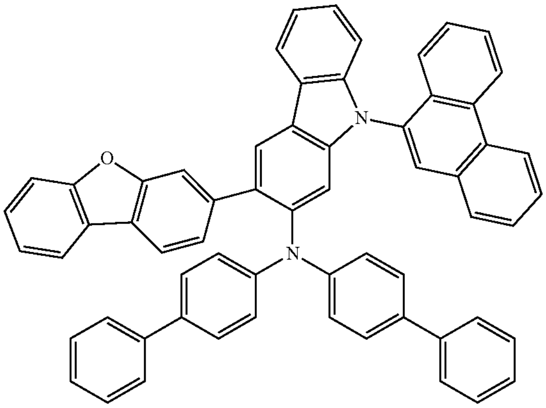
108
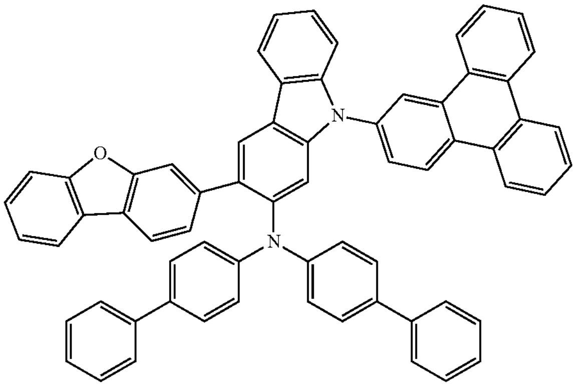
109
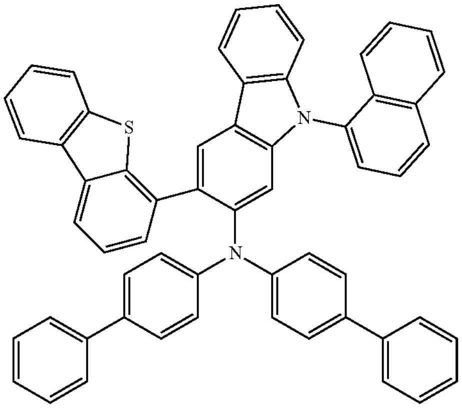

-continued
110
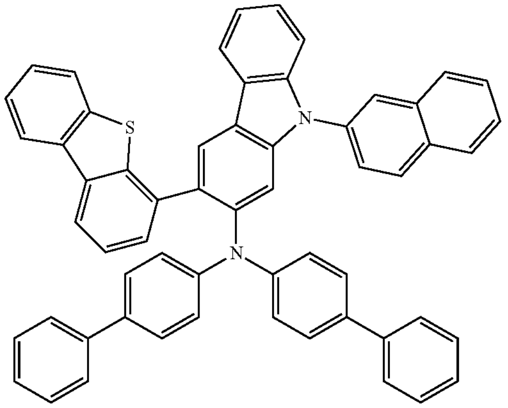
111
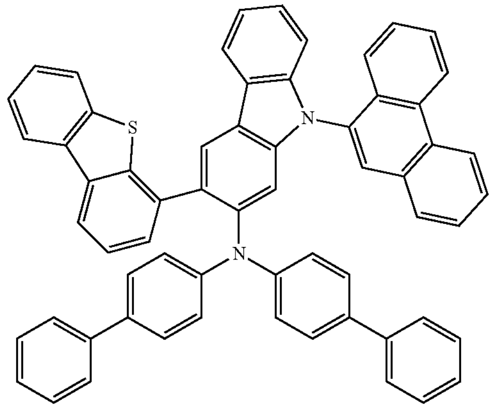
112
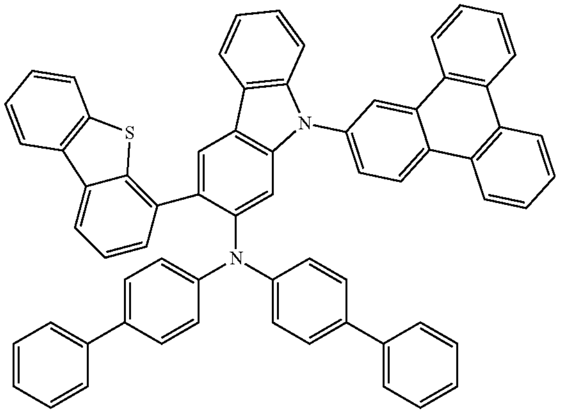
-continued
113
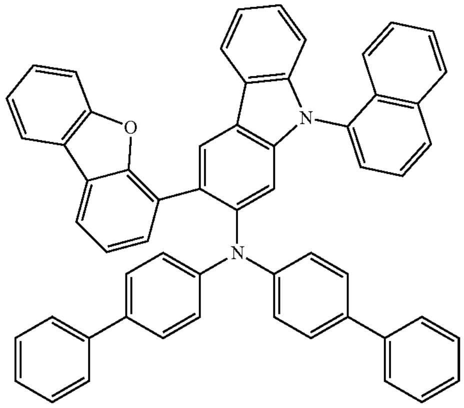
114
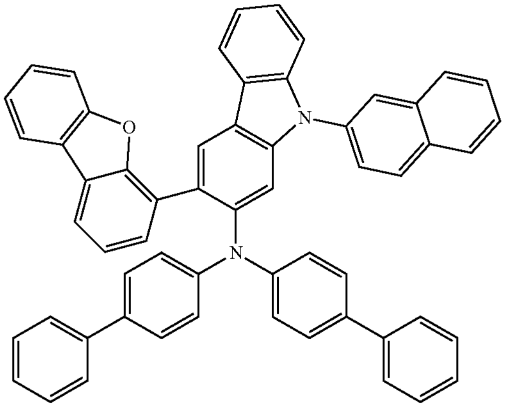
115
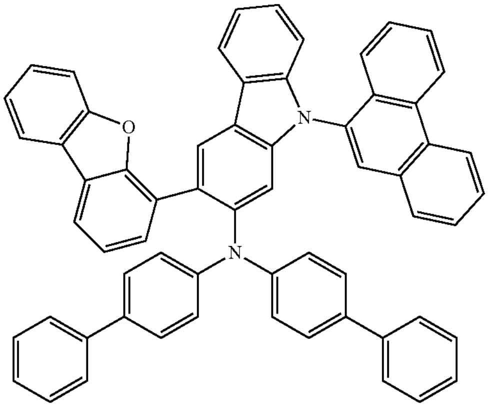

-continued
116
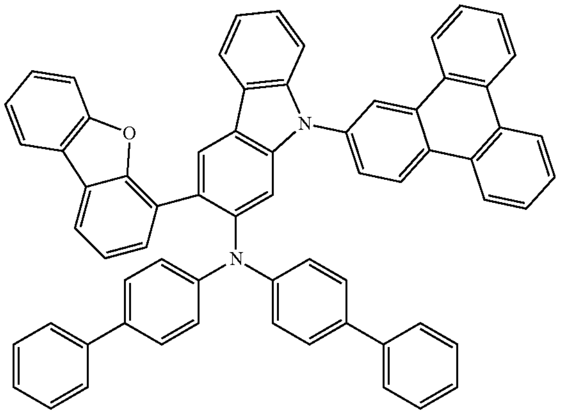
117
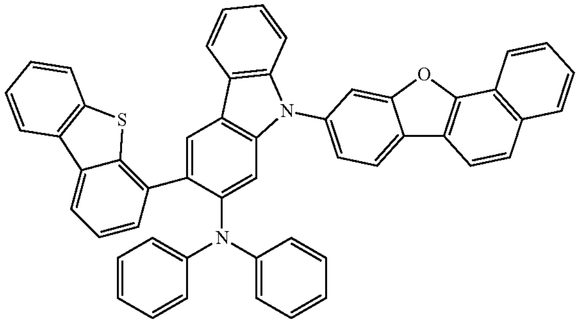
118
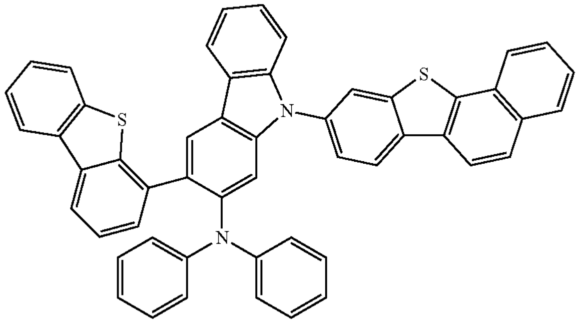
119
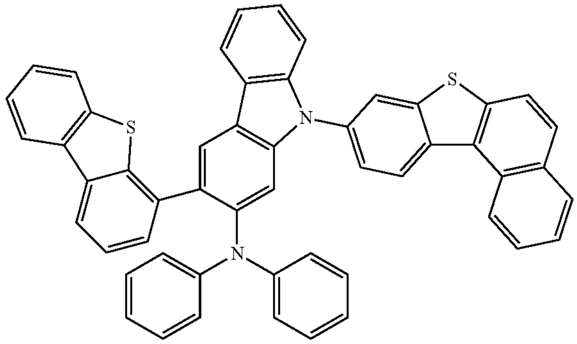
-continued
120
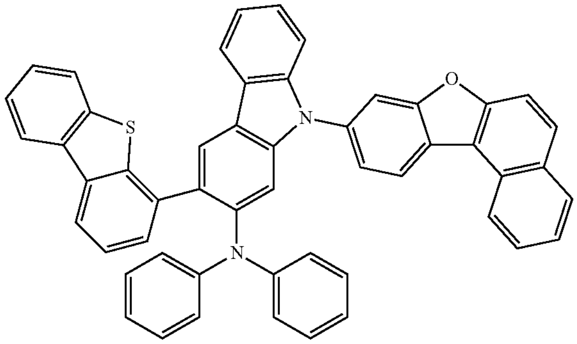
121
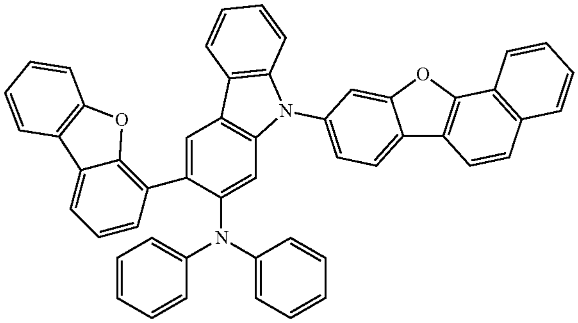
122
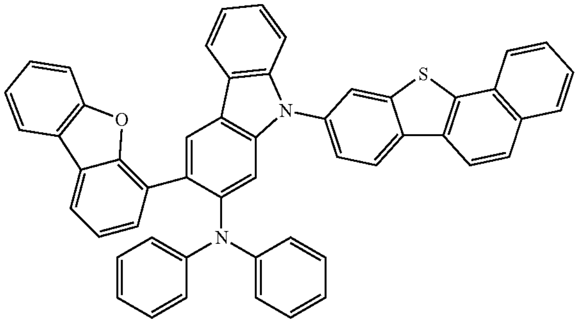
123
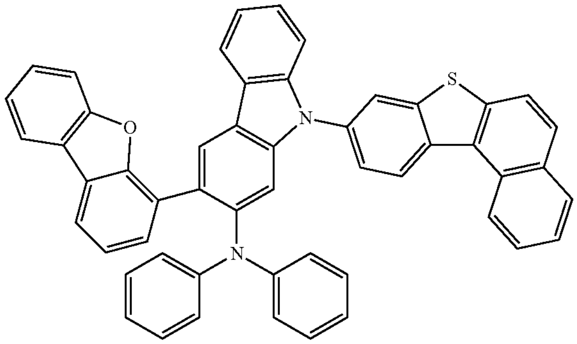

-continued
124
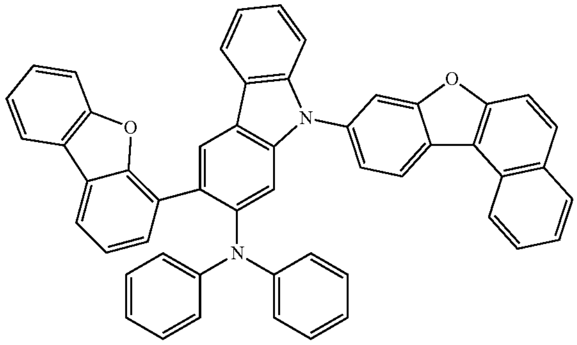
125
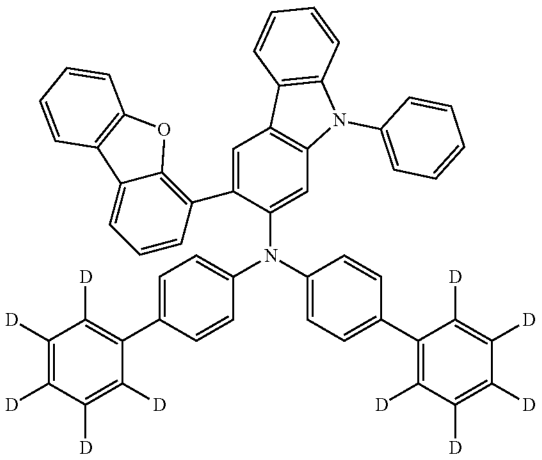
126
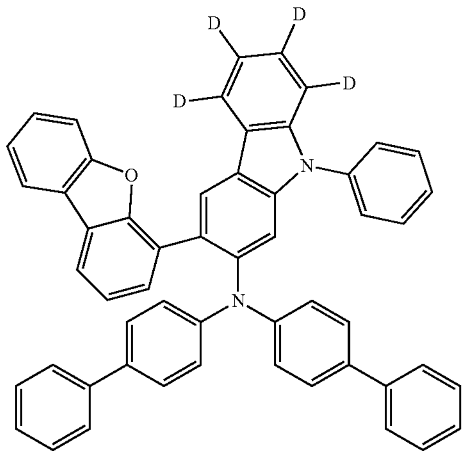
-continued
127
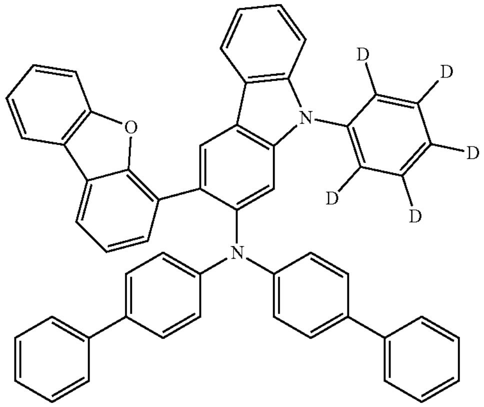
128
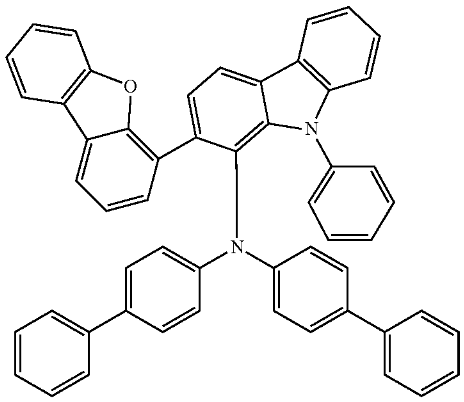
129
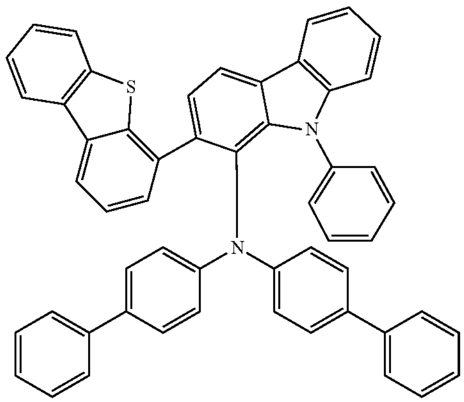

-continued
130
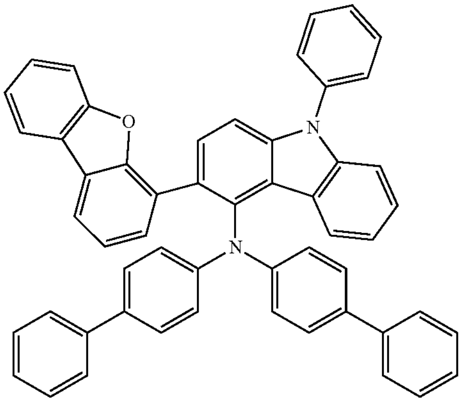
131
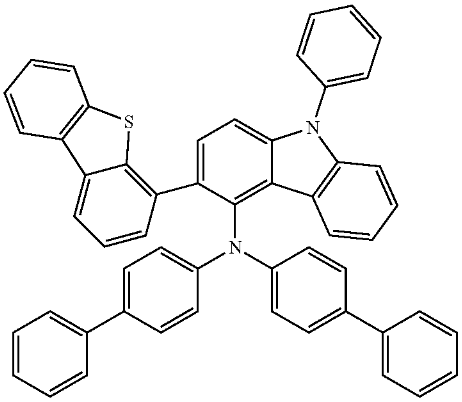
-continued
136
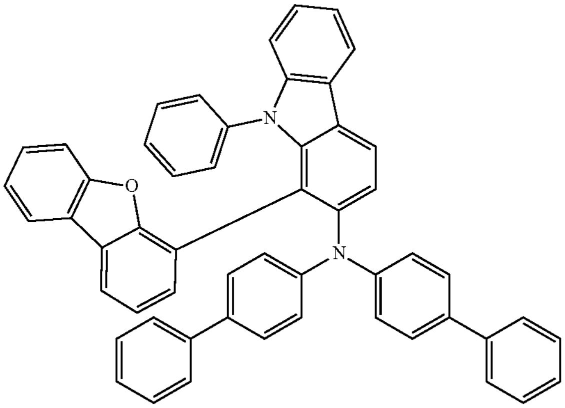
137
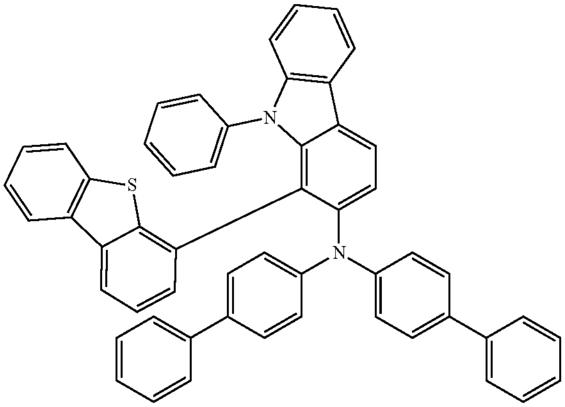
wherein in Compound 125 to Compound 127, D is a deuterium atom.
* * * * *